US012642001B2

(12) United States Patent
Ogawa et al.

(10) Patent No.: US 12,642,001 B2
(45) Date of Patent: May 26, 2026

(54) ORGANIC ELECTROLUMINESCENT ELEMENT

(71) Applicant: NIPPON STEEL Chemical & Material Co., Ltd., Tokyo (JP)

(72) Inventors: Junya Ogawa, Tokyo (JP); Masashi Tada, Tokyo (JP); Takahiro Kai, Tokyo (JP); Kazunari Yoshida, Tokyo (JP); Ikumi Kitahara, Tokyo (JP)

(73) Assignee: NIPPON STEEL CHEMICAL & MATERIAL CO., LTD., Tokyo (JP)

( * ) Notice: Subject to any disclaimer, the term of this patent is extended or adjusted under 35 U.S.C. 154(b) by 988 days.

(21) Appl. No.: 17/785,348

(22) PCT Filed: Dec. 11, 2020

(86) PCT No.: PCT/JP2020/046181

§ 371 (c)(1),
(2) Date: Jun. 14, 2022

(87) PCT Pub. No.: WO2021/131770

PCT Pub. Date: Jul. 1, 2021

(65) Prior Publication Data

US 2023/0113101 A1 Apr. 13, 2023

(30) Foreign Application Priority Data

Dec. 27, 2019 (JP) ................................ 2019-238535

(51) Int. Cl.

*H01L 51/54* (2006.01)
*H10K 50/12* (2023.01)
*H10K 85/60* (2023.01)
*H10K 50/11* (2023.01)
*H10K 101/00* (2023.01)
*H10K 101/10* (2023.01)

(52) U.S. Cl.

CPC ......... *H10K 85/6572* (2023.02); *H10K 50/12* (2023.02); *H10K 85/615* (2023.02); *H10K 85/622* (2023.02); *H10K 85/654* (2023.02); *H10K 85/657* (2023.02); *H10K 85/6574* (2023.02); *H10K 85/6576* (2023.02); *H10K 50/11* (2023.02); *H10K 2101/10* (2023.02); *H10K 2101/90* (2023.02)

(58) Field of Classification Search

None
See application file for complete search history.

(56) References Cited

U.S. PATENT DOCUMENTS

| | | | | |
|---|---|---|---|---|
| 2012/0104941 | A1 | 5/2012 | Jung et al. | |
| 2012/0153272 | A1* | 6/2012 | Fukuzaki | H05B 33/10 257/E51.026 |
| 2014/0374728 | A1 | 12/2014 | Adamovich et al. | |
| 2015/0112064 | A1* | 4/2015 | Kim | H10K 85/6572 544/331 |
| 2015/0166886 | A1 | 6/2015 | Endo et al. | |
| 2016/0126472 | A1* | 5/2016 | Oh | B65H 51/015 252/500 |
| 2016/0372683 | A1* | 12/2016 | Tanimoto | C09K 11/06 |
| 2017/0069848 | A1* | 3/2017 | Zeng | H10K 85/342 |
| 2017/0263869 | A1 | 9/2017 | Tada et al. | |
| 2018/0083201 | A1* | 3/2018 | Ogawa | C09K 11/025 |
| 2018/0138420 | A1 | 5/2018 | Tada et al. | |
| 2019/0019972 | A1 | 1/2019 | Nishimura et al. | |
| 2020/0006687 | A1 | 1/2020 | Inoue et al. | |
| 2021/0083195 | A1 | 3/2021 | Ogawa et al. | |
| 2021/0355128 | A1 | 11/2021 | Jung et al. | |

FOREIGN PATENT DOCUMENTS

| | | | | |
|---|---|---|---|---|
| CN | 103193717 A | | 7/2013 | |
| KR | 10-2014-0094408 A | | 7/2014 | |
| KR | 10-2017-0059985 A | | 5/2017 | |
| KR | 10-2017-0060836 A | | 6/2017 | |
| KR | 20170060836 A | * | 6/2017 | C07D 403/10 |
| KR | 10-2019-0089763 A | | 7/2019 | |
| KR | 20190089763 A | * | 7/2019 | C09K 11/06 |
| KR | 10-2020-0063053 A | | 6/2020 | |
| WO | WO 2011/005060 A2 | | 1/2011 | |
| WO | WO 2011/070963 A1 | | 6/2011 | |
| WO | WO 2011/136755 A1 | | 11/2011 | |
| WO | WO 2013/062075 A1 | | 5/2013 | |
| WO | WO 2016/194604 A1 | | 12/2016 | |
| WO | WO 2018/061446 A1 | | 4/2018 | |
| WO | WO 2018/173600 A1 | | 9/2018 | |

OTHER PUBLICATIONS

KR20170060836A—Machine_translation (Year: 2017).*
KR20190089763A—Machine_translation (Year: 2019).*

* cited by examiner

*Primary Examiner* — Andrew K Bohaty
(74) *Attorney, Agent, or Firm* — Birch, Stewart, Kolasch & Birch, LLP

(57) ABSTRACT

To provide an organic electroluminescent device having high efficiency while having a driving voltage. This organic electroluminescent device includes an anode, an organic layer and a cathode stacked on a substrate, at least one layer of the organic layer is a light-emitting layer containing a first host, a second host and a light-emitting dopant material, the first host is selected from a compound represented by the following general formula (1), and the second host is selected from a biscarbazole compound binding at a position other than the N-position, an indolocarbazole compound, or a carbazole compound in which a plurality of carbazole rings bind at the N-position. In the formula, a ring A is represented by formula (1b) or (1c), X represents NR, S, O, or $CR_2$, and at least one Y represents N.

21 Claims, 1 Drawing Sheet

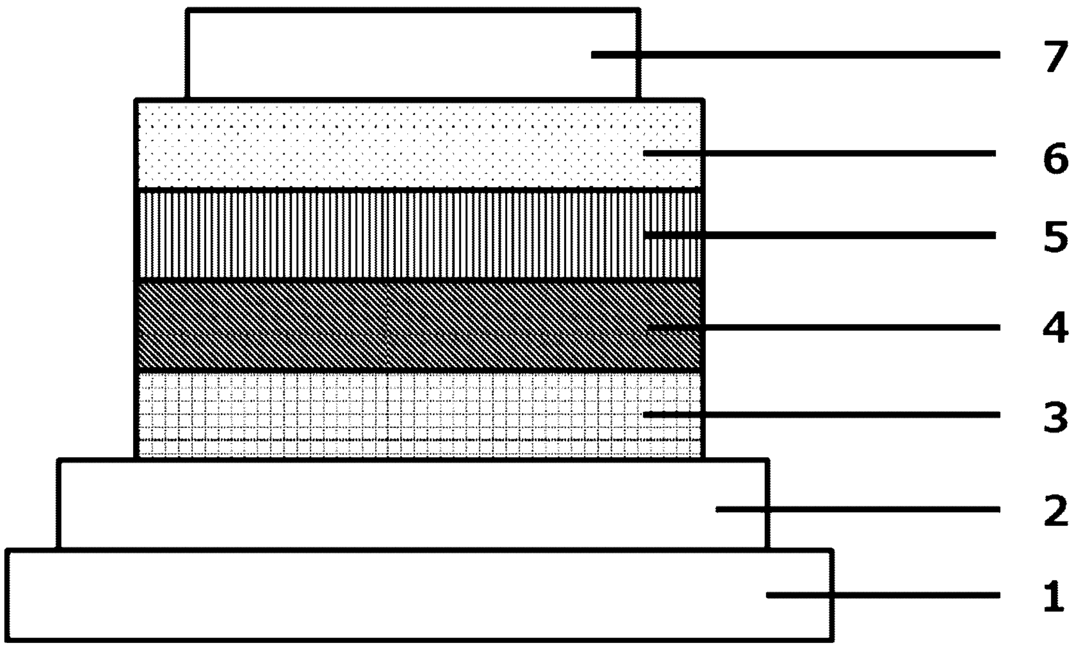
7
6
5
4
3
2
1

ORGANIC ELECTROLUMINESCENT ELEMENT

TECHNICAL FIELD

The present invention relates to an organic electroluminescent device. More specifically, the present invention relates to an organic electroluminescent device using two or more hosts.

BACKGROUND ART

Application of a voltage to an organic electroluminescent device (organic EL device) allows injection of holes and electrons from an anode and a cathode, respectively, into a light-emitting layer. Then, in the light-emitting layer, injected holes and electrons recombine to generate excitons. At this time, according to statistical rules of electron spins, singlet excitons and triplet excitons are generated at a ratio of 1:3. Regarding a fluorescence-emitting organic electroluminescent device using light emission from singlet excitons, it is said that the internal quantum efficiency thereof has a limit of 25%. Meanwhile, regarding a phosphorescent organic electroluminescent device using light emission from triplet excitons, it is known that intersystem crossing is efficiently performed from singlet excitons, the internal quantum efficiency is enhanced to 100%.

Recently, highly efficient organic electroluminescent devices utilizing delayed fluorescence have been developed. There is known, for example, an organic electroluminescent device utilizing a TTF (Triplet-Triplet Fusion) mechanism, which is one of delayed fluorescence mechanisms. The TTF mechanism utilizes a phenomenon in which singlet excitons are generated due to collision of two triplet excitons, and it is thought that the internal quantum efficiency can be theoretically raised to 40%. However, since the efficiency is lower compared to phosphorescent organic electroluminescent devices, further improvement in efficiency is required.

Patent Literature 1 discloses an organic electroluminescent device utilizing a TADF (Thermally Activated Delayed Fluorescence) mechanism. The TADF mechanism utilizes a phenomenon in which reverse intersystem crossing from triplet excitons to singlet excitons is generated in a material having a small energy difference between a singlet level and a triplet level, and it is thought that the internal quantum efficiency can be theoretically raised to 100%. However, phosphorescent devices are required to be further improved in efficiency characteristics and improved in low voltage characteristics.

CITATION LIST

Patent Literature

Patent Literature 1: WO2011/070963A
Patent Literature 2: WO2013/062075A
Patent Literature 3: US2014/0374728A
Patent Literature 4: WO2011/136755A
Patent Literature 5: WO2011/070963A
Patent Literature 6: KR2014-094408A
Patent Literature 7: KR2017-060836A
Patent Literature 8: CN103193717A
Patent Literature 9: WO2011/005060A Patent Literatures 2 and 3 disclose use of a biscarbazole compound as a mixed host.

Patent Literature 4 discloses use of a host material in which a plurality of hosts containing an indolocarbazole compound is premixed.

Patent Literature 5 discloses to use an indolocarbazole compound as a thermally activated delayed fluorescence-emitting dopant material.

Patent Literatures 6 and 7 disclose a carbazole compound having two triazine rings, and Patent Literatures 8 and 9 disclose a compound having two pyrimidine rings, in which the pyrimidine rings are linked by a phenyl group.

However, none of these can be said to be sufficient, and further improvement is desired.

SUMMARY OF INVENTION

In order to apply organic electroluminescent devices to display devices such as flat panel displays, or light sources, it is necessary to improve the luminous efficiency of devices and at the same time, to sufficiently secure the stability during driving. An object of the present invention is to provide an organic electroluminescent device having high efficiency while having a low driving voltage, and a material for organic electroluminescent device suitable therefor.

As a result of intensive studies, the present inventors have found that use of a specific azine compound as a first host provides an organic electroluminescent device exhibiting excellent characteristics, and have completed the present invention.

The present invention is an organic electroluminescent device including an anode, an organic layer and a cathode stacked on a substrate, wherein at least one layer of the organic layer is a light-emitting layer containing a first host, a second host and a light-emitting dopant material, the first host is selected from a compound represented by the following general formula (1), and the second host is selected from a compound represented by the following general formula (2), general formula (3), or general formula (4).

[Formula 1]

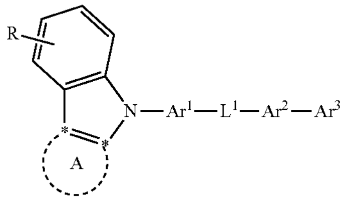

(1)

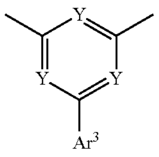

(1a)

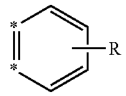

(1b)

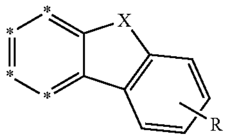

(1c)

In the formula, a ring A is represented by formula (1b) or (1c) and is fused to an adjacent ring at any position. * represents C or CR, and two adjacent * in the formula (1b) or formula (1c) bind to * of an adjacent ring.

X represents $NR^{11}$, S, O, or $CR^{12}R^{13}$, and $R^{11}$, $R^{12}$, and $R^{13}$ each independently represent an aliphatic hydrocarbon group having 1 to 10 carbon atoms, a substituted or unsubstituted aromatic hydrocarbon group having 6 to 30 carbon atoms, a substituted or unsubstituted aromatic heterocyclic group having 3 to 16 carbon atoms, or a substituted or unsubstituted linked aromatic group in which two to five of these aromatic rings are linked to each other.

R independently represents hydrogen, deuterium, an aliphatic hydrocarbon group having 1 to 10 carbon atoms, a substituted or unsubstituted aromatic hydrocarbon group having 6 to 30 carbon atoms, a substituted or unsubstituted aromatic heterocyclic group having 3 to 16 carbon atoms, or a substituted or unsubstituted linked aromatic group in which two to three of these aromatic groups are linked to each other.

Y independently represents N or $CR^{14}$, and at least one Y represents N.

$R^{14}$ represents hydrogen, deuterium, an aliphatic hydrocarbon group having 1 to 10 carbon atoms, a substituted or unsubstituted aromatic hydrocarbon group having 6 to 30 carbon atoms, a substituted or unsubstituted aromatic heterocyclic group having 3 to 16 carbon atoms, or a substituted or unsubstituted linked aromatic group in which two to five of these aromatic rings are linked to each other.

$Ar^1$ and $Ar^2$ are independently an aromatic heterocyclic group represented by formula (1a), and $Ar^3$ independently represents a substituted or unsubstituted aromatic hydrocarbon group having 6 to 30 carbon atoms, or a substituted or unsubstituted aromatic heterocyclic group having 3 to 16 carbon atoms, or a substituted or unsubstituted linked aromatic group in which two to five of these aromatic rings are linked to each other.

$L^1$ independently represents a substituted or unsubstituted aromatic hydrocarbon group having 6 to 30 carbon atoms.

[Formula 2]

(2)

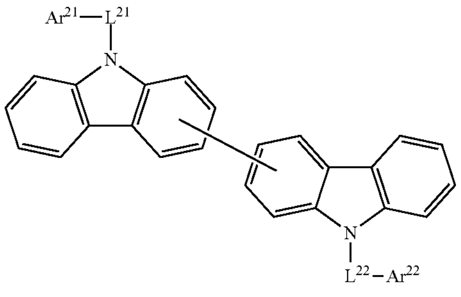

In the formula, $Ar^{21}$ and $Ar^{22}$ independently represent hydrogen, a substituted or unsubstituted aromatic hydrocarbon group having 6 to 14 carbon atoms, or a substituted or unsubstituted linked aromatic group in which two of the aromatic hydrocarbon groups are linked to each other. $L^{21}$ and $L^{22}$ independently represent a phenylene group.

[Formula 3]

(3)

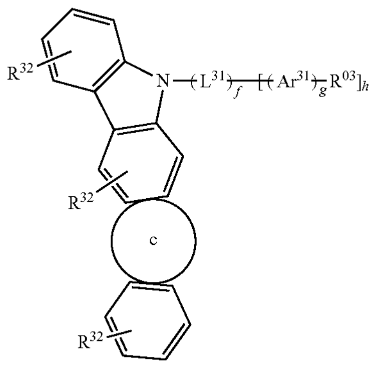

(3a)

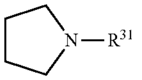

In the formula, a ring c is a heterocycle represented by formula (3a) and the ring c is fused to an adjacent ring at any position, $R^{03}$ and $R^{32}$ independently represent hydrogen, deuterium, an aliphatic hydrocarbon group having 1 to 10 carbon atoms, a substituted or unsubstituted aromatic hydrocarbon group having 6 to 30 carbon atoms, or a substituted or unsubstituted aromatic heterocyclic group having 3 to 16 carbon atoms, $R^{31}$ represents a substituted or unsubstituted aromatic hydrocarbon group having 6 to 10 carbon atoms, a carbazolyl group, or a substituted or unsubstituted linked aromatic group in which two to five of these aromatic rings are linked to each other, $L^{31}$ independently represents a substituted or unsubstituted aromatic hydrocarbon group having 6 to 30 carbon atoms, or a substituted or unsubstituted aromatic heterocyclic group having 3 to 16 carbon atoms, $Ar^{31}$ independently represents a substituted or unsubstituted aromatic hydrocarbon group having 6 to 10 carbon atoms.

f is the number of repetitions and represents an integer of 1 to 3, g is the number of repetitions and independently represents an integer of 0 to 3, and h is the number of substitutions and represents an integer of 1 to 7.

[Formula 4]

(4)

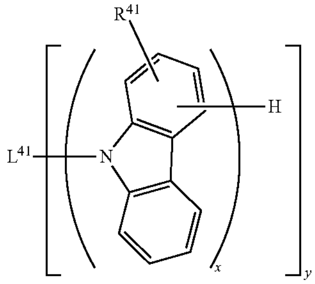

In the formula, $L^{41}$ represents a substituted or unsubstituted aromatic hydrocarbon group having 6 to 30 carbon atoms, a substituted or unsubstituted aromatic heterocyclic group having 3 to 5 carbon atoms, or a linked aromatic group in which two to five of these aromatic rings are linked. $R^{41}$ each independently represents hydrogen, deuterium, an aliphatic hydrocarbon group having 1 to 10 carbon atoms, a substituted or unsubstituted aromatic hydrocarbon group having 6 to 30 carbon atoms, or a substituted or unsubstituted aromatic heterocyclic group having 3 to 16 carbon atoms, provided that $R^{41}$ is not a carbazole group. x is the number of repetitions and independently represents an integer of 1 to 4, provided that at least one x is an integer of 2 to 4. y is the number of substitutions and represents an integer of 1 to 4. When x and y are each 2 or more, a plurality of carbazolyl groups in the formula may be the same or different.

The compound represented by the general formula (1) is a compound represented by the following formula (5), a compound represented by the following formula (6), or a compound represented by any of the following formulas (7) to (12).

In the formula (5), formula (6) and formulas (7) to (12), the same symbols as in the general formula (1) have the same meaning.

[Formula 5]

(5)

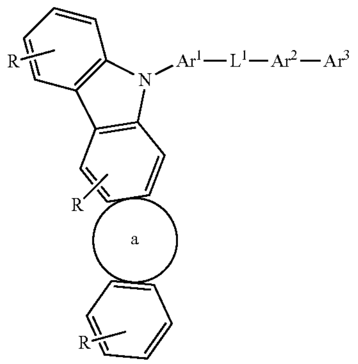

(5a)

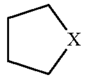

In the formula, a ring a is represented by formula (5a) and the ring a is fused to an adjacent ring at any position, X represents $NR^{51}$, S, O, or $CR^{52}R^{53}$, $R^{51}$, $R^{52}$ and $R^{53}$ each independently represent an aliphatic hydrocarbon group having 1 to 10 carbon atoms, a substituted or unsubstituted aromatic hydrocarbon group having 6 to 30 carbon atoms, a substituted or unsubstituted aromatic heterocyclic group having 3 to 16 carbon atoms, or a linked aromatic group in which two to five of these groups are linked to each other.

[Formula 6]

(6)

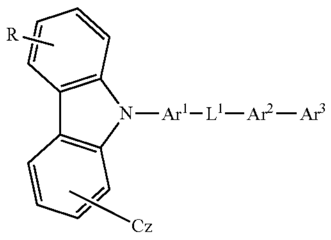

-continued (6a)

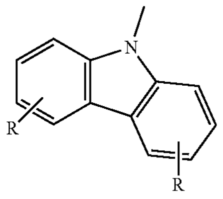

(6b)

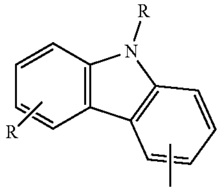

In the formula, Cz represents a carbazole group represented by formula (6a) or formula (6b).

[Formula 7]

(7)

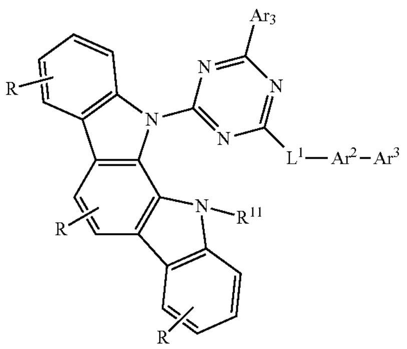

(8)

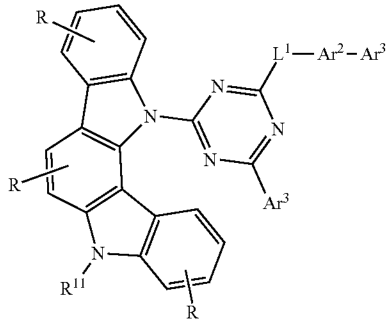

(9)

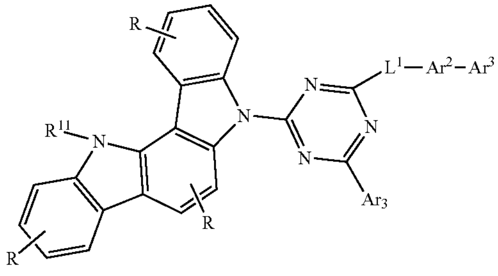

-continued

[Formula 8]

(10)

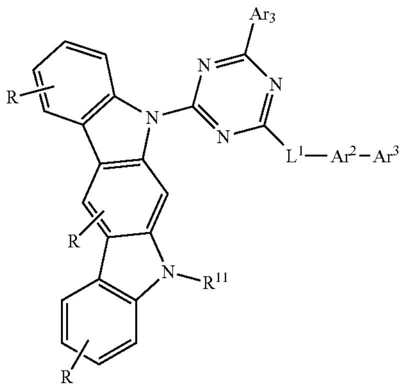

(11)

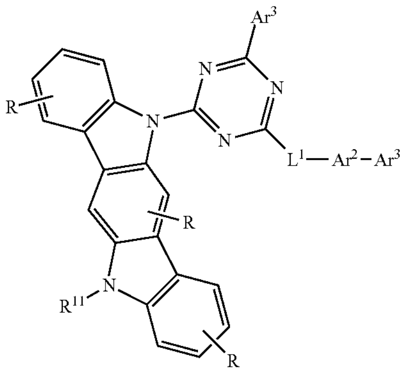

(12)

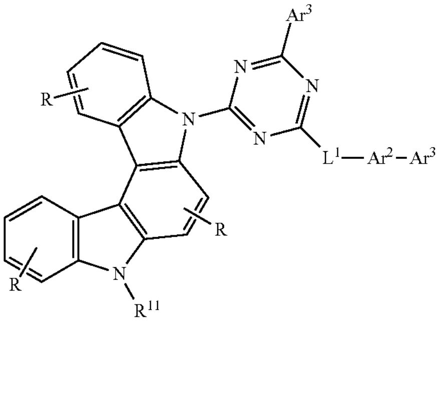

The compound represented by the general formula (2) can be used as the second host, and is a compound represented by the following formula (13). In the formula (13), the same symbols as in the general formula (2) have the same meaning.

[Formula 9]

(13)

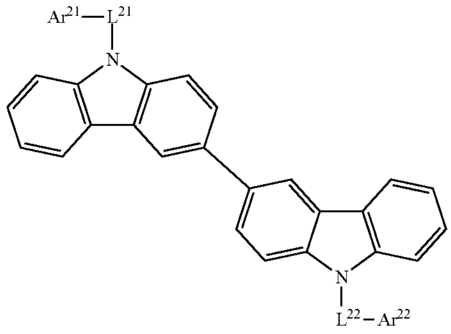

In the general formula (3), $L^{31}$ can represent a compound represented by a substituted or unsubstituted aromatic hydrocarbon group having 6 to 15 carbon atoms, a substituted or unsubstituted carbazole group, a substituted or unsubstituted dibenzothiophene group, or a substituted or unsubstituted dibenzofuran group. $L^{31}$ preferably represents a substituted or unsubstituted phenyl group, a substituted or unsubstituted naphthyl group, a substituted or unsubstituted biphenyl group, a substituted or unsubstituted 9,9'-dimethylfluorene group, or a substituted or unsubstituted carbazole group.

The compound represented by the general formula (3) is a compound represented by the following formula (14) or formula (15). In the formula (14) and formula (15), the same symbols as in the general formula (3) have the same meaning.

[Formula 10]

(14)

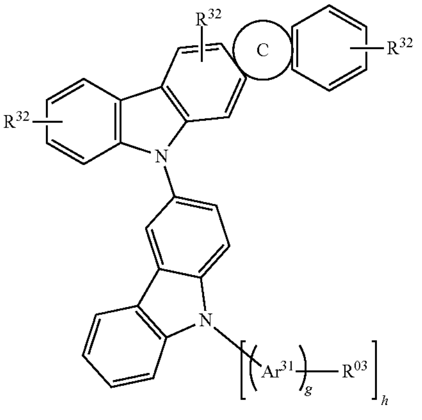

-continued (15)

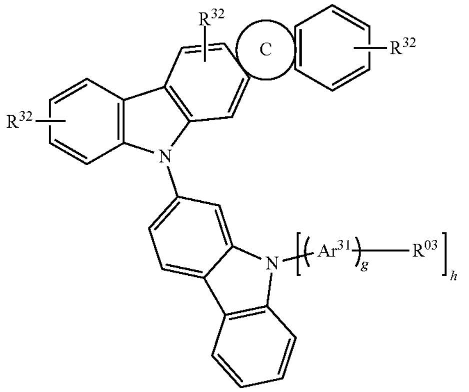

The general formula (4) desirably has at least one binding structure represented by formula (4a), or at least one binding structure represented by formula (4b). In the formula (4a) and formula (4b), the same symbols as in the general formula (4) have the same meaning.

[Formula 11]

(4a)

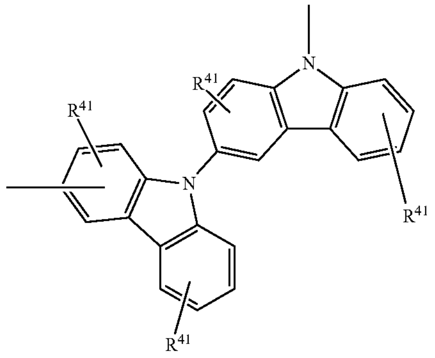

(4b)

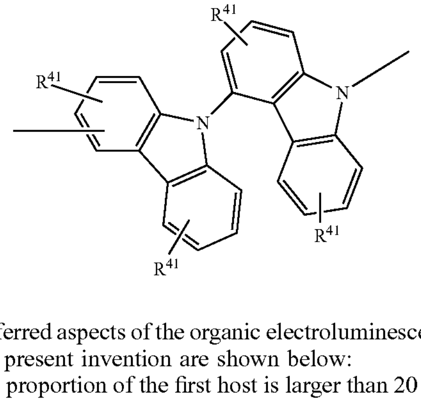

Preferred aspects of the organic electroluminescent device of the present invention are shown below:

The proportion of the first host is larger than 20 wt % and less than 55 wt % based on the first host and the second host in total;

The light-emitting dopant material is an organic metal complex containing at least one metal selected from the group consisting of ruthenium, rhodium, palladium, silver, rhenium, osmium, iridium, platinum and gold;

The light-emitting dopant material is a fluorescent dopant material containing a thermally activated delayed fluorescence-emitting dopant.

The difference in electron affinities (EA) of the first host and the second host is more than 0.1 eV and less than 0.6 eV.

The difference in EA of the first host and an electron transport layer material is within 0.3 eV.

A hole blocking layer is provided adjacent to the light-emitting layer, and the compound represented by the general formula (1) is contained in the hole blocking layer.

In addition, the present invention is a composition for the organic electroluminescent device, containing a first host and a second host, wherein the composition contains the compound represented by the general formula (1) as the first host and the compound represented by the general formula (2), general formula (3), or general formula (4) as the second host.

Preferred aspects of the composition for the organic electroluminescent device of the present invention are shown below.

The compound represented by the formula (13) is contained as the second host.

The difference in 50% weight reduction temperatures of the first host and the second host is within 20° C.

In addition, the present invention is a method for producing an organic electroluminescent device including an anode, an organic layer and a cathode stacked on a substrate, the method including producing a light-emitting layer by using the composition and a light-emitting dopant material.

For improvement of device characteristics, a higher durability of a material used for an organic layer against charges is needed, and particularly, in the light-emitting layer, it is important to reduce leakage of excitons and charges to surrounding layers. For leakage reduction of charges/excitons, it is effective to improve localization of a light emission area in the light-emitting layer. For this purpose, it is necessary to control amounts of both charges (electrons/holes) injected into the light-emitting layer or amounts of both charges transported in the light-emitting layer within a preferred range.

In an azine compound represented by formula (1) used in the present invention, the lowest unoccupied molecular orbital (LUMO) having an effect on electron injection transport properties of a material is distributed on two or more nitrogen-containing 6-membered rings via an aromatic hydrocarbon group, and changing not only the number of nitrogen-containing heterocycles and a linking mode of an aromatic linking group for connection of the nitrogen-containing heterocycles, but also the number of nitrogen atoms on such a nitrogen-containing 6-membered ring allows a high-level control of electron injection transport properties of the device. On the other hand, the lowest occupied molecular orbital (HOMO) having an effect on hole injection transport properties is widely distributed on a fused aromatic heterocycle typified in indolocarbazole, and changing the kind or number of substituents on the fused aromatic heterocycle allows a high-level control of hole injection transport properties of the device.

In this regard, the carbazole compound or the indolocarbazole compound represented by the general formulas (2) to (4) especially has a high hole injection transport ability and changing the binding form of a carbazole ring or an indolocarbazole ring or the kind or number of substituents to a skeleton thereof allows a high-level control of hole injection transport properties. Then, mixing the above azine compound and carbazole compound and using the mixture can control amounts of both charges injected into an organic layer within a preferred range, so that more favorable device characteristics can be expected. In particular, in the case of a delayed fluorescence-emitting EL device or a phosphorescent EL device, they have a lowest excited triplet energy sufficiently high to confine the excitation energy generated in the light-emitting layer and therefore, they have no outflow of energy from the inside of the light-emitting layer and they can achieve high efficiency and extended life at a low voltage.

BRIEF DESCRIPTION OF DRAWING

FIG. 1 is a schematic cross-sectional view showing one example of an organic electroluminescent device.

DESCRIPTION OF EMBODIMENTS

An organic electroluminescent device of the present invention has a structure in which an anode, an organic layer and a cathode are stacked on a substrate, wherein at least one layer of the organic layer contains a material for the above organic electroluminescent device.

This organic electroluminescent device has an organic layer composed of a plurality of layers between the anode and the cathode opposed to each other; and at least one layer of the plurality of layers is a light-emitting layer, and there may be a plurality of light-emitting layers. Then, at least one of the light-emitting layers contains a first host, a second host and a light-emitting dopant material. The light-emitting layer is preferably composed of a vapor deposition layer.

The first host contained in the light-emitting layer is selected from the compounds represented by the general formula (1), and the second host contained therein is selected from the compounds represented by the general formula (2), general formula (3) or general formula (4).

In the general formula (1), p represents the number of repetitions, is an integer of 1 to 3, and p is preferably 1.

A ring A is represented by formula (1b) or (1c), and is fused to an adjacent ring at any position. Two adjacent * in the formula (1b) or formula (1c) bind to of an adjacent ring. * binding to an adjacent ring represents C, and the remaining two * in the formula (1b) represent CR. The ring A is a carbazole ring when is represented by the formula (1b), and is an indolocarbazole ring when is represented by the formula (1c).

R independently represents hydrogen, deuterium, an aliphatic hydrocarbon group having 1 to 10 carbon atoms, a substituted or unsubstituted aromatic hydrocarbon group having 6 to 30 carbon atoms, or a substituted or unsubstituted aromatic heterocyclic group having 3 to 16 carbon atoms, or a substituted or unsubstituted linked aromatic group in which two to three of these aromatic groups are linked to each other, and preferably hydrogen, an aliphatic hydrocarbon group having 1 to 6 carbon atoms, a substituted or unsubstituted aromatic hydrocarbon group having 6 to 10 carbon atoms, or a substituted or unsubstituted aromatic heterocyclic group having 3 to 10 carbon atoms.

X represents $NR^{11}$, S, O, or $CR^{12}R^{13}$, preferably $NR^{11}$.

$R^{11}$, $R^{12}$, and $R^{13}$ each independently represent an aliphatic hydrocarbon group having 1 to 10 carbon atoms, a substituted or unsubstituted aromatic hydrocarbon group having 6 to 30 carbon atoms, a substituted or unsubstituted aromatic heterocyclic group having 3 to 16 carbon atoms, or a linked aromatic group in which two to five of these aromatic rings are linked to each other. Preferred is a substituted or unsubstituted aromatic hydrocarbon group having 6 to 30 carbon atoms, or a substituted or unsubstituted aromatic heterocyclic group having 3 to 16 carbon atoms, and more preferred is a substituted or unsubstituted aromatic hydrocarbon group having 6 to 10 carbon atoms.

In the present specification, the linked aromatic group refers to a group in which aromatic rings of the aromatic hydrocarbon group or aromatic heterocyclic group are linked by a single bond, and these may be linked linearly or linked in a branched manner and the aromatic rings may be the same or different.

$Ar^1$ and $Ar^2$ represent an aromatic heterocyclic group represented by formula (1a). Y independently represents N or $CR^{14}$, and at least one Y represents N. Two or more Y preferably represent N, and three Y further preferably represent N. When three Y represent N, a triazine ring is formed.

Ara represents a substituted or unsubstituted aromatic hydrocarbon group having 6 to 30 carbon atoms, a substituted or unsubstituted aromatic heterocyclic group having 3 to 16 carbon atoms, or a substituted or unsubstituted linked aromatic group in which two to five of these aromatic rings are linked to each other. Preferred is a substituted or unsubstituted aromatic hydrocarbon group having 6 to 10 carbon atoms, or a substituted or unsubstituted aromatic heterocyclic group having 3 to 12 carbon atoms, and more preferred is a substituted or unsubstituted aromatic hydrocarbon group having 6 to 10 carbon atoms. Alternatively, a linked aromatic group in which two to three of these aromatic rings are linked to each other is adopted.

$L^1$ represents a substituted or unsubstituted aromatic hydrocarbon group having 6 to 30 carbon atoms, preferably represents a phenylene group represented by formula (1d) or formula (1e).

[Formula 12]

(1d)

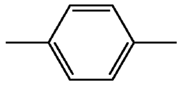

(1e)

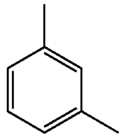

R, $R^{14}$ and $Ar^3$ represent a monovalent group, and when these symbols each occur plural times in the formula, such plural symbols may be the same or different at each occurrence.

When R, $R^{11}$, $R^{12}$, $R^{13}$ and $R^{14}$ represent an aliphatic hydrocarbon group having 1 to 10 carbon atoms, the group may be linear, branched or cyclic, and specific examples thereof include methyl, ethyl, propyl, butyl, t-butyl, pentyl, hexyl, cyclohexyl, heptyl, octyl, nonyl, and decyl. Preferred is an alkyl group having 1 to 4 carbon atoms.

In the case of R, $R^{11}$, $R^{12}$, $R^{13}$, $R^{14}$ or $Ar^3$ being an unsubstituted aromatic hydrocarbon group or aromatic heterocyclic group, specific examples thereof include a group generated from benzene, naphthalene, anthracene, fluoranthene, phenanthrene, triphenylene, pyridine, pyrimidine, triazine, thiophene, isothiazole, thiazole, pyridazine, pyrrole, pyrazole, imidazole, pyrazine, furan, isoxazole, oxazole, quinoline, isoquinoline, quinoxaline, quinazoline, benzotriazole, phthalazine, indole, benzofuran, benzothiophene, benzoxazole, benzothiazole, indazole, benzimidazole, benzisothiazole, benzothiadiazole, dibenzofuran, dibenzothiophene, dibenzoselenophene, benzocarbazole, benzonaphtothiophene, benzonaphtofuran, phenanthroline or carbazole. Preferred examples include a group generated from benzene, naphthalene, pyridine, pyrimidine, triazine, thiophene, isothiazole, triazole, pyridazine, pyrrole, pyrazole, imidazole, triazole, thiadiazole, pyrazine, furan, isoxazole, oxazole, quinoline, isoquinoline, quinoxaline, quinazoline, phthalazine, indole, benzofuran, benzothiophene, benzoxazole, benzothiazole, indazole, benzimidazole, benzisothiazole, or benzothiadiazole, dibenzofuran, dibenzothiophene, or carbazole. More preferred is a group generated from benzene.

In the present specification, the aromatic hydrocarbon group, the aromatic heterocyclic group, and a linked aromatic group can have a substituent. Preferred examples of the substituent in the aromatic hydrocarbon group, the aromatic heterocyclic group, and the linked aromatic group can include an alkyl group having 1 to 5 carbon atoms, an alkoxy group having 1 to 5 carbon atoms, an alkenyl group having 2 to 5 carbon atoms, deuterium, halogen, an amino group, and a cyano group.

Preferred aspects of the compounds represented by the general formula (1) include the compounds represented by any of the formula (5) or formula (6) and formulas (7) to (12), the compounds represented by any of (7) to (12) are preferred, and the compounds represented by any of the general formulas (7) to (9) are more preferred. In the formulas (5) to (12), the same symbols as in the general formula (1) have the same meaning.

Specific examples of the compounds represented by the general formula (1) are described below, but the compounds are not limited to these exemplified compounds.

[Formula 13]

1-1

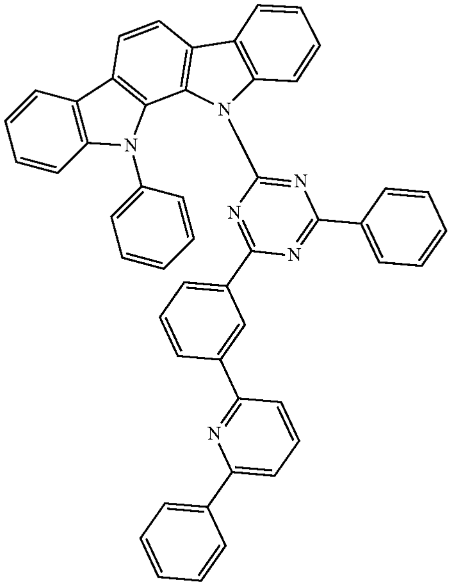

-continued 1-2

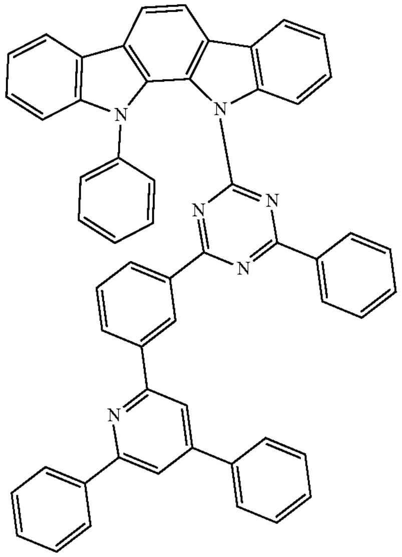

1-3

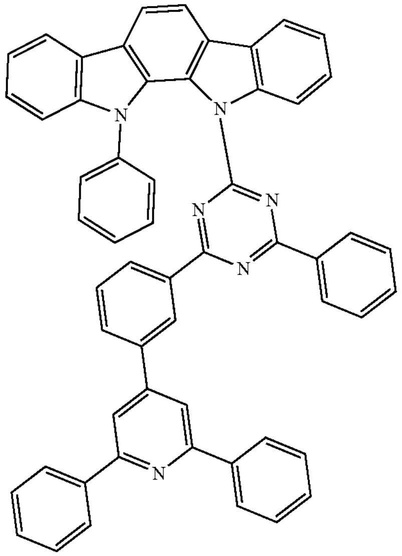

1-4

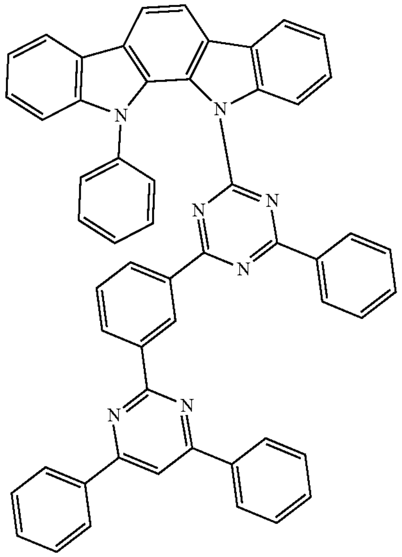

-continued
1-5
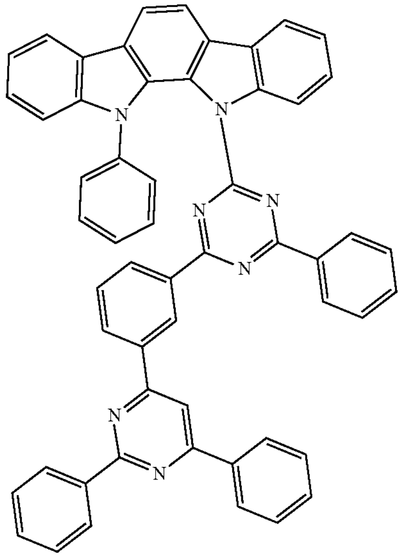
1-6
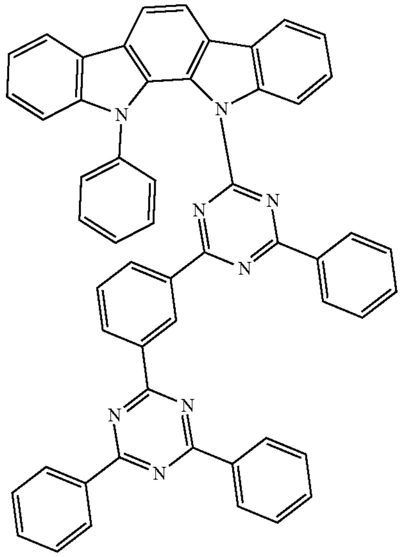
-continued
1-7
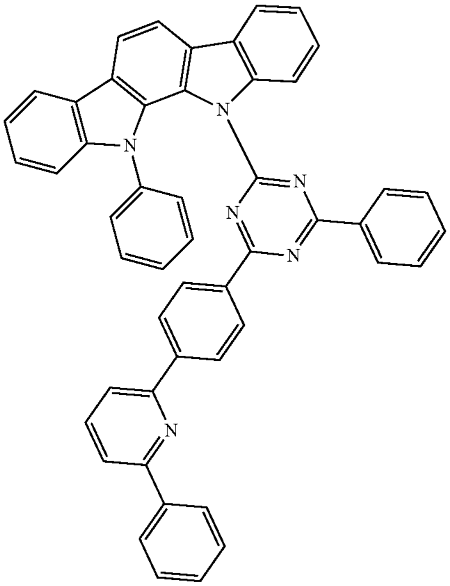
1-8
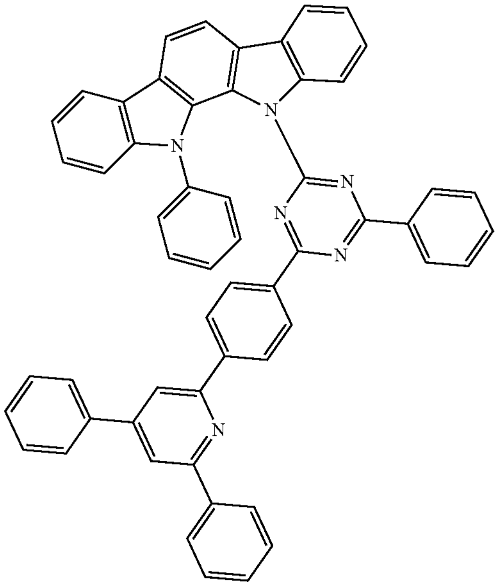

-continued
1-9
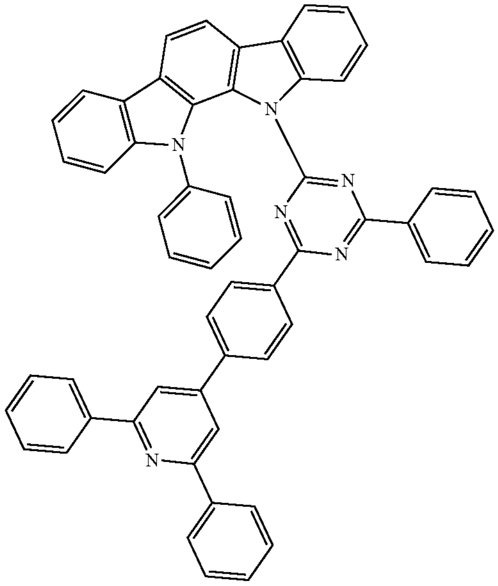
1-10
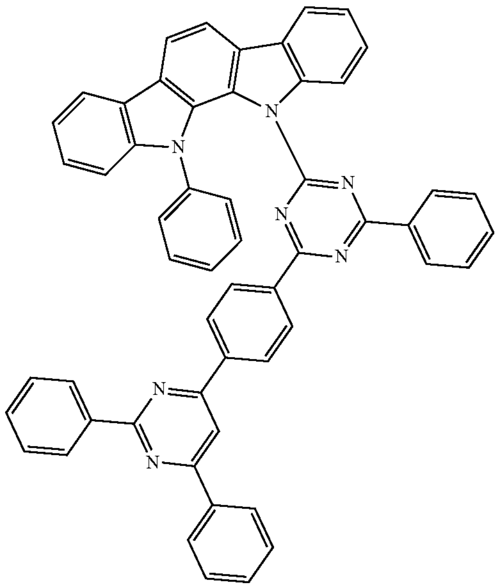
-continued
1-11
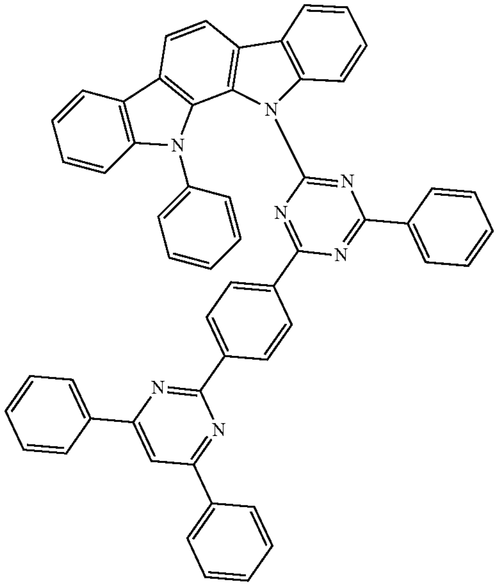
1-12
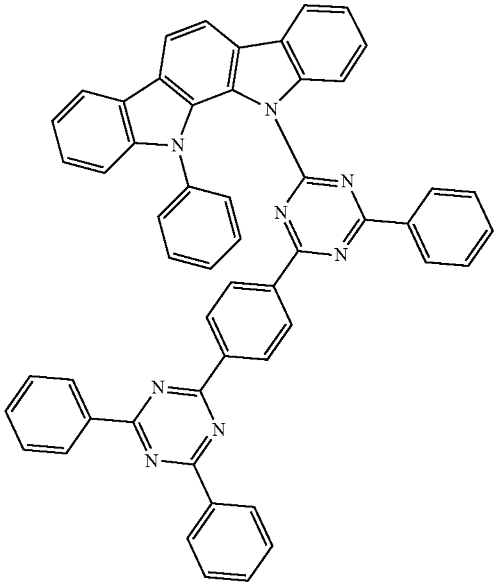

-continued
1-13
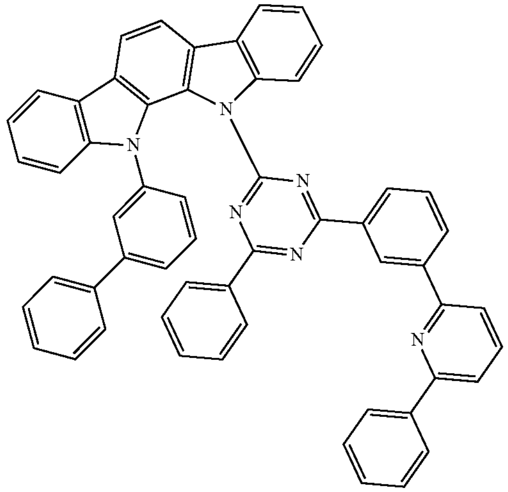
1-14
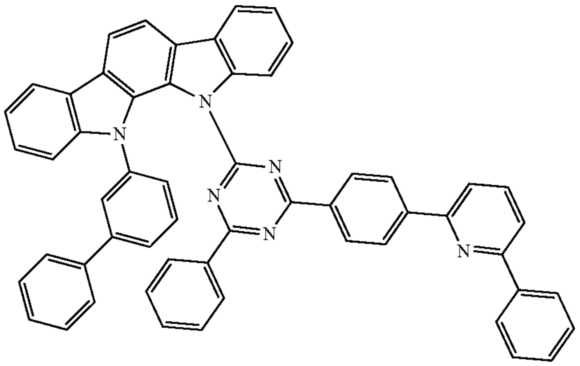
1-15
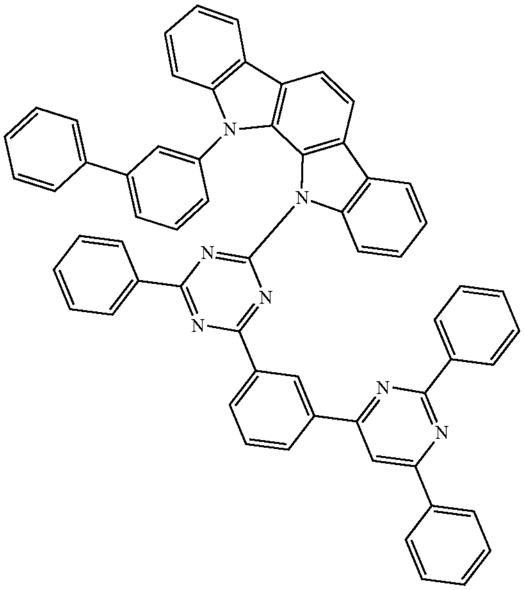
-continued
1-16
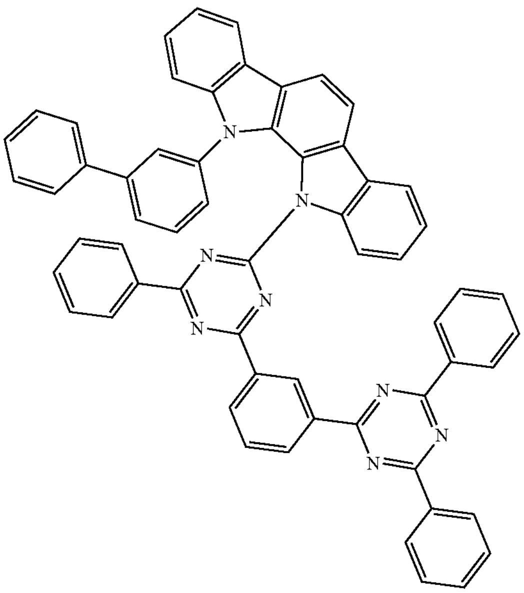
1-17
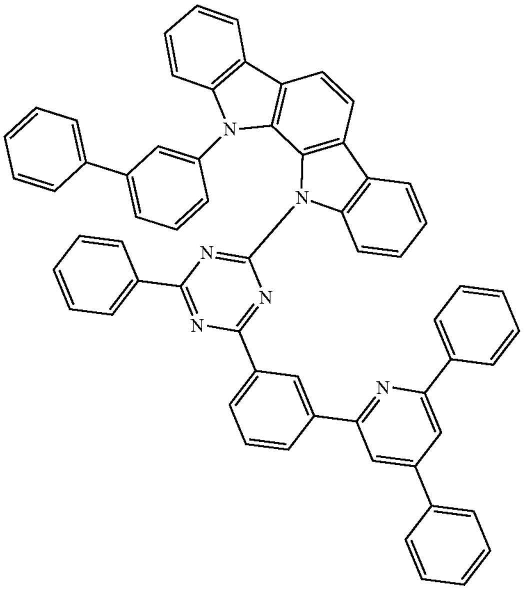

-continued
1-18
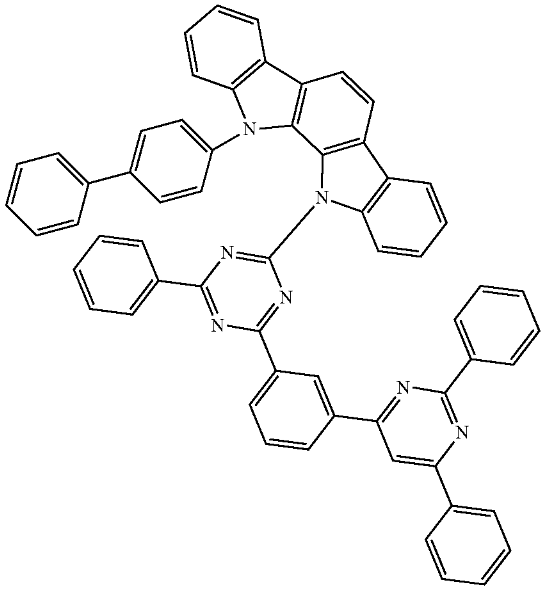
-continued
1-20
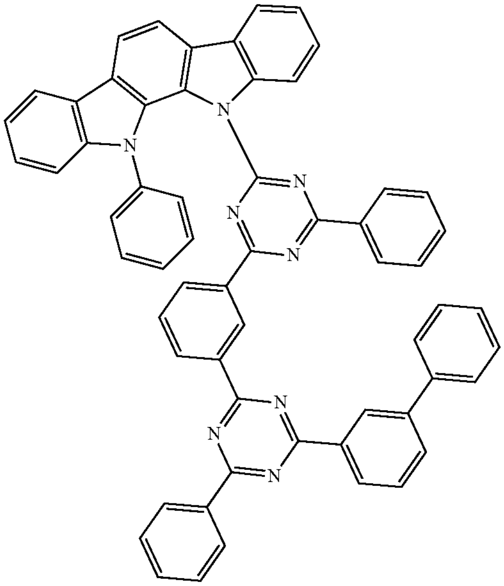
[Formula 14]
1-19
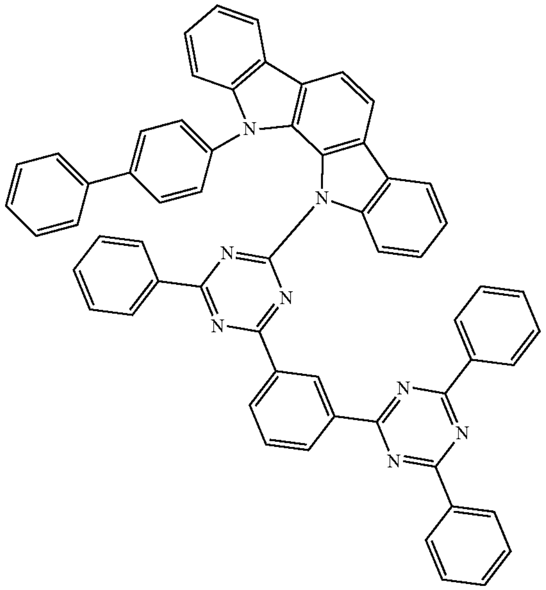
1-22
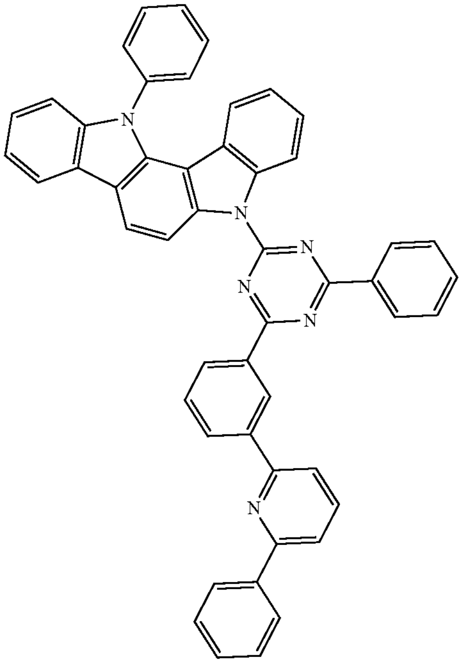

-continued
1-23
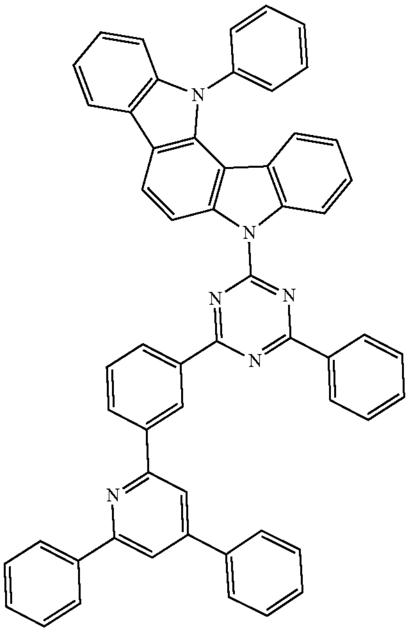
1-24
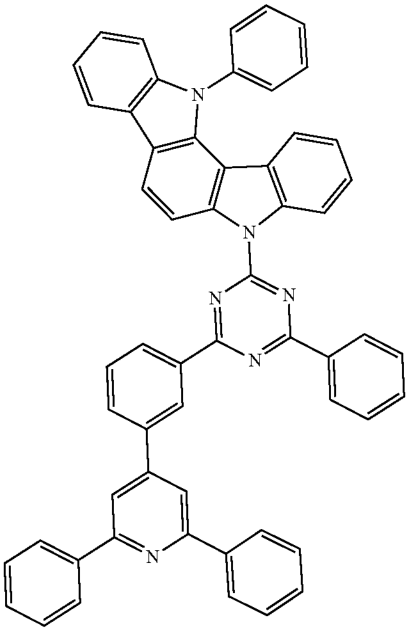
-continued
1-25
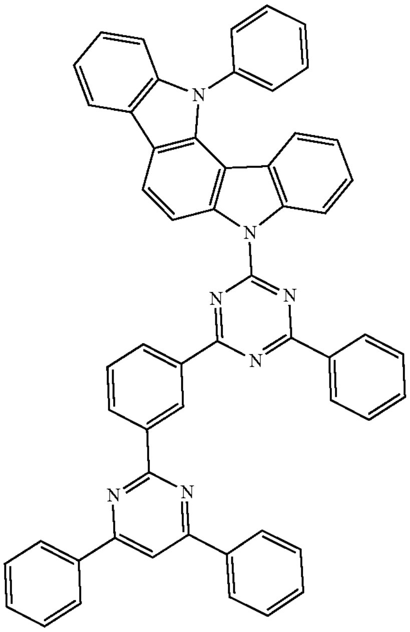
1-26
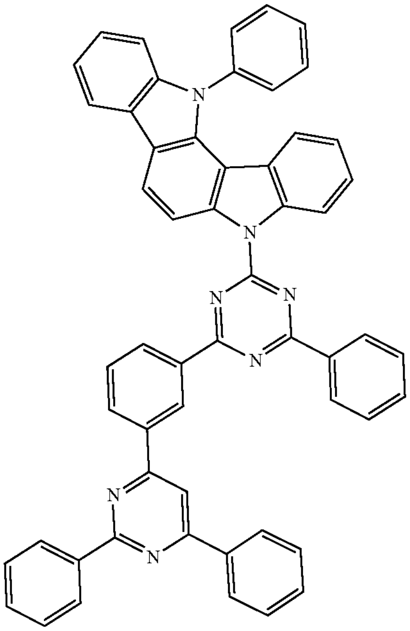

-continued
1-27
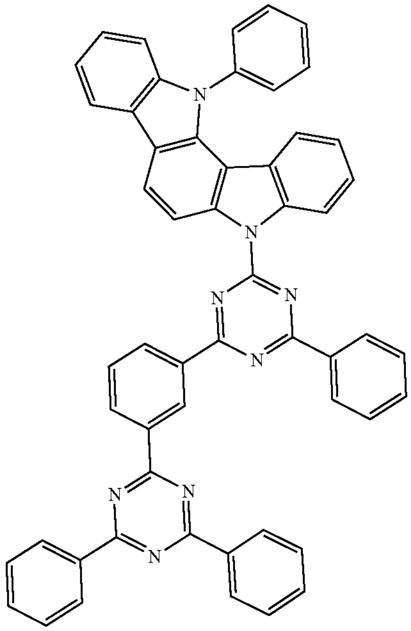
1-28
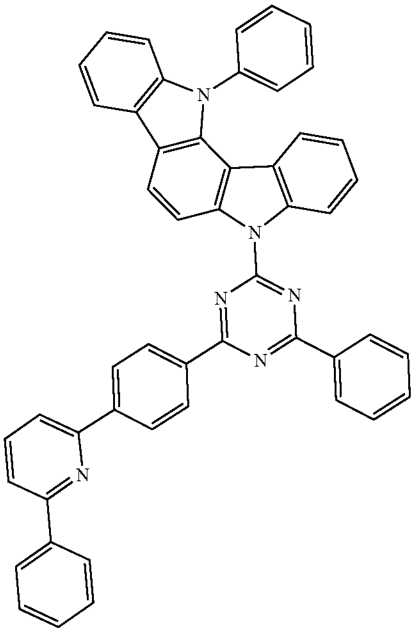
-continued
1-29
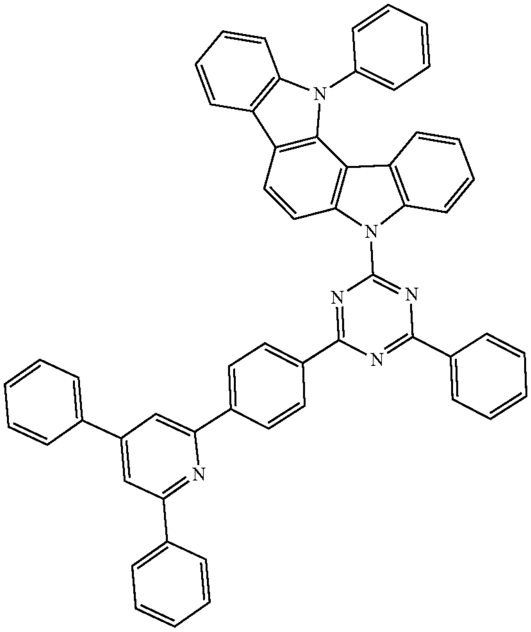
1-30
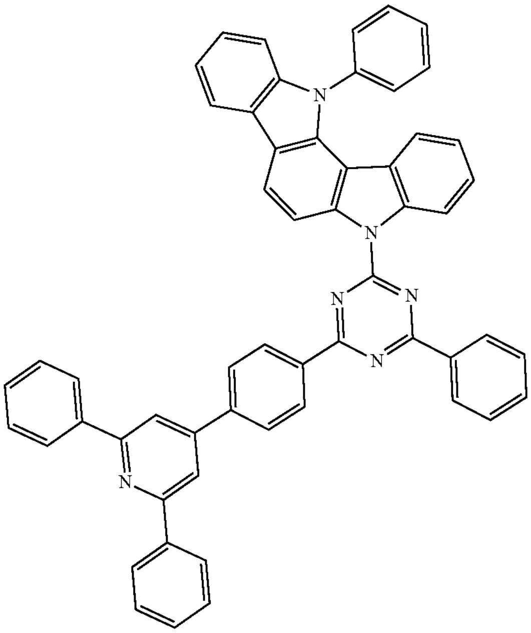

-continued
1-31
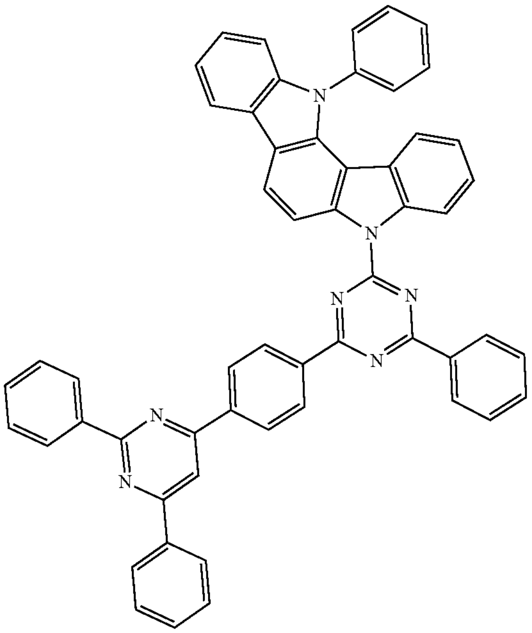
1-32
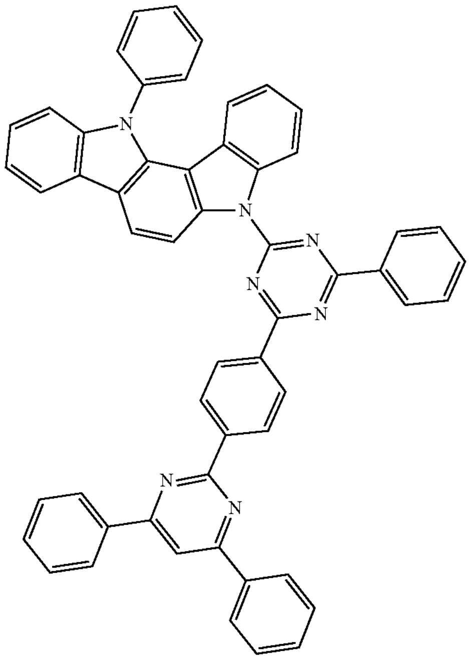
-continued
1-33
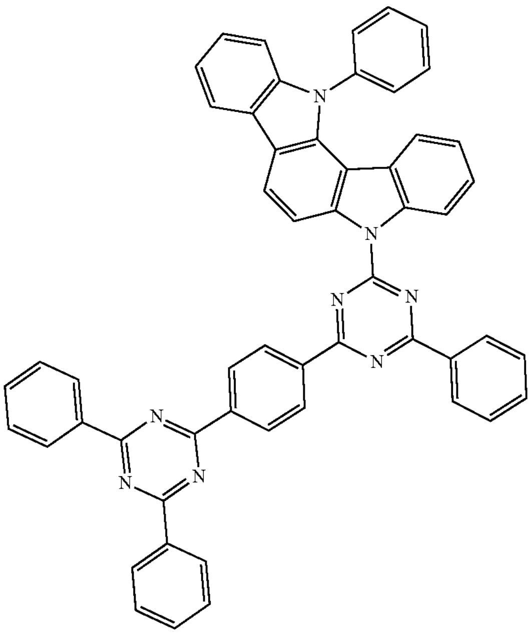
1-34
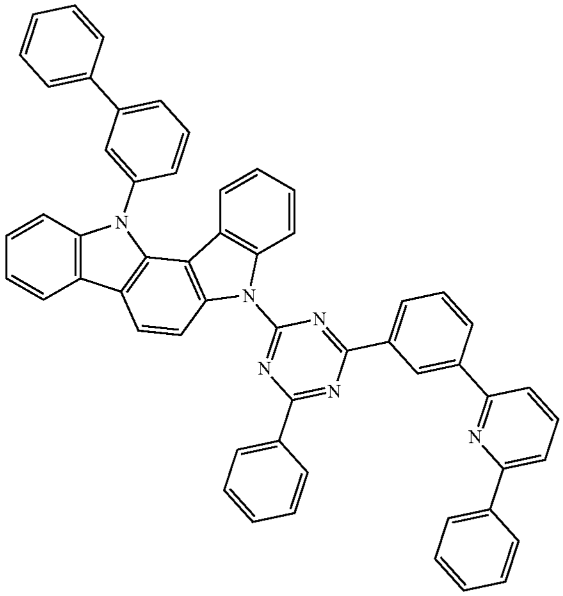

-continued
1-35
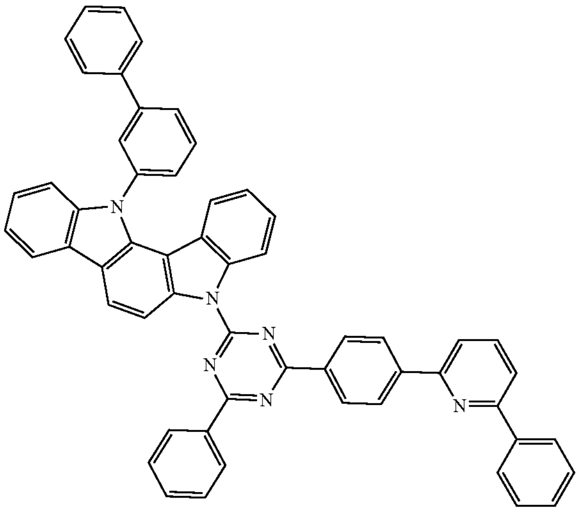
1-36
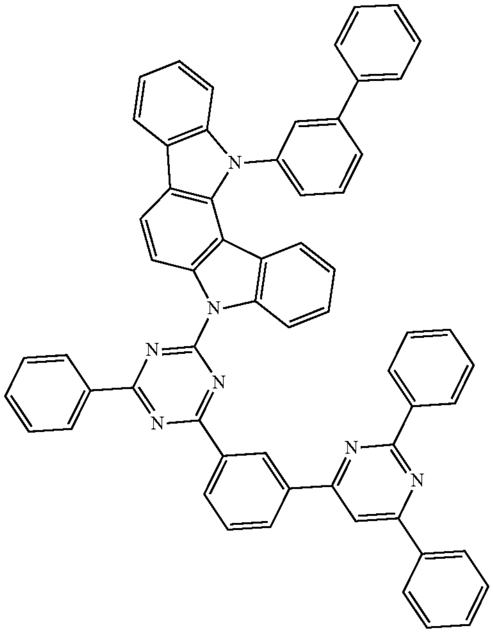
-continued
1-37
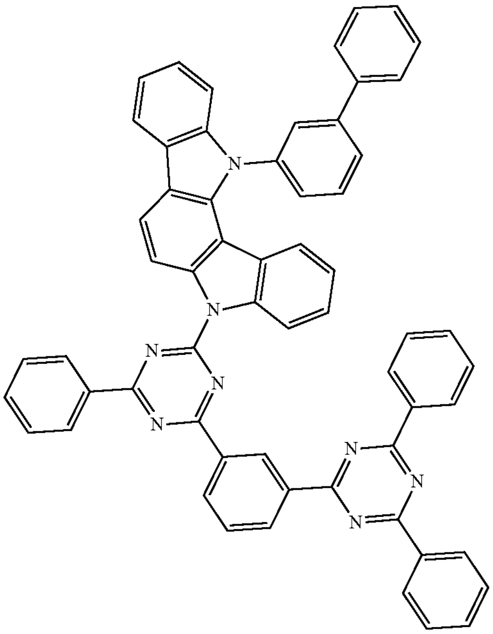
1-38
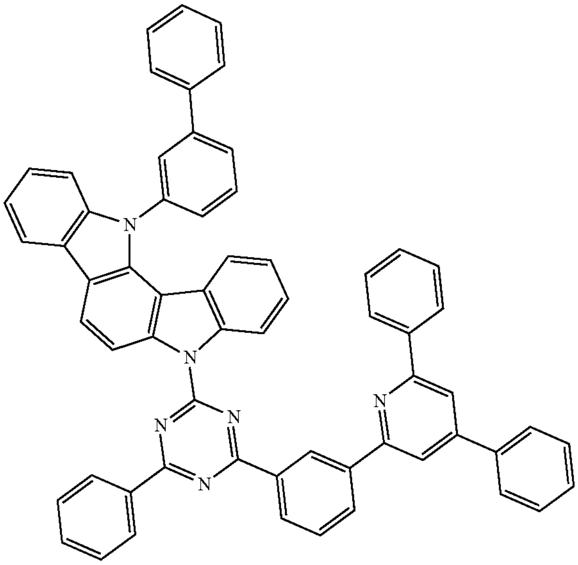

-continued
1-39
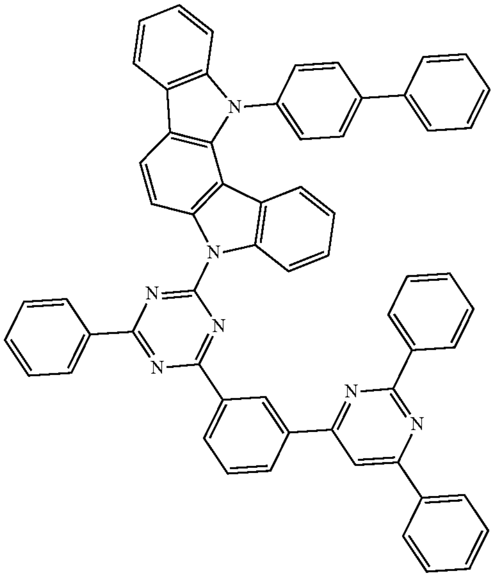
-continued
1-41
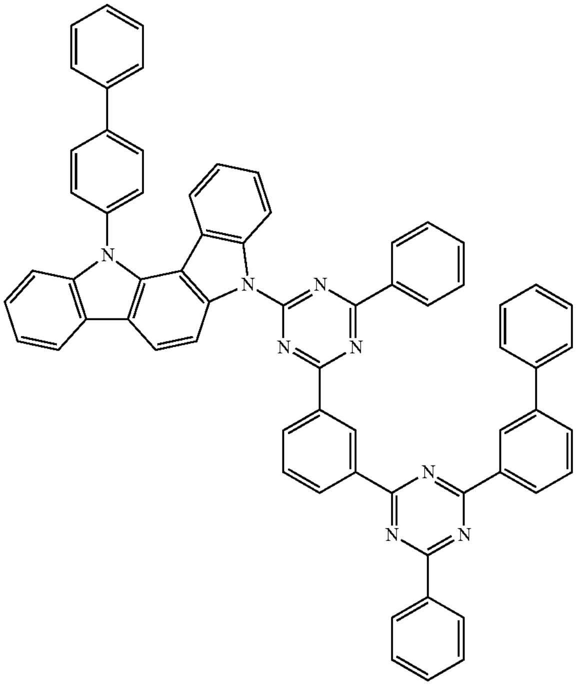
[Formula 15]
1-40
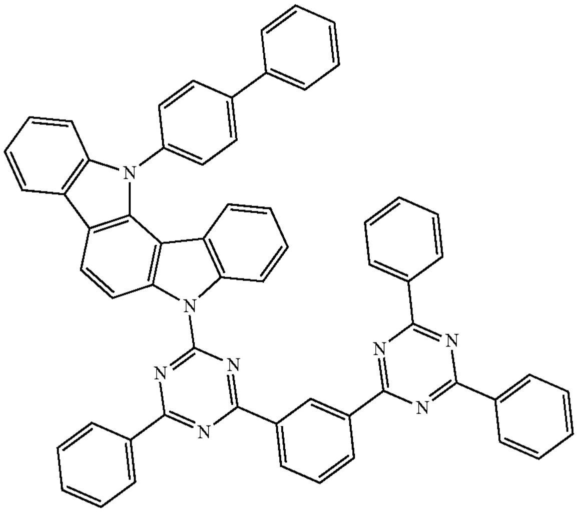
1-42
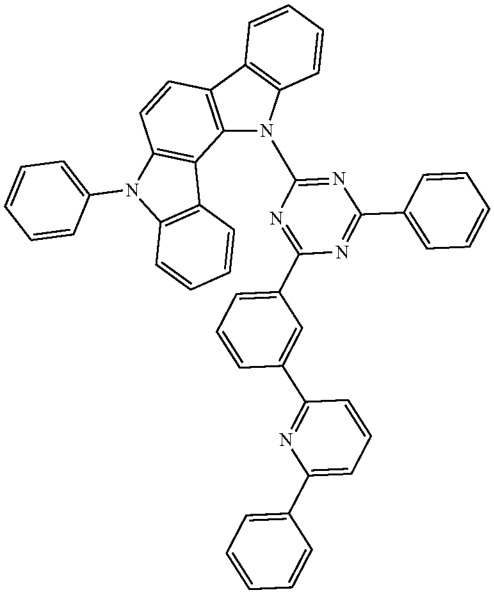

-continued
1-43
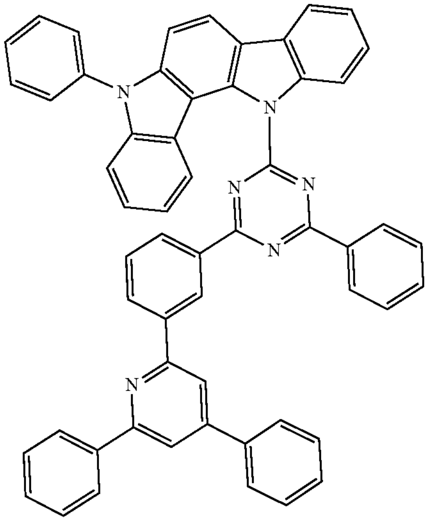
1-44
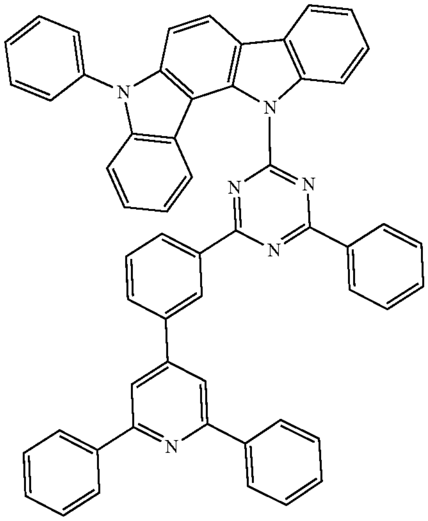
1-45
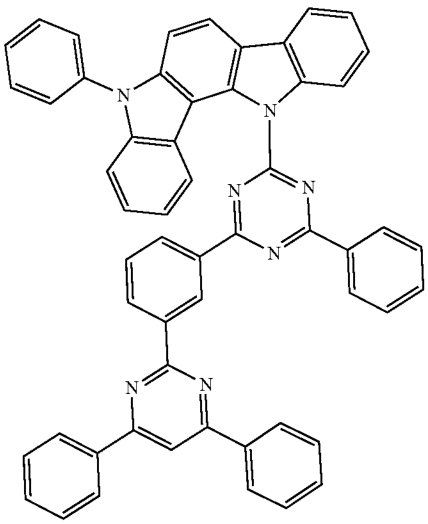
-continued
1-46
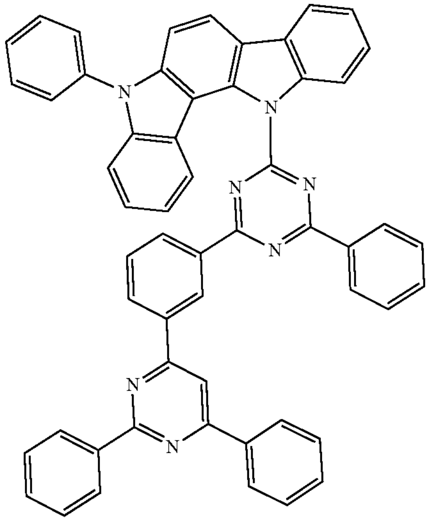
1-47
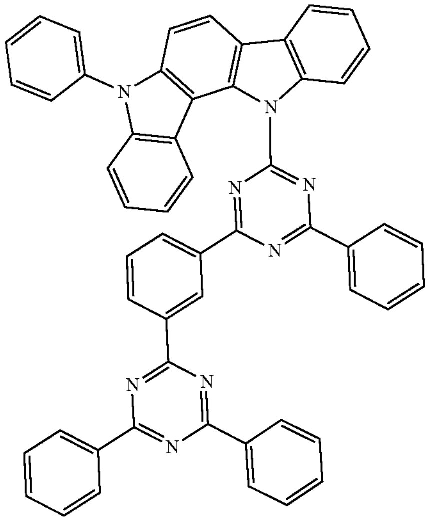
1-48
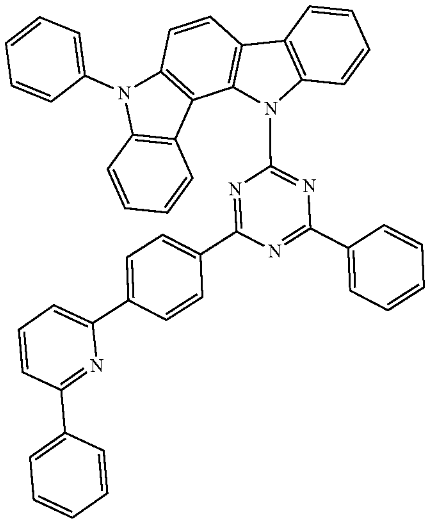

-continued
1-49
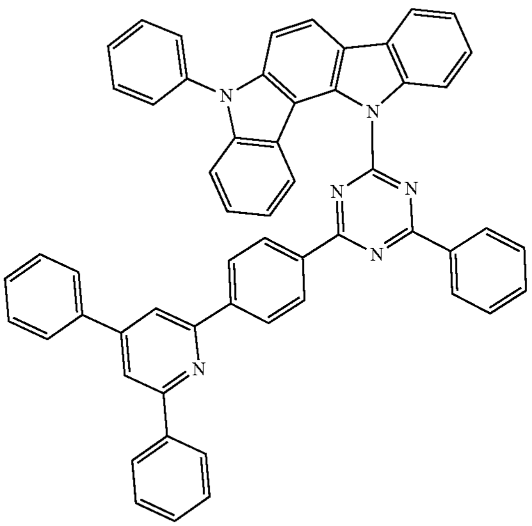
1-50
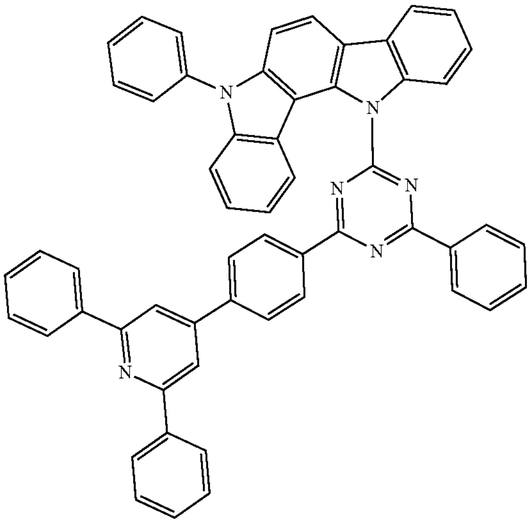
1-51
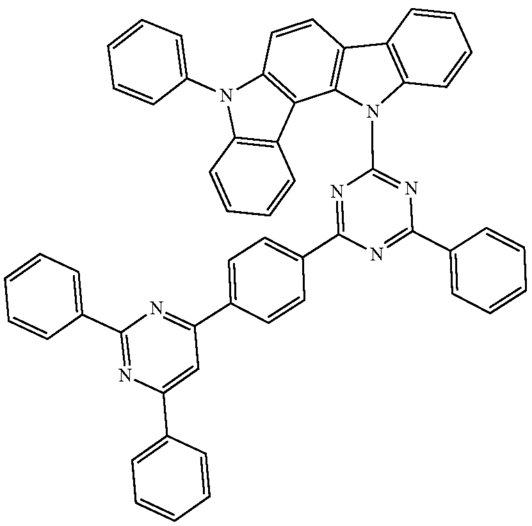
-continued
1-52
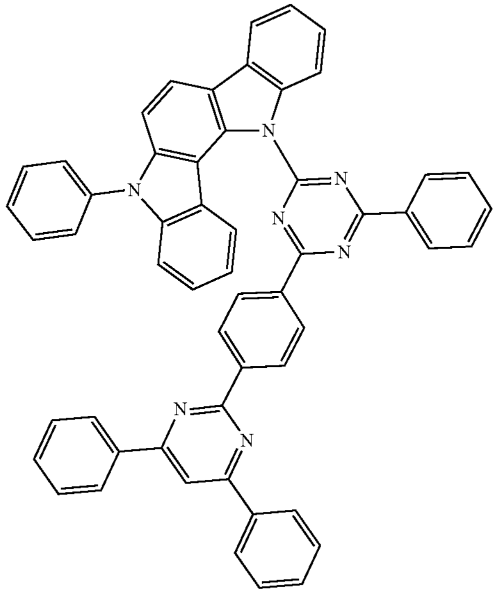
1-53
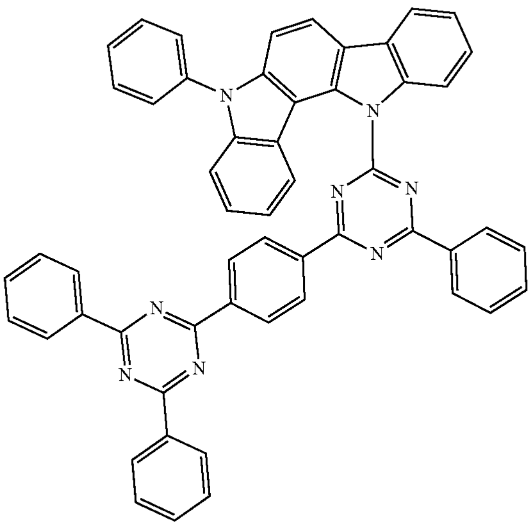

-continued
1-54
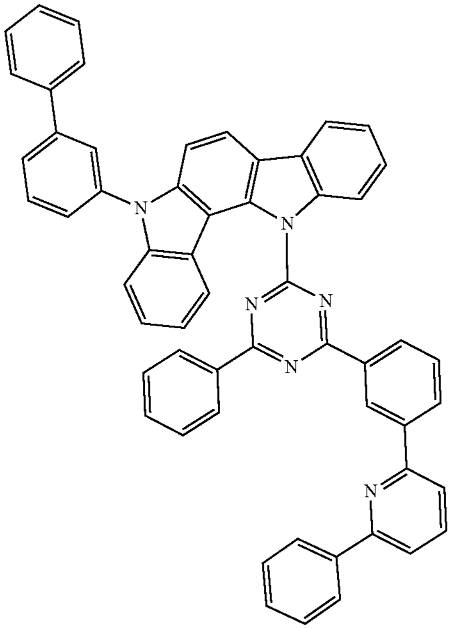
1-55
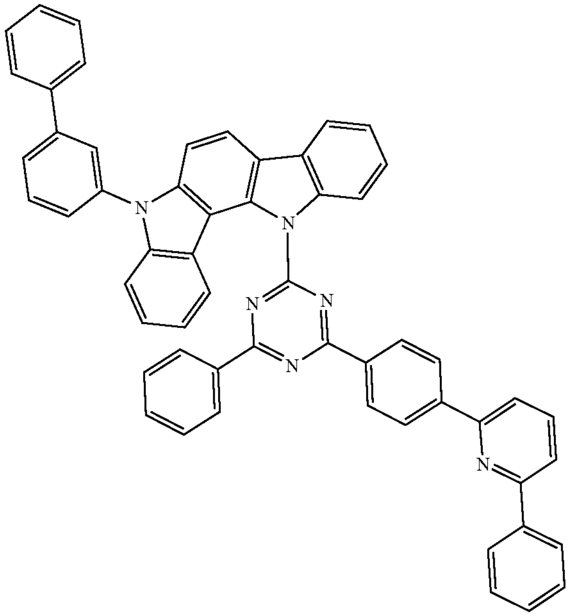
-continued
1-56
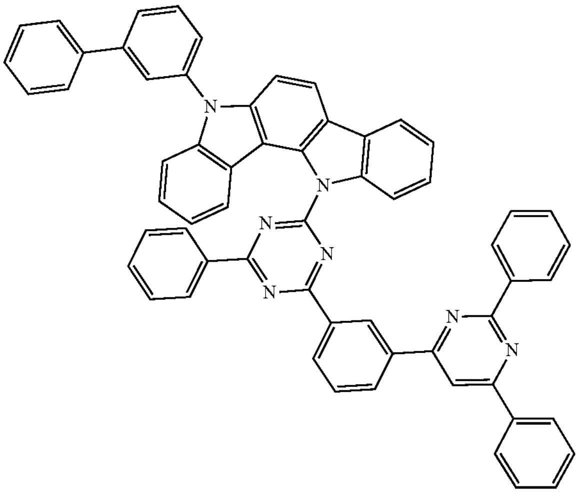
1-57
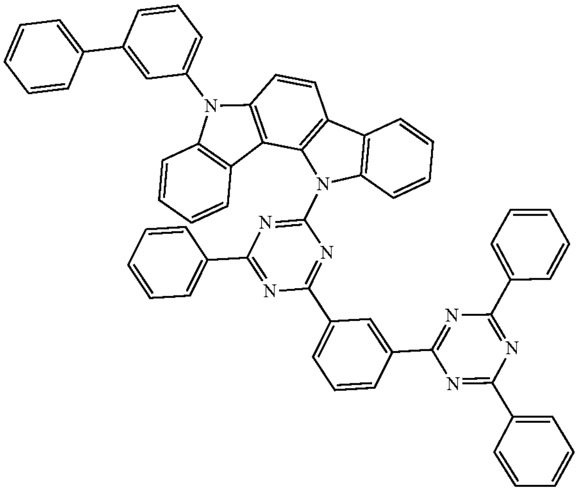
1-58
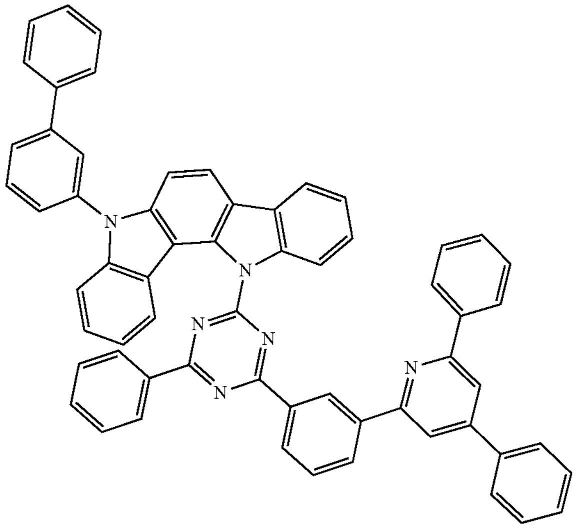

-continued
1-59
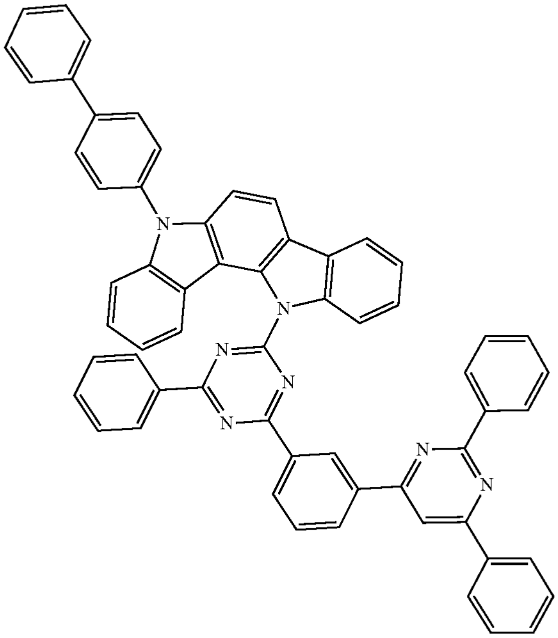
[Formula 16]
1-60
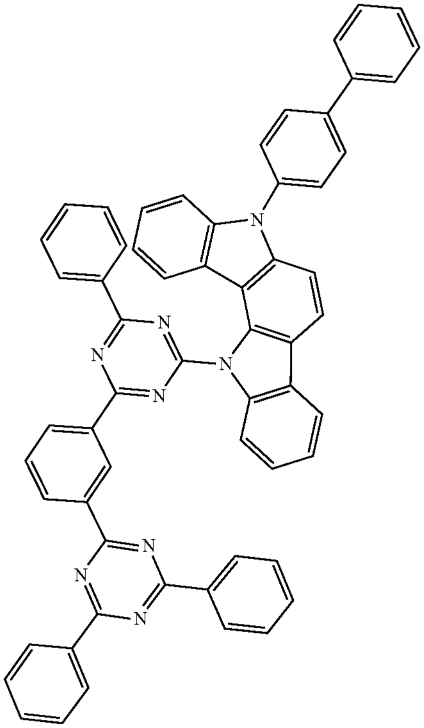
-continued
1-61
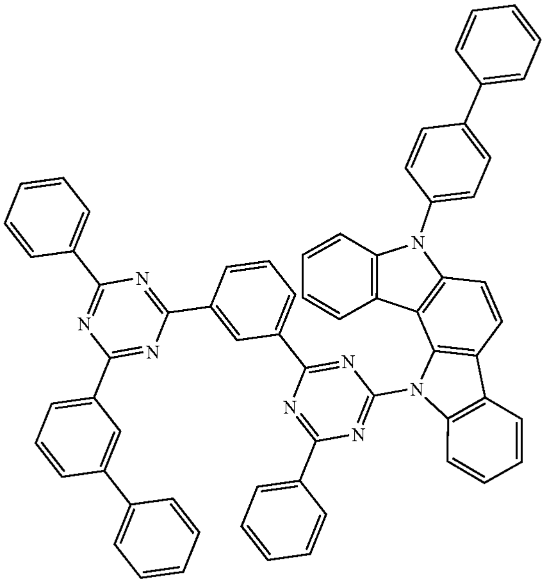
1-62
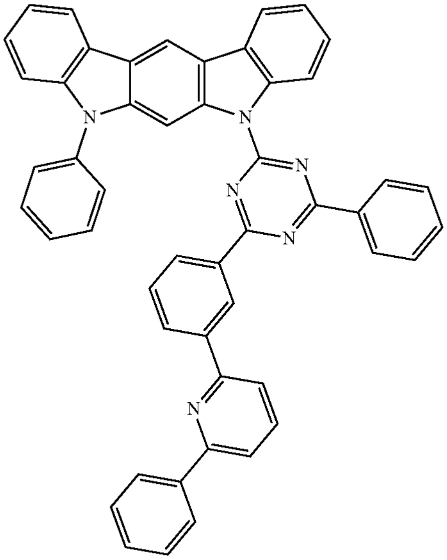

-continued
1-63
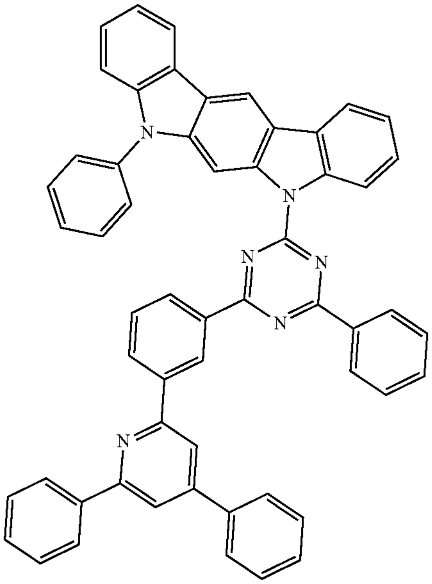
-continued
1-65
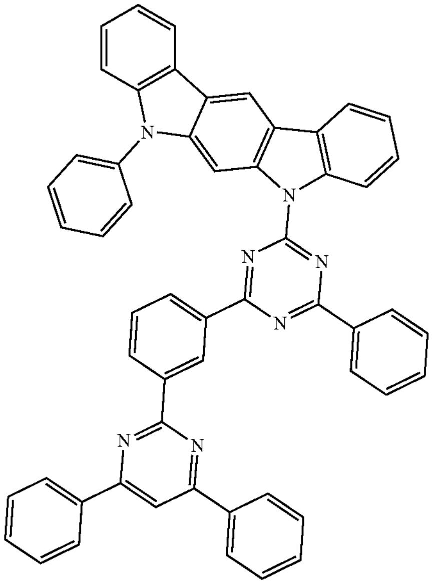
1-64
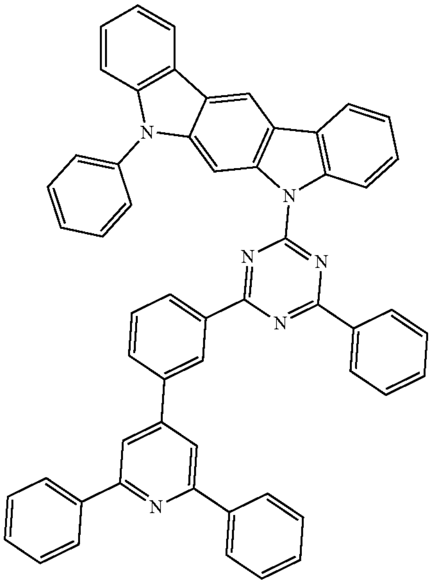
1-66
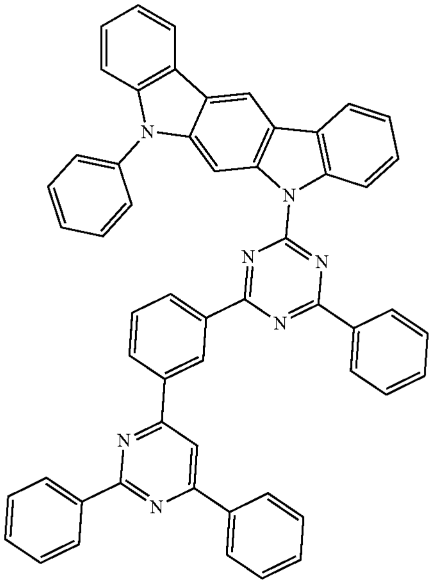

-continued
1-67
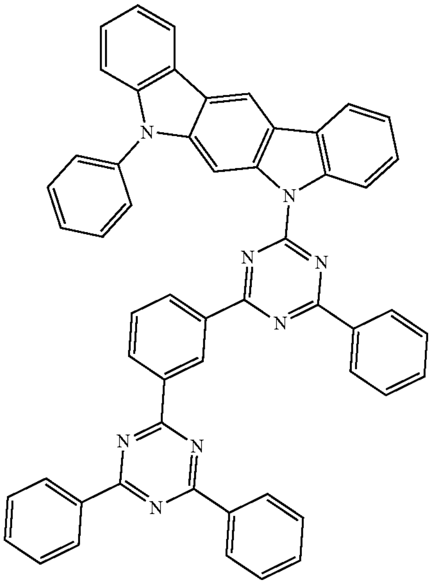
1-68
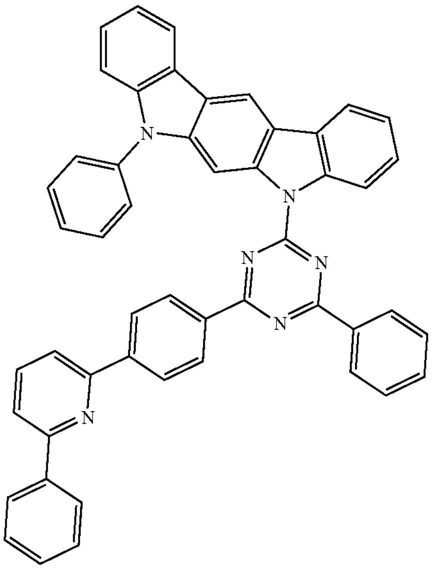
-continued
1-69
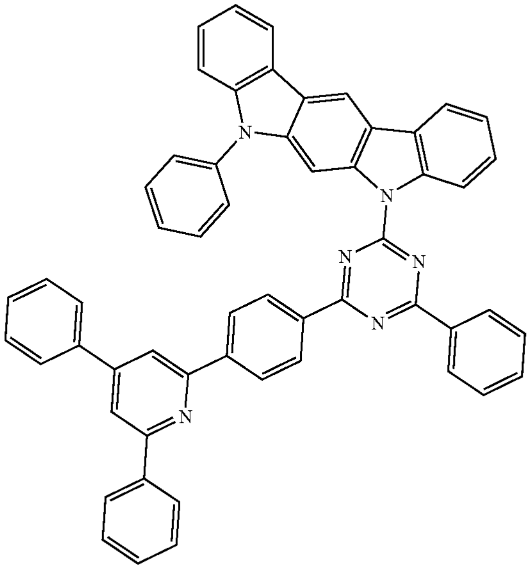
1-70
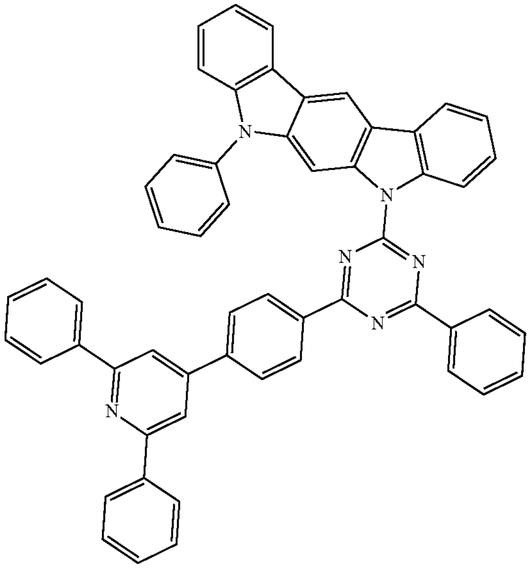

-continued
1-71
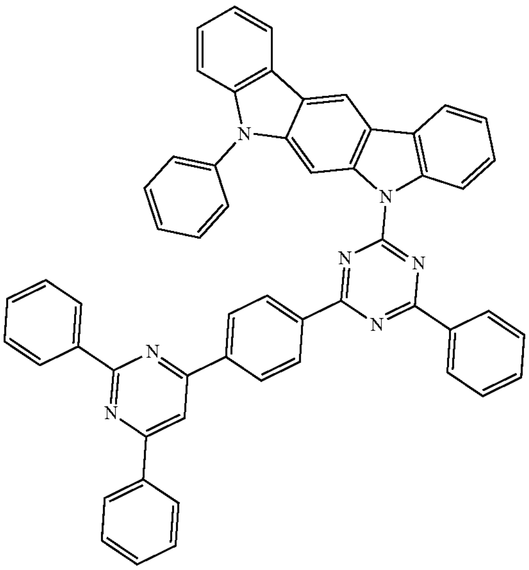
1-72
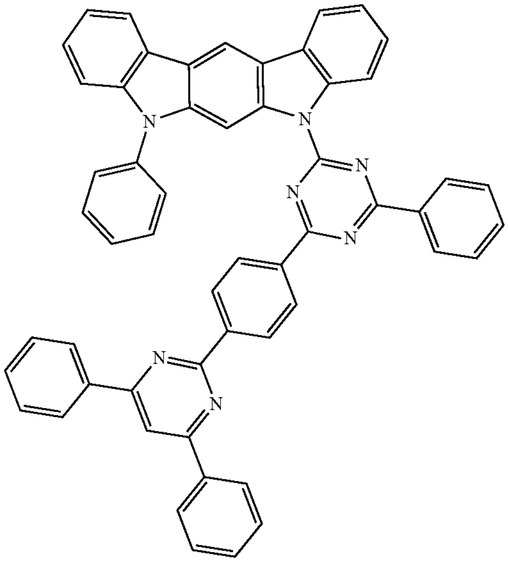
-continued
1-73
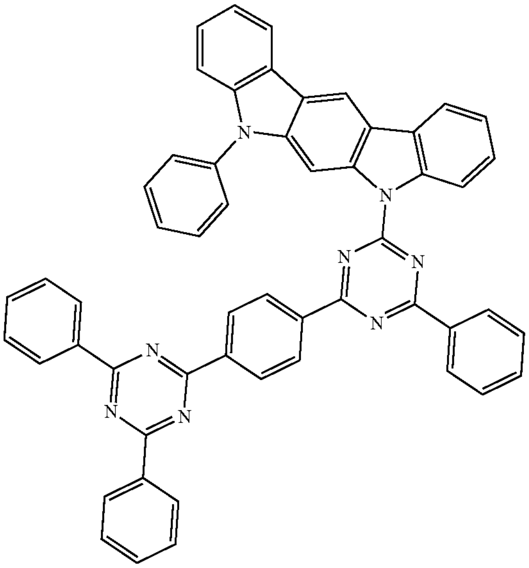
1-74
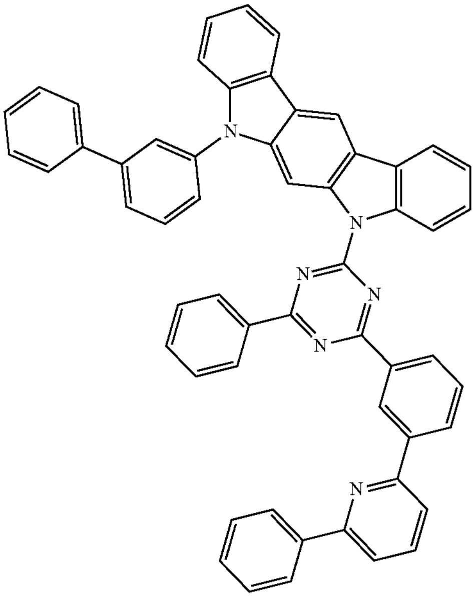

-continued
1-75
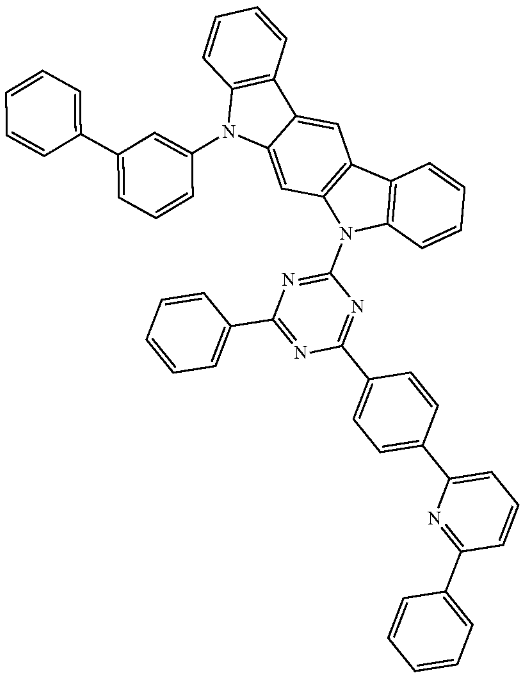
1-76
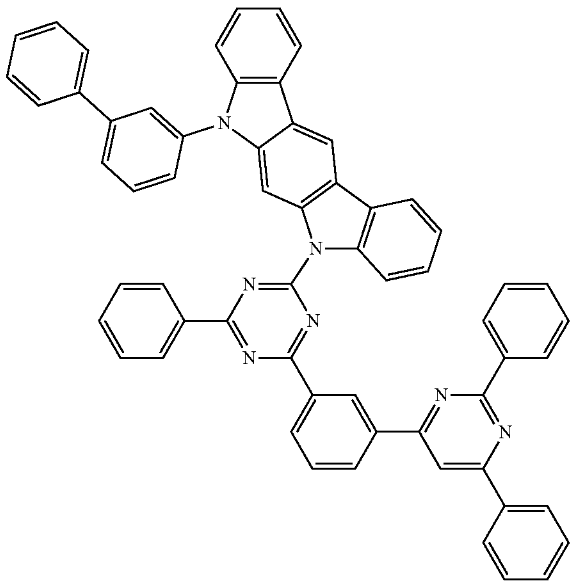
-continued
1-77
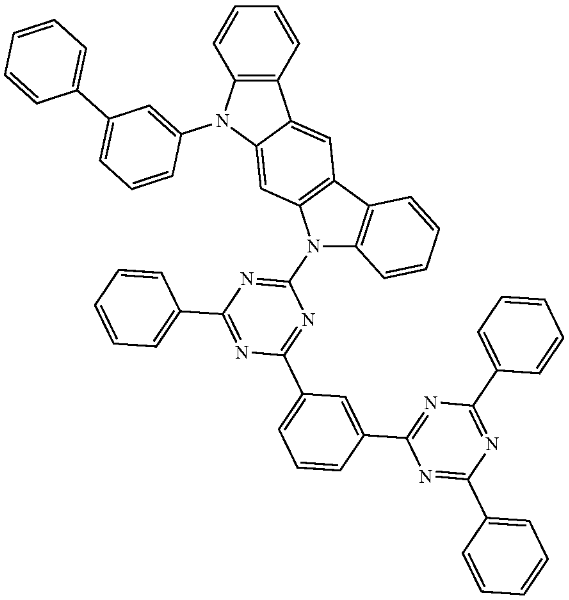
1-78
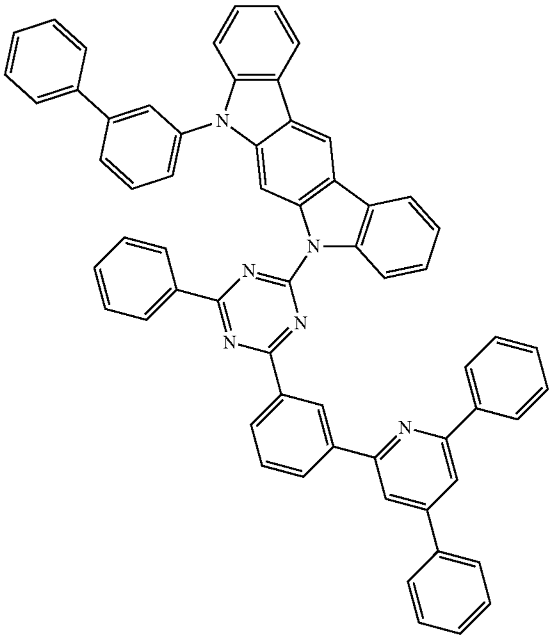

-continued
1-79
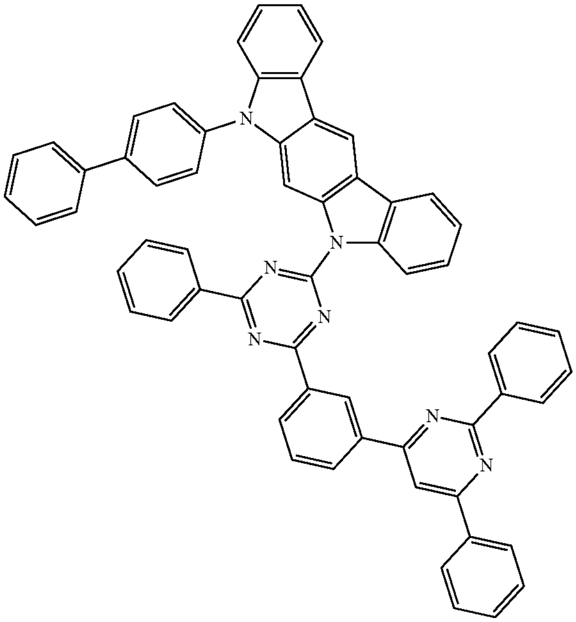
-continued
1-81
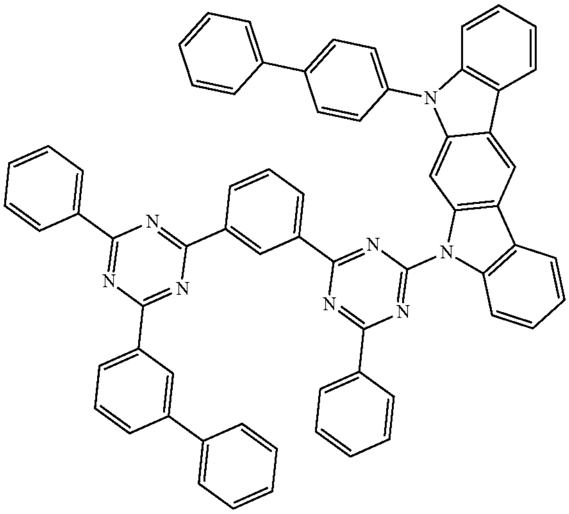
[Formula 17]
1-80
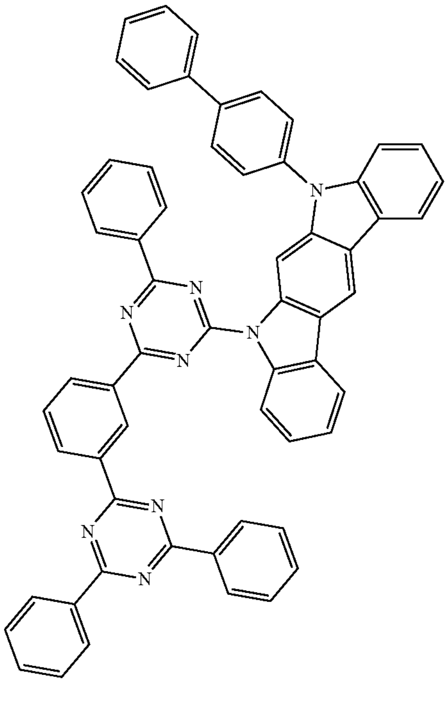
1-82
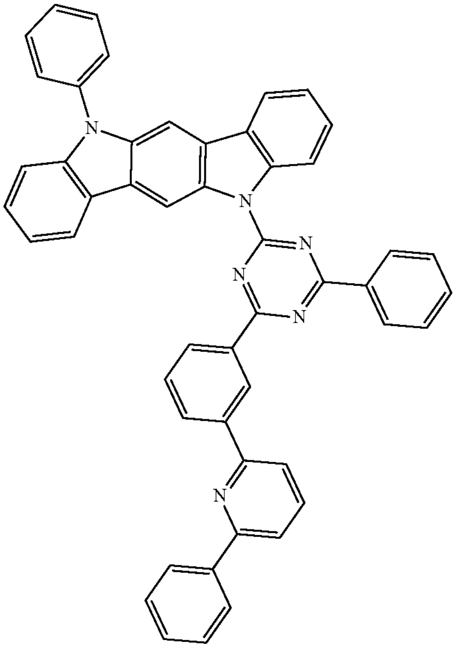

-continued
1-83
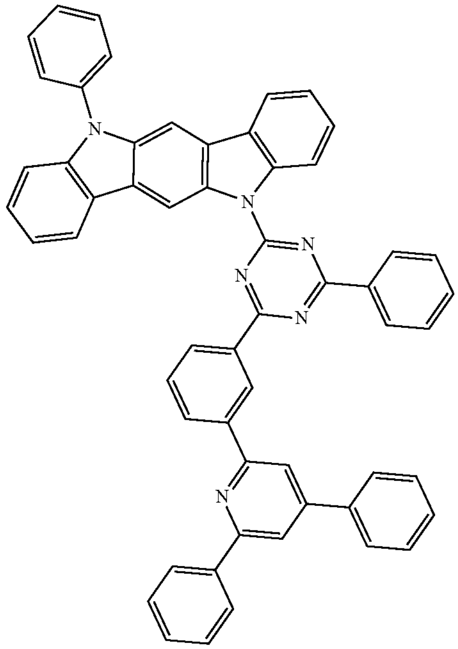
1-84
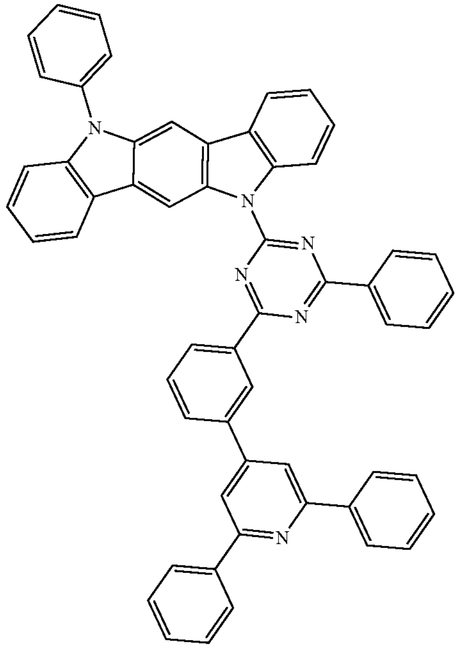
-continued
1-85
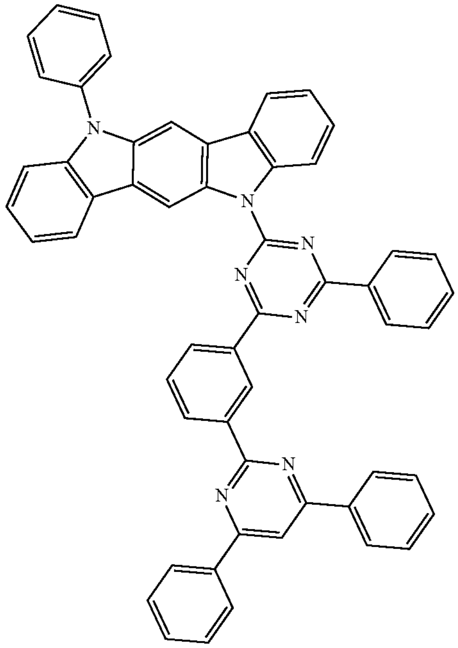
1-86
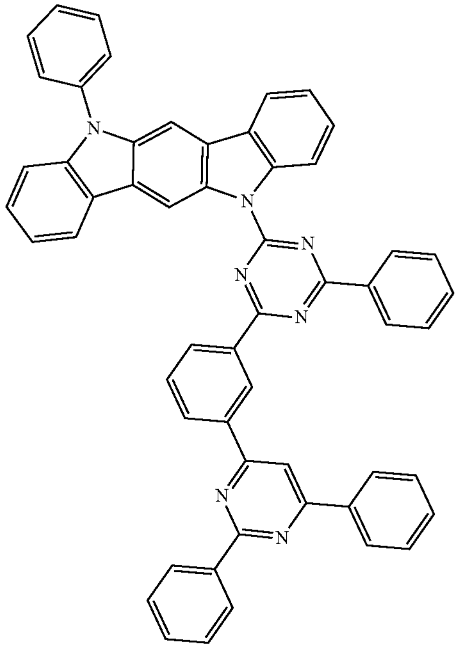

-continued
1-87
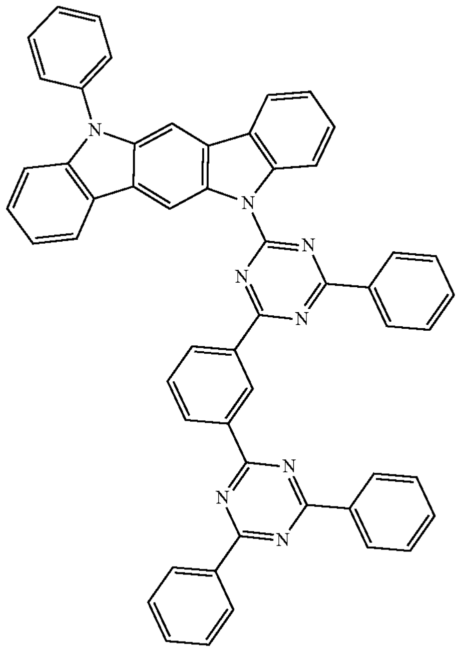
1-88
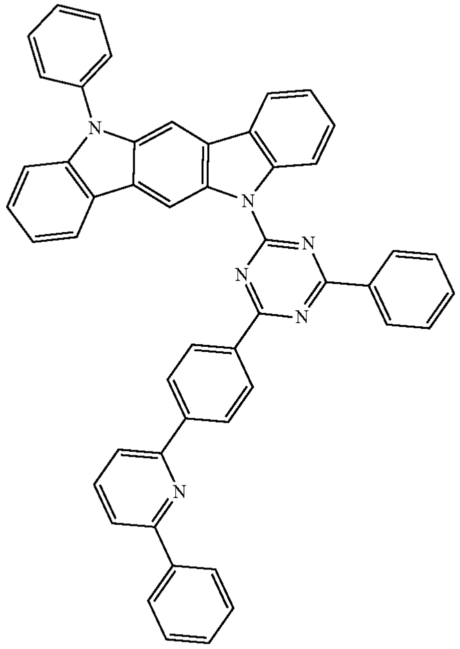
-continued
1-89
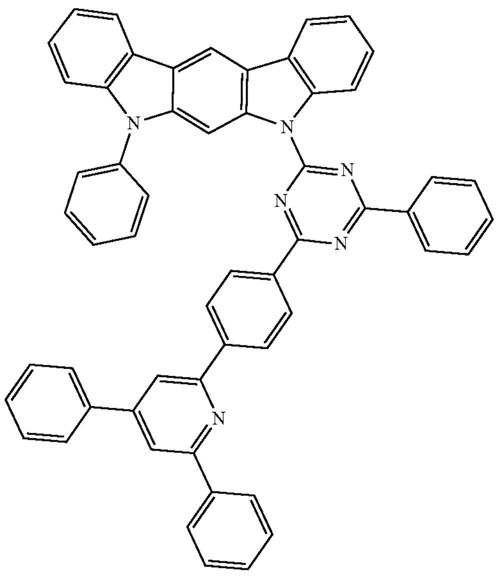
1-90
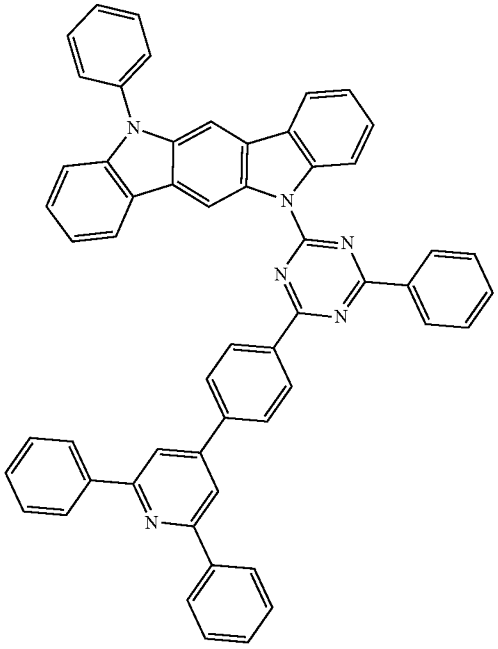

-continued
1-91
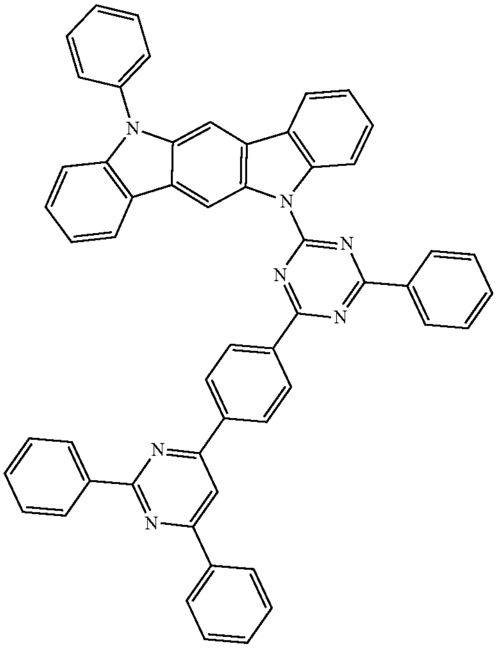
1-92
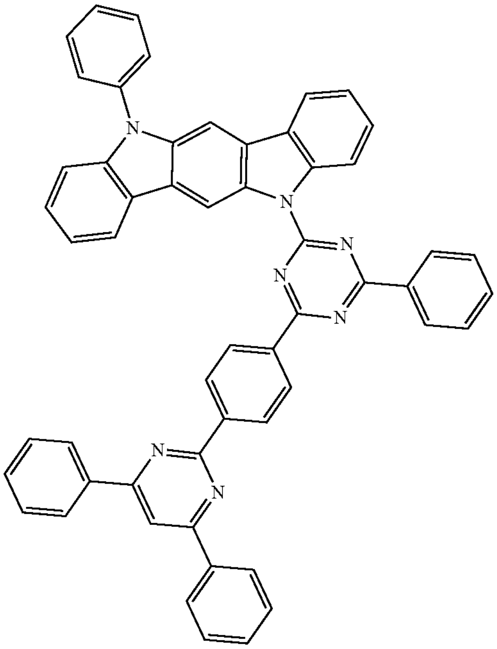
-continued
1-93
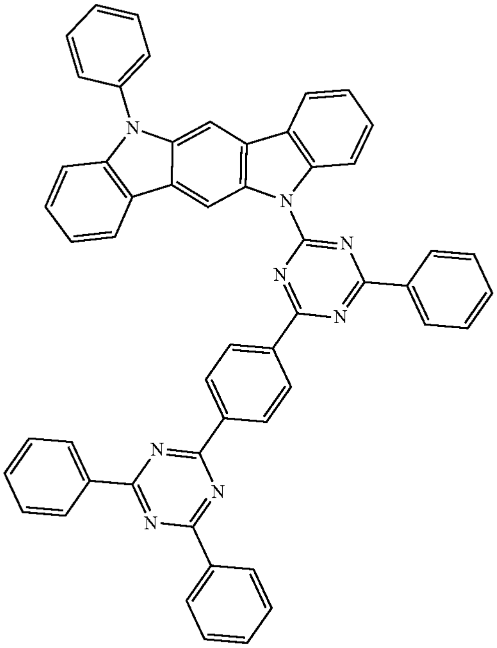
1-94
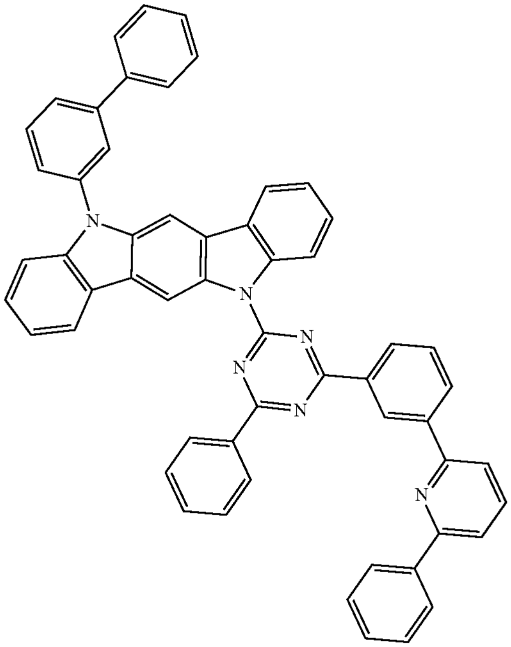

-continued
1-95
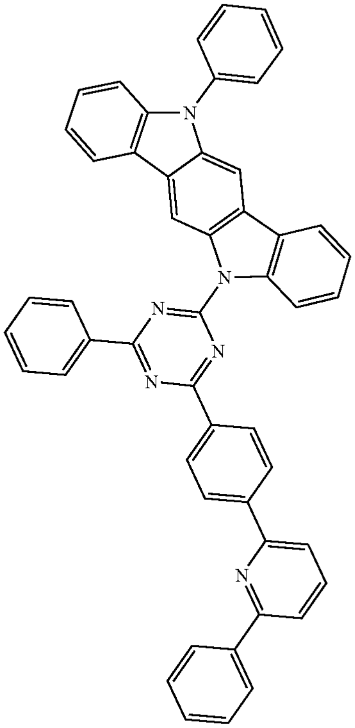
1-96
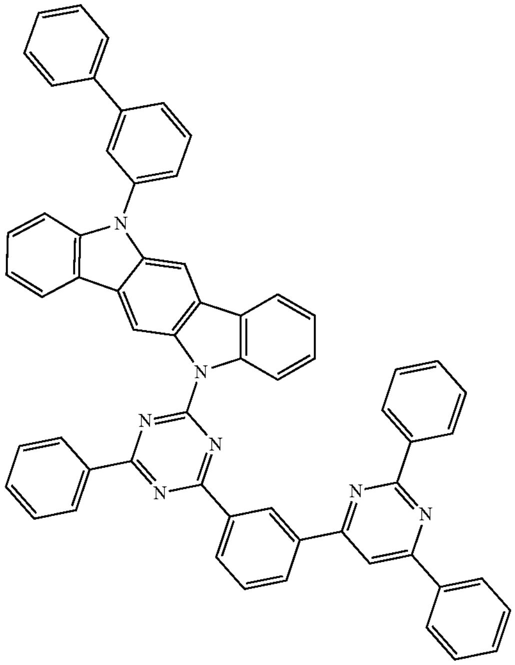
-continued
1-97
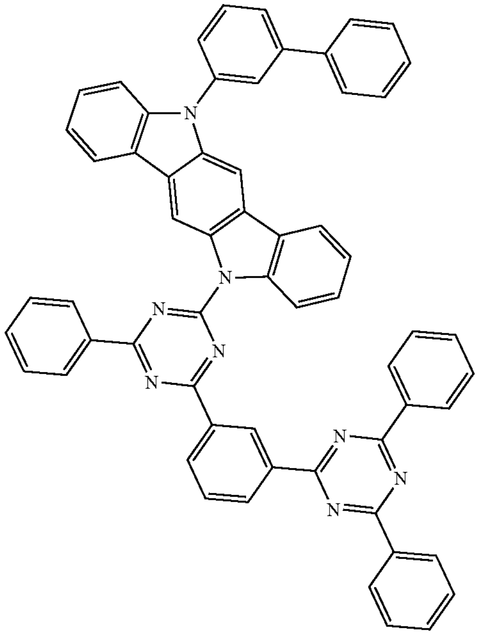
1-98
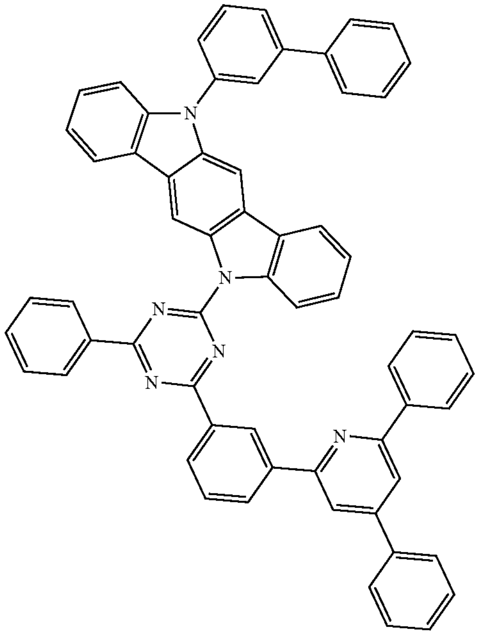

-continued
1-99
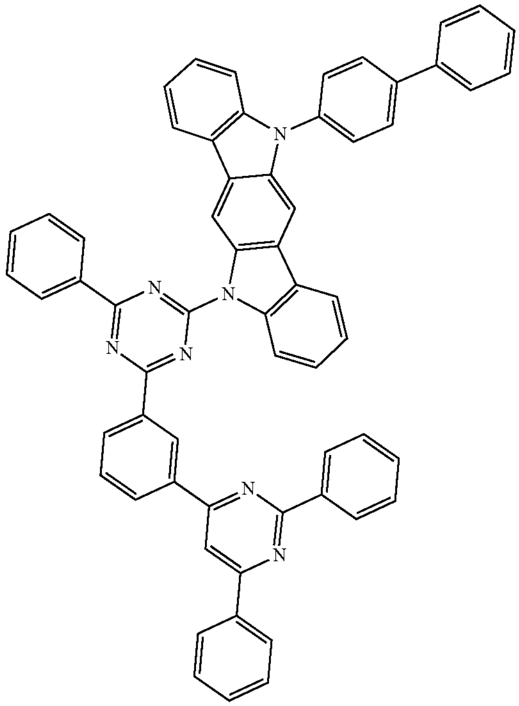
-continued
1-101
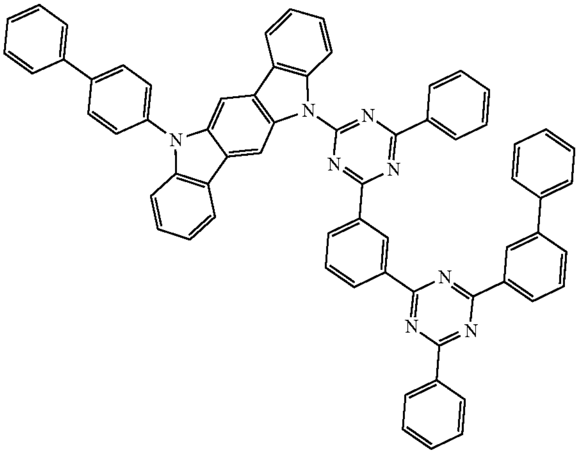
[Formula 18]
1-100
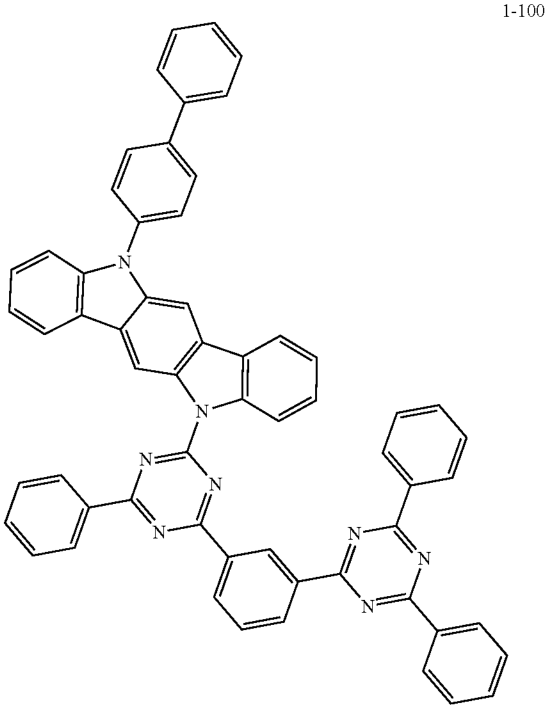
1-102
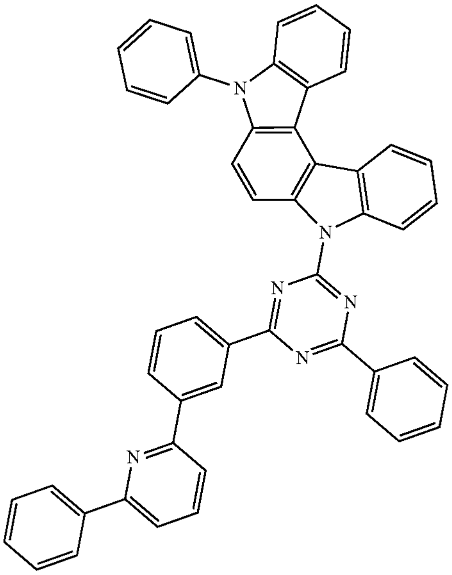

-continued
1-103
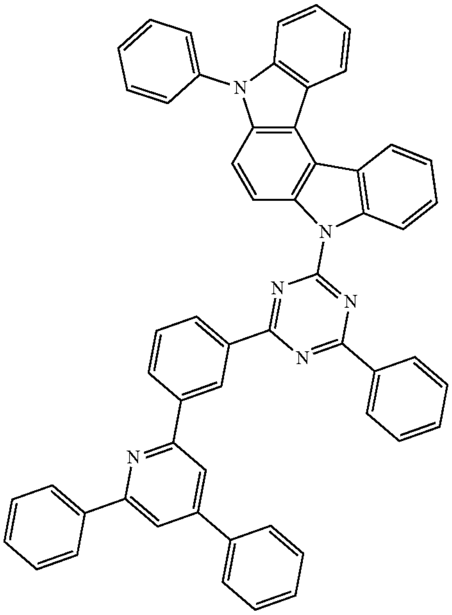
1-104
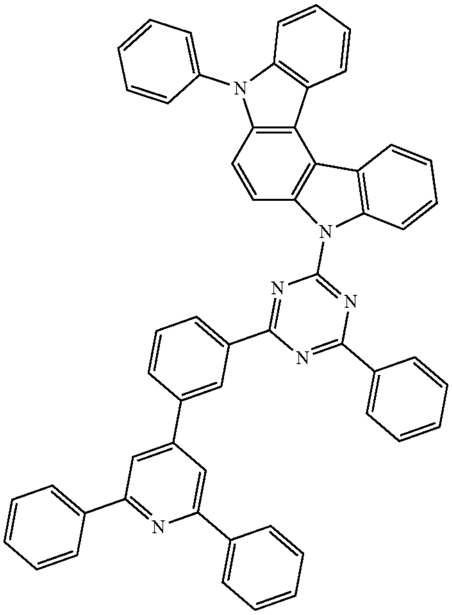
-continued
1-105
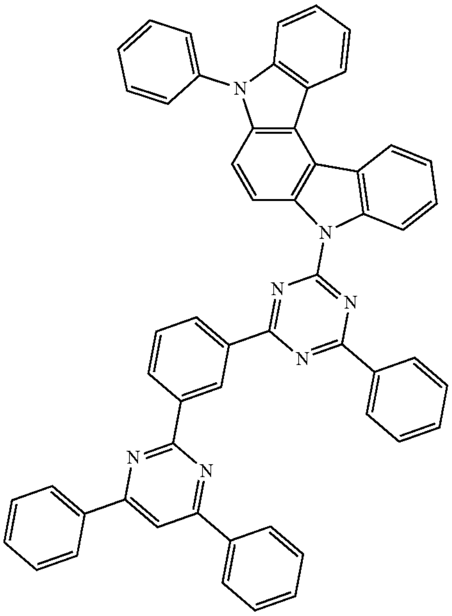
1-106
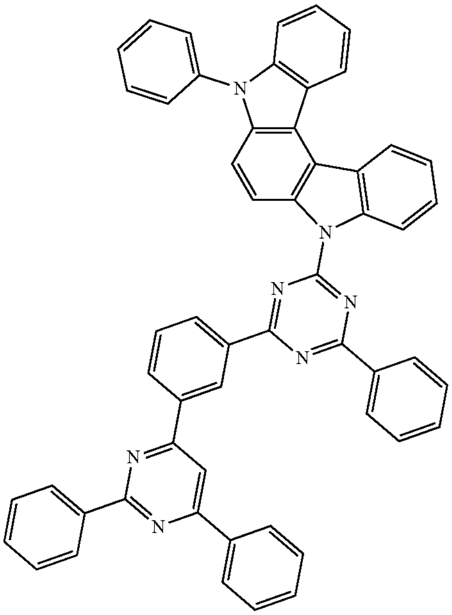

-continued
1-107
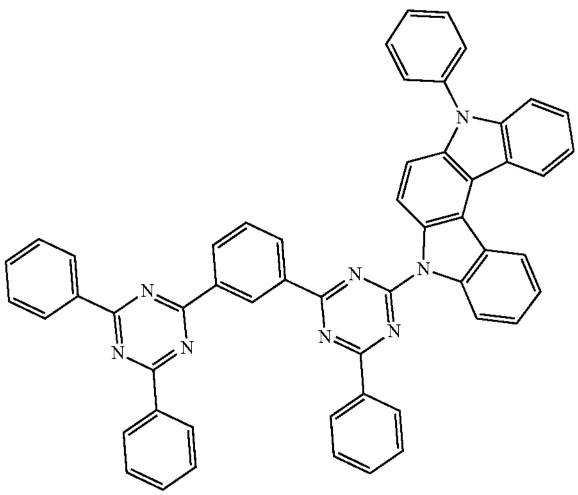
1-108
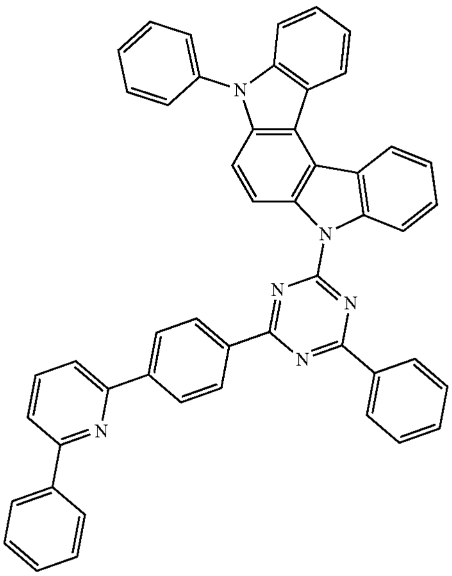
-continued
1-109
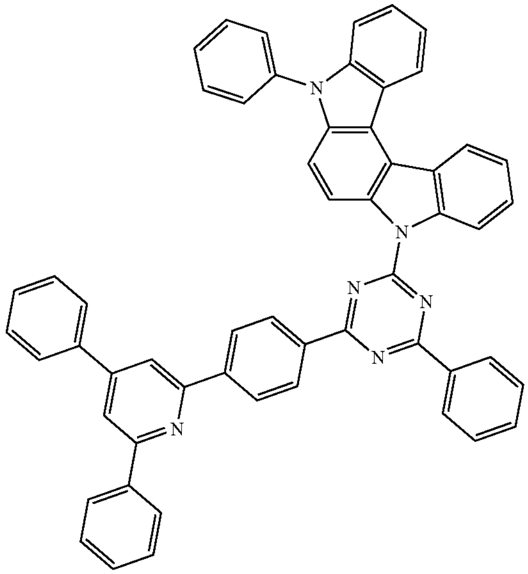
1-110
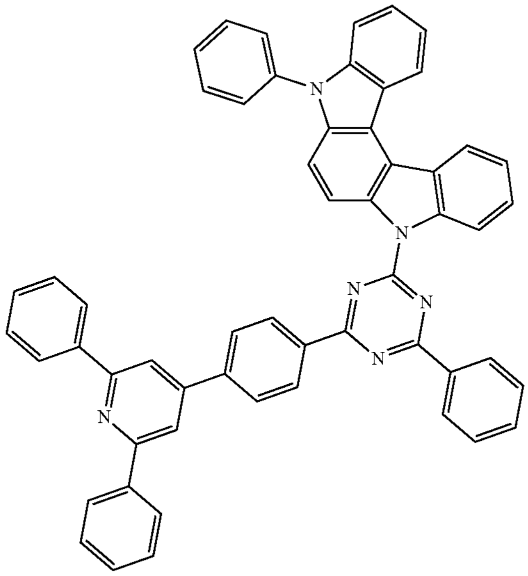

-continued
1-111
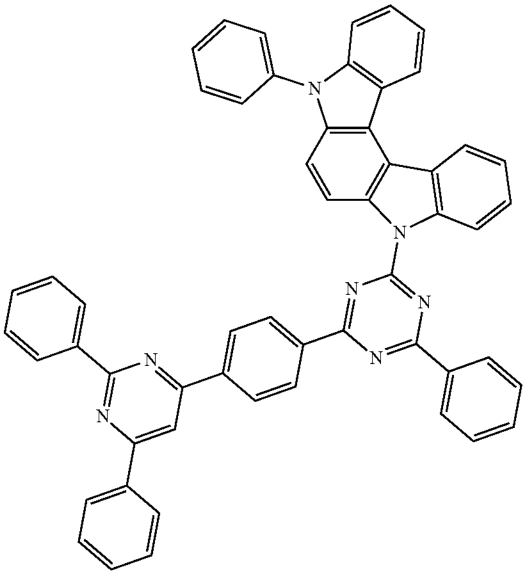
1-112
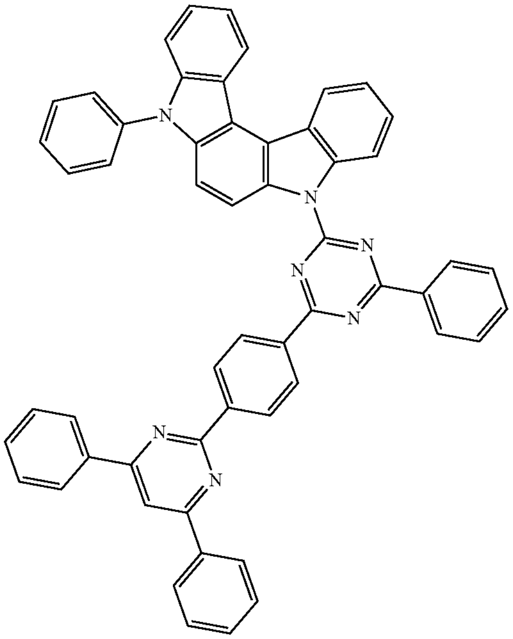
-continued
1-113
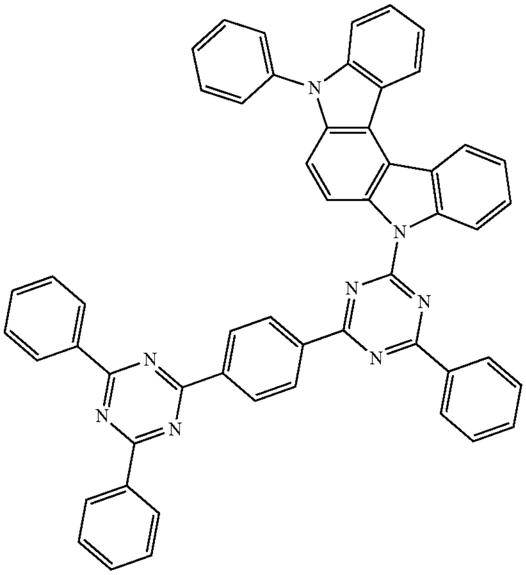
1-114
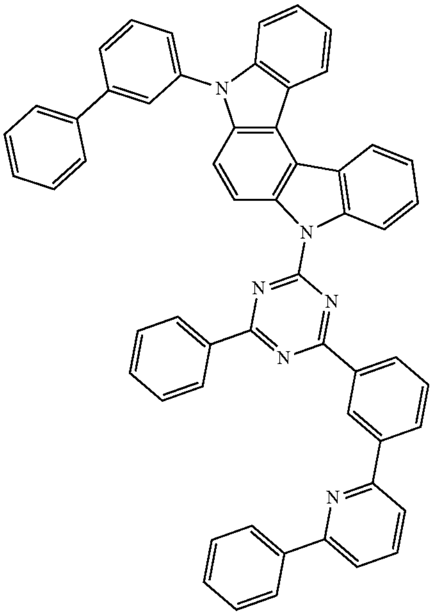

-continued
1-115
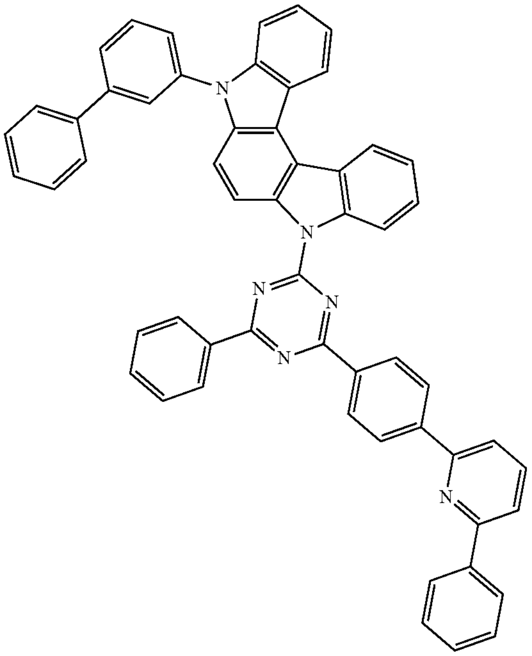
1-116
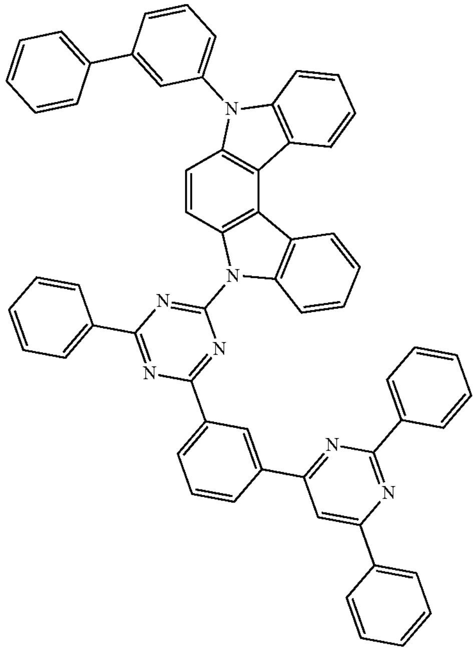
-continued
1-117
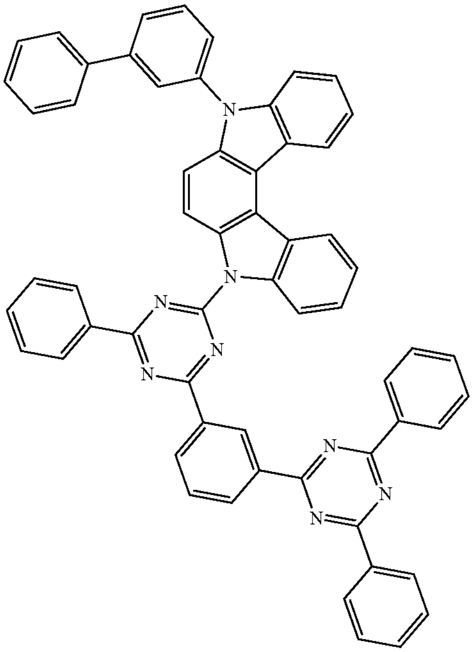
1-118
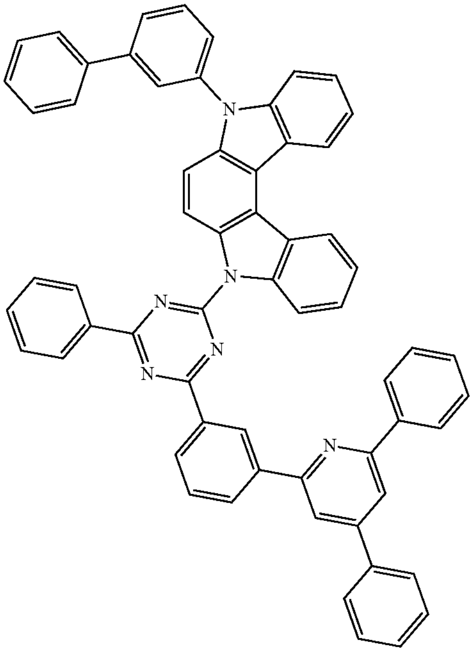

-continued
1-119
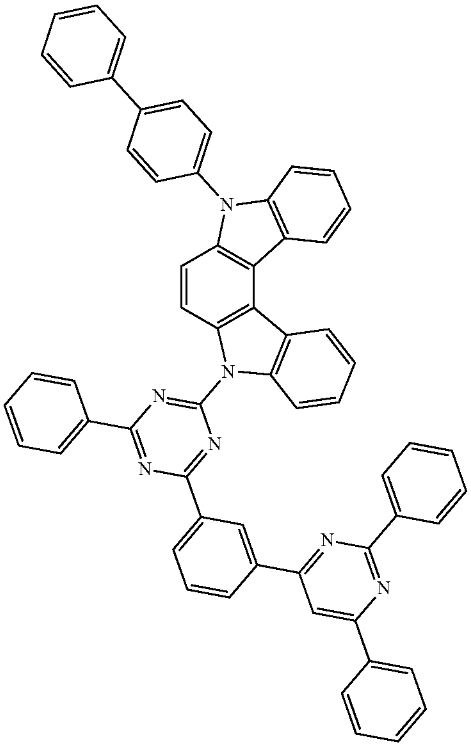
-continued
1-121
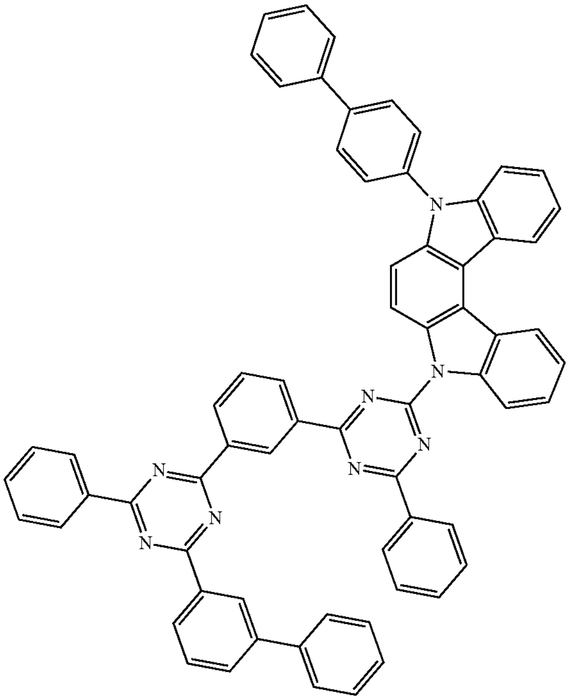
[Formula 19]
1-120
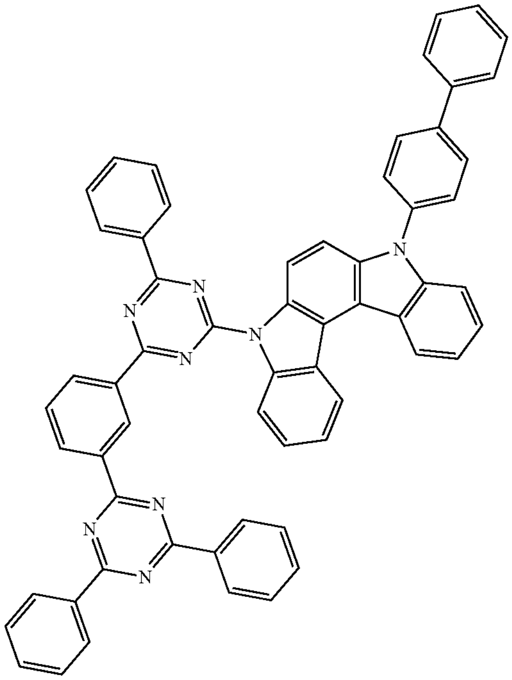
1-122
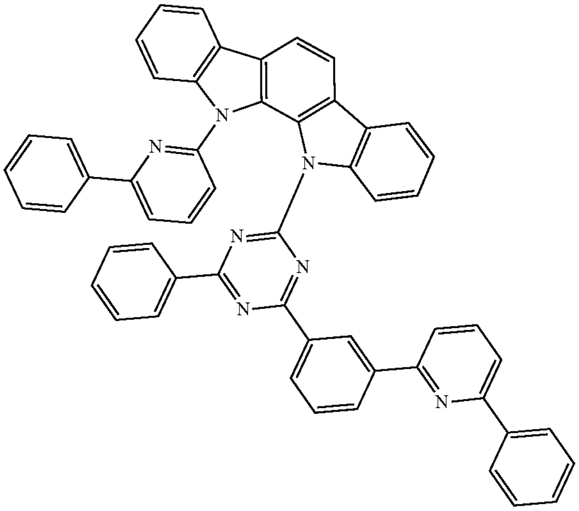

-continued
1-123
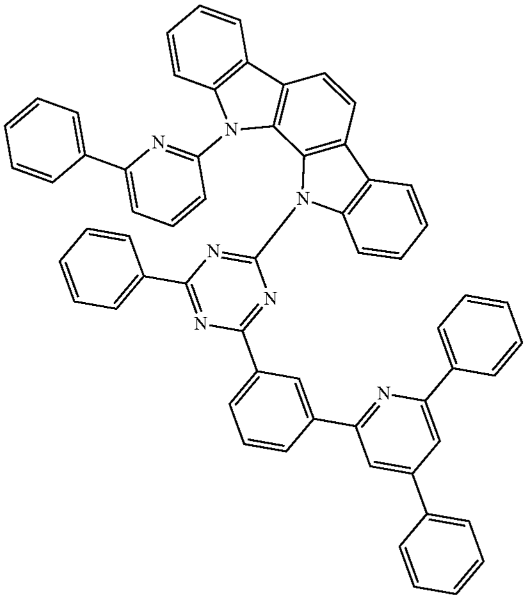
1-124
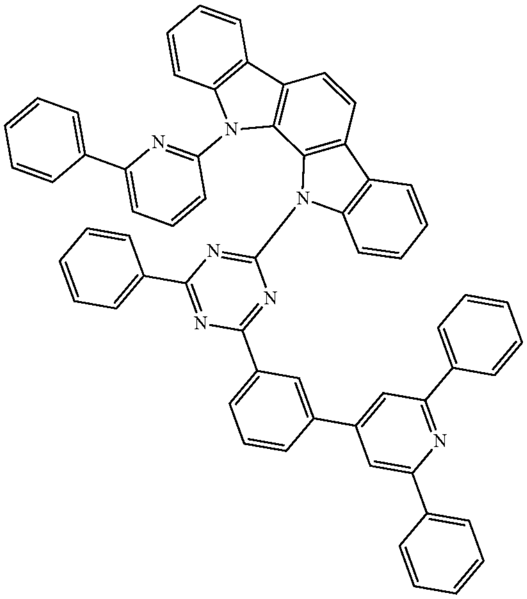
-continued
1-125
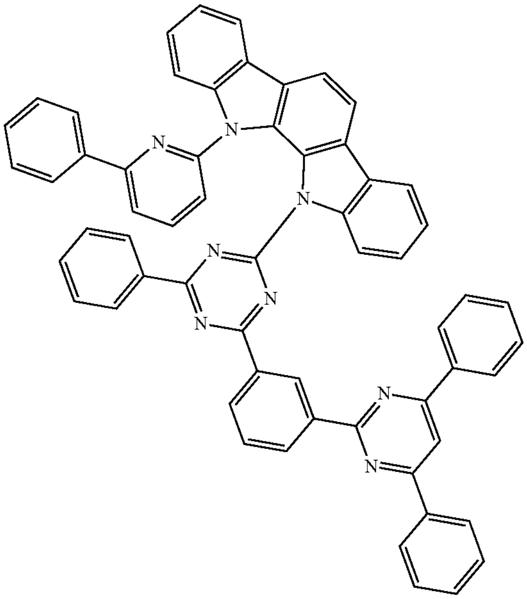
1-126
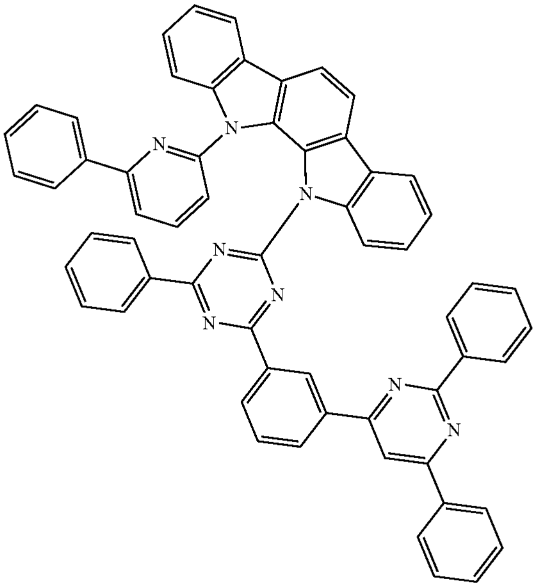

-continued
1-127
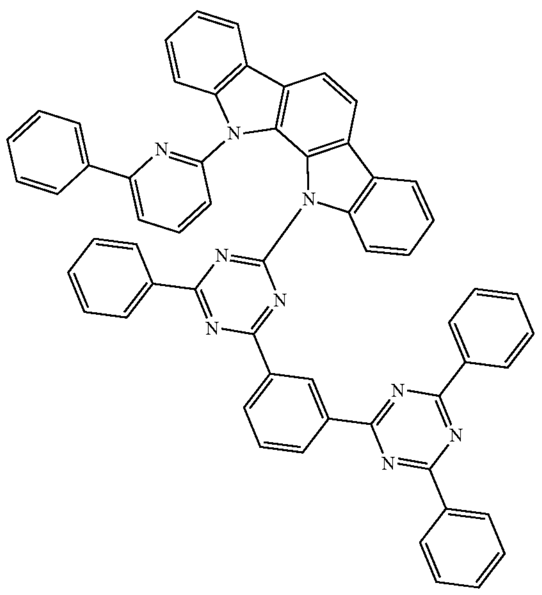
1-128
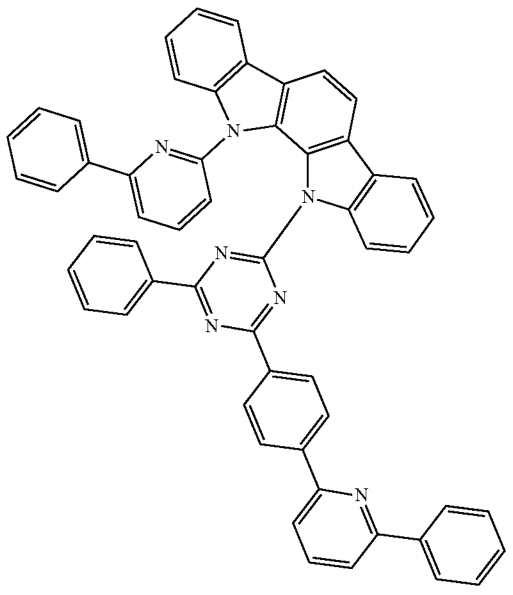
-continued
1-129
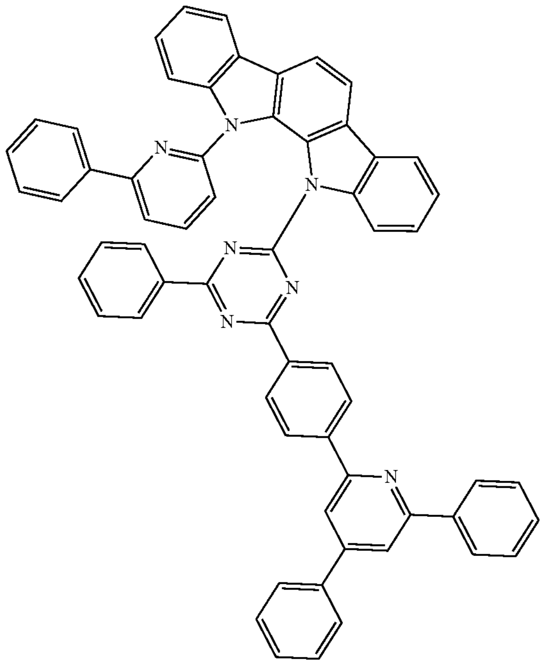
1-130
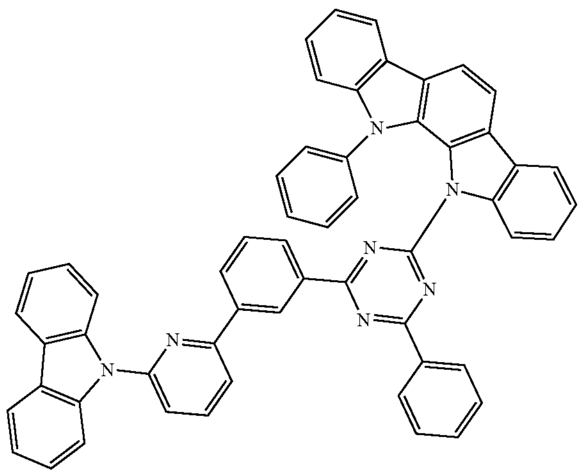

-continued
1-131
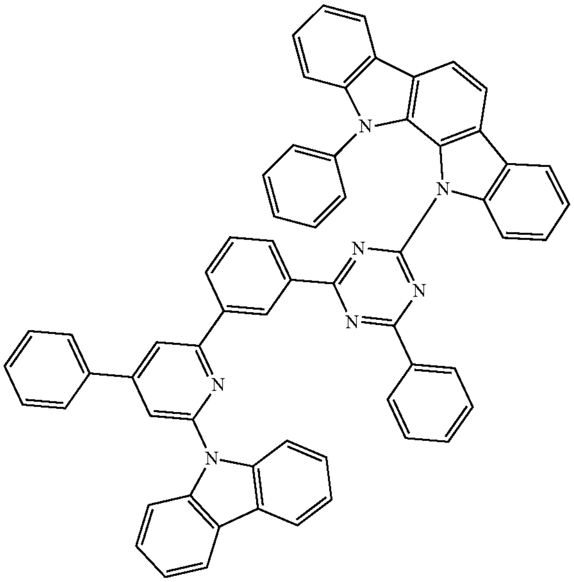
1-132
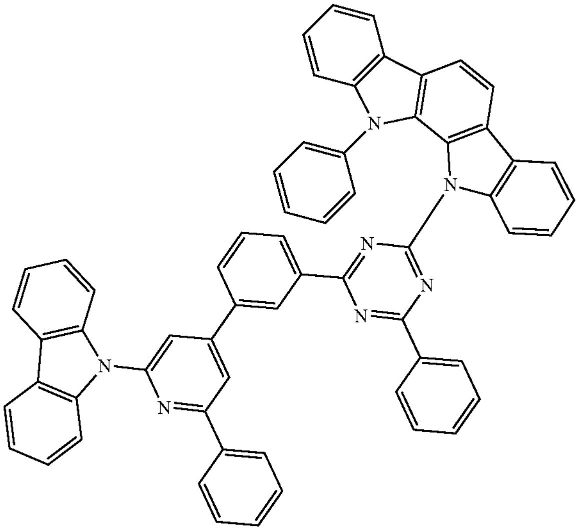
-continued
1-133
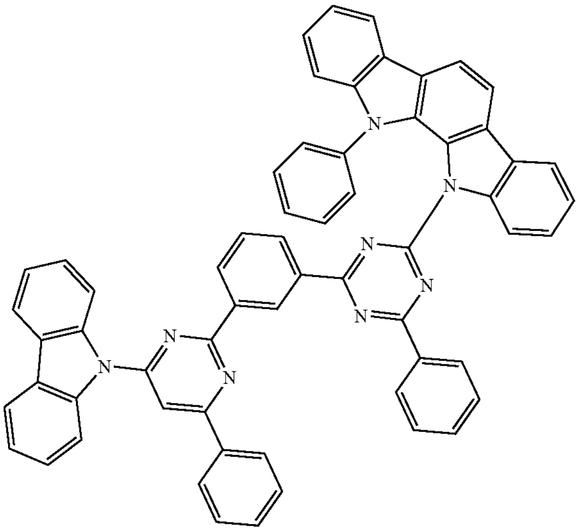
1-134
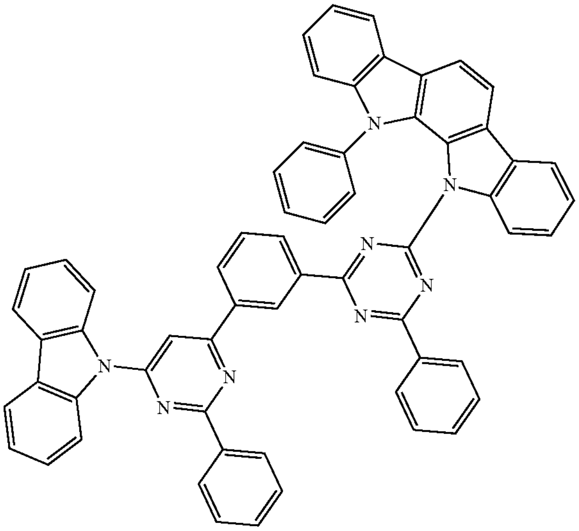

-continued
1-135
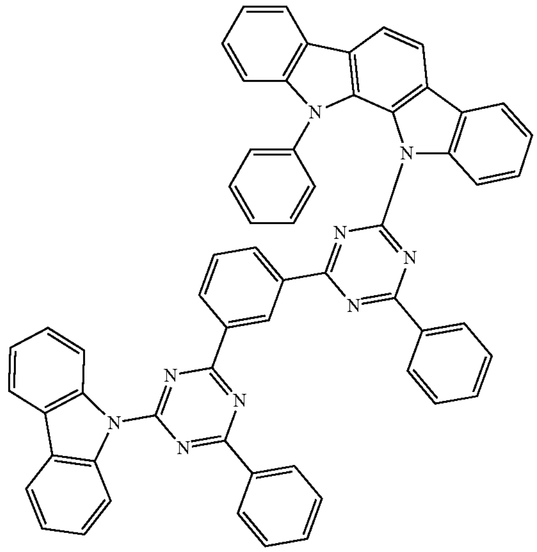
1-137
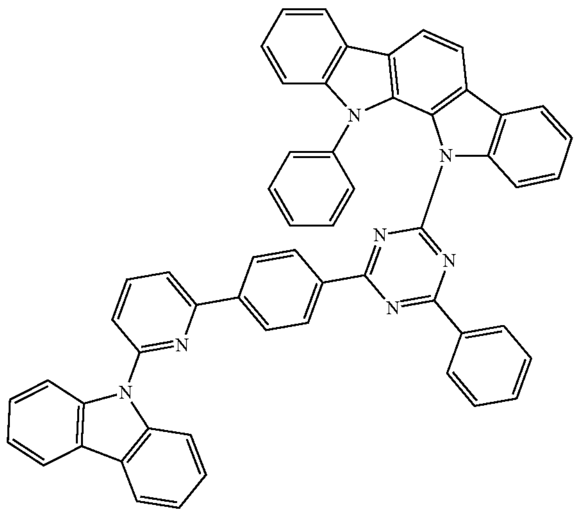
-continued
1-138
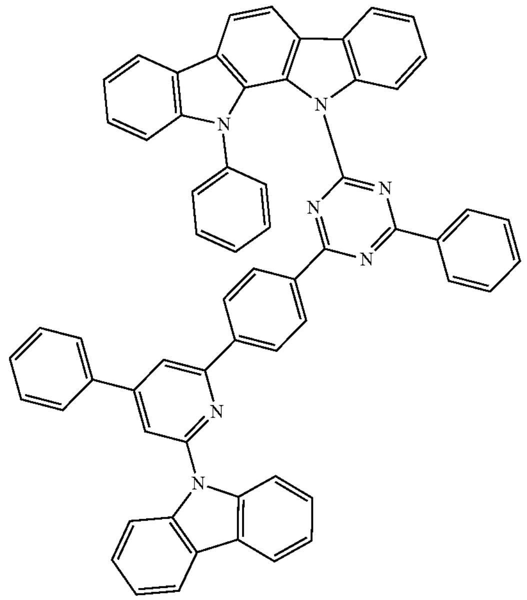
1-139
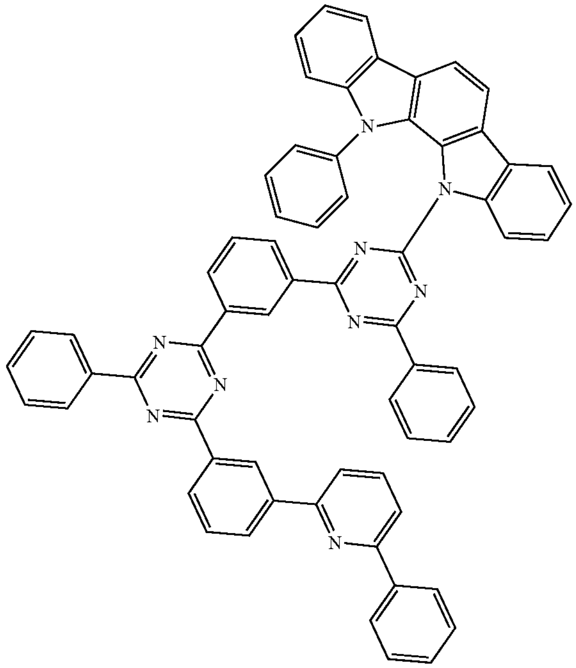

-continued
1-140
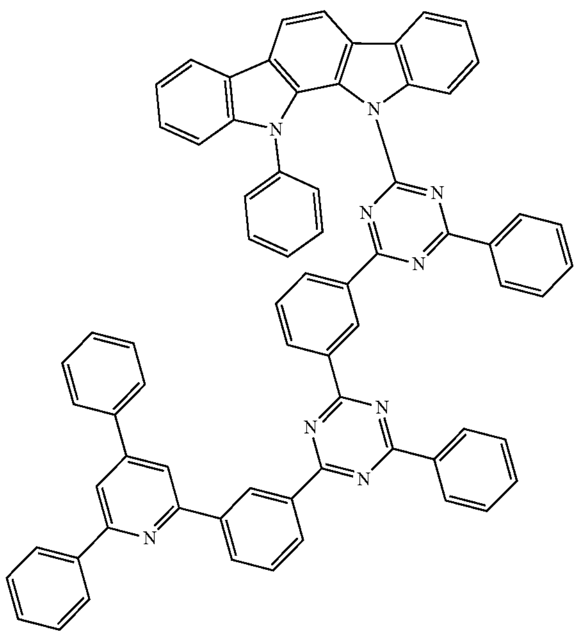
[Formula 20]
1-141
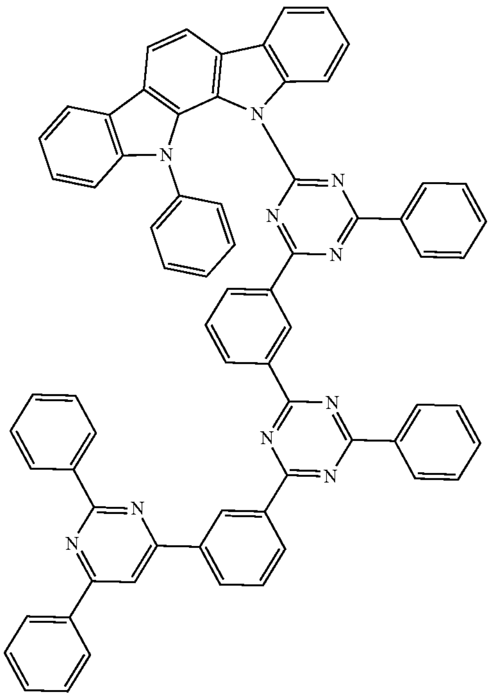
-continued
1-142
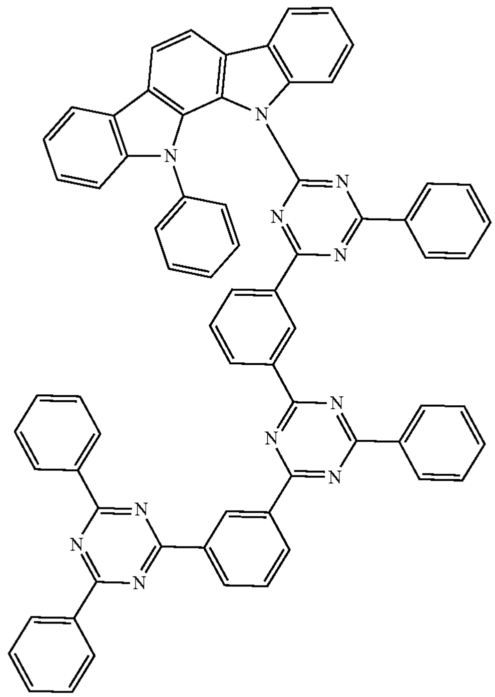
1-143
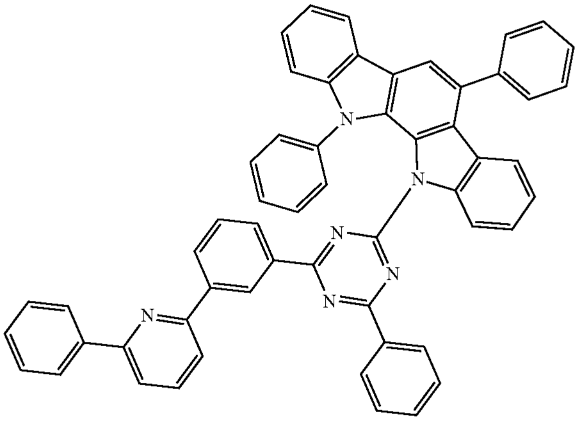

-continued
1-144
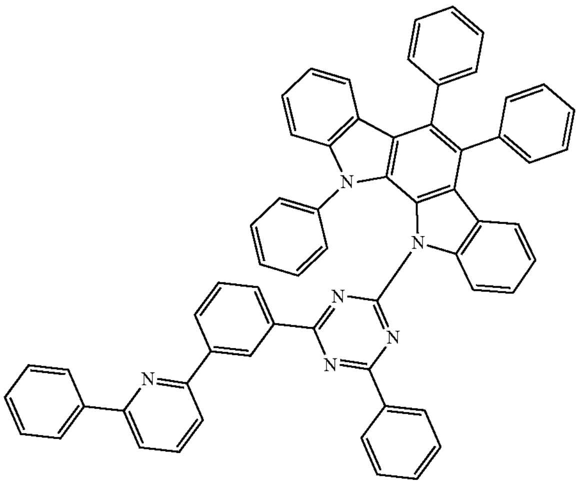
1-145
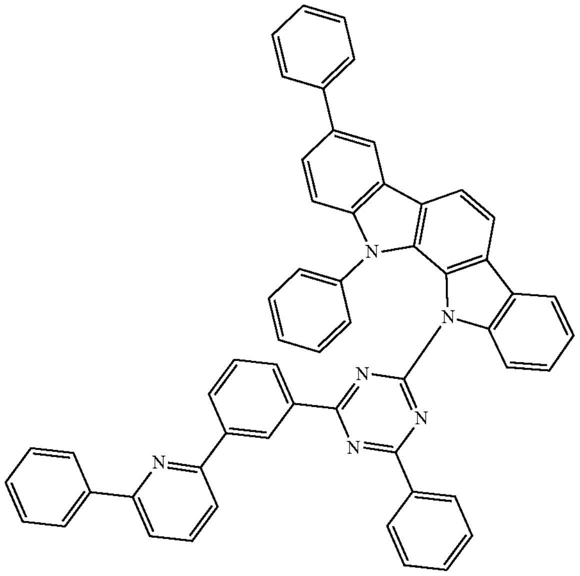
-continued
1-146
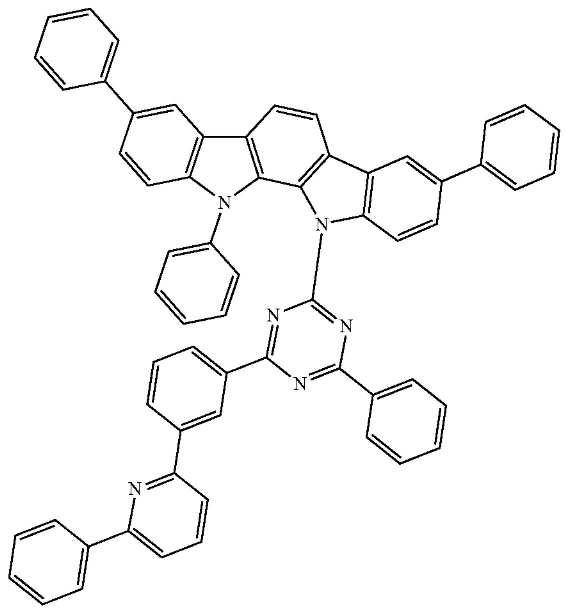
1-147
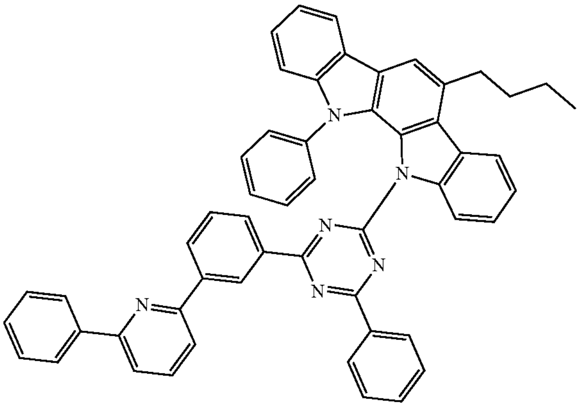
1-148
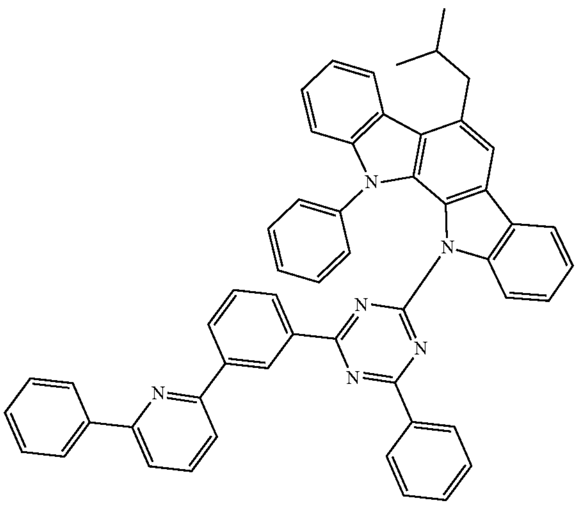

-continued
1-149
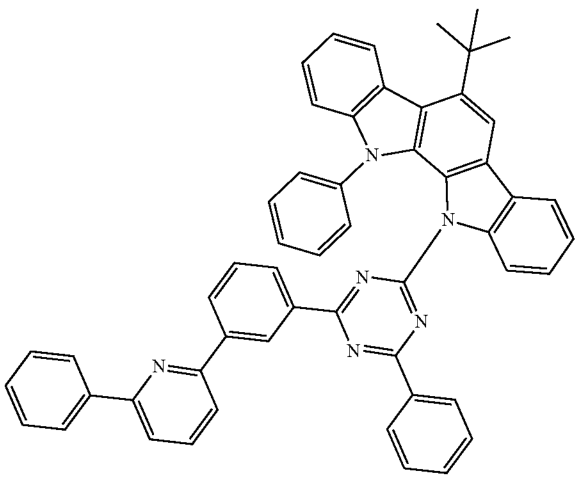
1-150
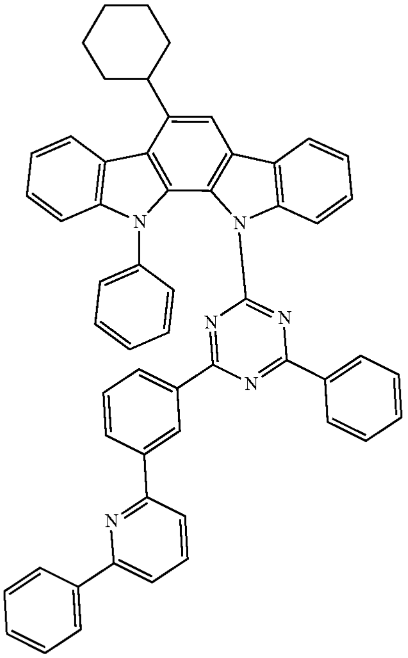
1-151
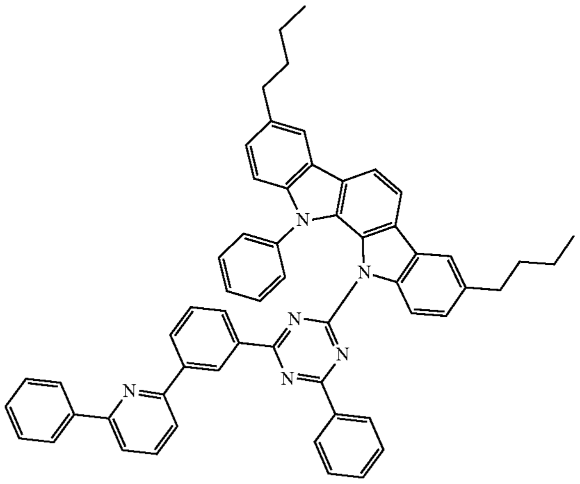
-continued
1-152
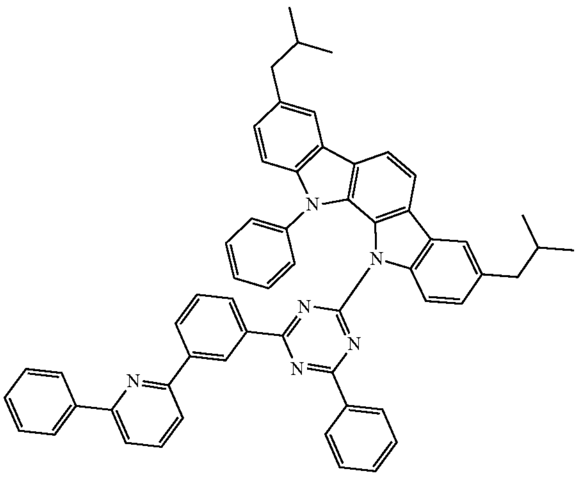
1-153
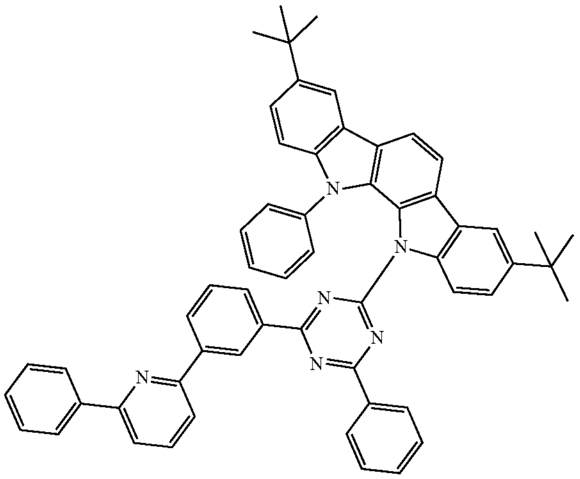
1-154
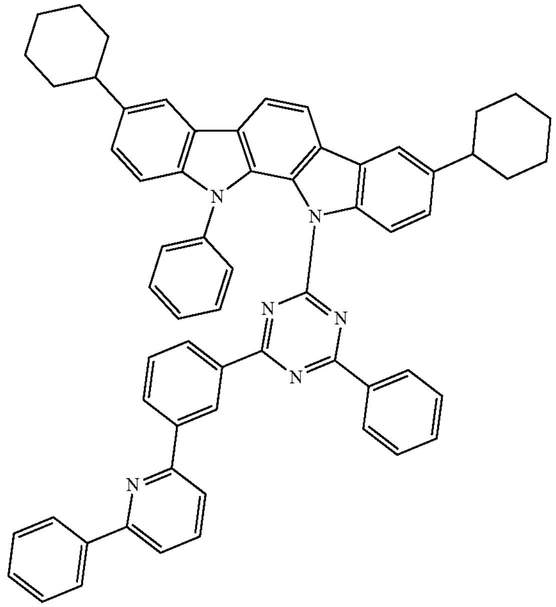

-continued
1-155
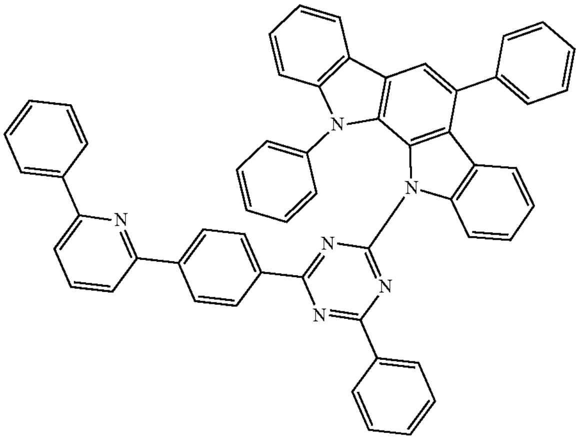
1-156
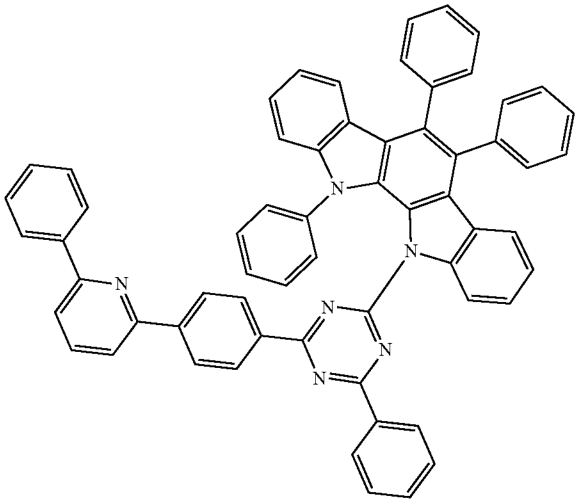
1-157
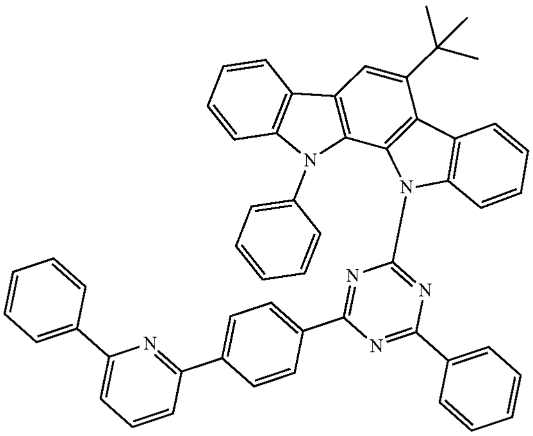
-continued
1-158
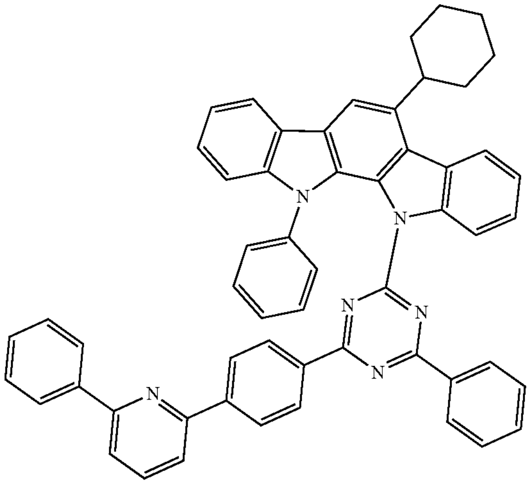
1-159
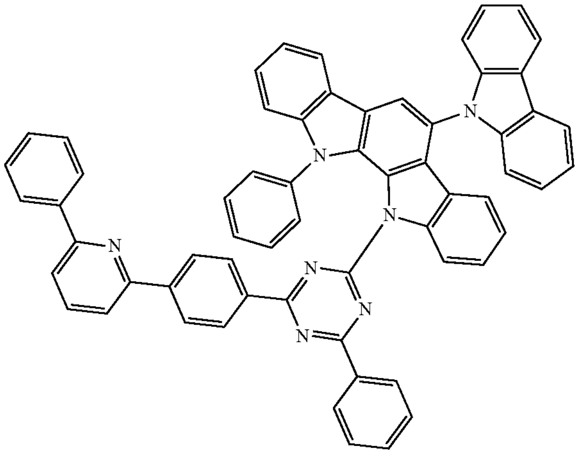
1-160
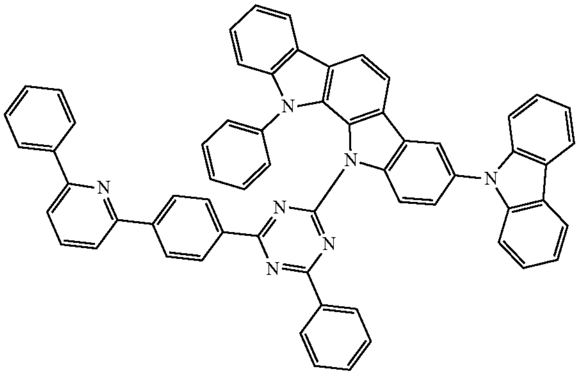

-continued
1-161
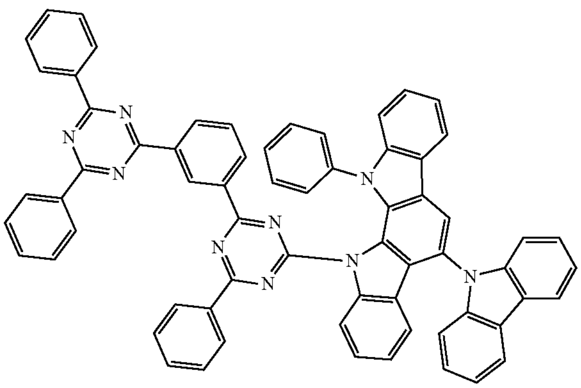
1-162
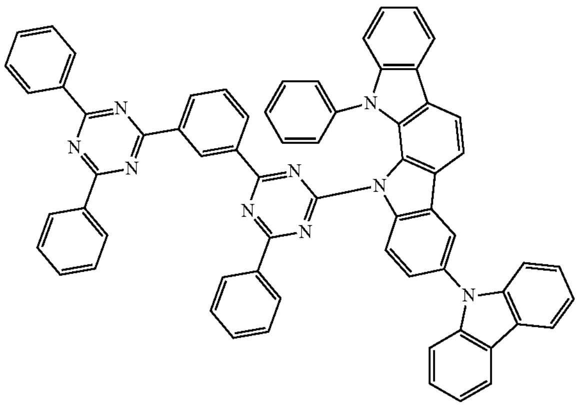
1-163
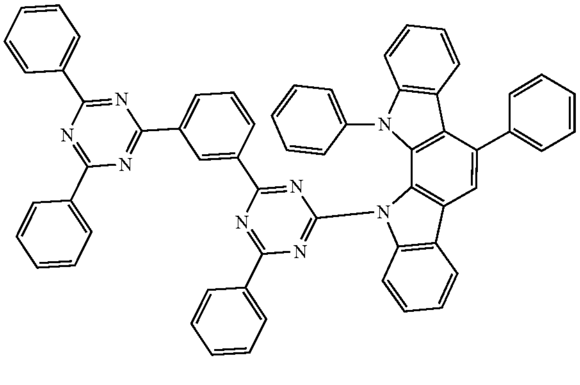
-continued
1-164
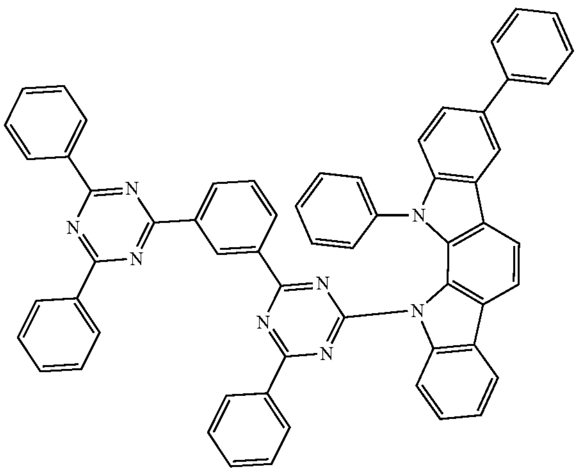
[Formula 21]
1-165
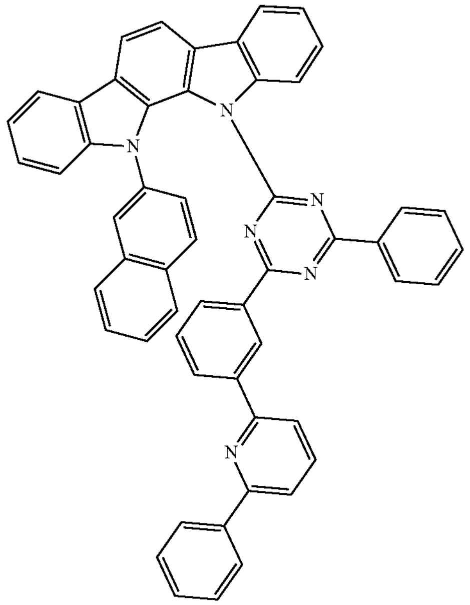

-continued
1-166
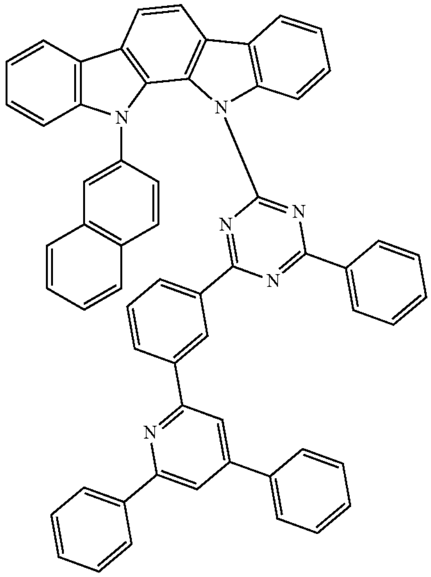
1-167
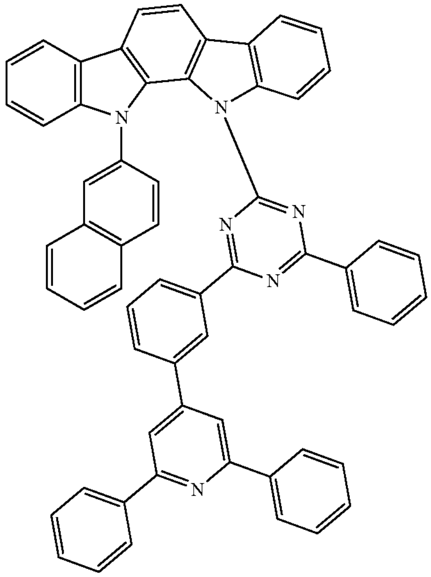
-continued
1-168
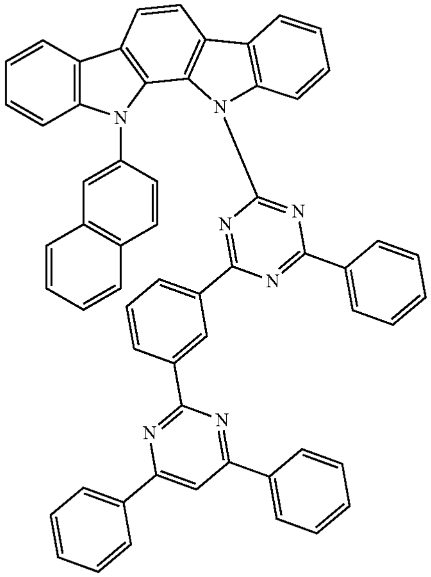
1-169
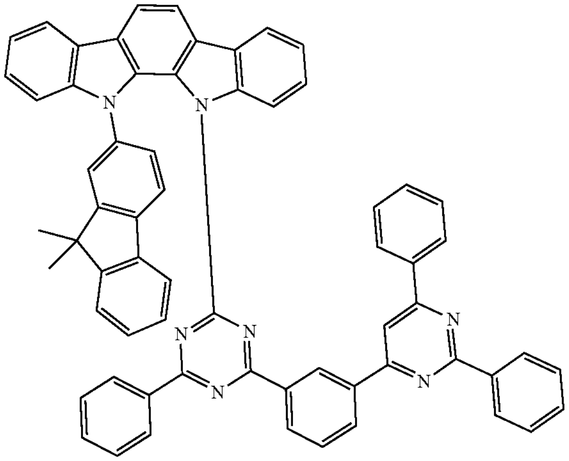
1-170
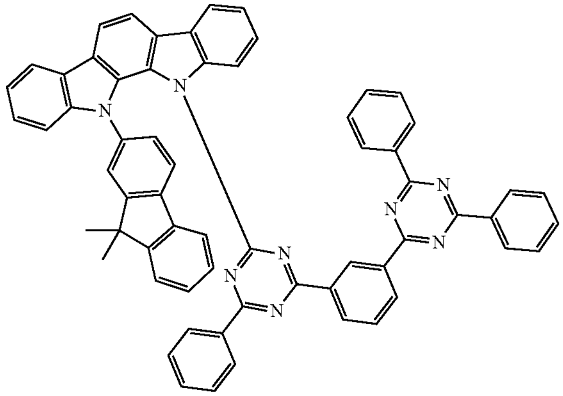

-continued
1-171
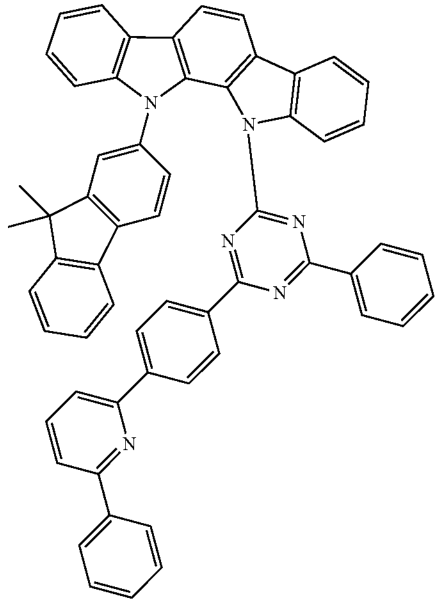
1-172
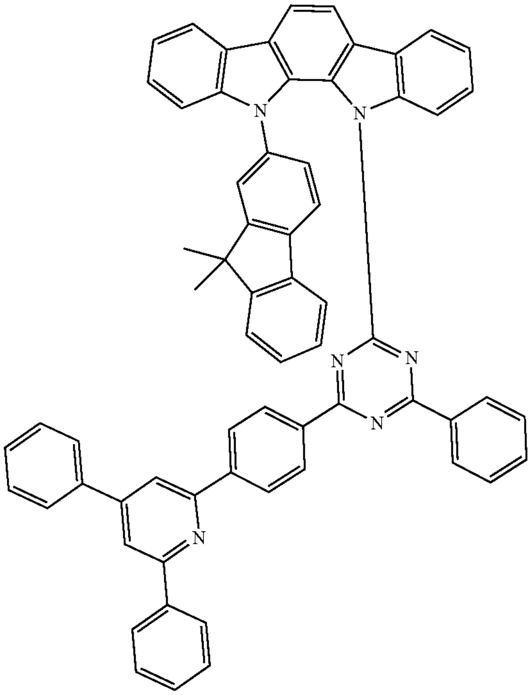
-continued
1-173
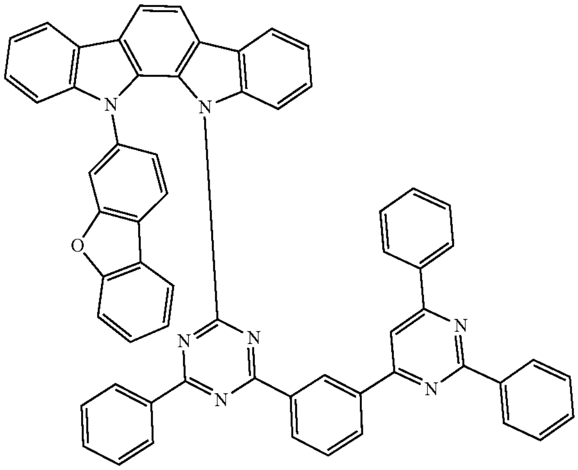
1-174
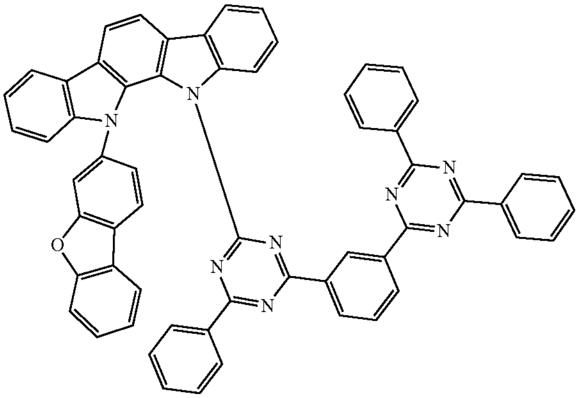
1-175
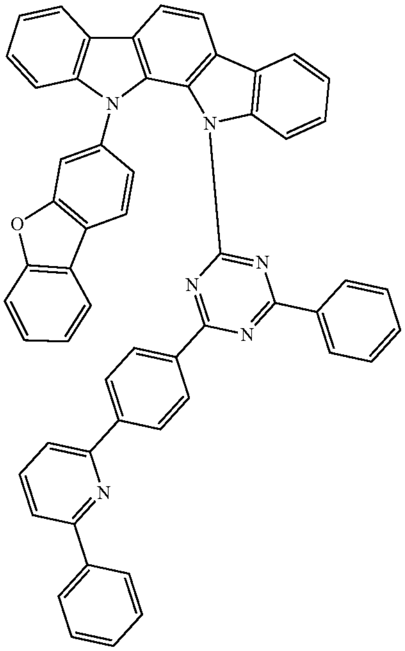

-continued
1-176
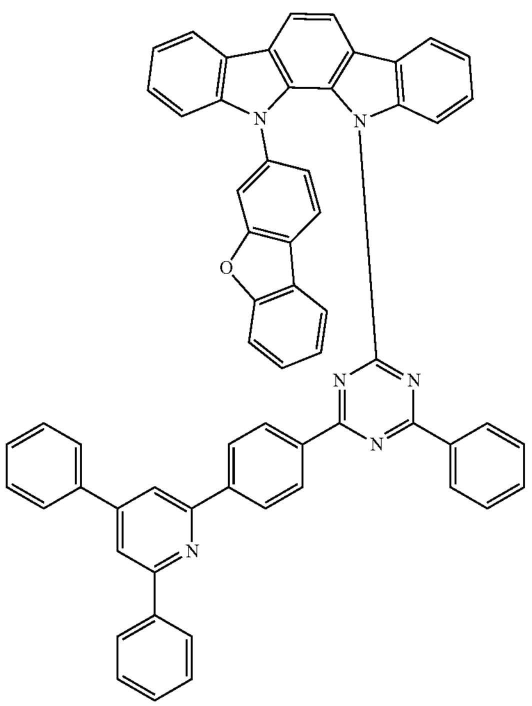
1-173b
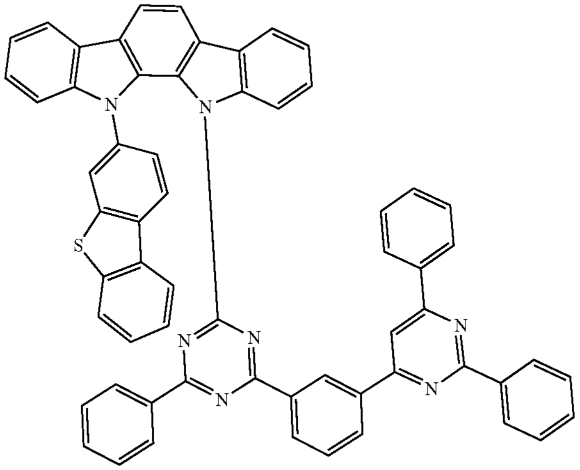
1-174b
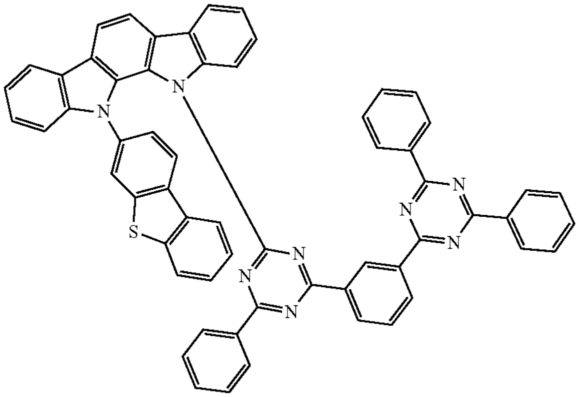
-continued
1-175b
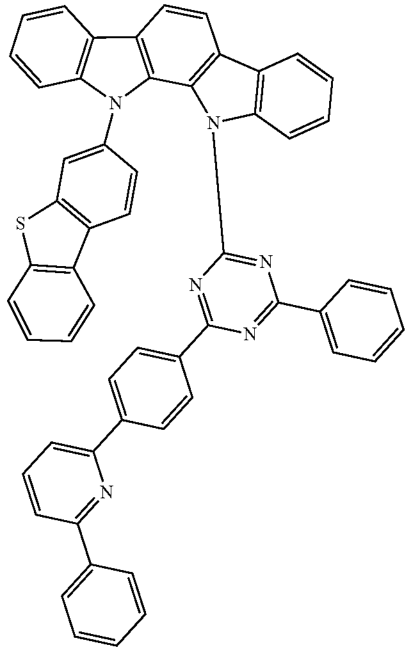
1-176b
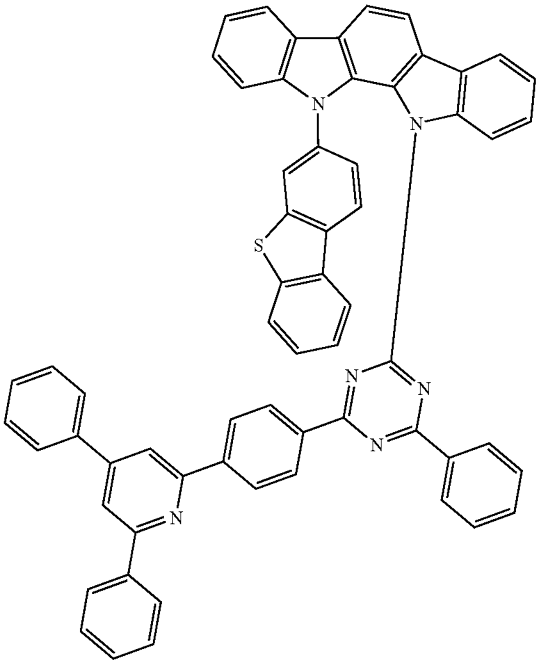

-continued
1-177
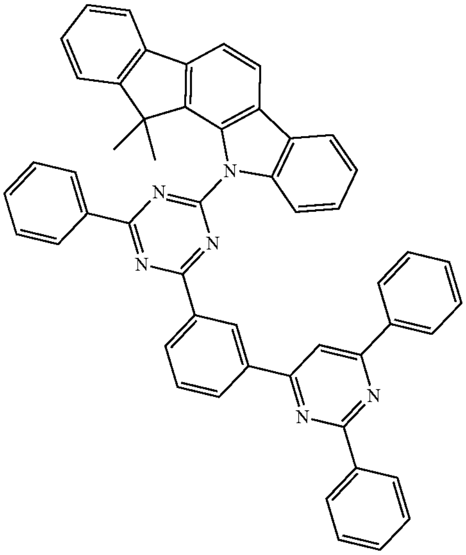
1-178
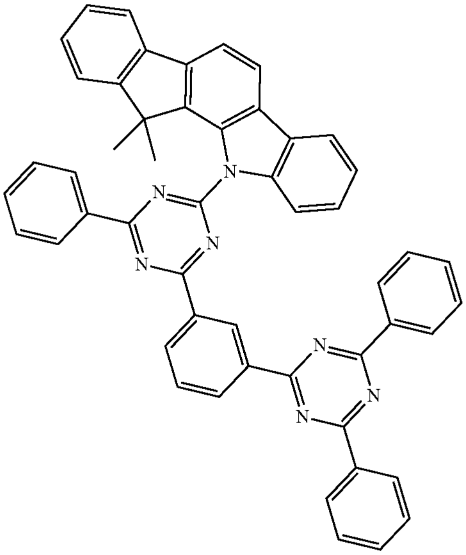
1-179
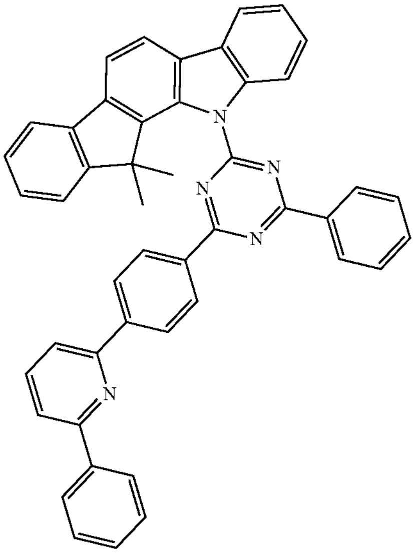
-continued
1-180
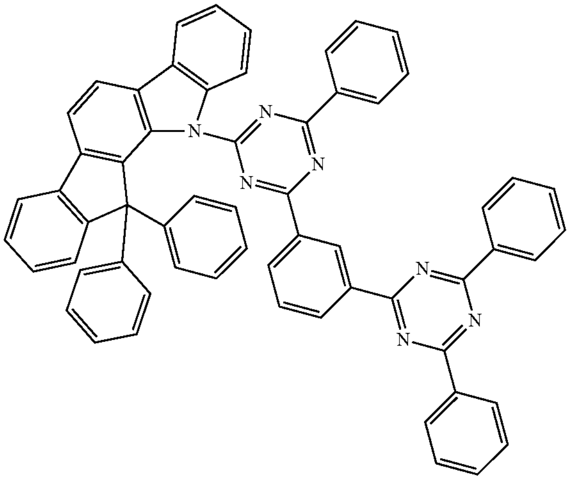
[Formula 22]
1-181
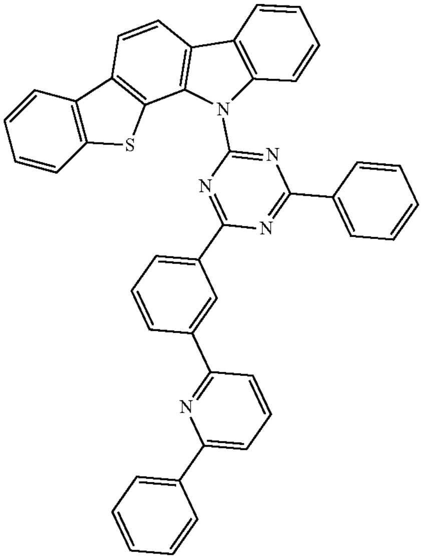
1-182
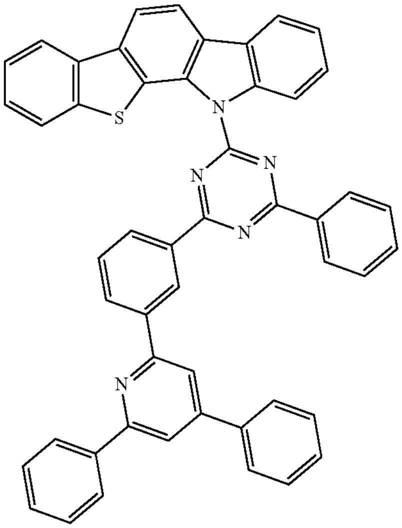

-continued
1-183
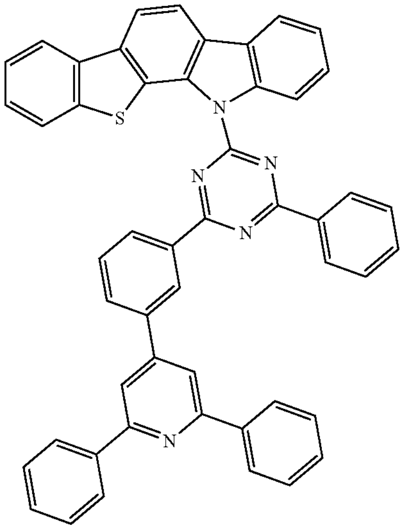
1-184
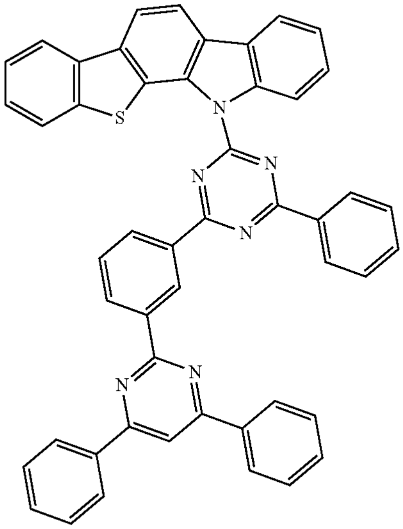
1-185
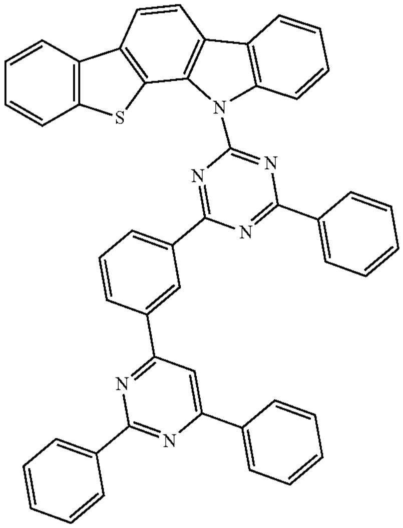
-continued
1-186
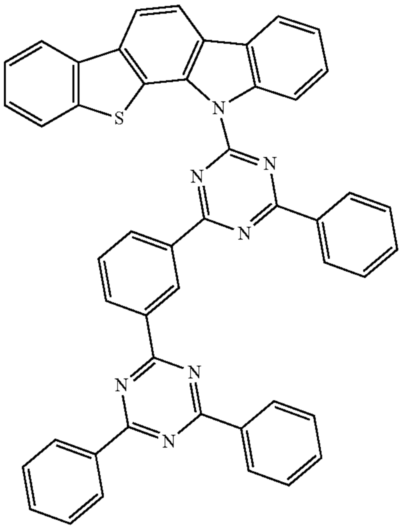
1-187
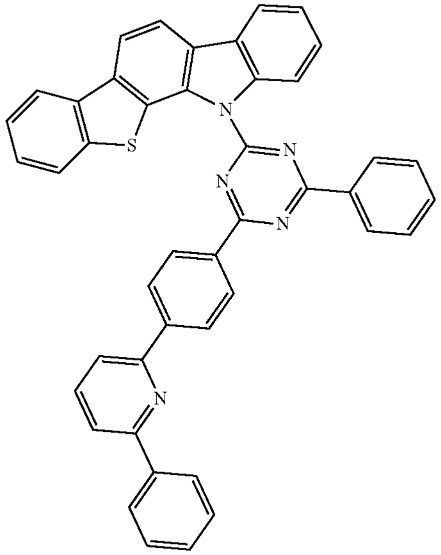
1-188
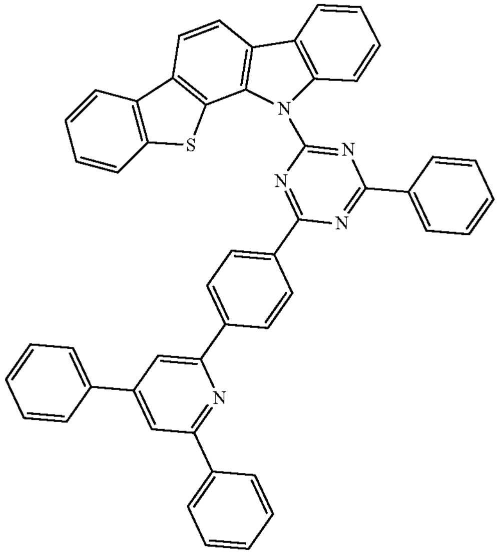

-continued
1-189
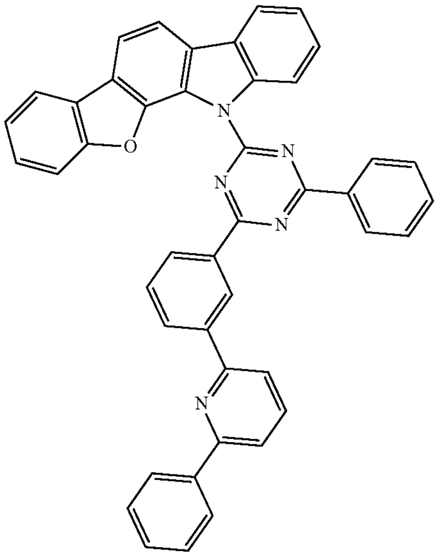
1-191
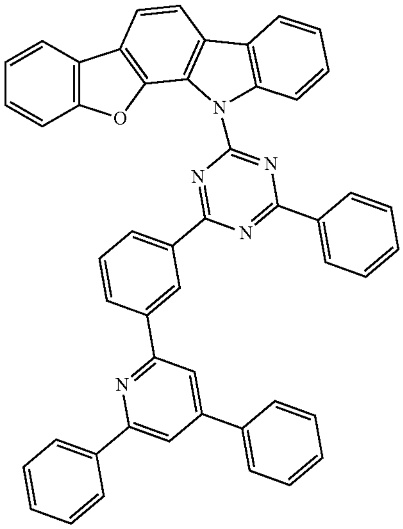
1-192
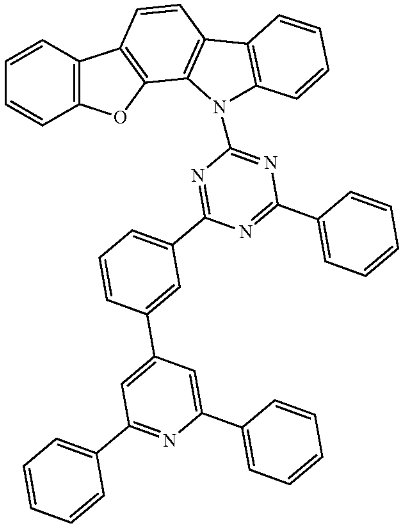
-continued
1-193
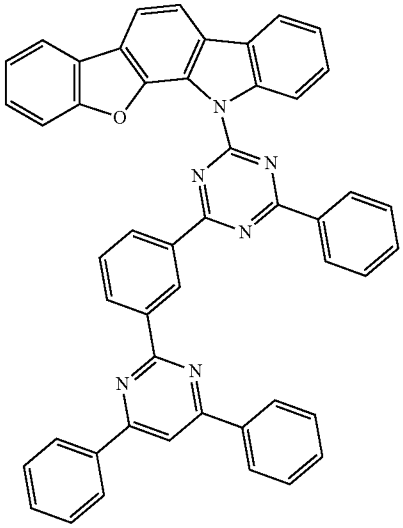
1-194
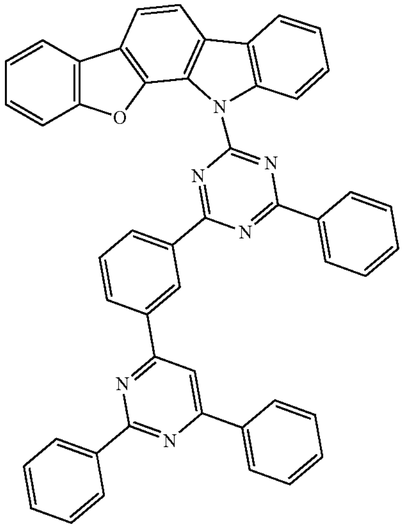
1-195
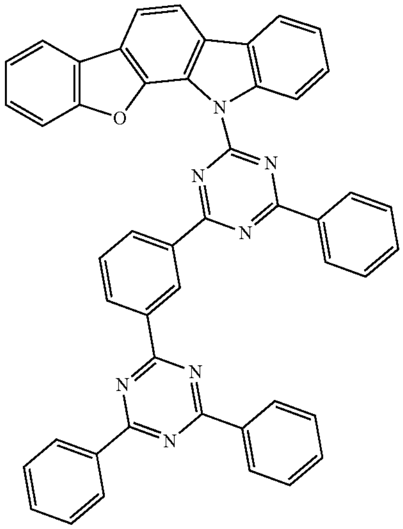

-continued
1-196
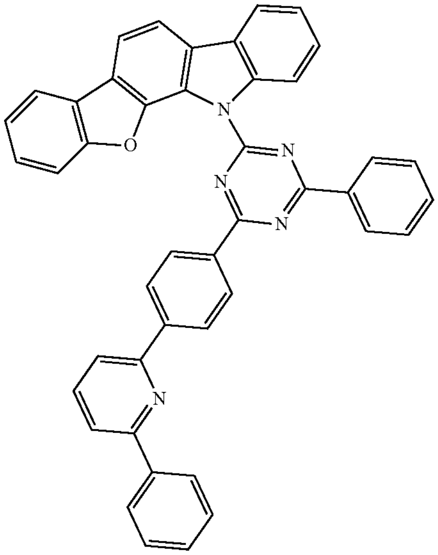
1-197
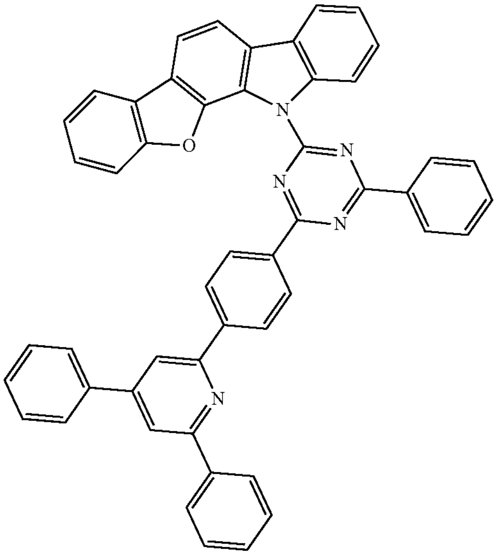
-continued
1-198
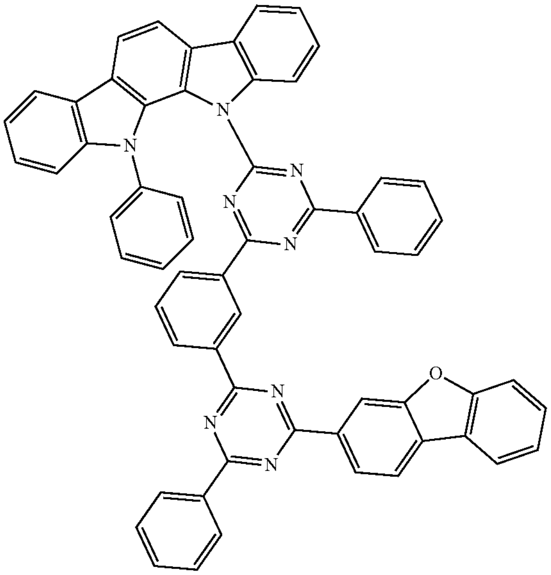
1-199
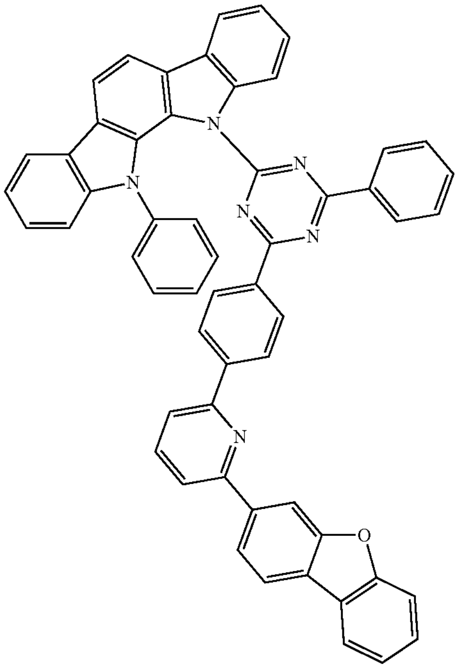

-continued
1-200
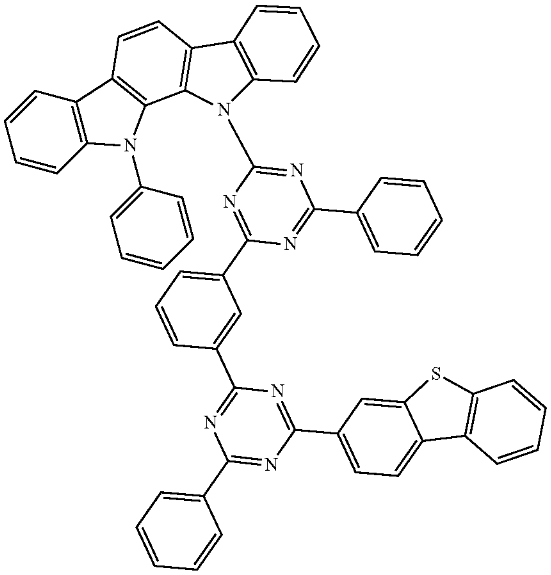
1-201
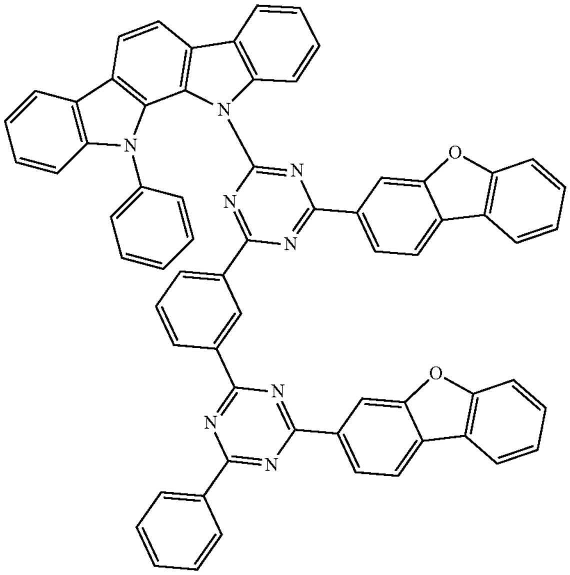
-continued
[Formula 23]
1-202
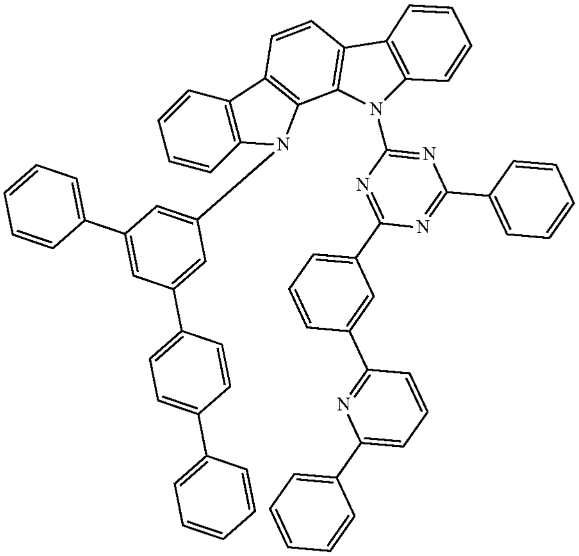
1-203
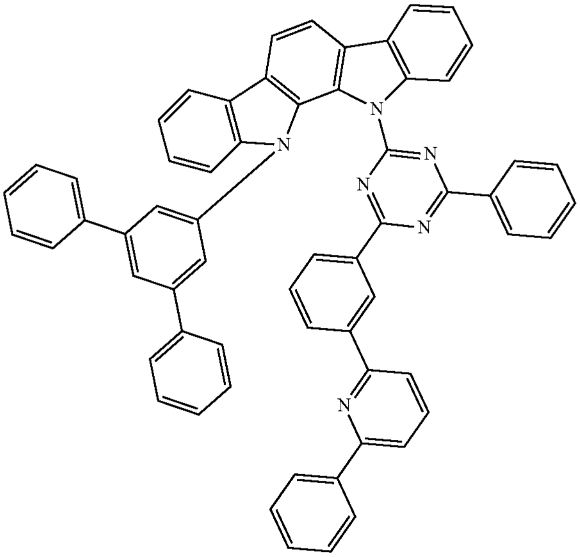

-continued
1-204
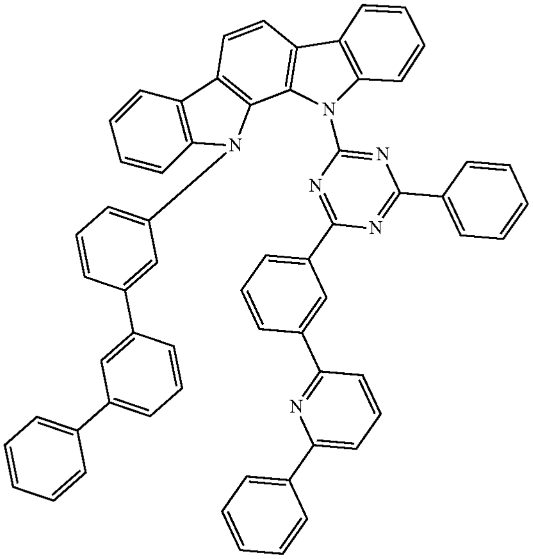
1-205
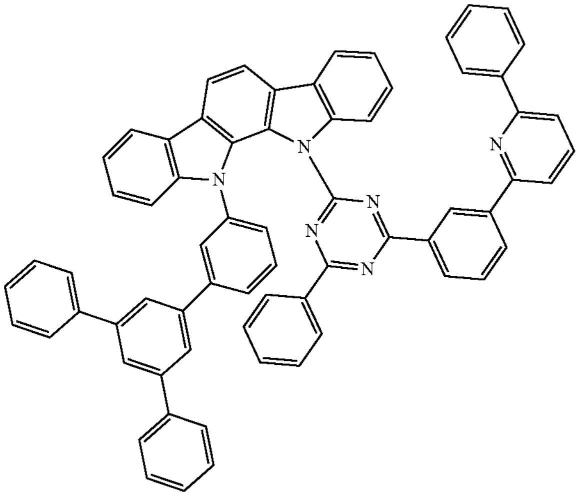
1-206
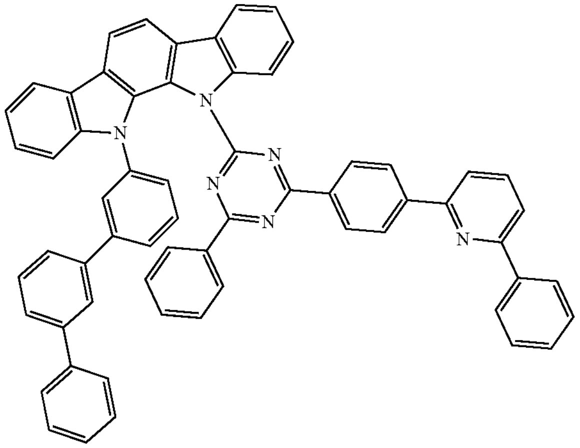
-continued
1-207
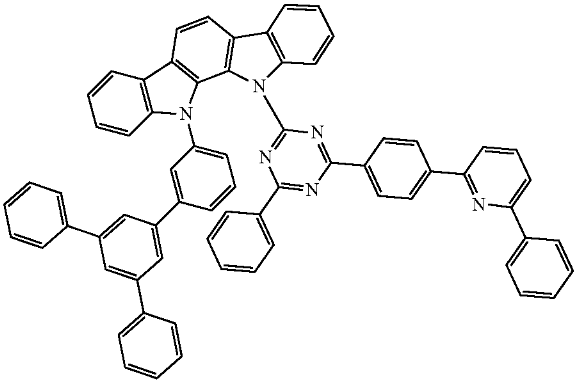
1-208
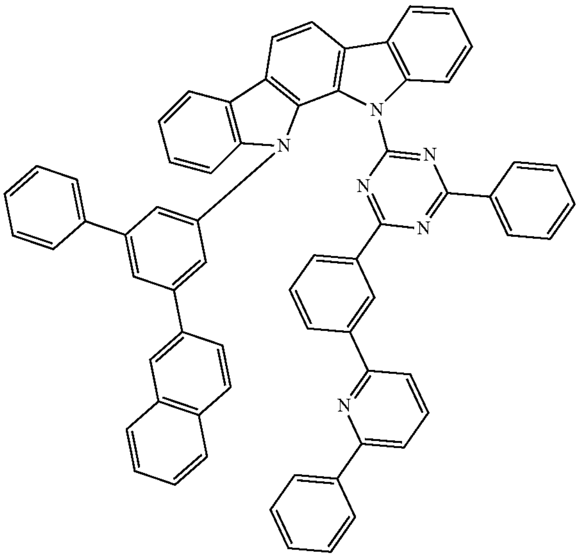
1-209
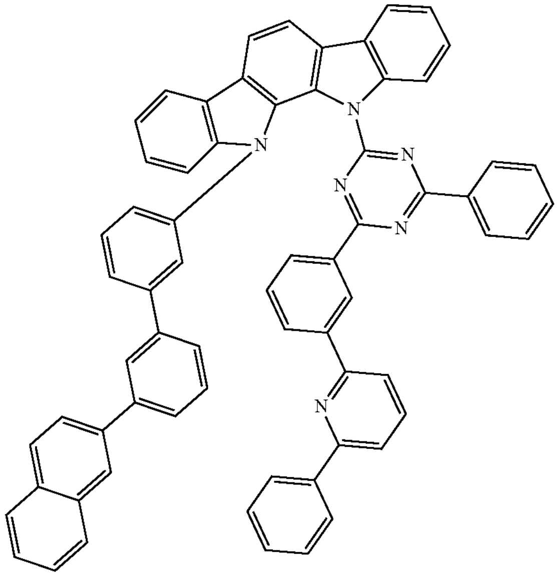

-continued
1-210
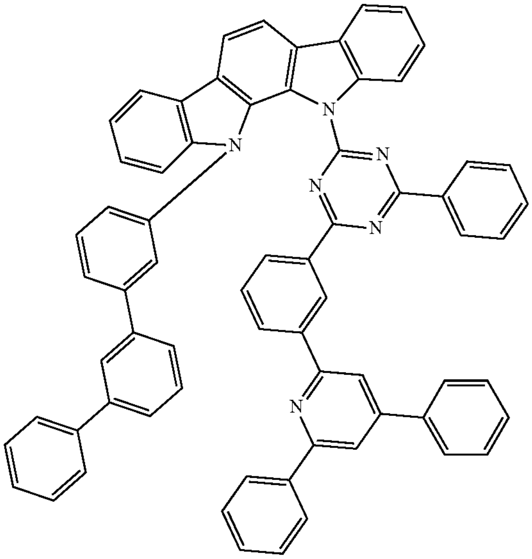
1-211
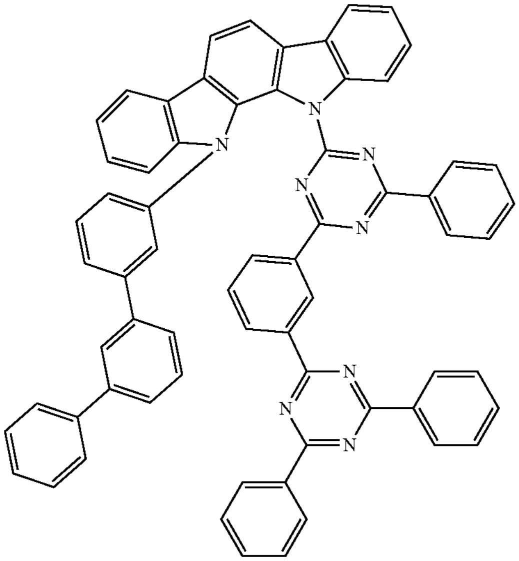
-continued
1-212
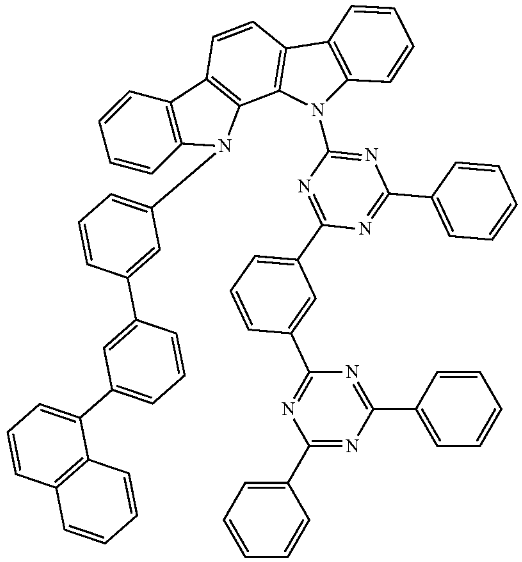
1-213
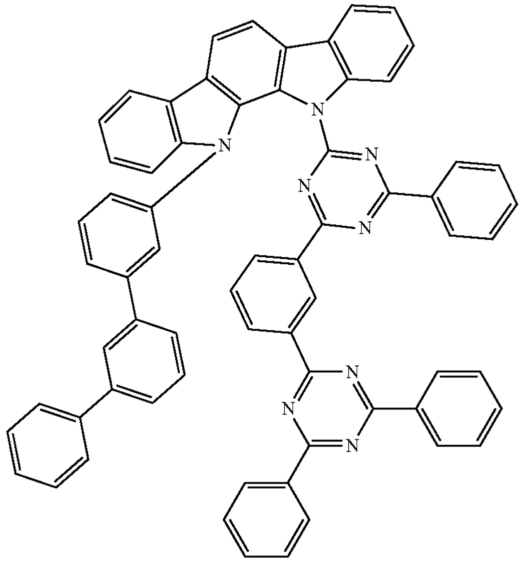
1-214
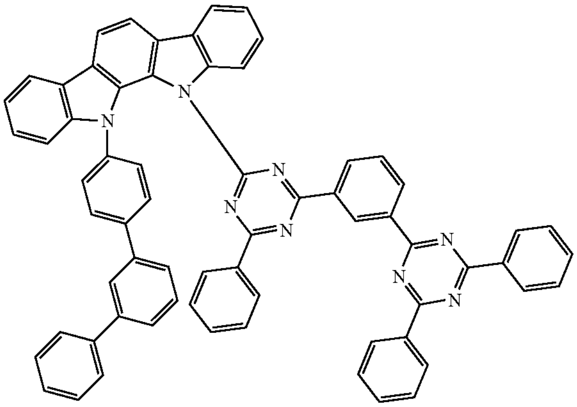

-continued
1-215
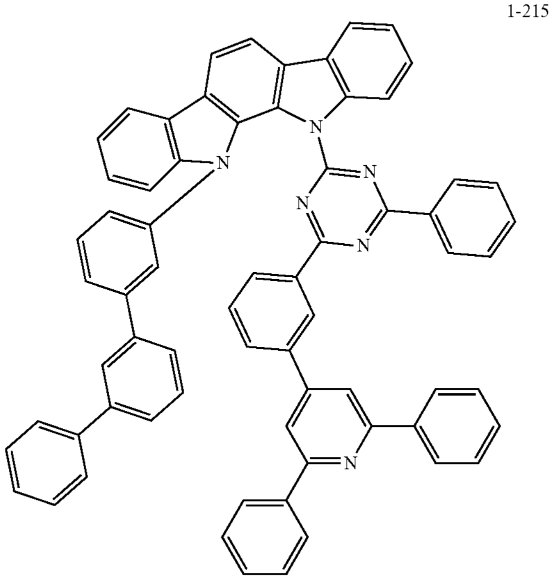
1-216
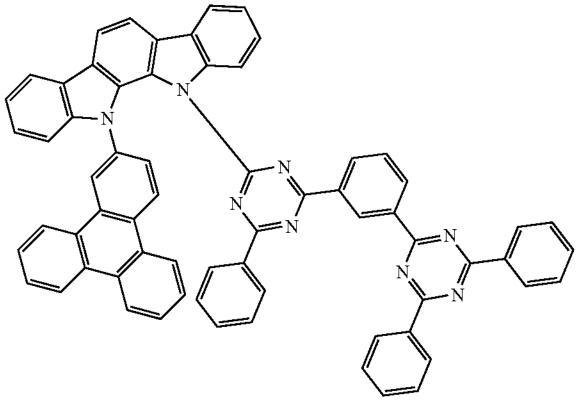
[Formula 24]
1-217
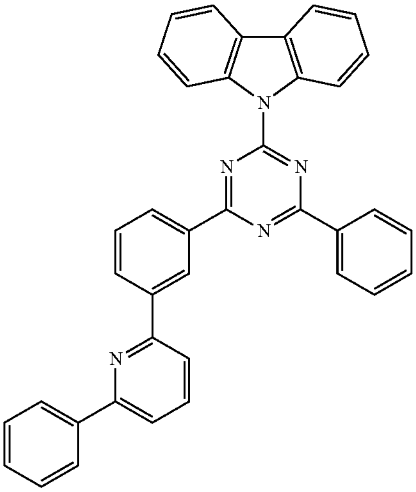
-continued
1-218
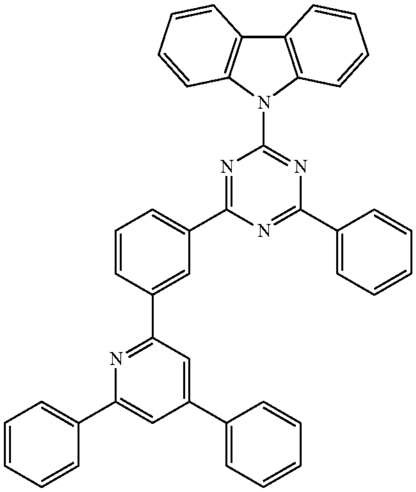
1-219
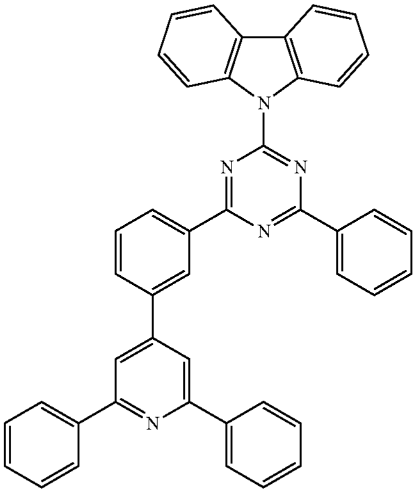
1-220
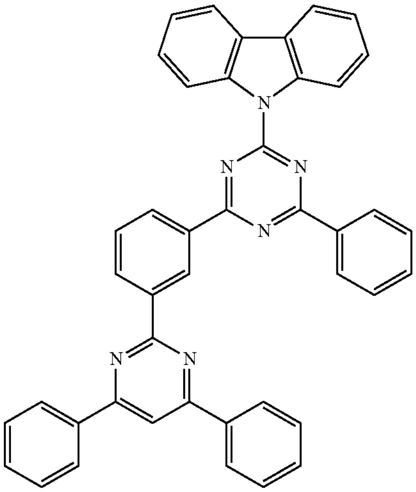

-continued
1-221
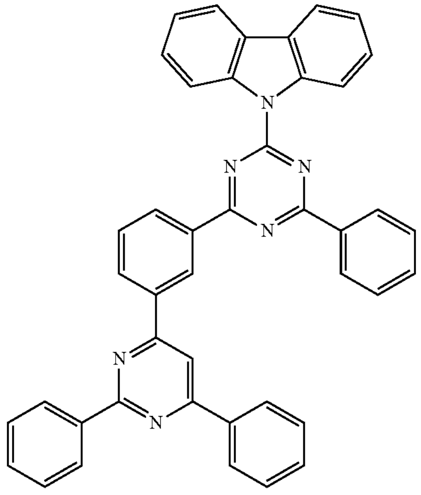
1-222
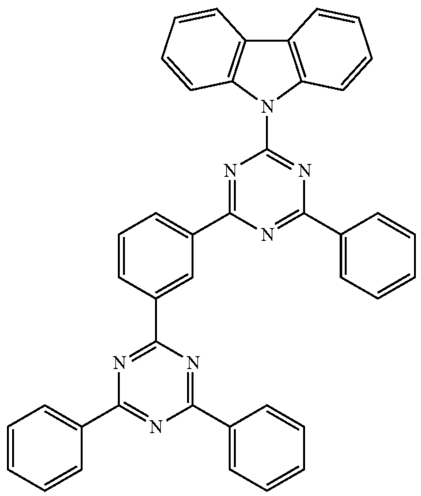
1-223
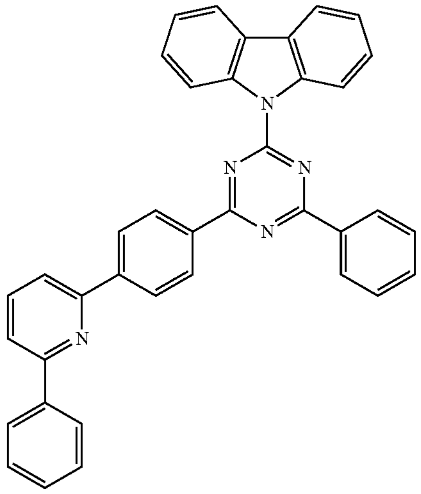
-continued
1-224
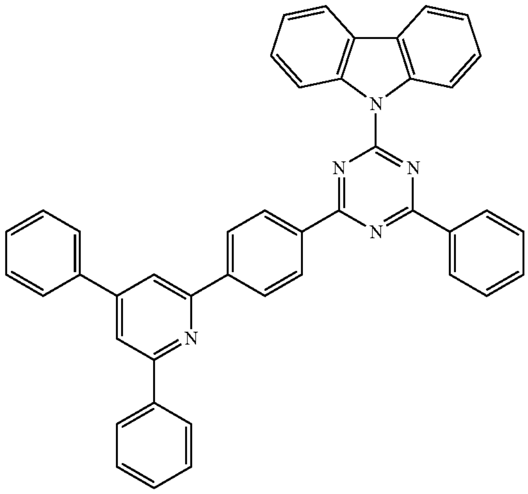
1-225
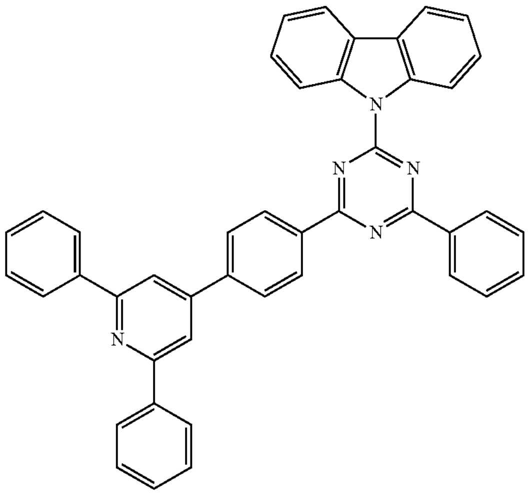
1-226
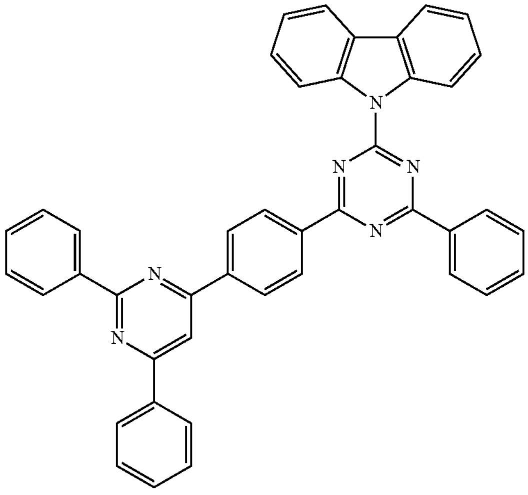

-continued
1-227
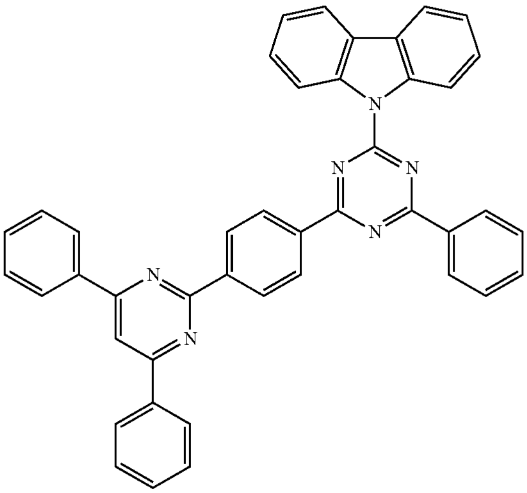
1-228
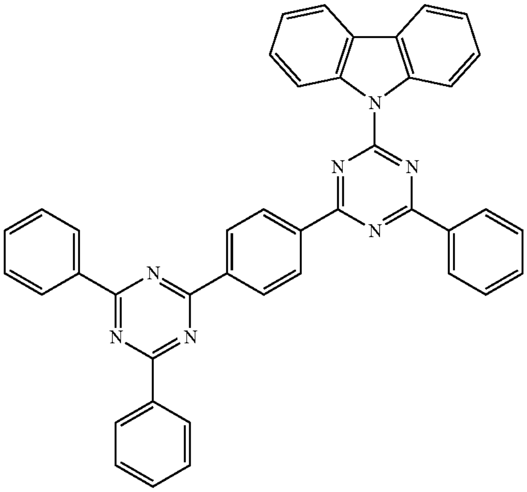
1-229
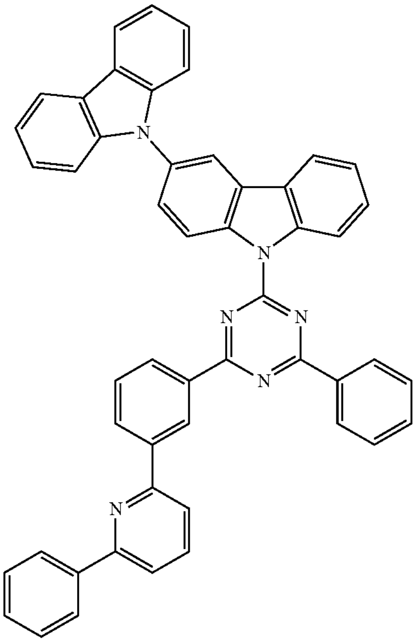
-continued
1-230
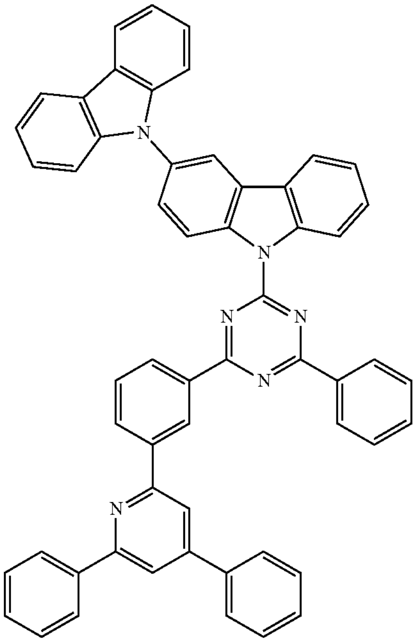
1-231
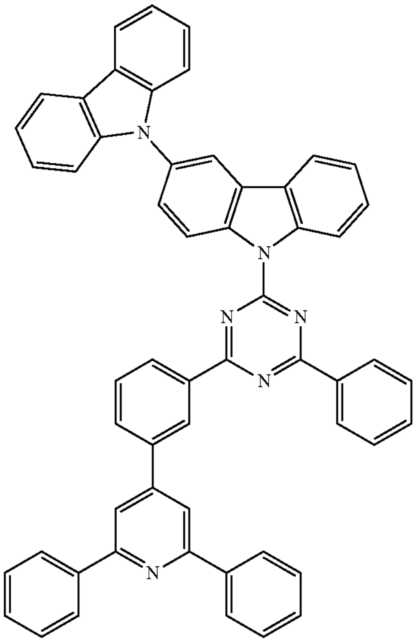

-continued
1-232
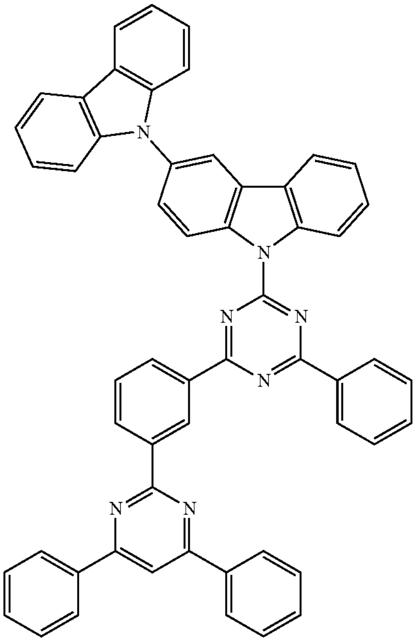
1-233
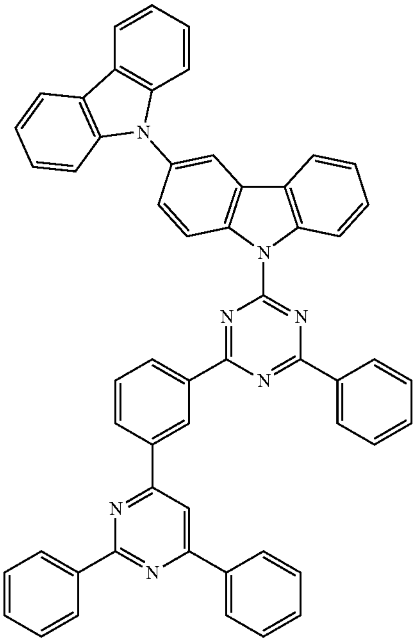
-continued
1-234
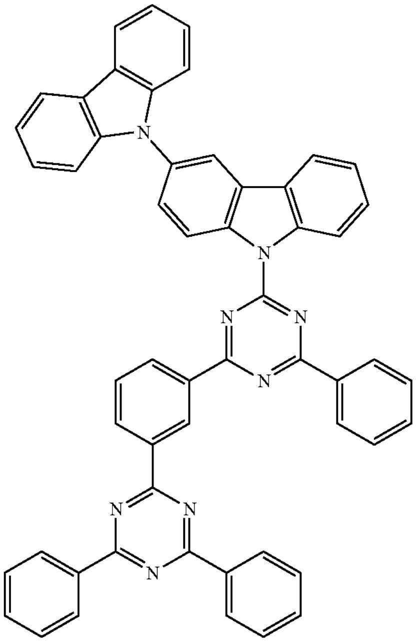
1-235
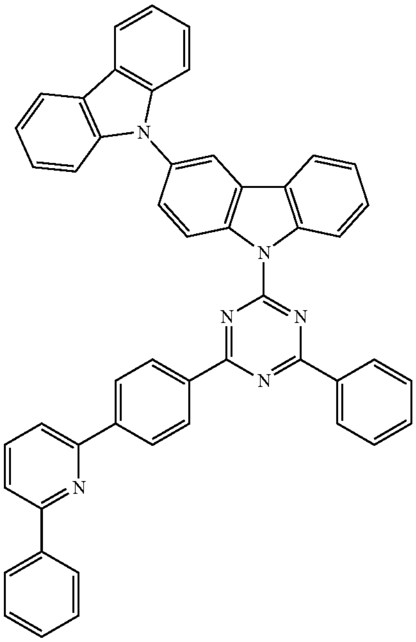

-continued 1-236

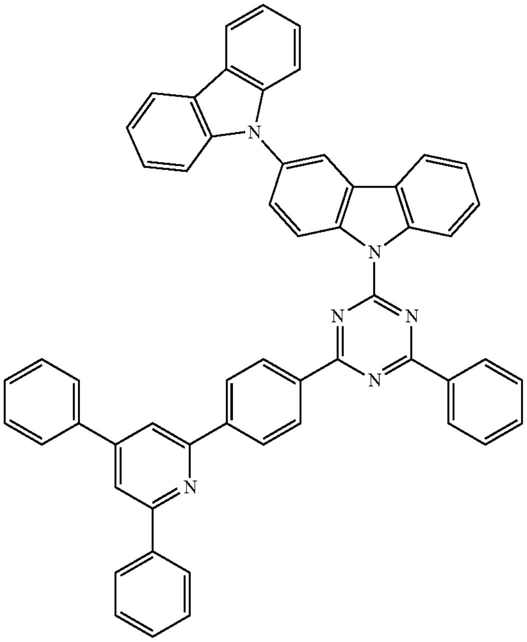

The general formula (2) representing the second host and formula (13) representing preferred aspects thereof will be described. In the general formula (2) and formula (13), the same symbols have the same meaning.

$Ar^{21}$ and $Ar^{22}$ independently represent hydrogen, a substituted or unsubstituted aromatic hydrocarbon group having 6 to 14 carbon atoms, or a substituted or unsubstituted linked aromatic group in which two of the aromatic rings in the aromatic hydrocarbon group are linked; preferably, hydrogen or an aromatic hydrocarbon group having 6 to 12 carbon atoms; and more preferably an aromatic hydrocarbon group having 6 to 10 carbon atoms.

In the case of unsubstituted $Ar^{21}$ and $Ar^{22}$ are aromatic hydrocarbon group or linked aromatic group, specific examples thereof include an aromatic group or linked aromatic group generated by removing one H from aromatic hydrocarbons such as benzene, naphthalene, anthracene, phenanthrene, fluorene and biphenyl, or a compound in which two aromatic rings of these aromatic hydrocarbons are linked. Preferred are aromatic groups generated from benzene, naphthalene, anthracene, phenanthrene, or linked aromatic groups in which two of the aromatic rings are linked to each other. More preferred are aromatic groups generated from benzene, naphthalene, phenanthrene or biphenyl. It is further preferred that $Ar^{21}$ and $Ar^{22}$ are a phenyl group.

$Ar^{21}$ and $Ar^{22}$ may be hydrogen; but in that case, one of them is preferably the aromatic group or linked aromatic group. It is further preferred that $Ar^3$ is hydrogen and $Ar^4$ is a phenyl group. In addition, the aromatic group or linked aromatic group may have a substituent, and preferred substituents are an alkyl group having 1 to 12 carbon atoms or an alkoxy group having 1 to 12 carbon atoms.

$L^{21}$ and $L^{22}$ are a phenylene group, and the phenylene group may be any of o-phenylene group, m-phenylene group and p-phenylene group. Preferred is p-phenylene group or m-phenylene group.

Specific examples of the compounds represented by the general formula (2) and formula (13) are described below, but the compounds are not limited to these exemplified compounds.

[Formula 25]

2-1

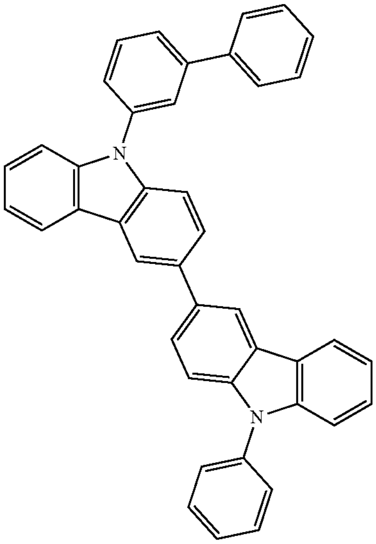

2-2

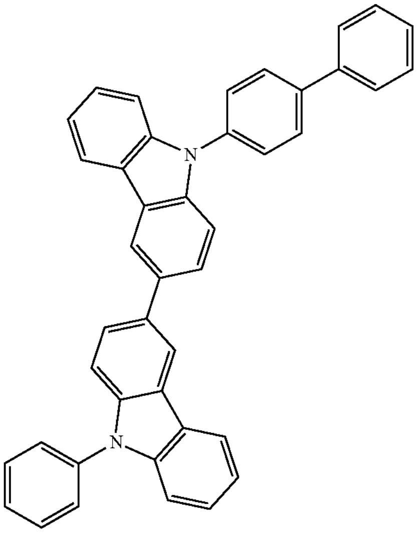

-continued
2-3
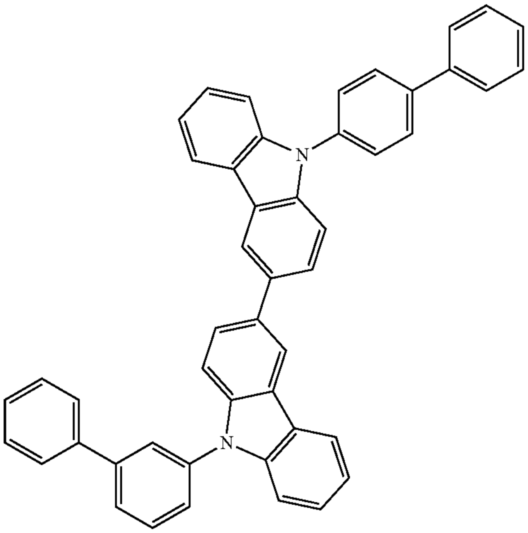
2-4
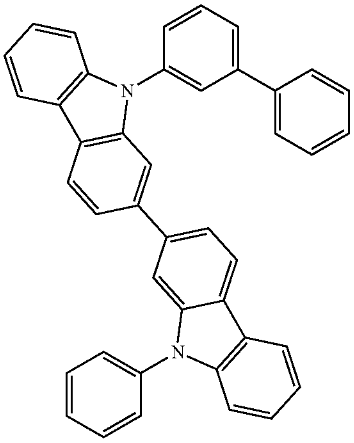
2-5
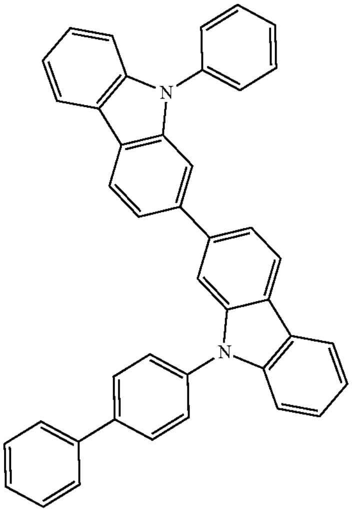
-continued
2-6
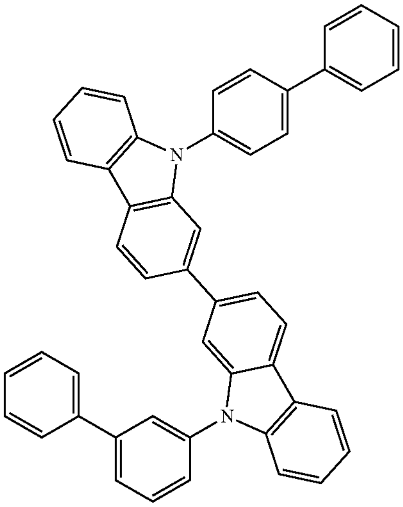
2-7
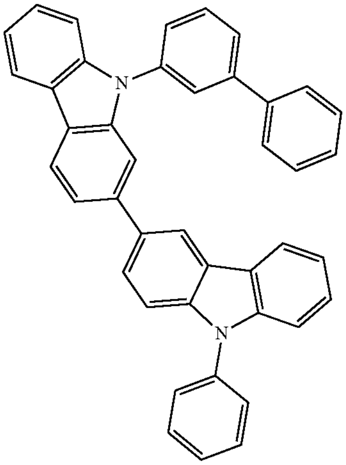
2-8
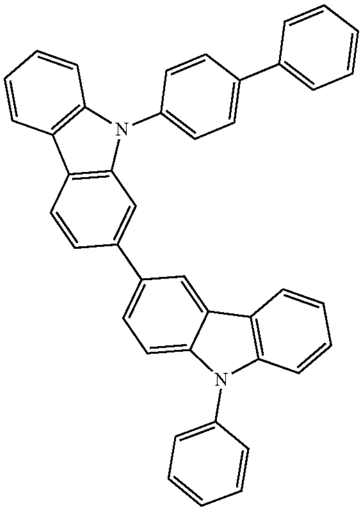

-continued
2-9
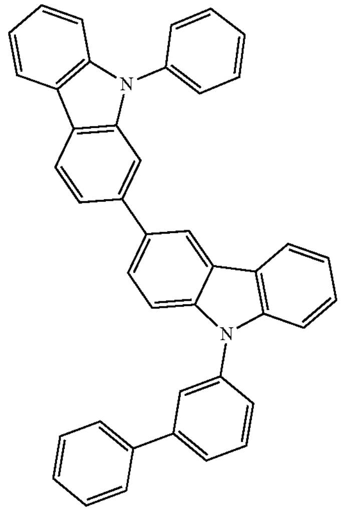
2-10
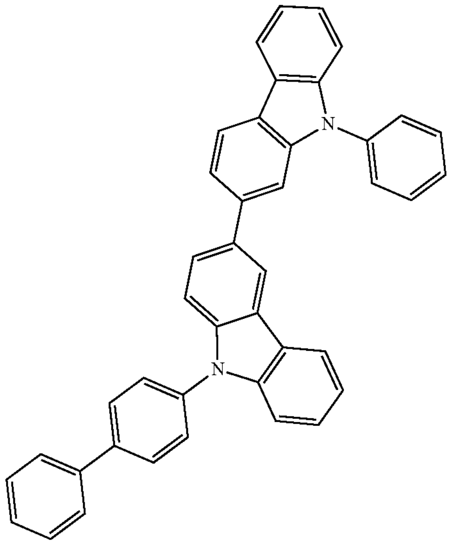
2-11
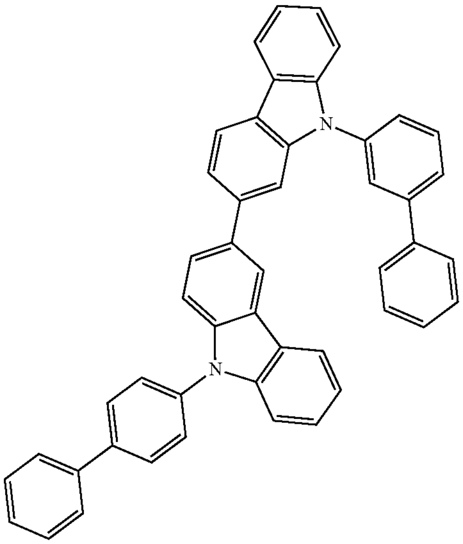
-continued
2-12
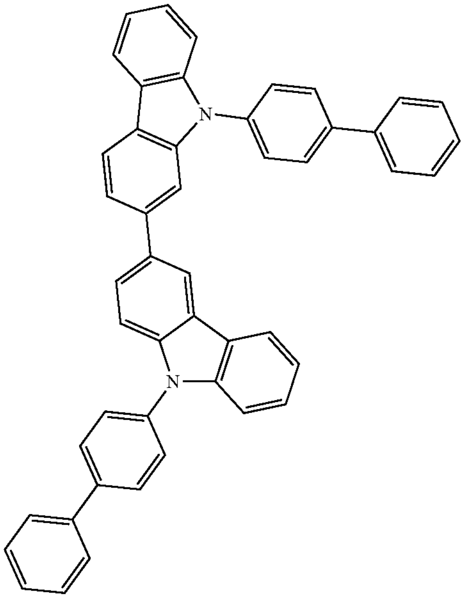
2-13
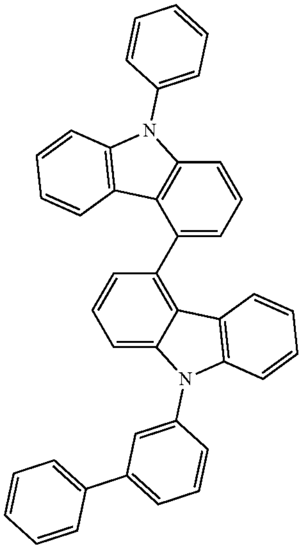

-continued
2-14
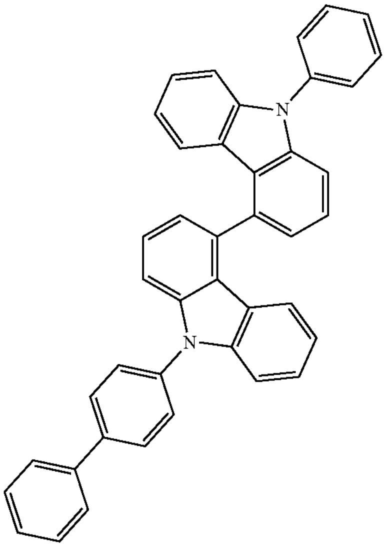
2-15
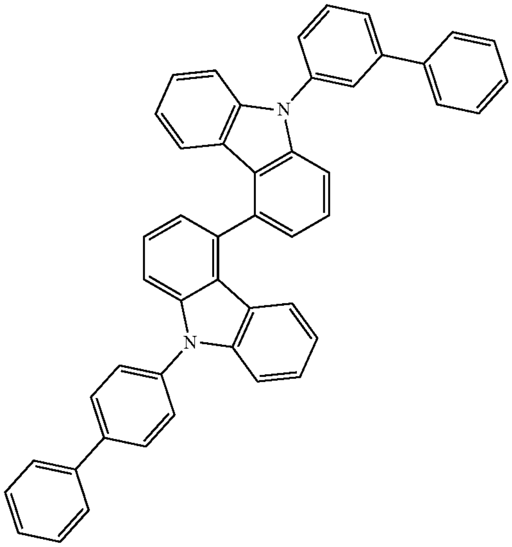
2-16
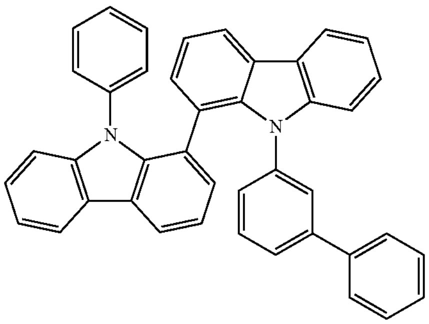
-continued
2-17
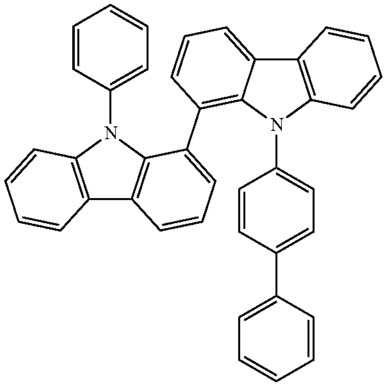
2-18
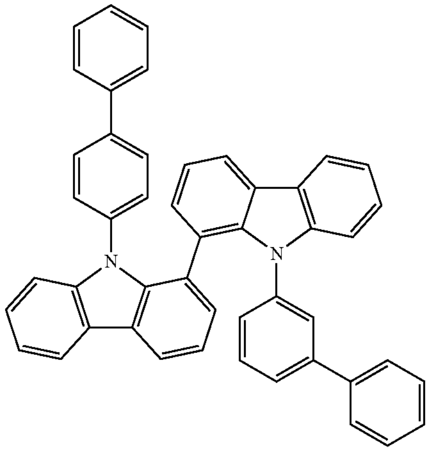
2-19
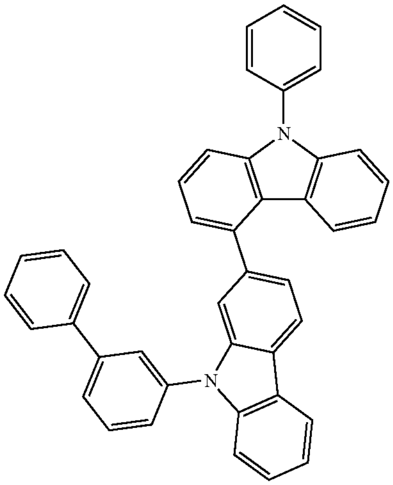

-continued
2-20
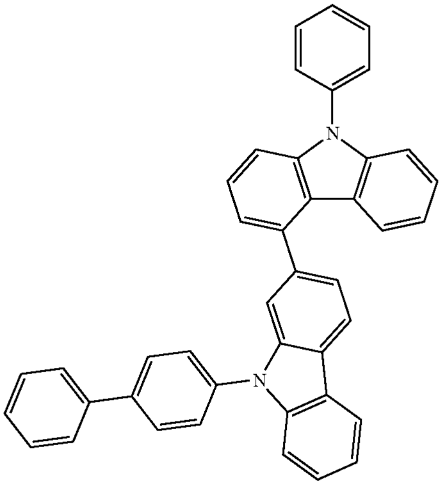
[Formula 26]
2-21
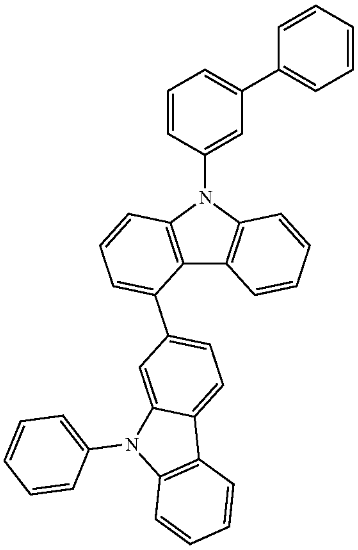
-continued
2-22
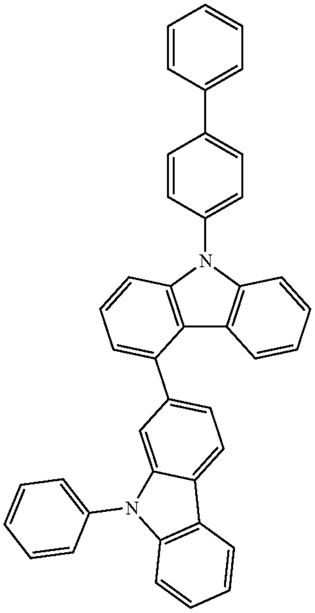
2-23
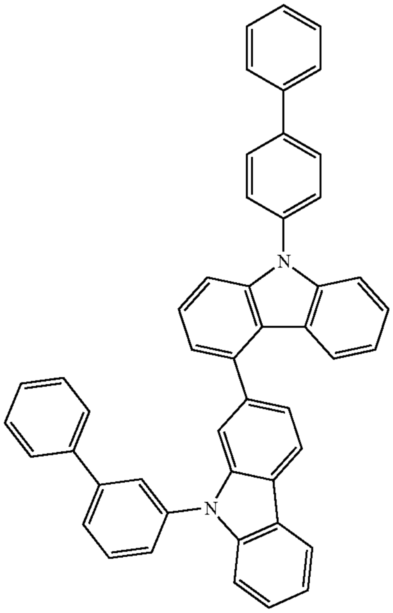

-continued
2-24
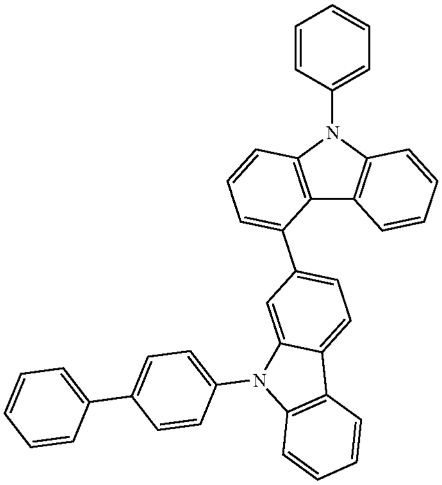
2-25
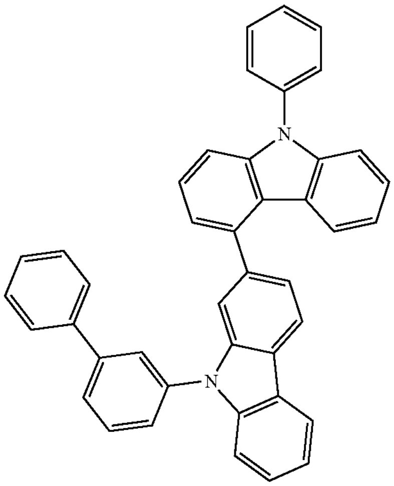
2-26
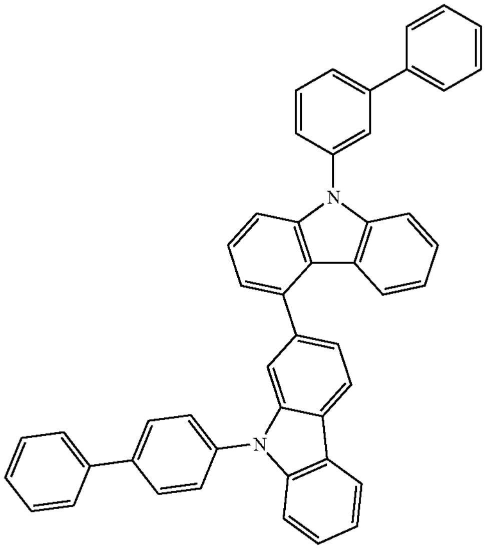
-continued
2-27
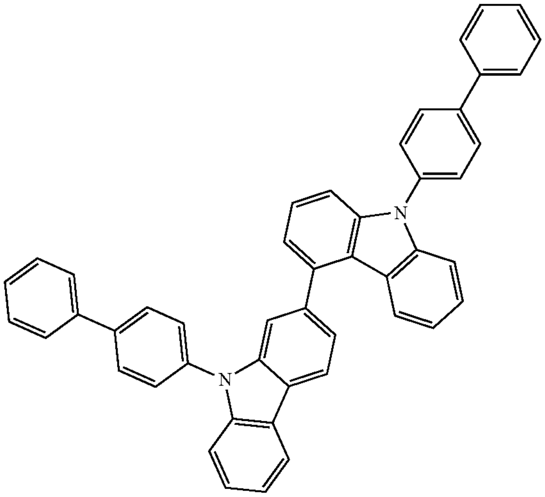
2-28
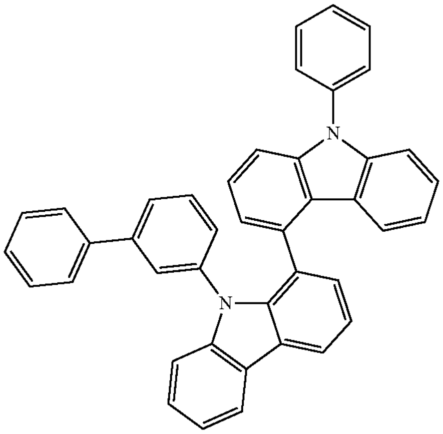
2-29
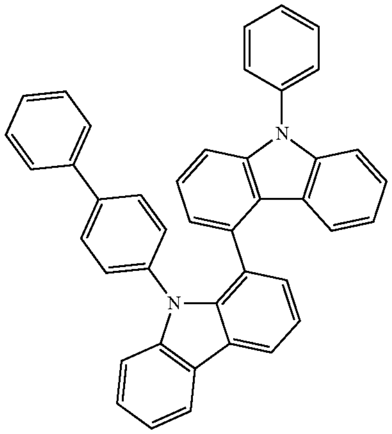

-continued
2-30
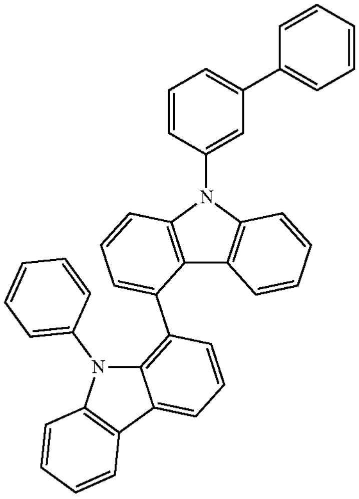
2-31
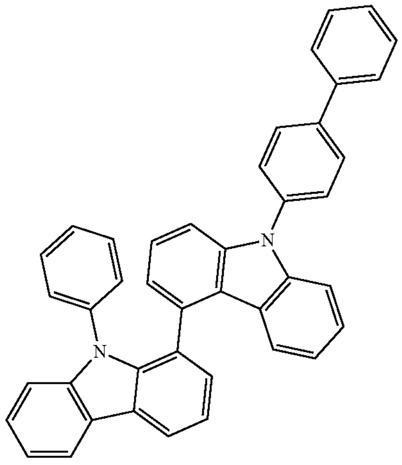
2-32
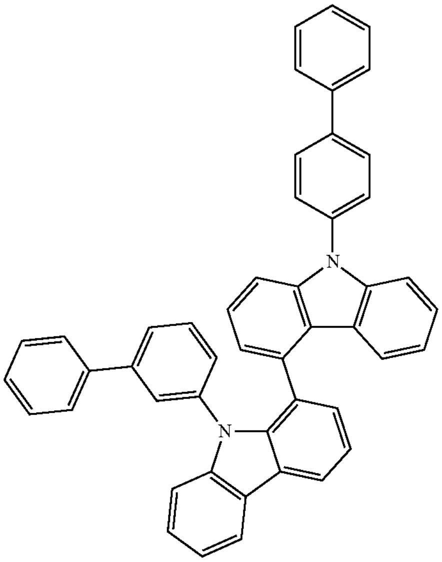
-continued
2-33
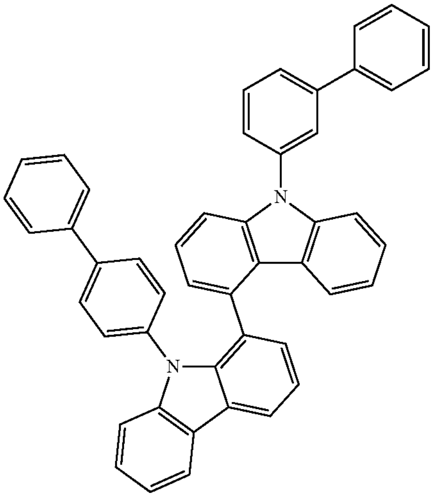
2-34
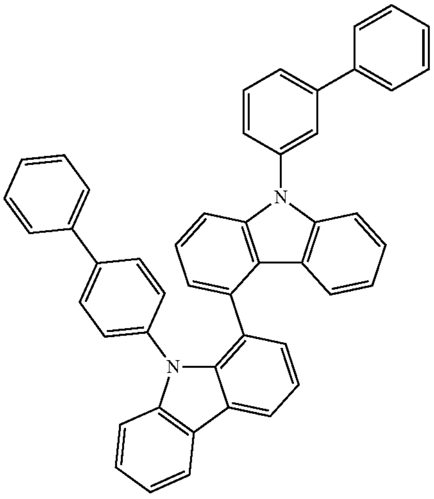
2-35
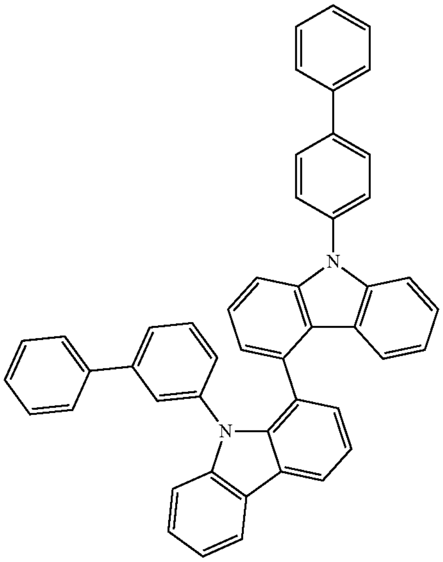

-continued
2-36
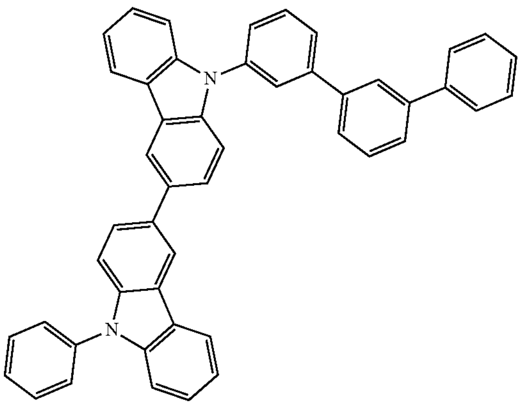
2-37
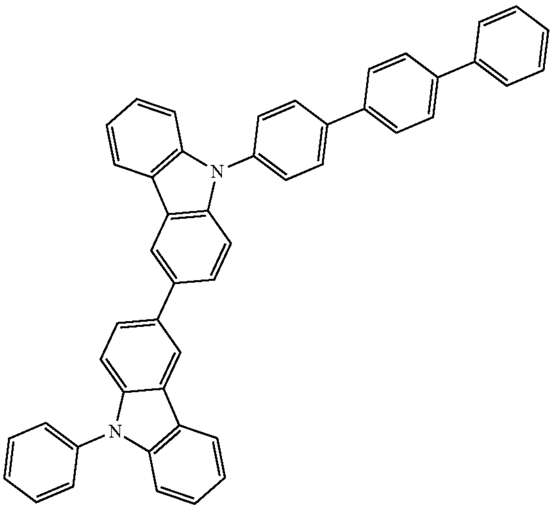
2-38
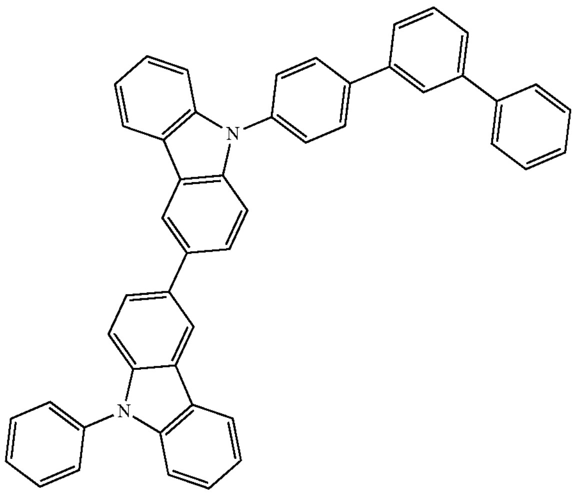
-continued
2-39
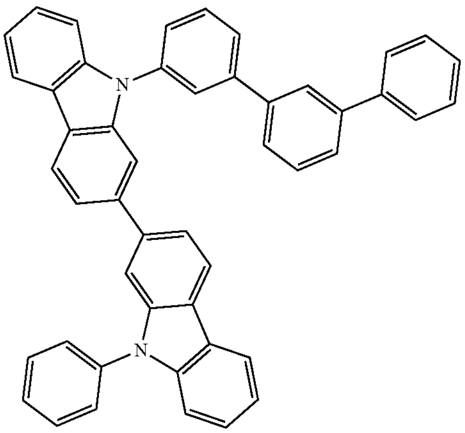
2-40
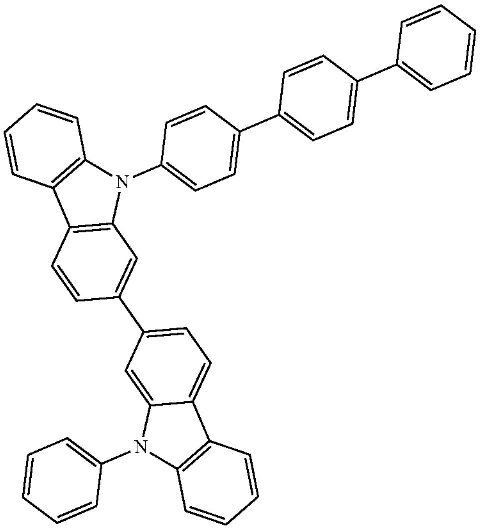
2-41
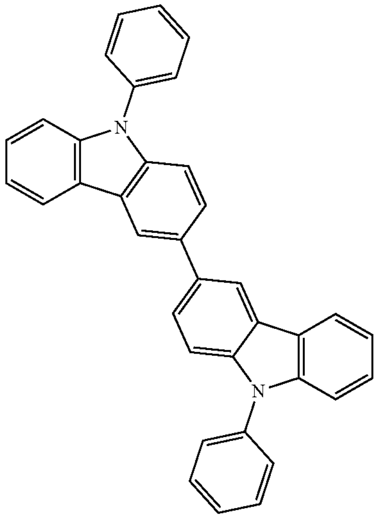

-continued 2-42

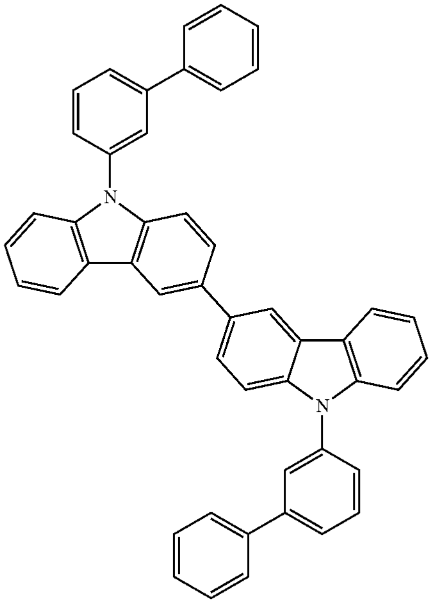

2-43

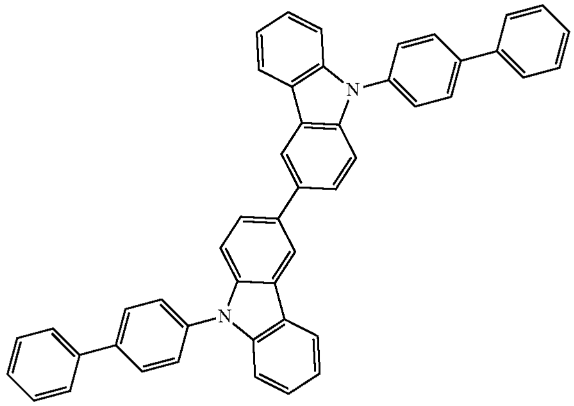

2-44

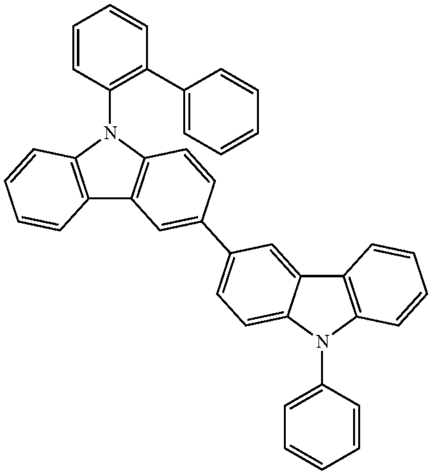

Next, the general formula (3) will be described.

In the general formula (3), the ring c is a heterocycle represented by formula (3a) and the ring c is fused to an adjacent ring at any position.

$R^{03}$ and $R^{32}$ independently represent hydrogen, deuterium, an aliphatic hydrocarbon group having 1 to 10 carbon atoms, a substituted or unsubstituted aromatic hydrocarbon group having 6 to 30 carbon atoms, or a substituted or unsubstituted aromatic heterocyclic group having 3 to 16 carbon atoms. Preferred is hydrogen, an aliphatic hydrocarbon group having 1 to 8 carbon atoms, a substituted or unsubstituted aromatic hydrocarbon group having 6 to 10 carbon atoms, or a substituted or unsubstituted aromatic heterocyclic group having 3 to 12 carbon atoms. More preferred is hydrogen, an aliphatic hydrocarbon group having 1 to 6 carbon atoms, a substituted or unsubstituted phenyl group, or a substituted or unsubstituted aromatic heterocyclic group having 3 to 6 carbon atoms.

When $R^{03}$ and $R^{32}$ represent an aliphatic hydrocarbon group, the group may be linear, branched or cyclic, and specific examples thereof include methyl, ethyl, propyl, butyl, t-butyl, pentyl, hexyl, cyclohexyl, heptyl, octyl, nonyl, and decyl. Preferred is an alkyl group having 1 to 4 carbon atoms.

$R^{31}$ represents a substituted or unsubstituted aromatic hydrocarbon group having 6 to 10 carbon atoms, a carbazolyl group, or a substituted or unsubstituted linked aromatic group in which two to five of these aromatic rings are linked to each other. The aromatic ring is here selected from an aromatic hydrocarbon ring and a carbazole ring.

Preferred is a substituted or unsubstituted aromatic hydrocarbon group having 6 to 10 carbon atoms, a carbazolyl group, or a substituted or unsubstituted linked aromatic group in which two to three of these aromatic groups are linked to each other.

In the case of $R^{03}$ and $R^{32}$ being an unsubstituted aromatic hydrocarbon group or aromatic heterocyclic group, specific examples thereof include an aromatic group generated by removing one H from benzene, naphthalene, pyridine, pyrimidine, triazine, thiophene, isothiazole, thiazole, pyridazine, pyrrole, pyrazole, imidazole, triazole, thiadiazole, pyrazine, furan, isoxazole, oxazole, oxadiazole, quinoline, isoquinoline, quinoxaline, quinazoline, oxadiazole, thiadiazole, benzotriazine, phthalazine, tetrazole, indole, benzofuran, benzothiophene, benzoxazole, benzothiazole, indazole, benzimidazole, benzotriazole, benzisothiazole, benzothiadiazole, dibenzofuran, dibenzothiophene, dibenzoselenophene, or carbazole. Preferred are aromatic groups generated from benzene, pyridine, pyrimidine, triazine, thiophene, isothiazole, thiazole, pyridazine, pyrrole, pyrazole, imidazole, triazole, thiadiazole, pyrazine, furan, isoxazole, oxazole, oxadiazole, quinoline, isoquinoline, quinoxaline, quinazoline, oxadiazole, thiadiazole, benzotriazine, phthalazine, tetrazole, indole, benzofuran, benzothiophene, benzoxazole, benzothiazole, indazole, benzimidazole, benzotriazole, benzisothiazole, and benzothiadiazole. More preferred are aromatic groups generated from benzene, pyridine, pyrimidine, triazine, thiophene, isothiazole, thiazole, pyridazine, pyrrole, pyrazole, imidazole, triazole, thiadiazole, pyrazine, furan, isoxazole, oxazole, and oxadiazole.

$L^{31}$ independently represents a substituted or unsubstituted aromatic hydrocarbon group having 6 to 30 carbon atoms, or a substituted or unsubstituted aromatic heterocyclic group having 3 to 16 carbon atoms. Preferred examples of the aromatic hydrocarbon group or aromatic heterocyclic group are the same as in the case where $R^{03}$ is of these groups except that these groups are a divalent group.

f is the number of repetitions and represents an integer of 1 to 3, g is the number of repetitions and represents an integer of 0 to 3, and h represents the number of substitutions and each independently represents an integer of 1 to 7. Preferably, f is 1, g is 0 to 1, and h is 1 to 2.

The compound represented by the general formula (3) is preferably the compound represented by the formula (14) or (15).
In formula (14) or (15), ring c, $R^{03}$, $R^{32}$, $Ar^{31}$, g and h are as defined for the general formula (3).
Specific examples of the indolocarbazole compound represented by the general formula (3) are described below, but the compound is not limited thereto.
[Formula 27]
3-1
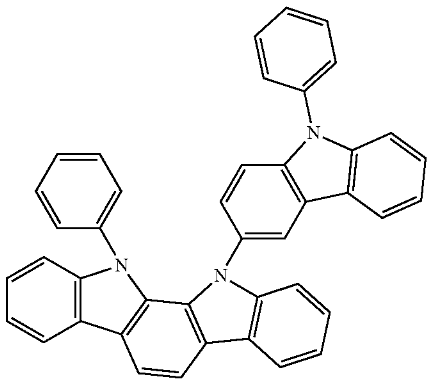
3-2
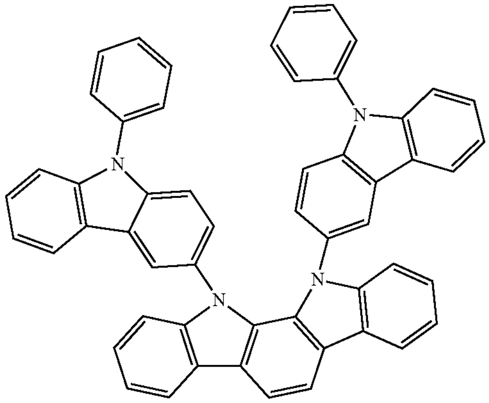
3-3
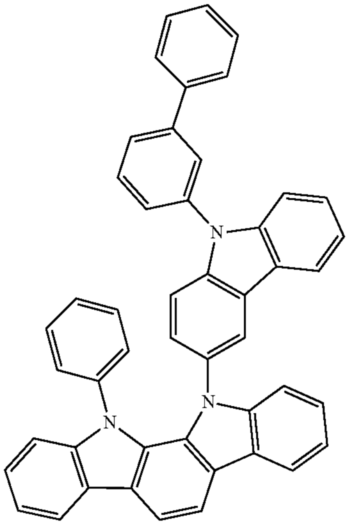
-continued
3-4
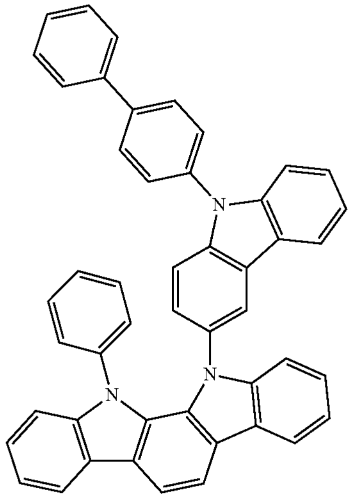
3-5
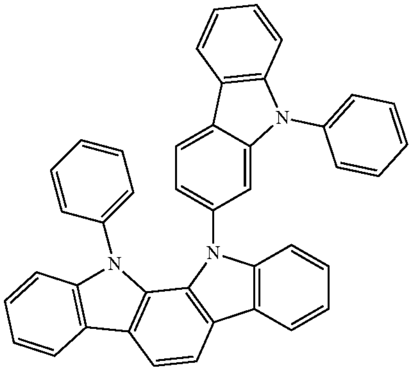
3-6
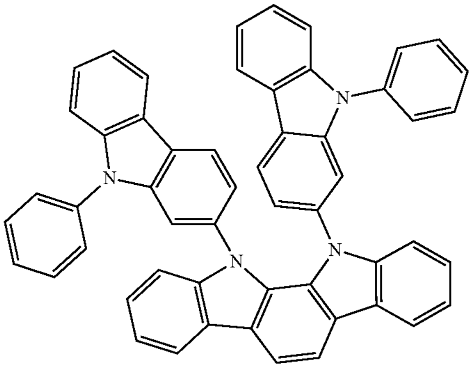
3-7
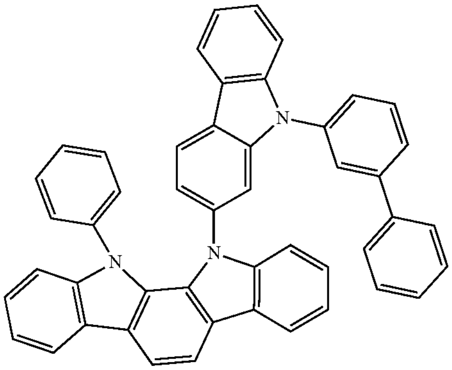

-continued
3-8
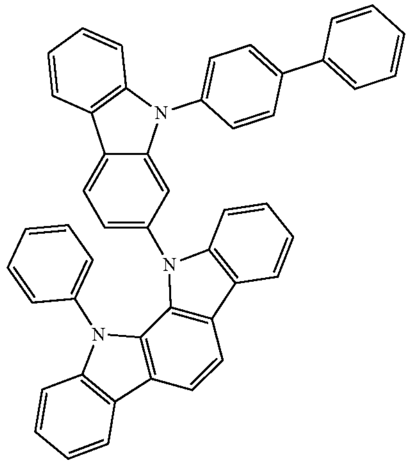
3-9
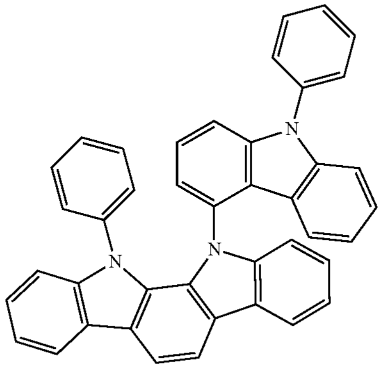
3-10
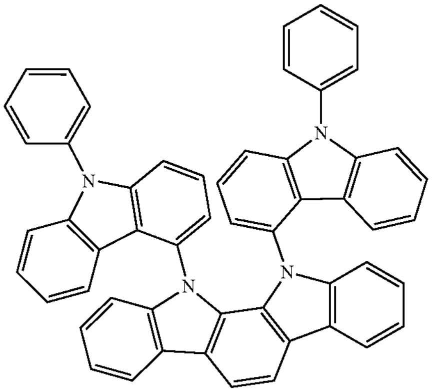
3-11
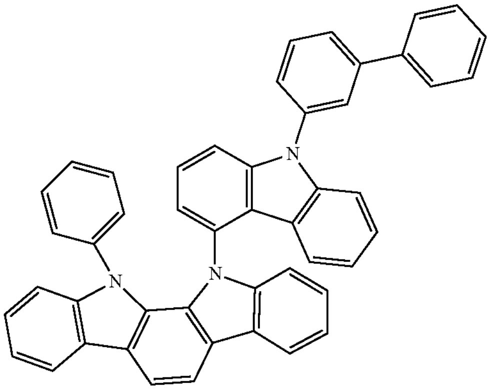
-continued
3-12
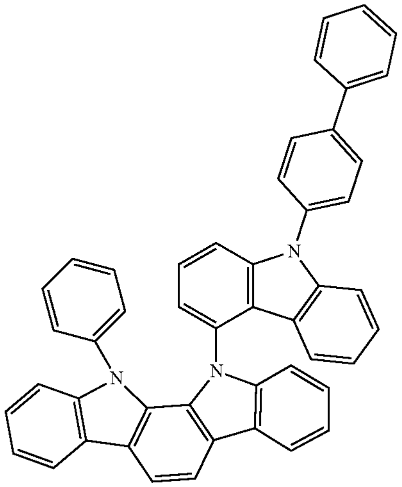
3-13
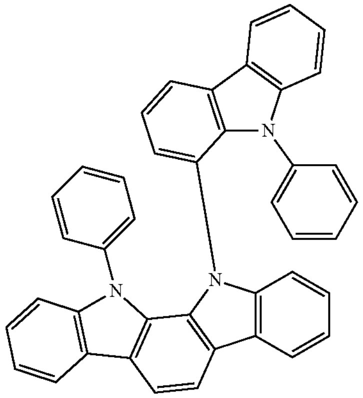
3-14
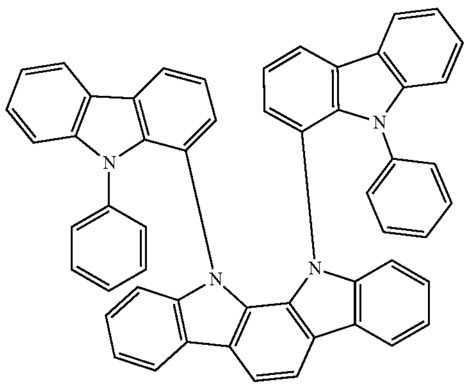

-continued
3-15
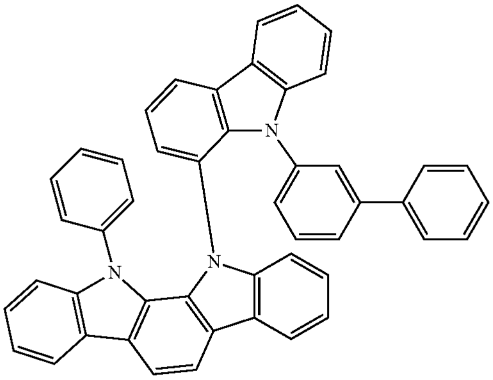
3-16
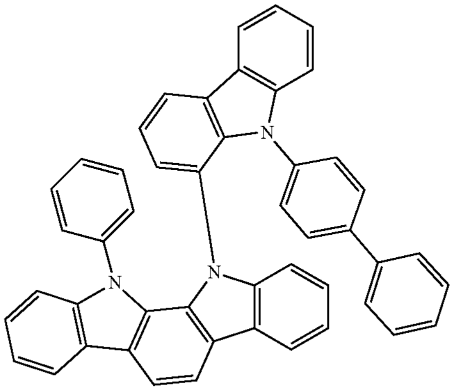
3-17
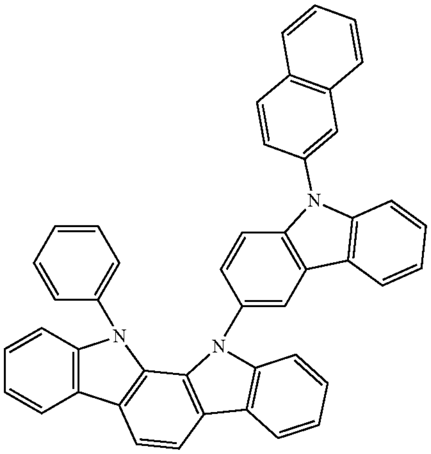
3-18
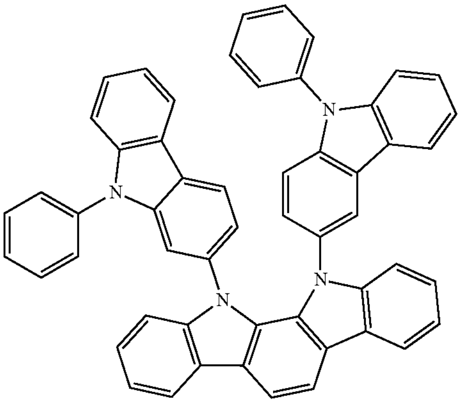
-continued
3-19
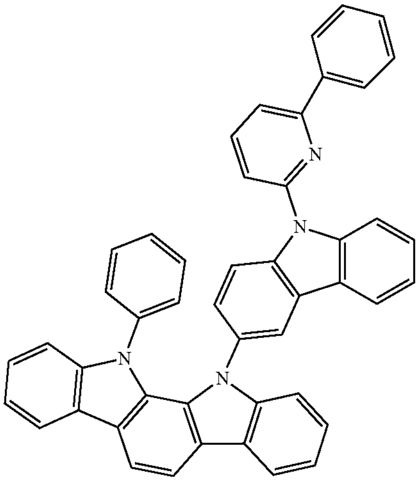
3-20
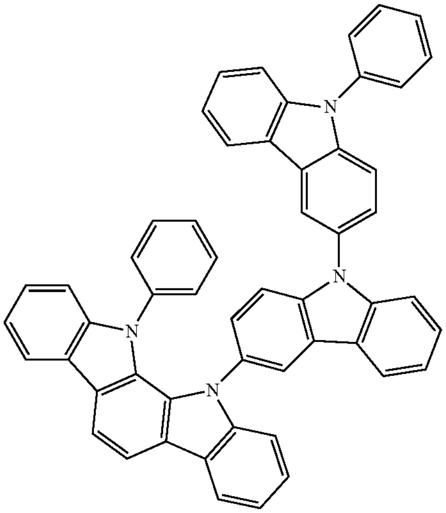
[Formula 28]
3-21
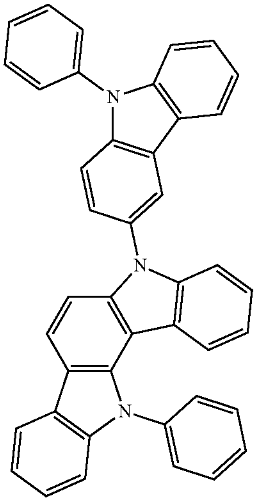

-continued
3-22
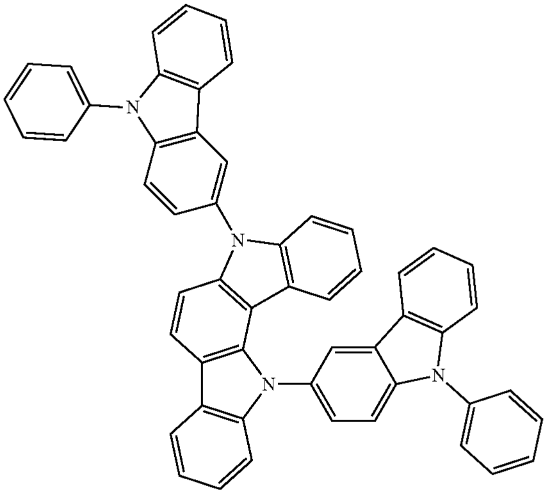
3-23
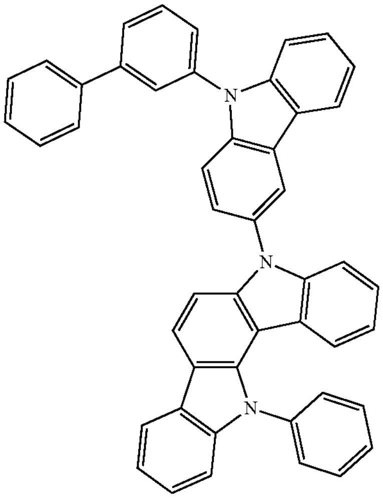
3-24
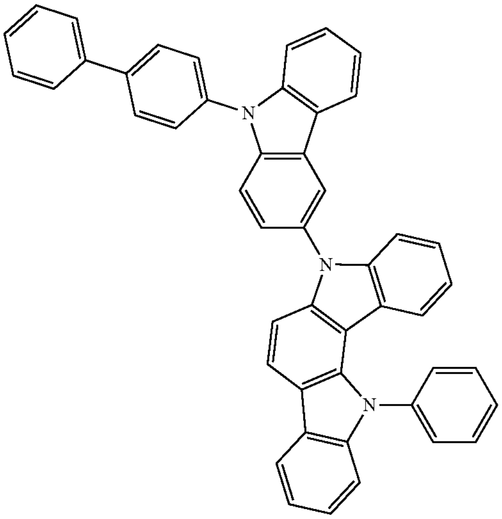
-continued
3--25
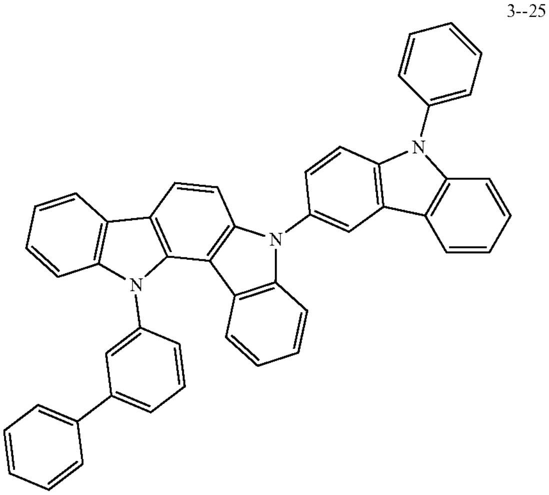
3-26
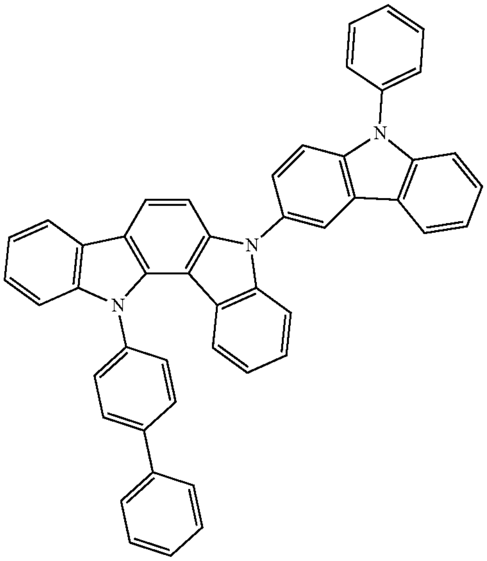

-continued
3-27
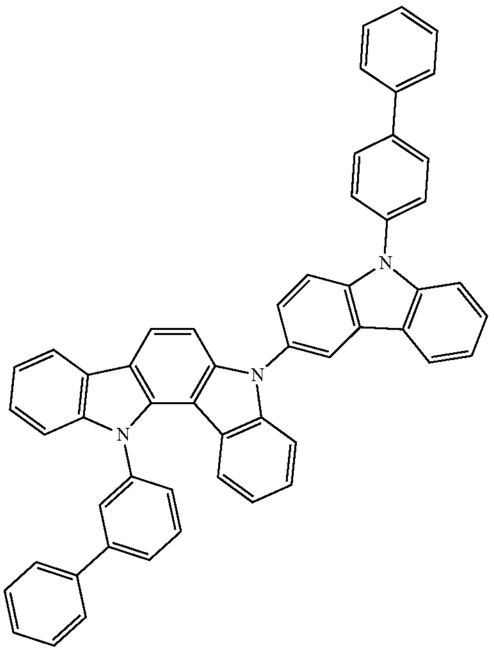
3-28
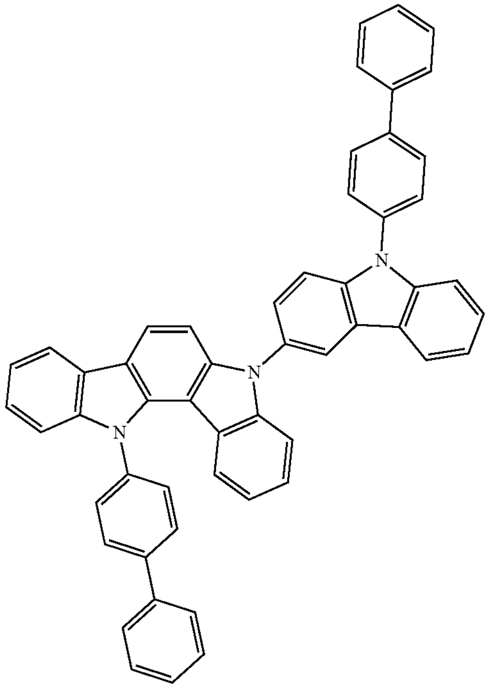
-continued
3-29
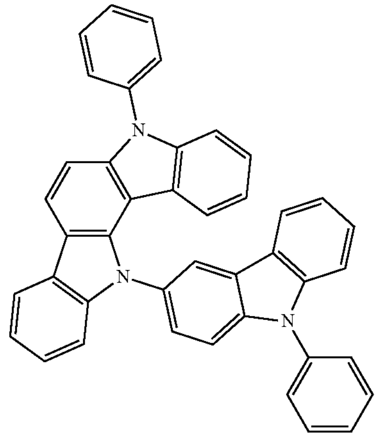
3-30
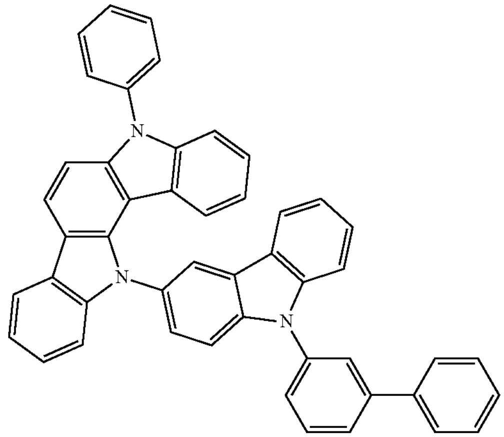
3-31
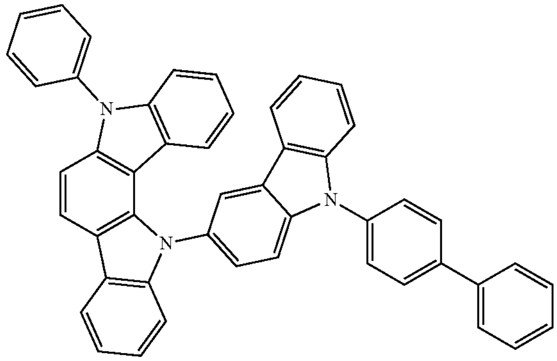

-continued
3-32
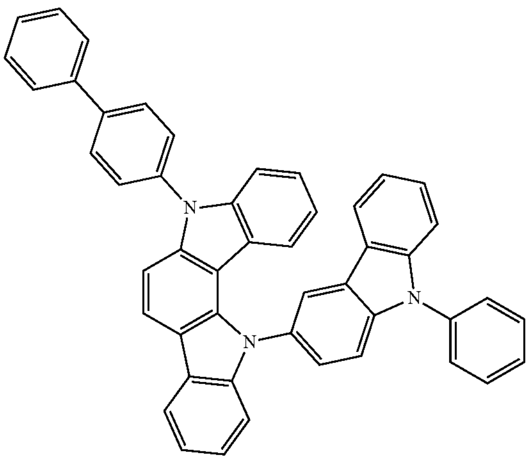
3-33
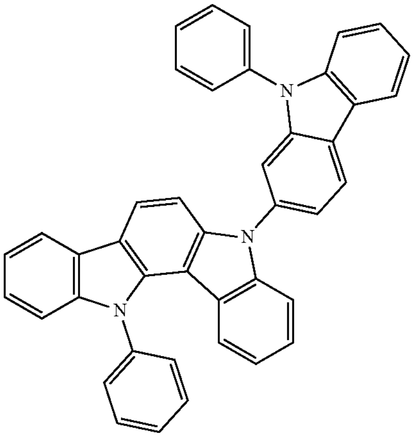
3-34
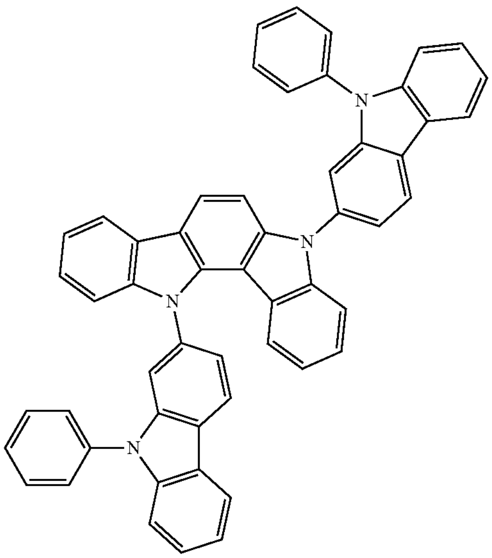
-continued
3-35
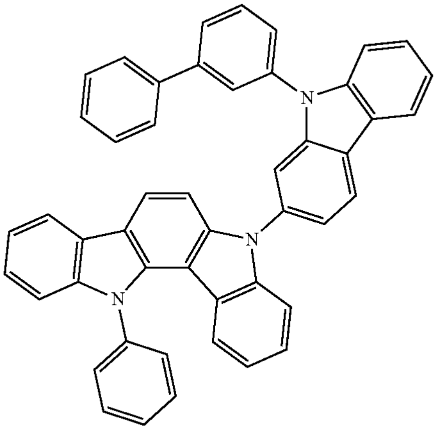
3-36
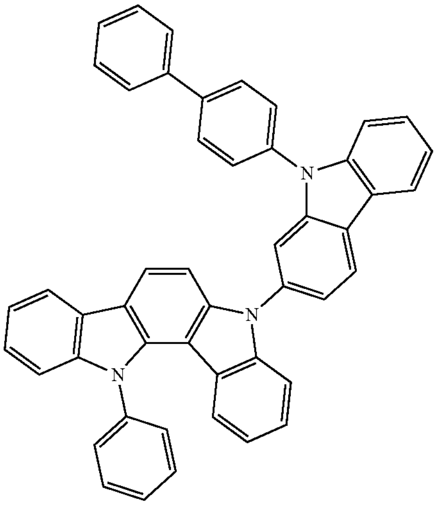
3-37
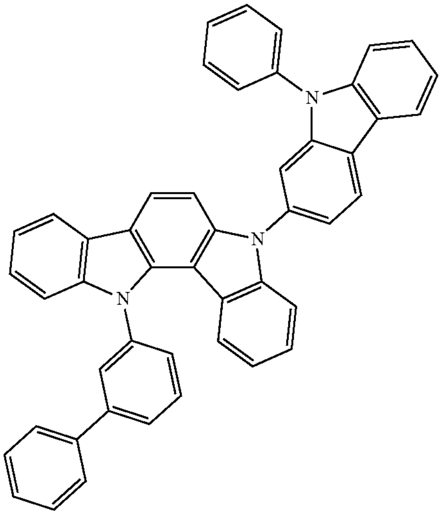

-continued
3-38
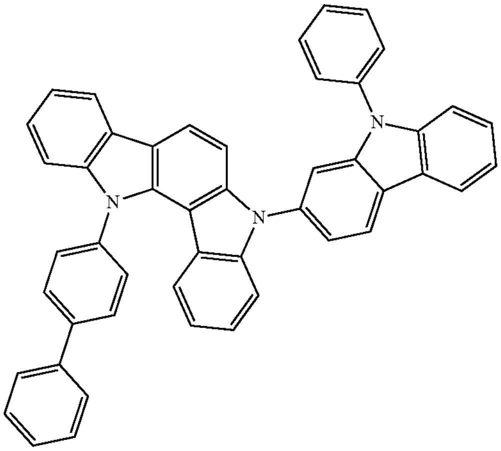
3-39
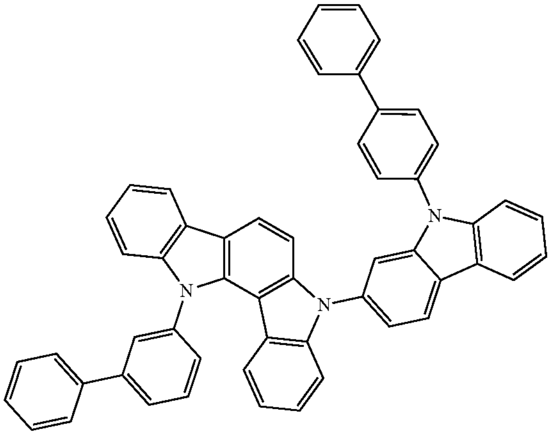
3-40
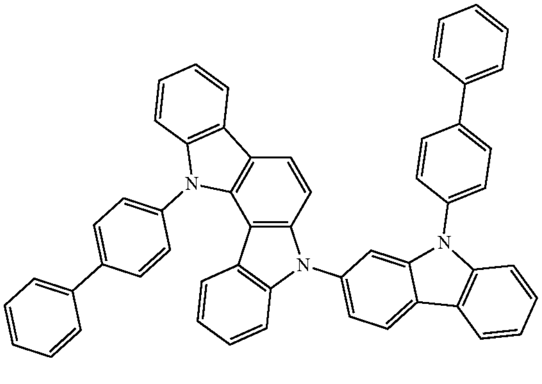
-continued
[Formula 29]
3-41
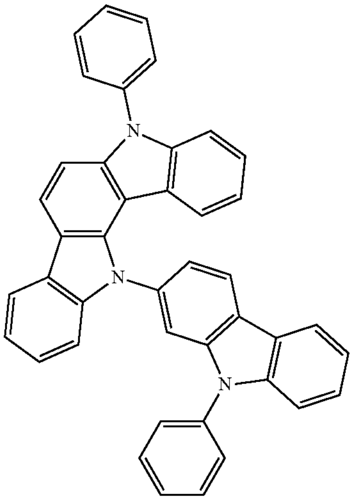
3-42
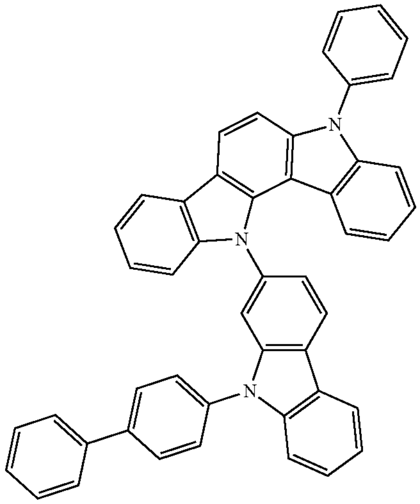
3-43
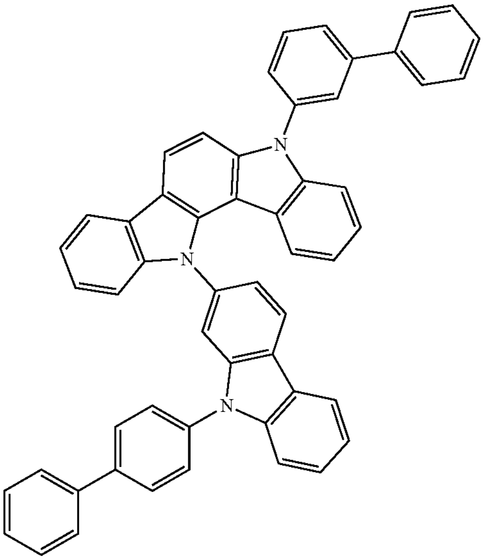

-continued
3-44
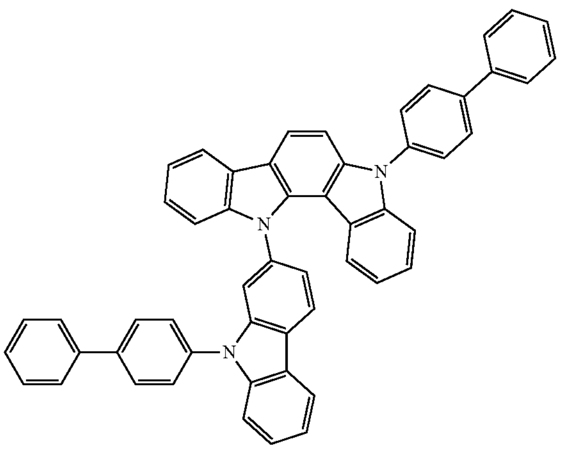
3-45
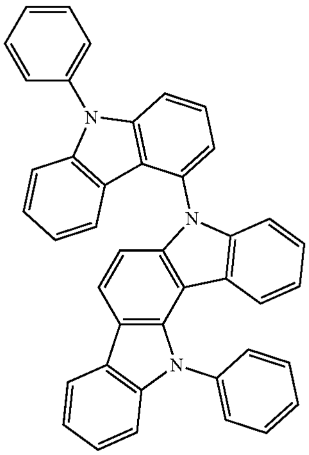
3-46
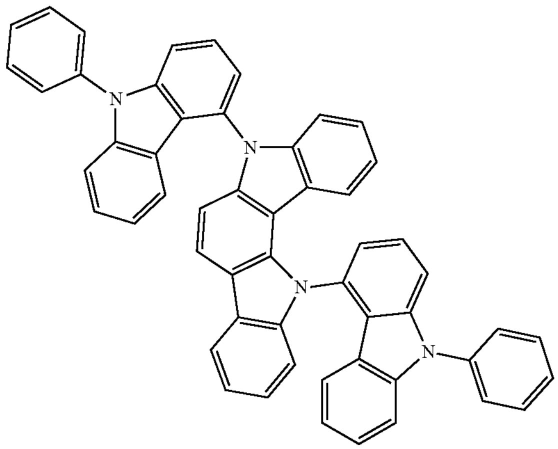
-continued
3-47
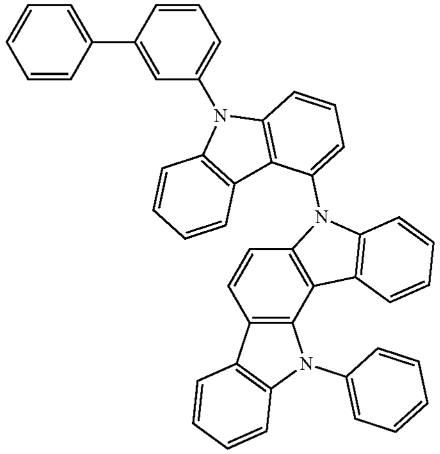
3-48
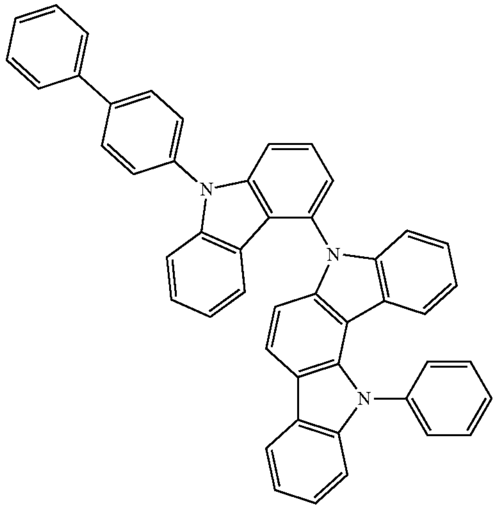
3-49
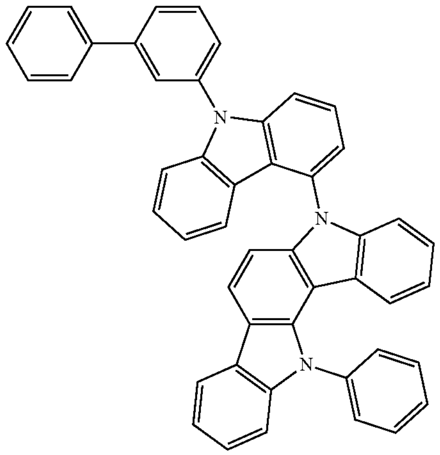

-continued
3-50
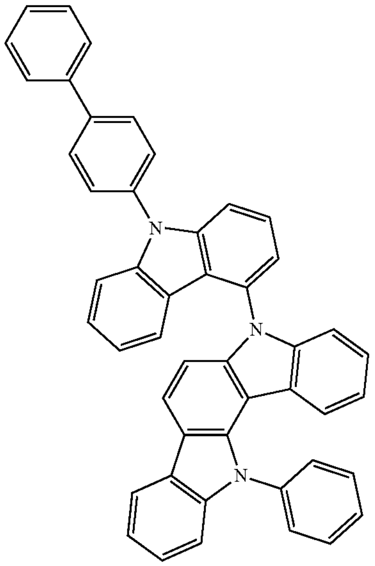
3-51
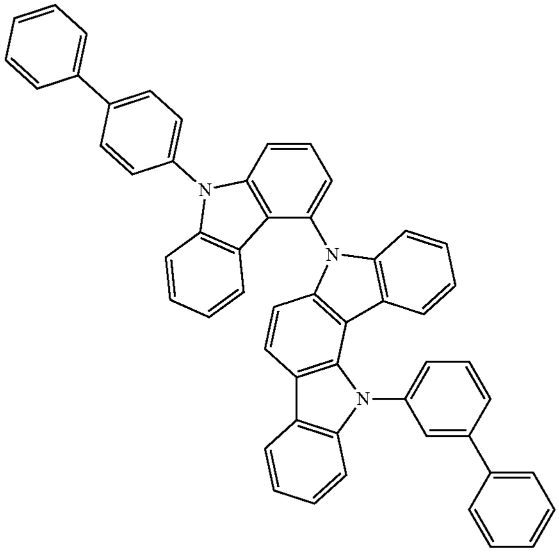
3-52
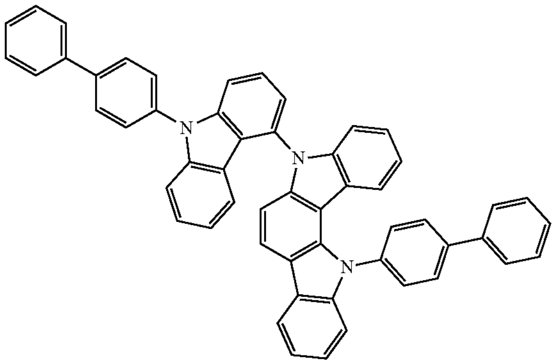
-continued
3-53
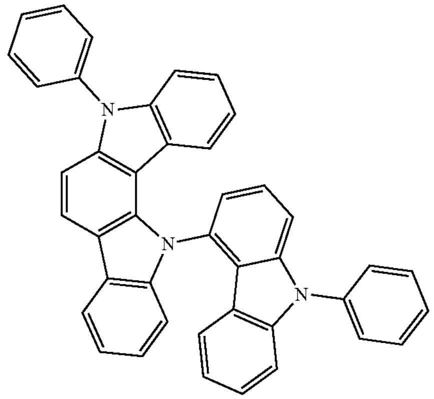
3-54
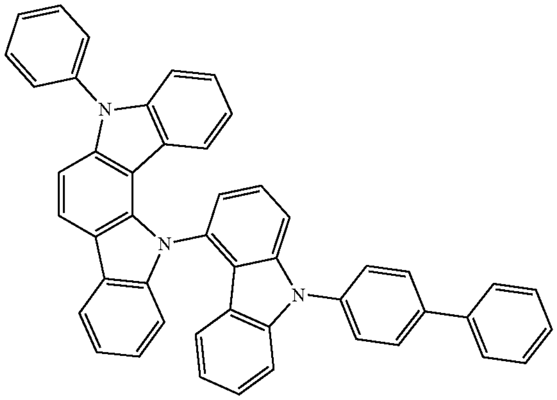
3-55
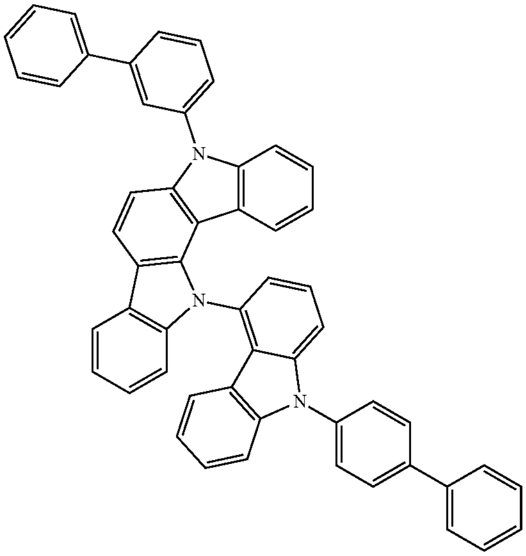

-continued
3-56
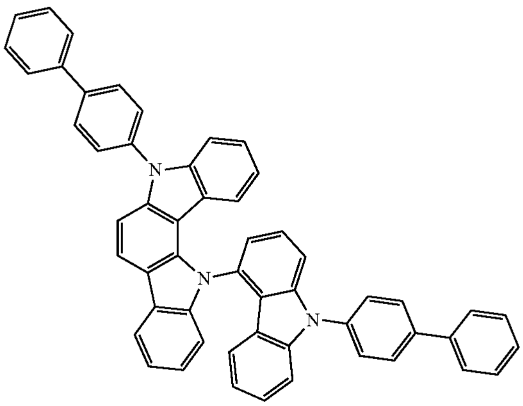
3-57
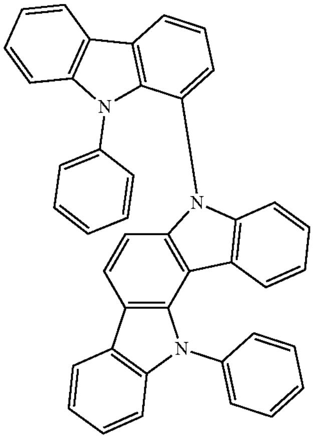
3-58
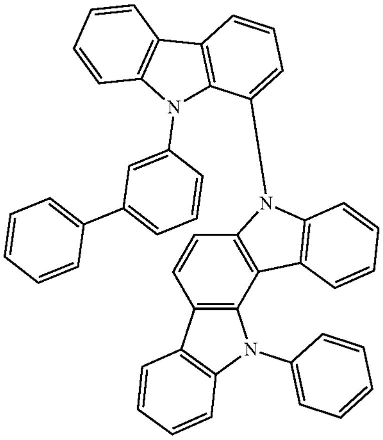
-continued
3-59
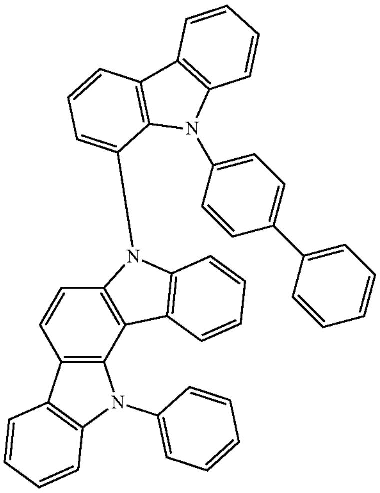
3-60
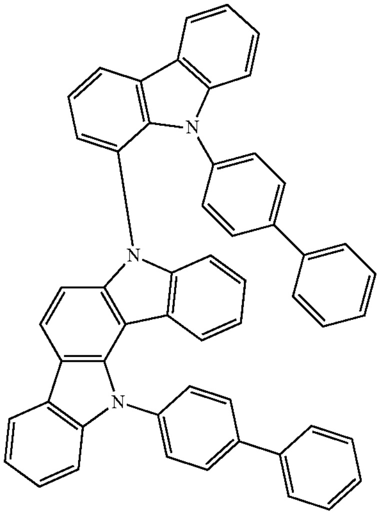
[Formula 30]
3-61
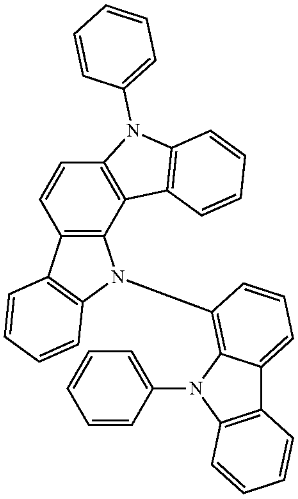

-continued
3-62
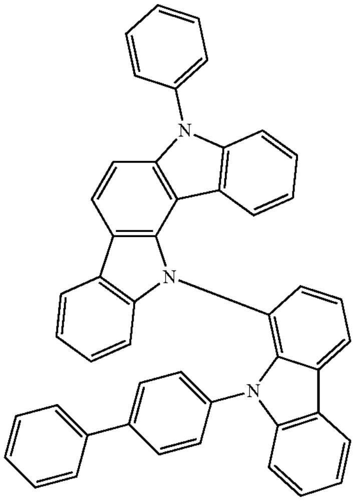
3-63
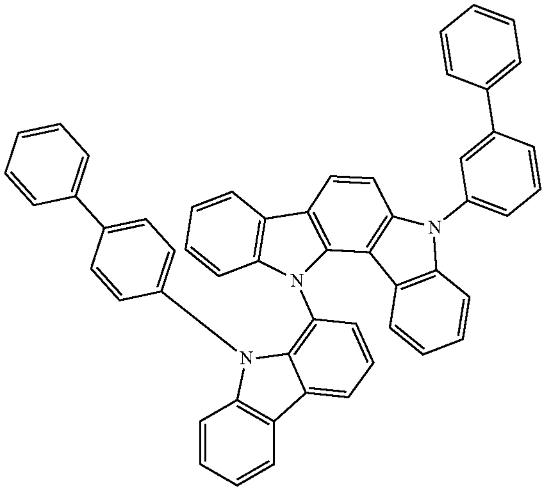
3-64
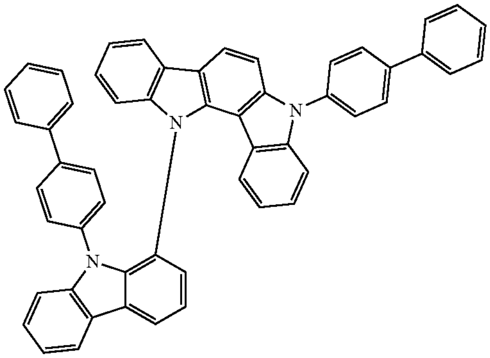
-continued
3-65
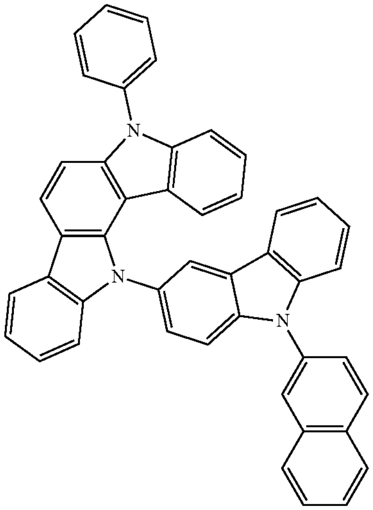
3-66
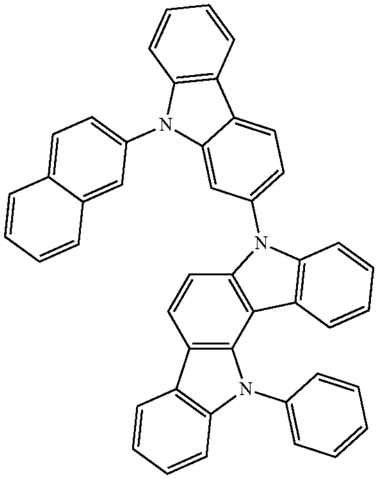
3-67
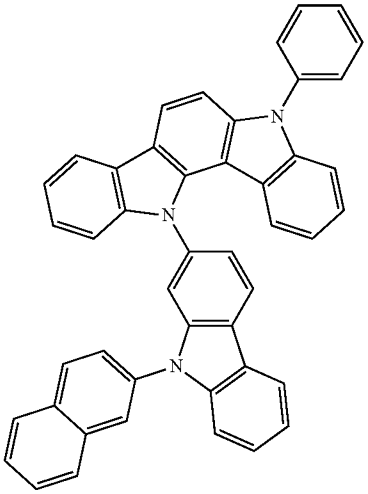

-continued
3-68
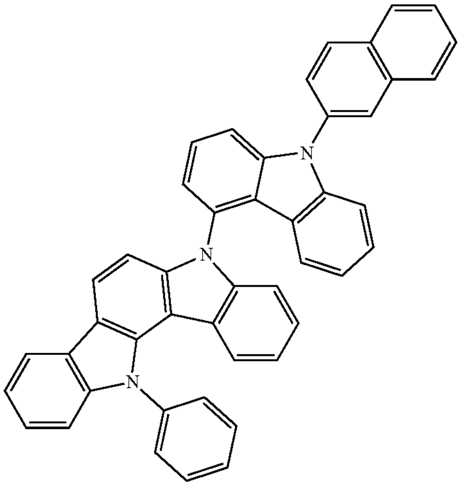
3-69
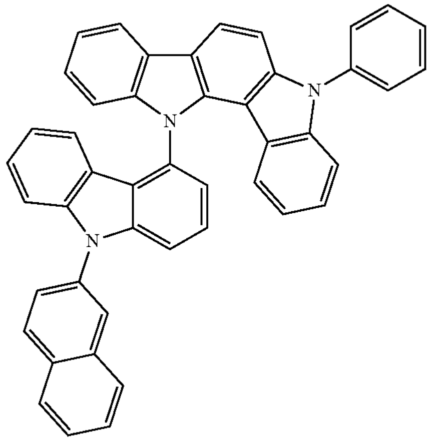
3-70
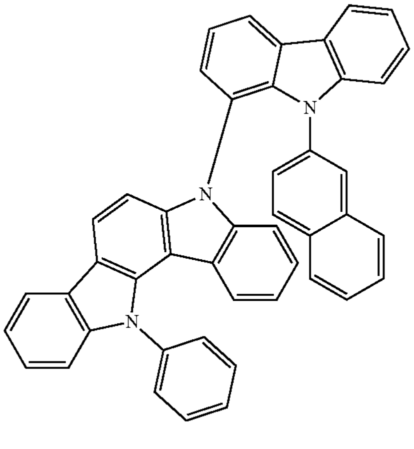
-continued
3-71
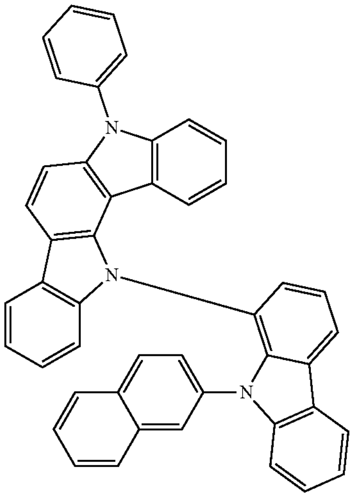
3-72
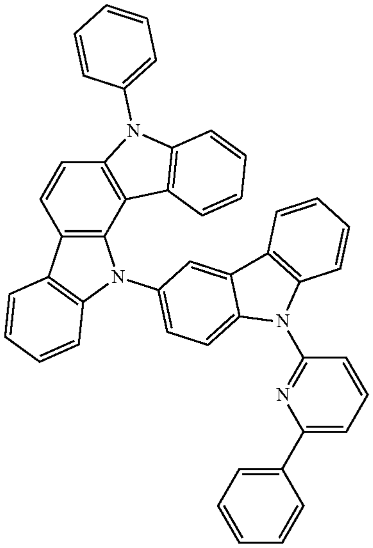
3-73
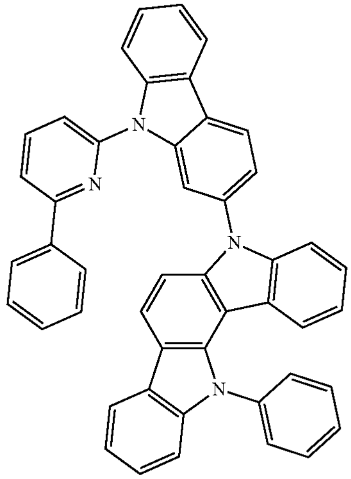

-continued
3-74
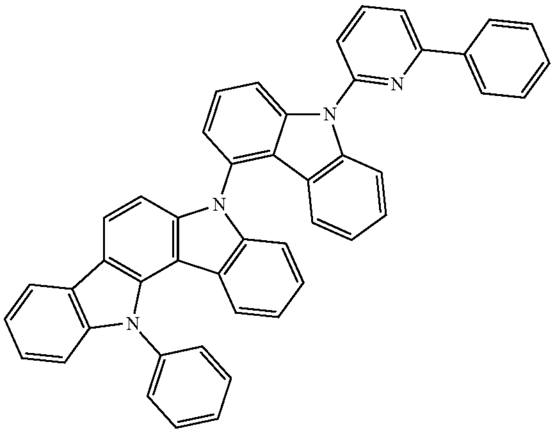
3-75
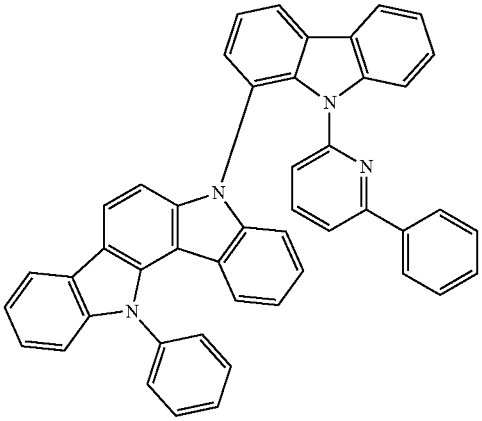
3-76
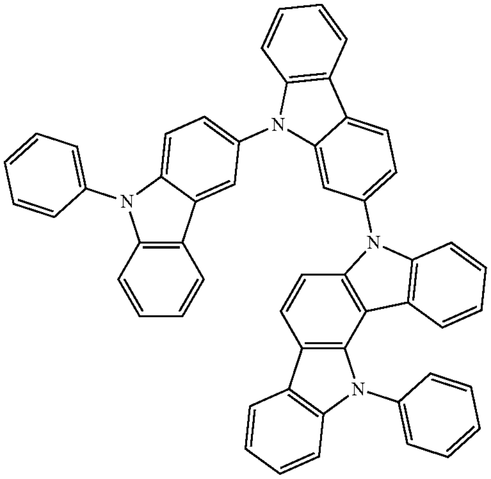
-continued
3-77
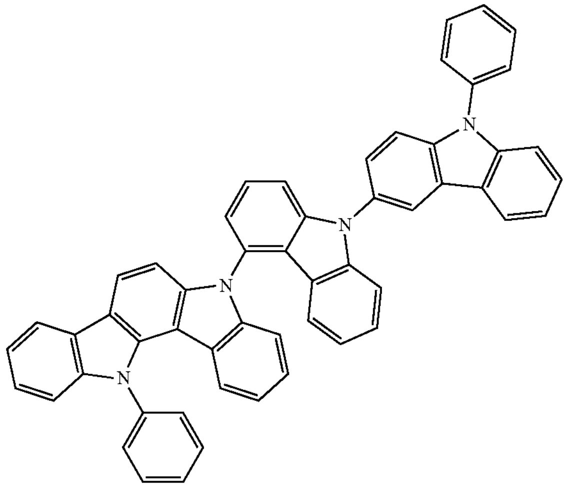
3-78
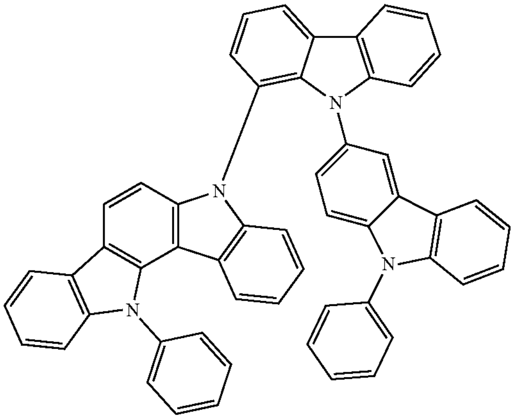
3-79
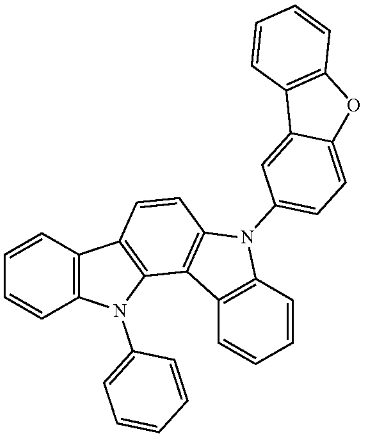

-continued
3-80
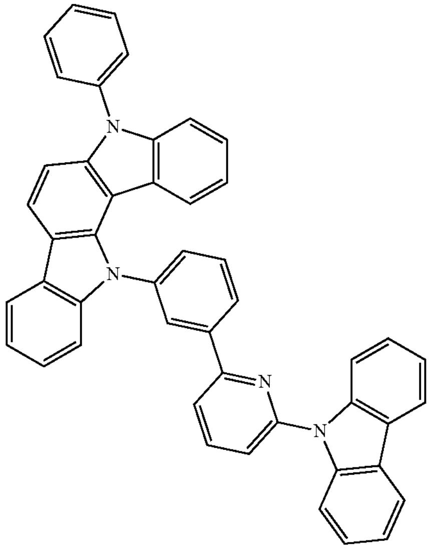
[Formula 31]
3-81
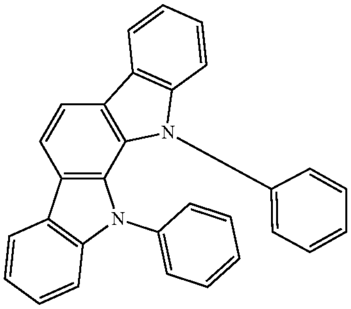
3-82
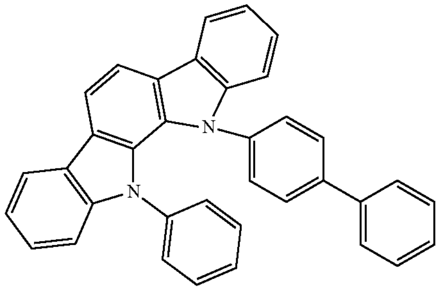
3-83
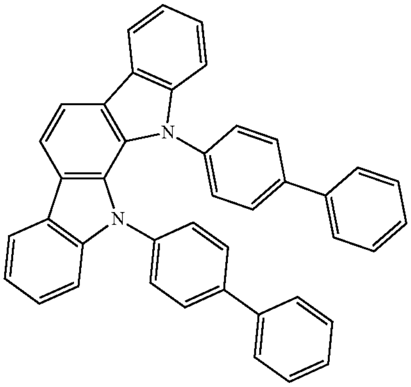
-continued
3-84
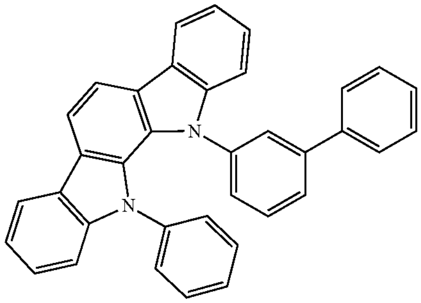
3-85
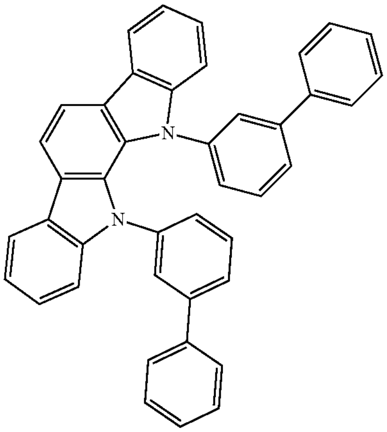
3-86
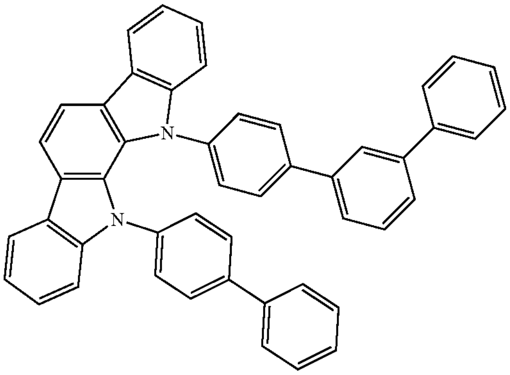
3-87
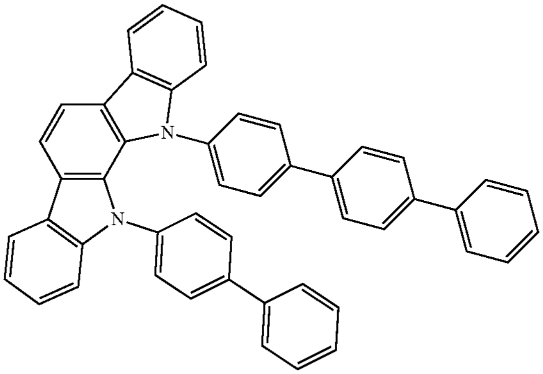

-continued
3-88
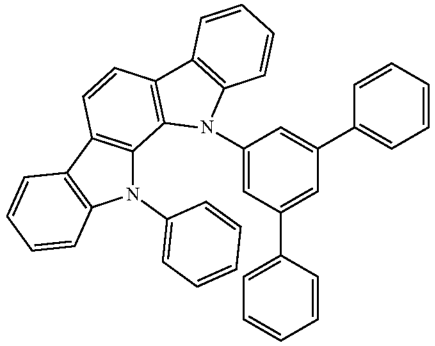
3-89
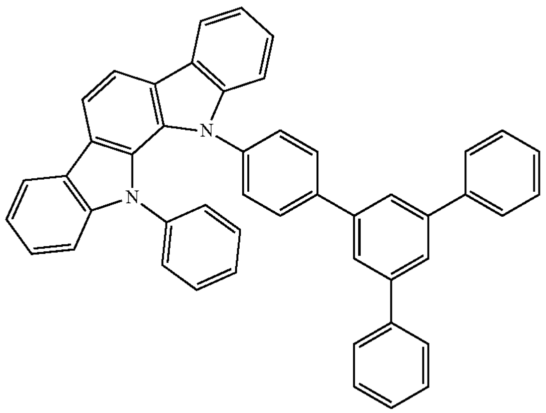
3-90
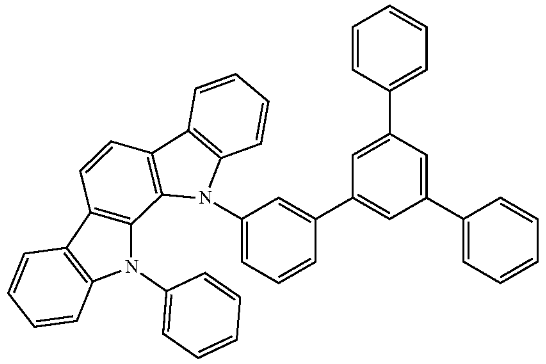
3-91
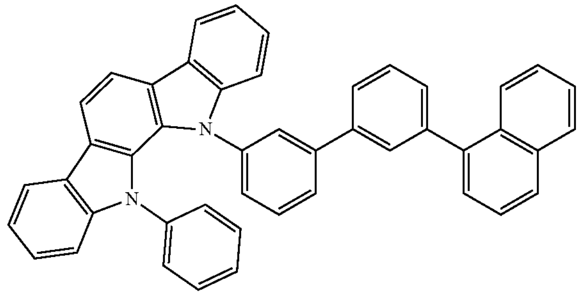
-continued
3-92
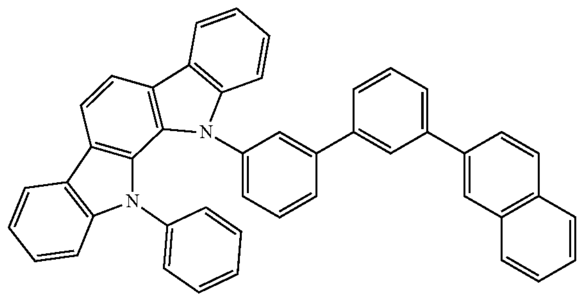
3-93
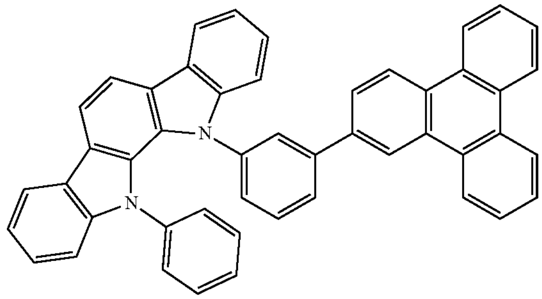
3-94
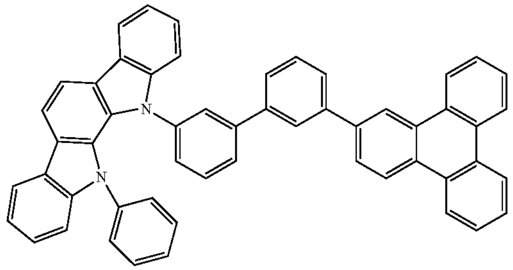
3-95
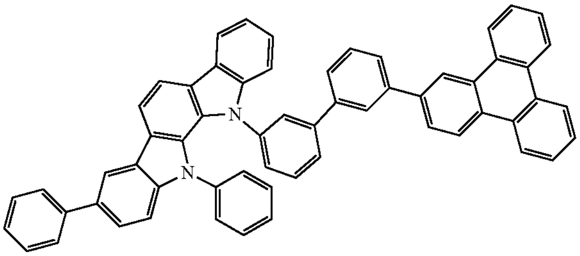
3-96
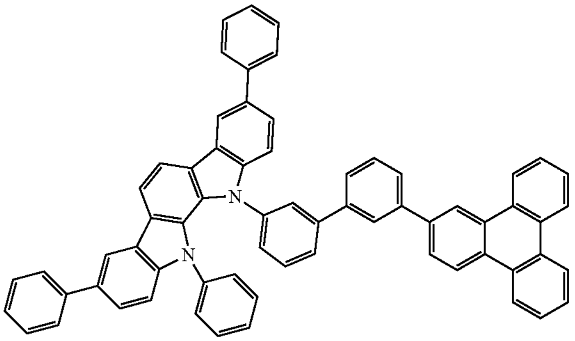

3-97
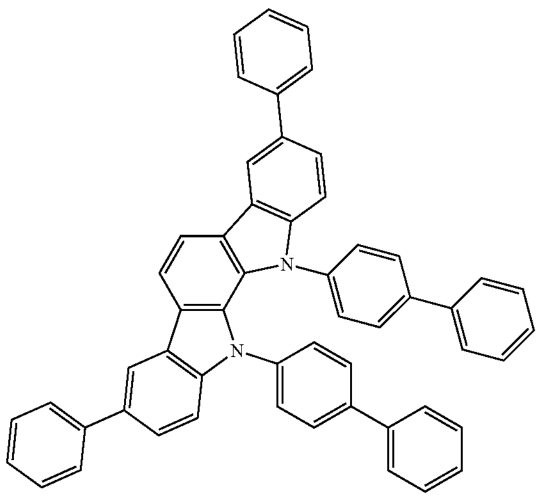
3-98
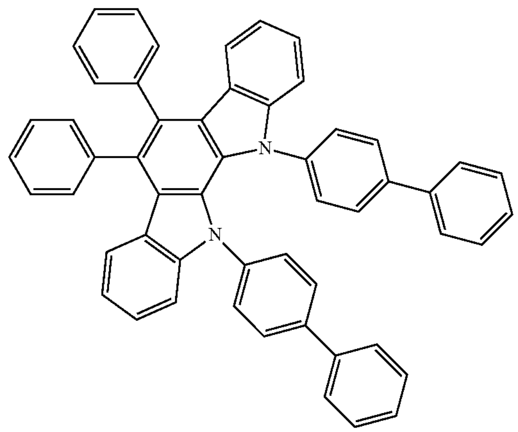
3-99
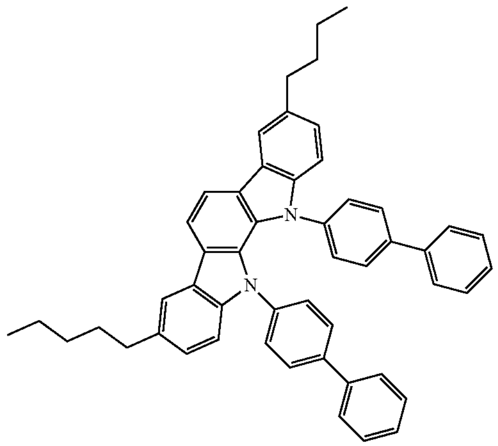
3-100
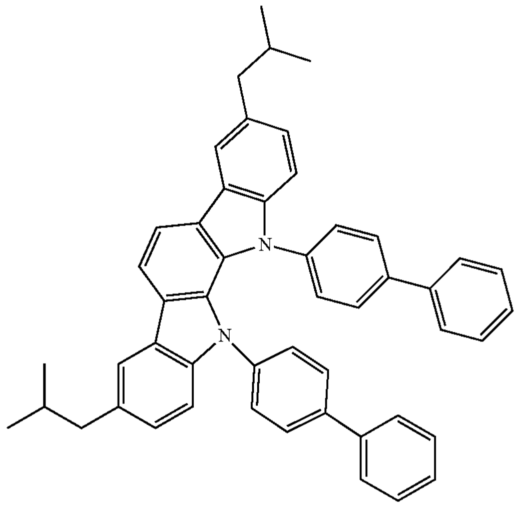
3-101
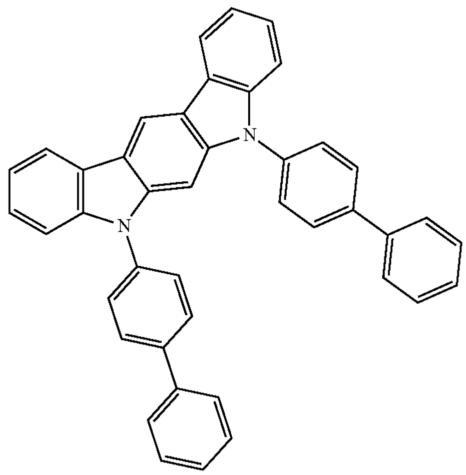
3-102
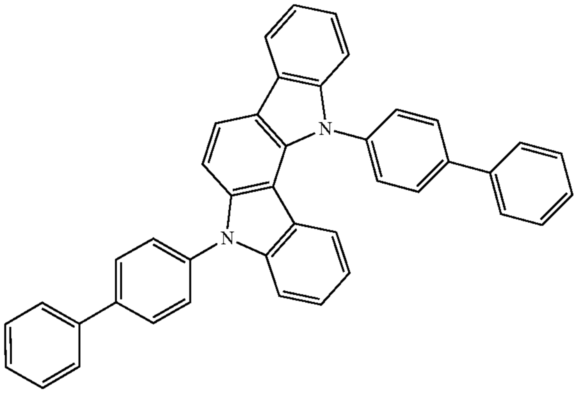

-continued 3-103

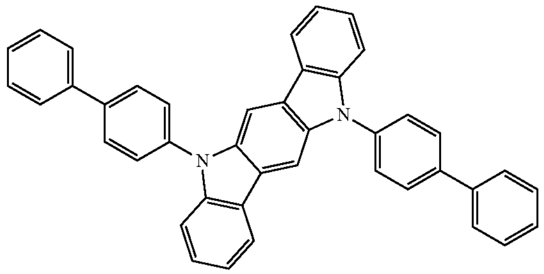

3-104

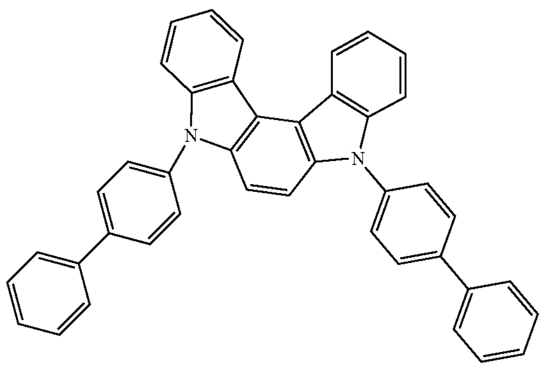

3-105

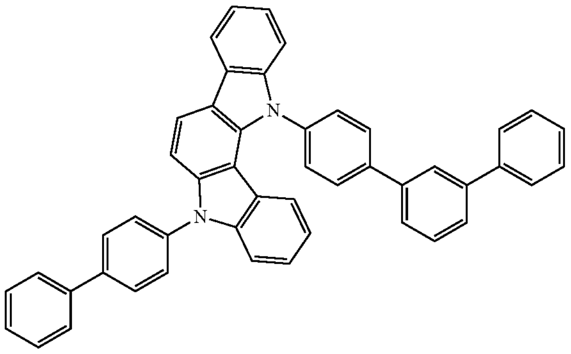

3-106

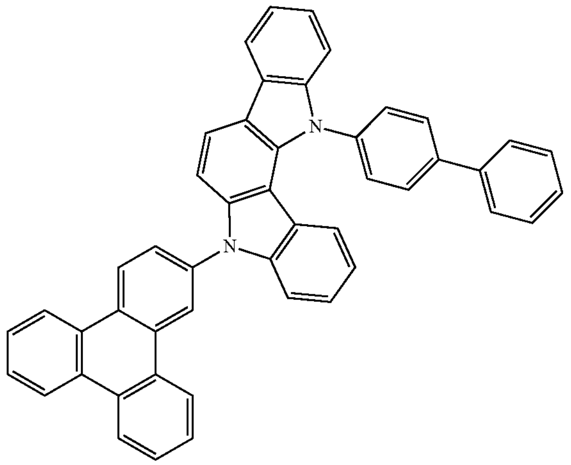

-continued 3-107

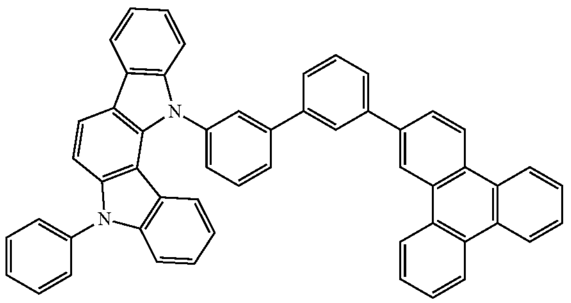

3-108

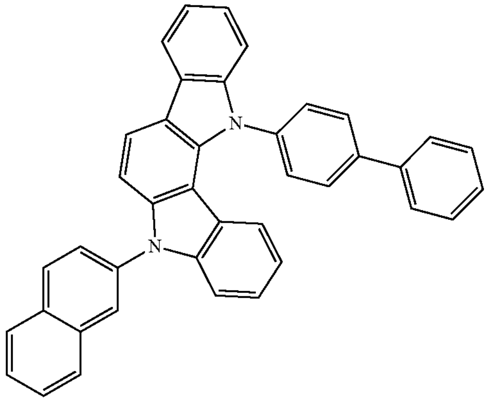

Next, the general formula (4) will be described.

In the general formula (4), $L^{41}$ represents a substituted or unsubstituted aromatic hydrocarbon group having 6 to 30 carbon atoms, a substituted or unsubstituted aromatic heterocyclic group having 3 to 5 carbon atoms, or a linked aromatic group in which two to five of these aromatic rings are linked.

In the case of the aromatic hydrocarbon group or aromatic heterocyclic group, specific examples thereof include a group generated from benzene, pyridine, pyrimidine, triazine, pentalene, indene, naphthalene, azulene, heptalene, octalene, indacene, acenaphthylene, phenalene, phenanthrene, anthracene, trindene, fluoranthene, acephenanthrylene, aceanthrylene, triphenylene, pyrene, chrysene, tetraphene, tetracene, pleiadene, picene, perylene, pentaphene, pentacene, tetraphenylene, cholanthrylene, helicene, hexaphene, rubicene, coronene, trinaphthylene, heptaphene, pyranthrene, anthracene, biphenyl, or terphenyl. More preferred is a group generated from benzene, biphenyl, or terphenyl.

$R^{41}$ each independently represents hydrogen, deuterium, an aliphatic hydrocarbon group having 1 to 10 carbon atoms, a substituted or unsubstituted aromatic hydrocarbon group having 6 to 30 carbon atoms, or a substituted or unsubstituted aromatic heterocyclic group having 3 to 16 carbon atoms, provided that $R^{41}$ is not a carbazole group and advantageously $R^{41}$ is not a group containing a carbazole ring.

When $R^{41}$ represents an aliphatic hydrocarbon group, the group may be linear, branched or cyclic, and specific examples thereof include methyl, ethyl, propyl, butyl, t-butyl, pentyl, hexyl, cyclohexyl, heptyl, octyl, nonyl, and decyl. Preferred is an alkyl group having 1 to 4 carbon atoms.

In the case of $R^{41}$ being an unsubstituted aromatic hydrocarbon group or aromatic heterocyclic group, specific examples thereof include a group generated by removing one H from benzene, pentalene, indene, naphthalene, azulene, heptalene, octalene, indacene, acenaphthylene, phenalene, phenanthrene, anthracene, trindene, fluoranthene, acephenanthrylene, aceanthrylene, triphenylene, pyrene, chrysene, tetraphene, tetracene, pleiadene, picene, perylene, pentaphene, pentacene, tetraphenylene, cholanthrylene, helicene, hexaphene, rubicene, coronene, trinaphthylene, heptaphene, pyranthrene, furan, benzofuran, isobenzofuran, xanthene, oxathrene, dibenzofuran, peri-xanthenoxanthene, thiophene, thioxanthene, thianthrene, phenoxathiin, thionaphthene, isothianaphthene, thiophthene, thiophanthrene, dibenzothiophene, pyrrole, pyrazole, tellurazole, selenazole, thiazole, isothiazole, oxazole, furazan, indolizine, indole, isoindole, indazole, purine, quinolizine, isoquinoline, imidazole, naphthyridine, phthalazine, benzodiazepine, quinoxaline, cinnoline, quinoline, pteridine, phenanthridine, acridine, perimidine, phenanthroline, phenazine, carboline, phenotellurazine, phenoselenazine, phenothiazine, phenoxazine, anthyridine, benzothiazole, benzimidazole, benzoxazole, benzisooxazole, or benzisothiazole.

y represents the number of substitutions, and represents an integer of 1 to 4. Preferably, y is 1 or 2, and more preferably 1. x is the number of repetitions, and each independently represent an integer of 1 to 4. Preferably, x is 1 to 3. However, at least one x is an integer of 2 to 4.

The general formula (4) preferably has at least one binding structure represented by formula (4a) or formula (4b) therein. It is more preferred that all of the binding structures among carbazolyl groups should be a binding structure represented by formula (4a) or formula (4b).

The sum of x (total number of carbazolyl groups) is an integer of 2 to 12, preferably 2 to 9, and more preferably 2 to 6.

In the formula (4a) or formula (4b), the same symbols as in the general formula (4) have the same meaning.

Specific examples of the carbazole compound represented by the general formula (4) are described below, but the compound is not limited thereto.

[Formula 32]

4-1

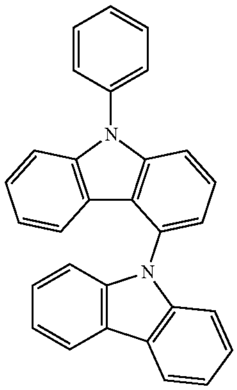

-continued 4-2

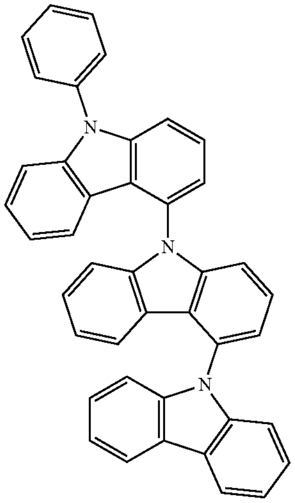

4-3

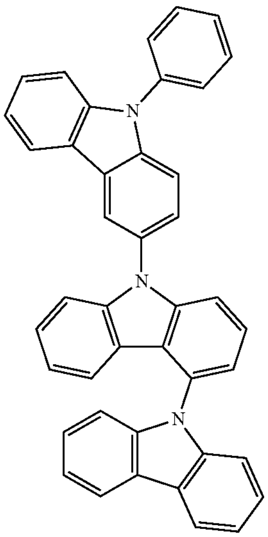

4-4

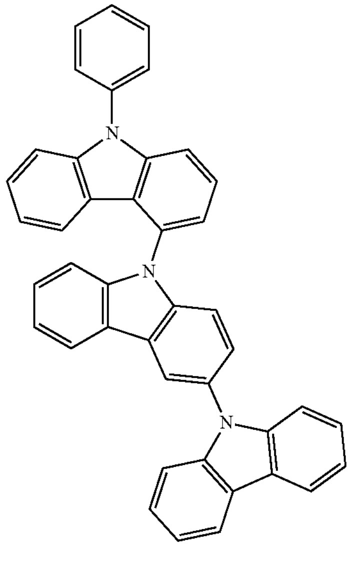

-continued
4-5
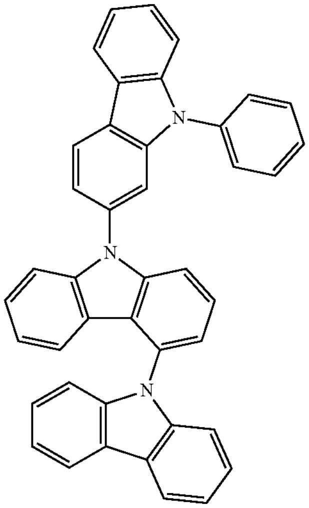
4-6
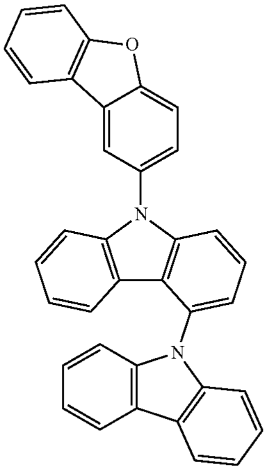
4-7
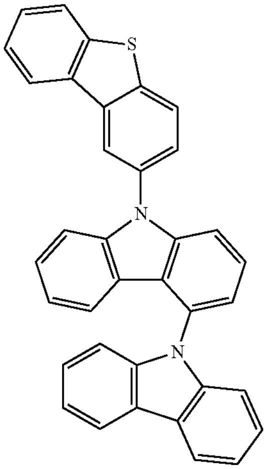
-continued
4-8
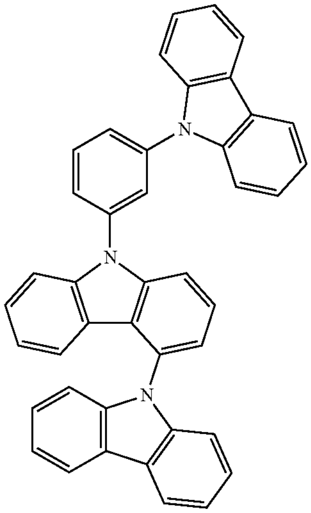
4-9
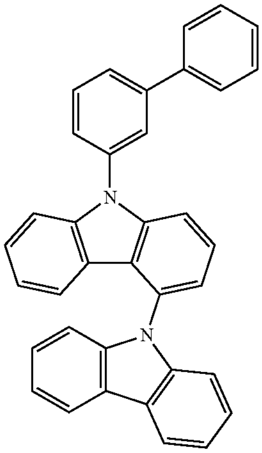
4-10
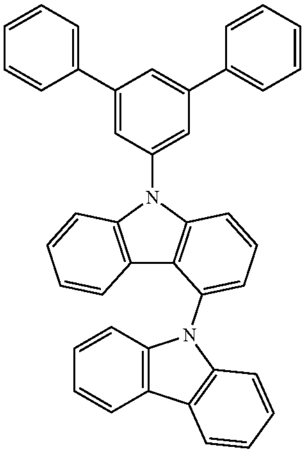

-continued
4-11
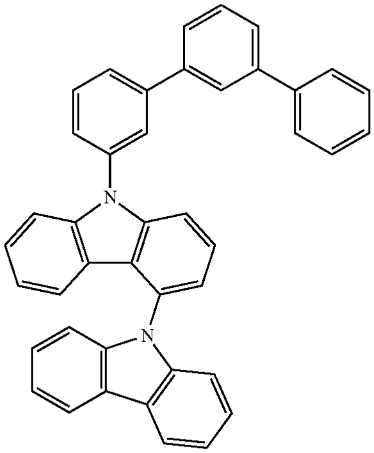
4-12
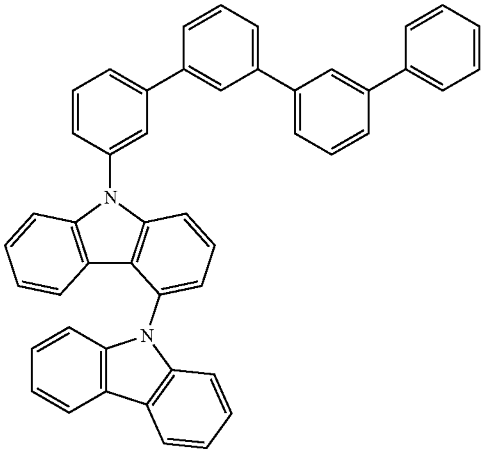
4-13
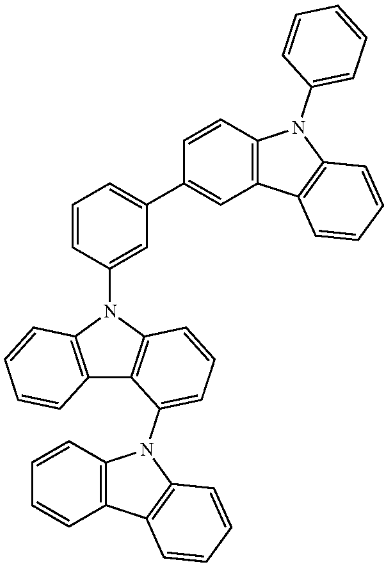
-continued
4-14
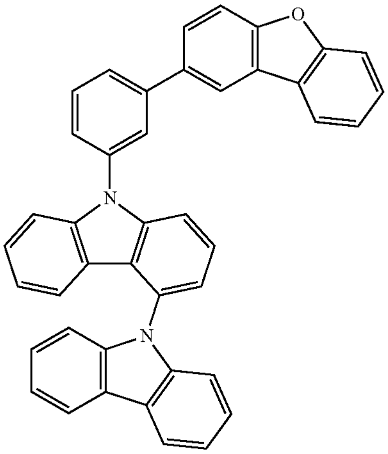
4-15
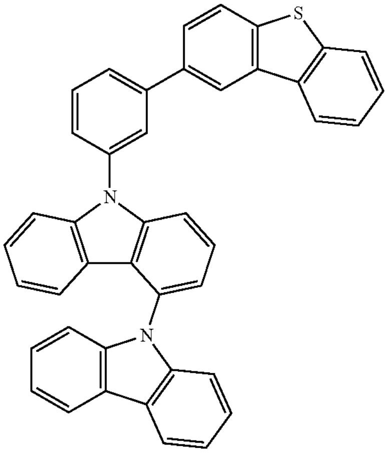
4-16
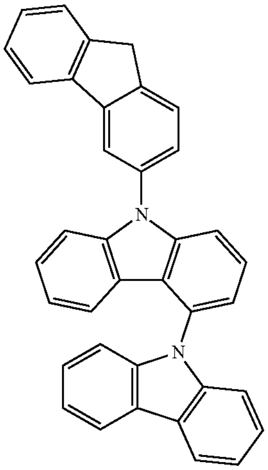

-continued
4-17
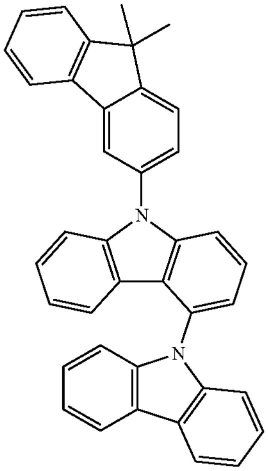
4-18
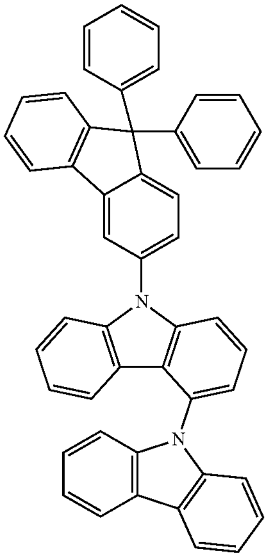
4-19
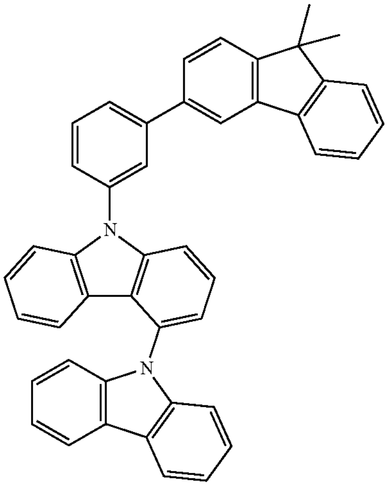
-continued
[Formula 33]
4-19b
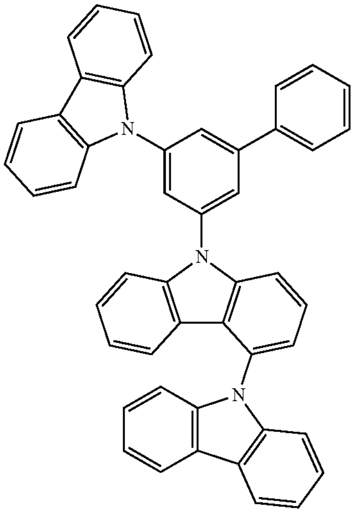
4-20
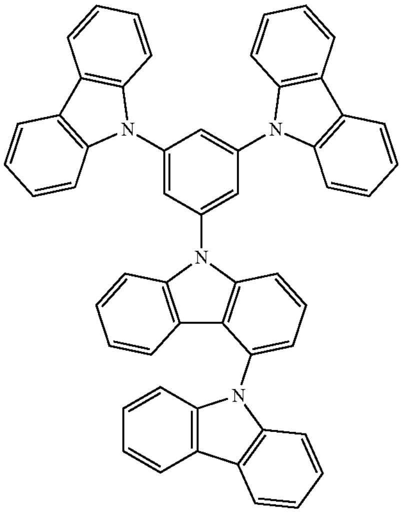

-continued
4-21
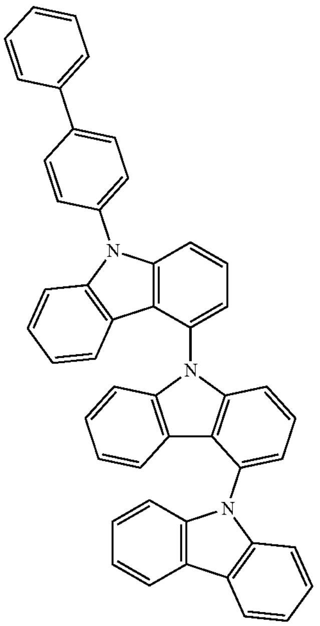
4-22
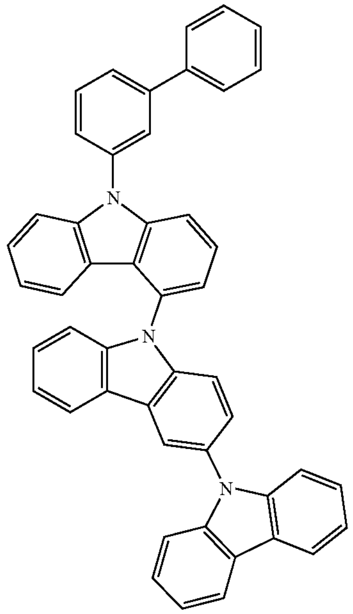
-continued
4-23
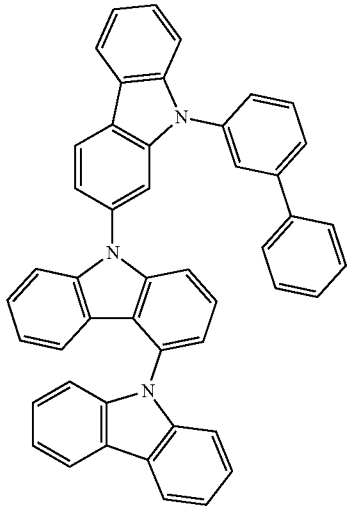
4-24
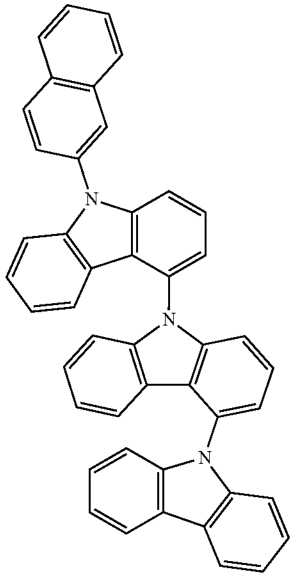
4-25
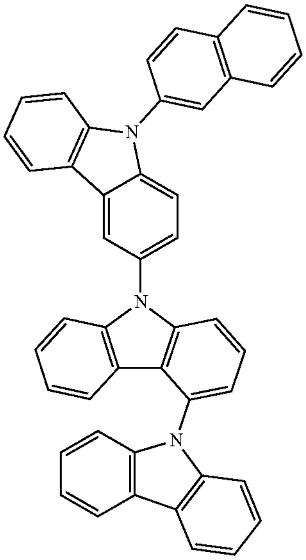

-continued
4-26
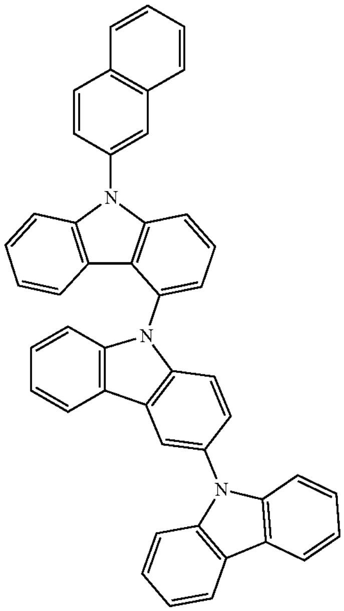
4-27
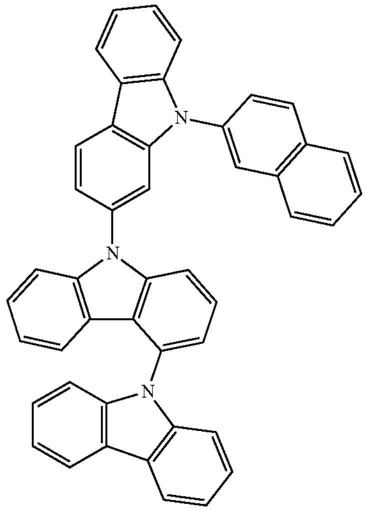
4-28
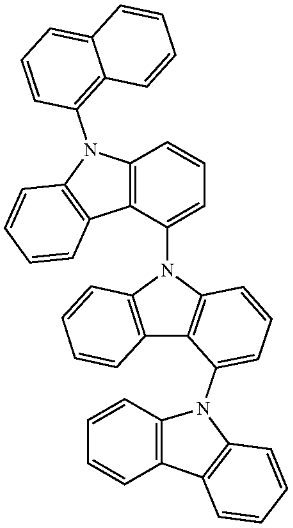
-continued
4-29
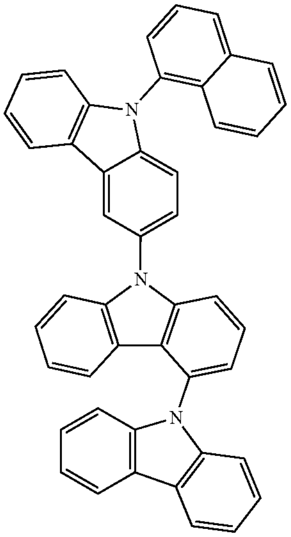
4-30
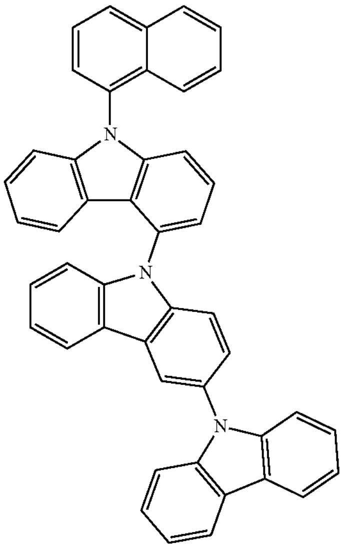
4-31
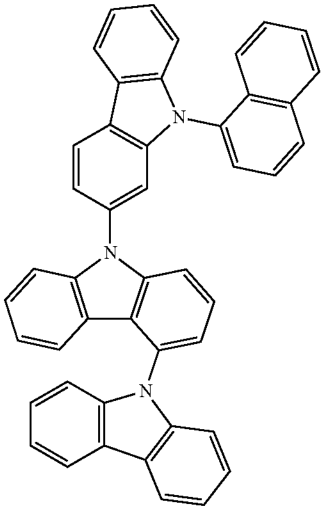

-continued
4-32
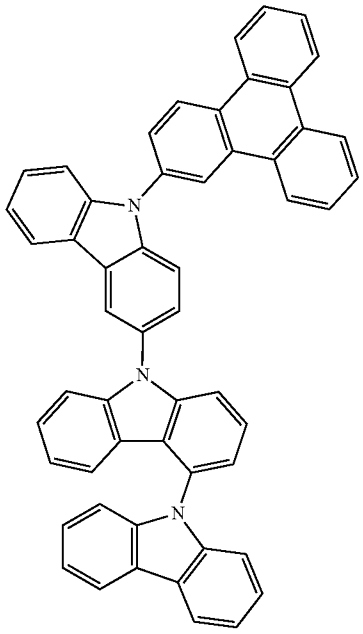
[Formula 34]
4-33
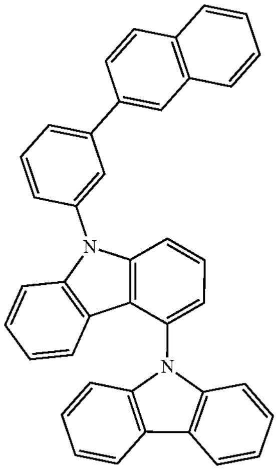
4-34
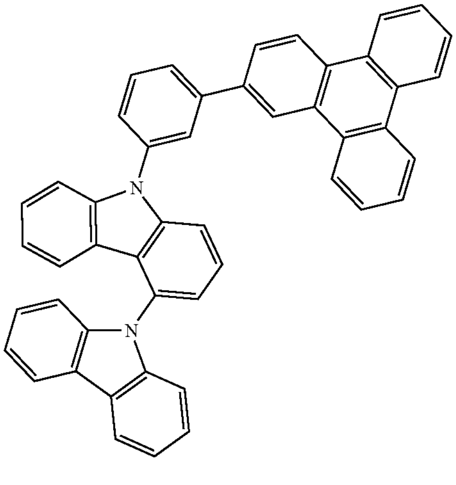
-continued
4-35
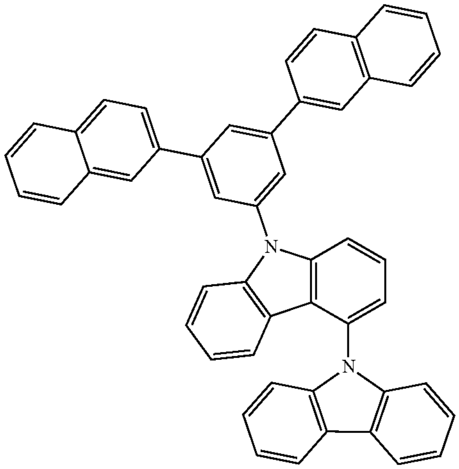
4-36
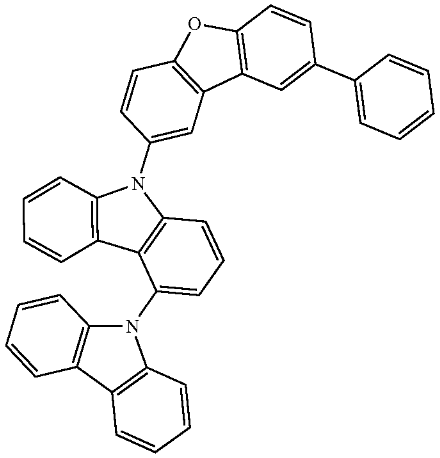
4-37
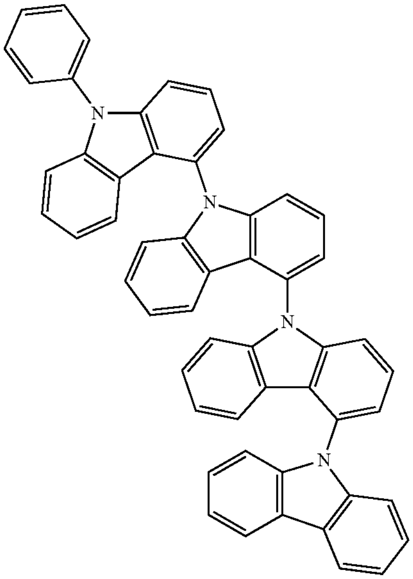

-continued
4-38
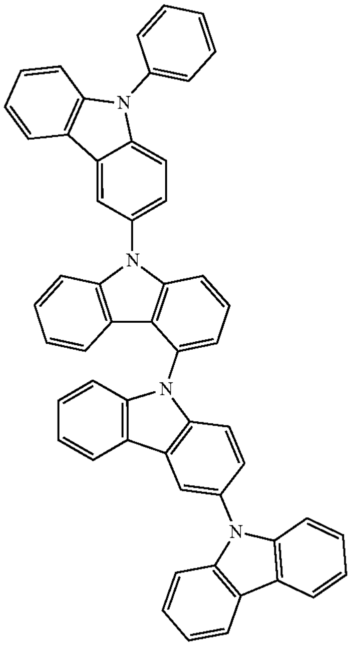
4-39
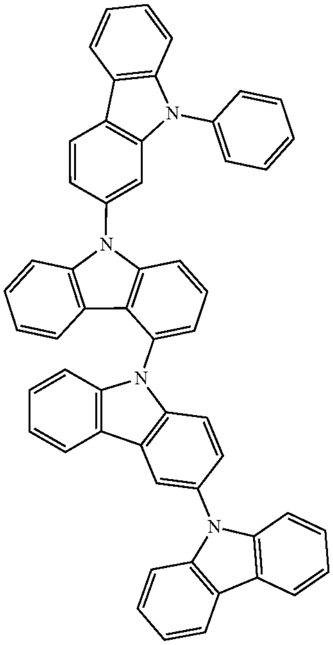
-continued
4-40
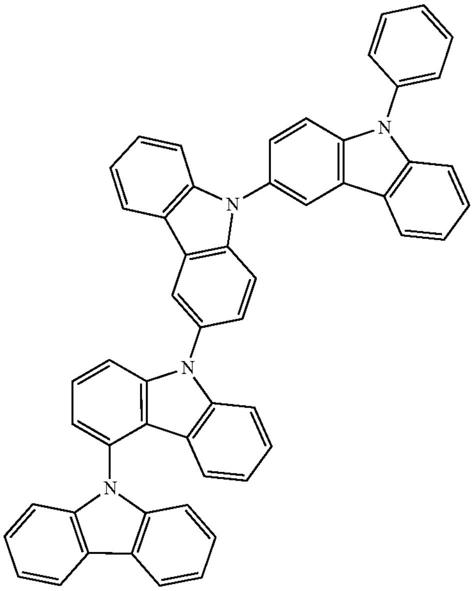
4-41
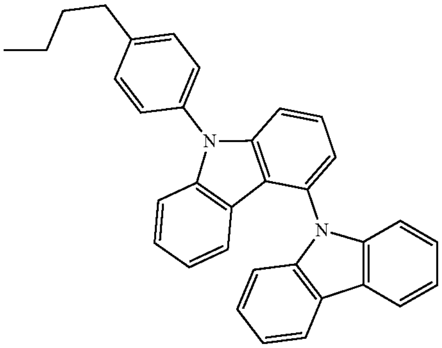
4-42
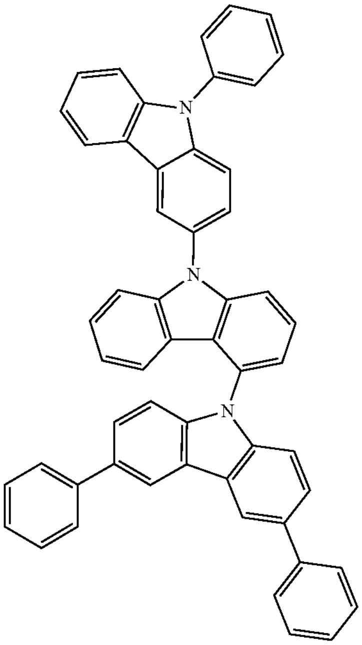

-continued
4-43
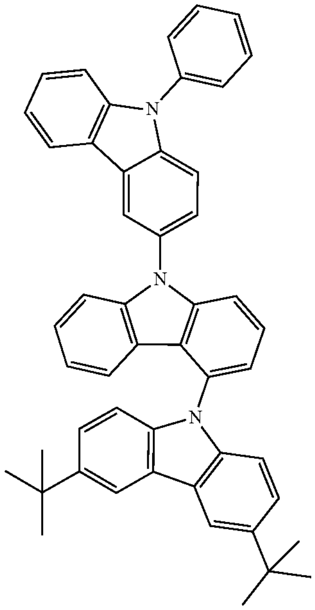
4-44
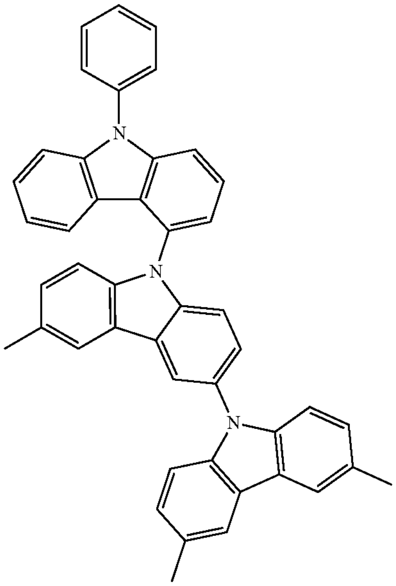
-continued
[Formula 35]
4-45
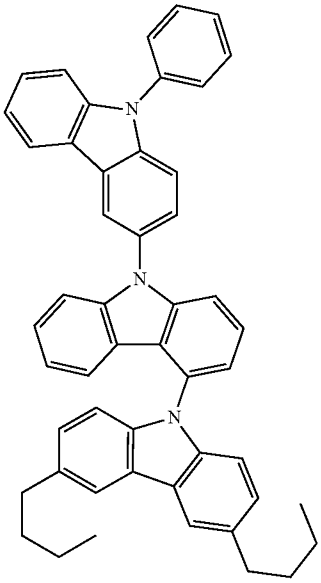
4-46
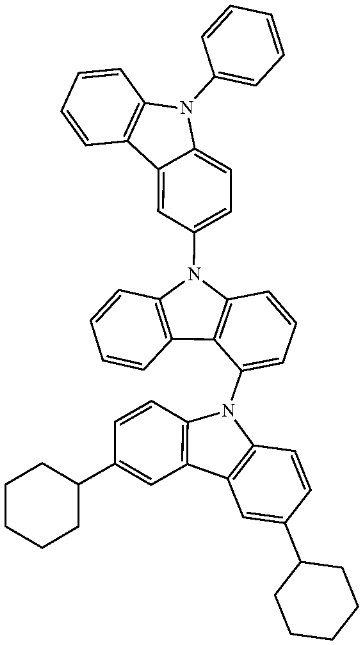

-continued
4-47
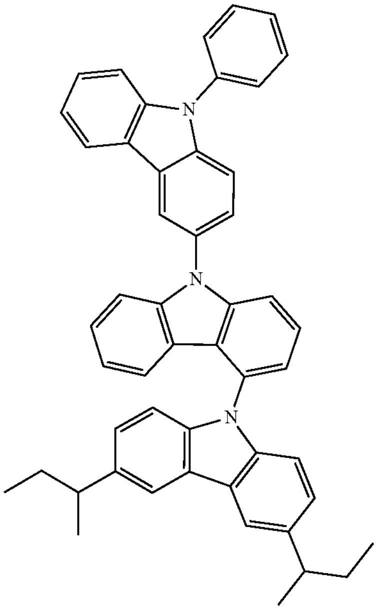
4-48
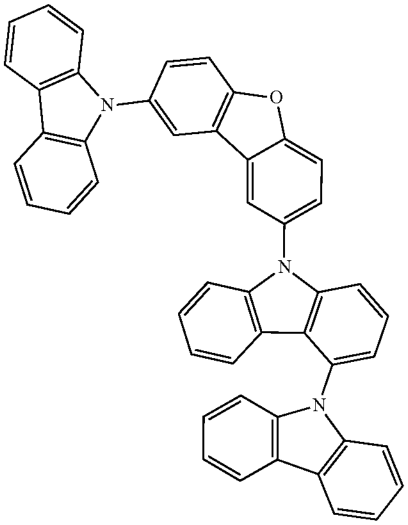
4-49
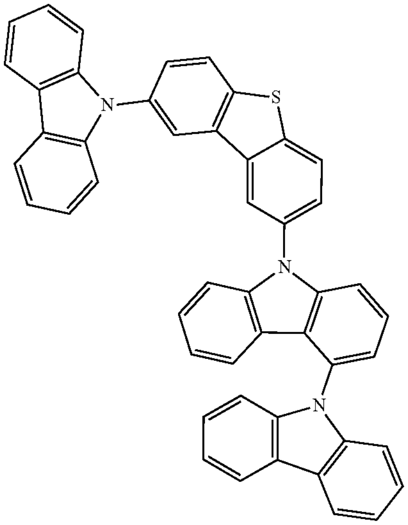
-continued
4-50
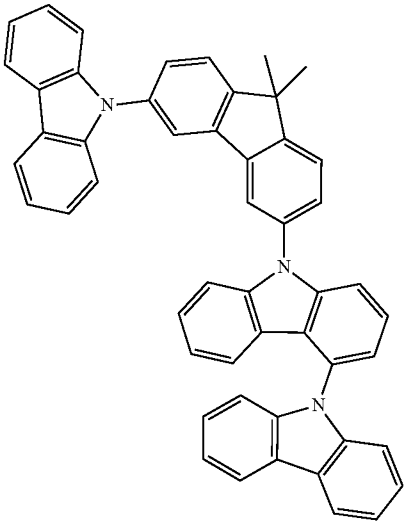
4-51
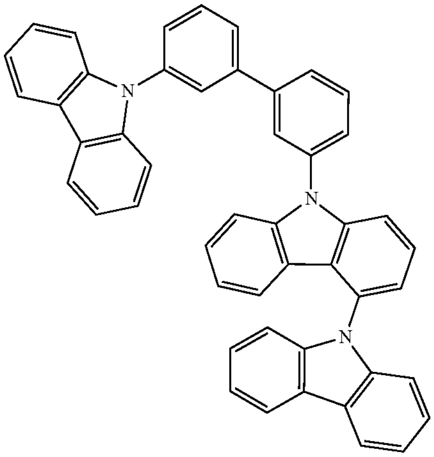
4-52
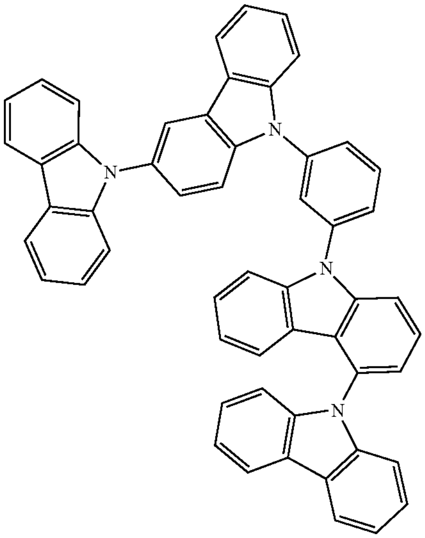

4-53
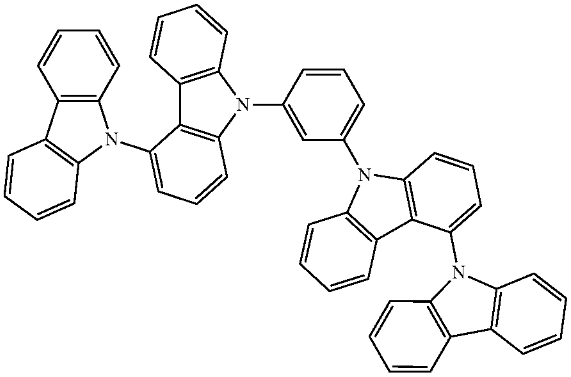
4-54
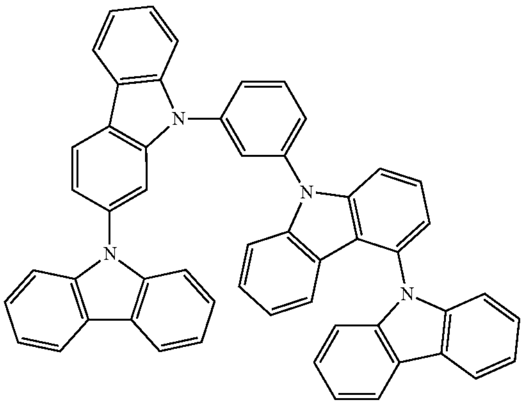
4-55
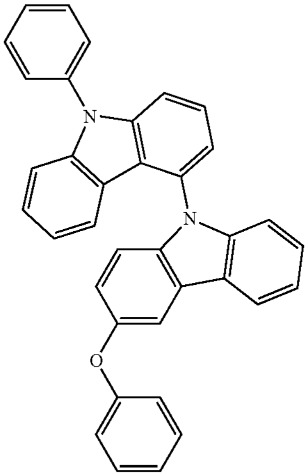
4-56
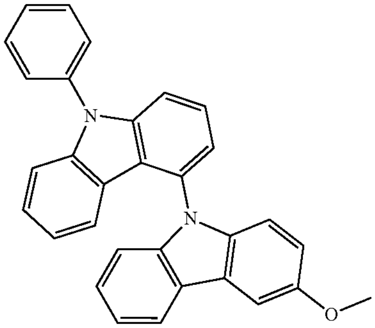
4-57
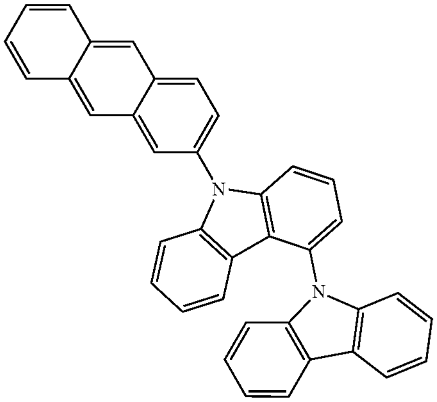
4-58
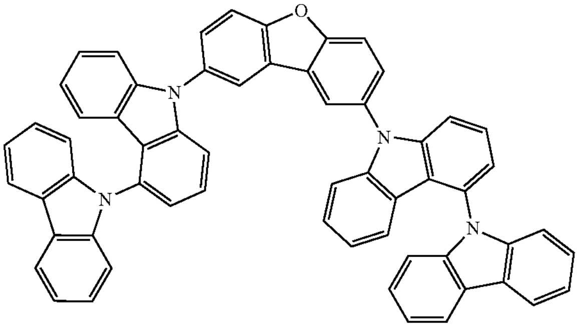
4-59
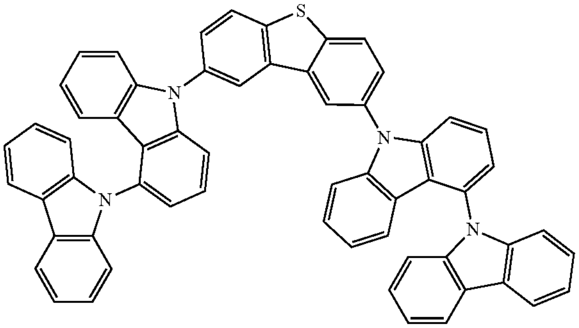
[Formula 36]
4-60
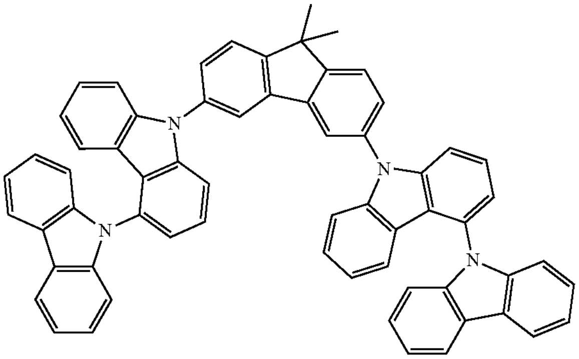

-continued
4-61
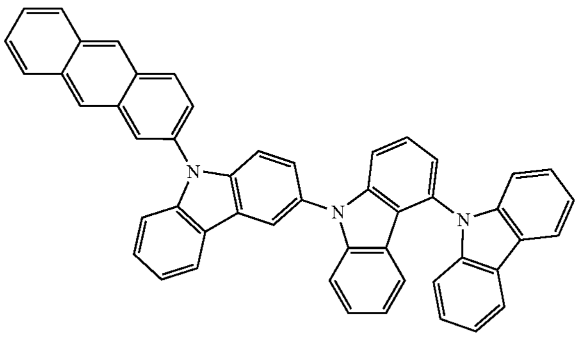
4-62
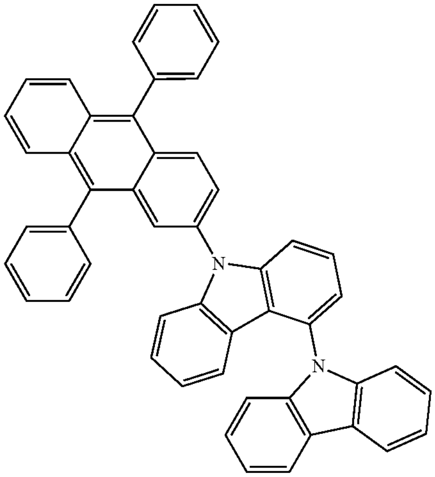
4-63
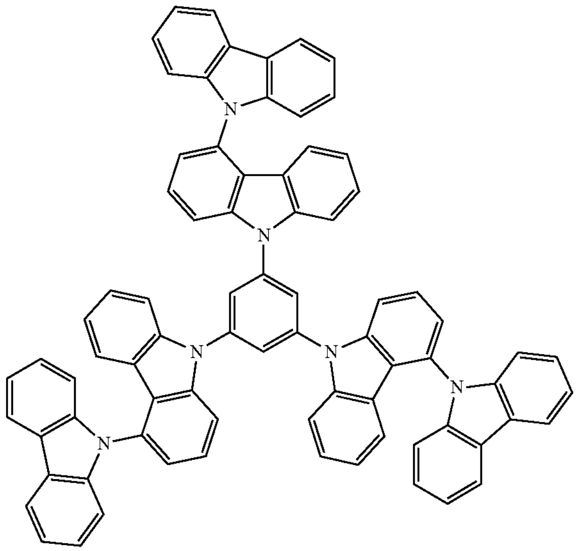
-continued
4-64
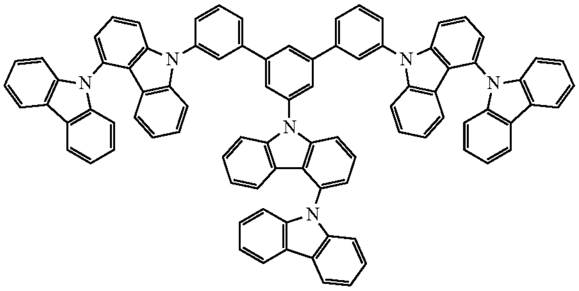
4-65
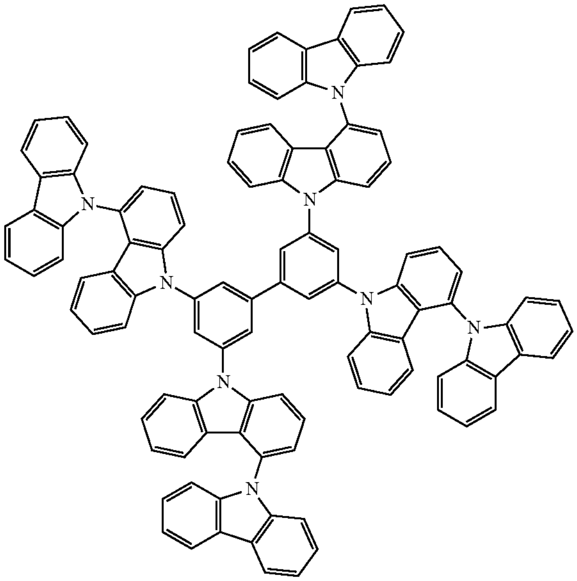
4-66
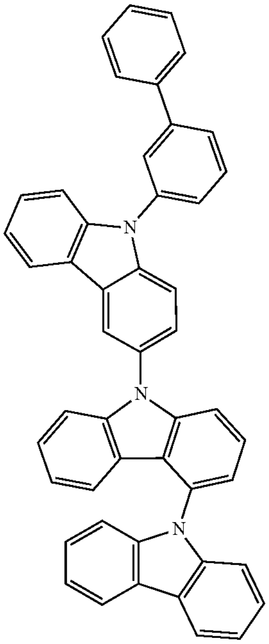

-continued
4-67
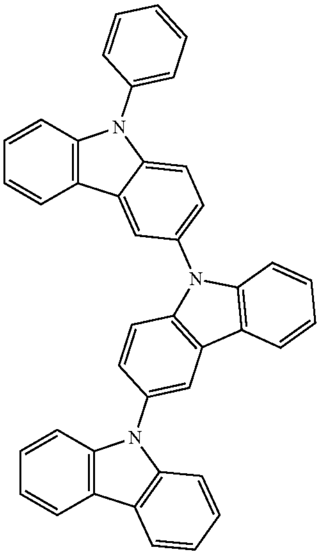
4-68
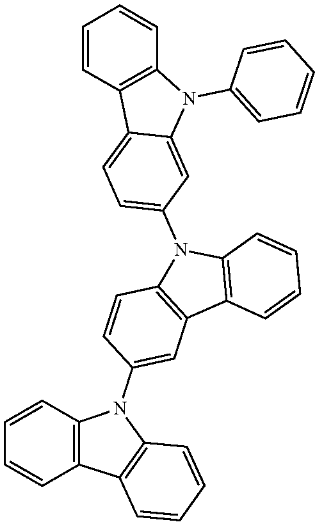
4-69
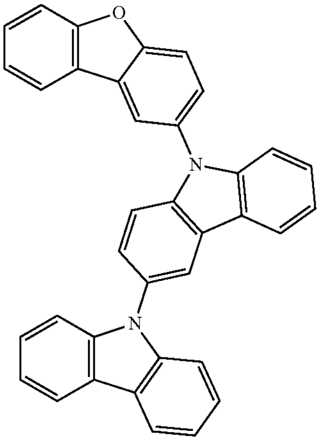
-continued
4-70
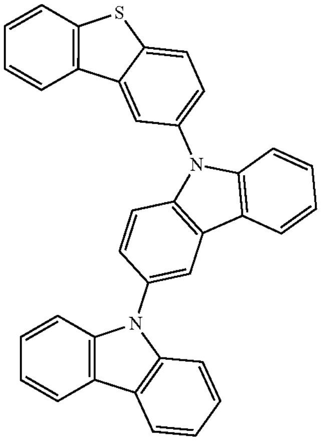
4-71
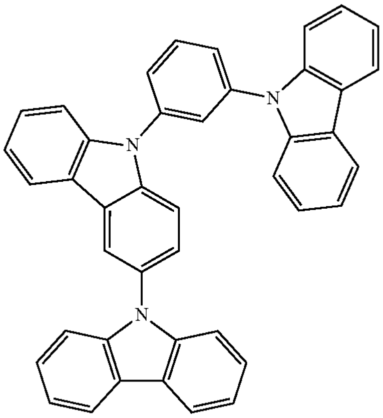
4-72
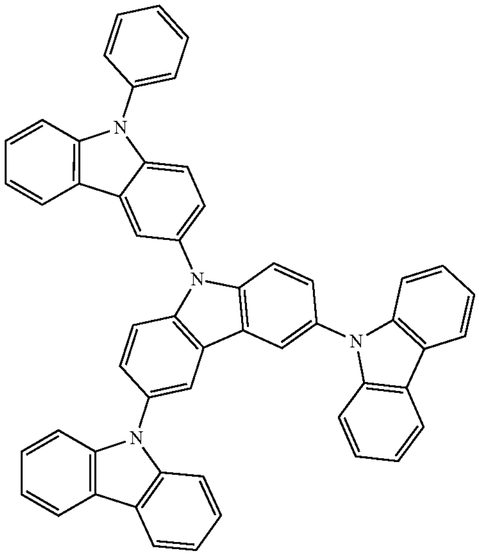

-continued
4-73
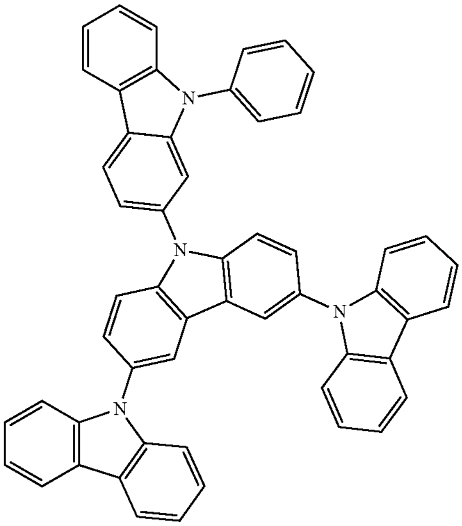
4-74
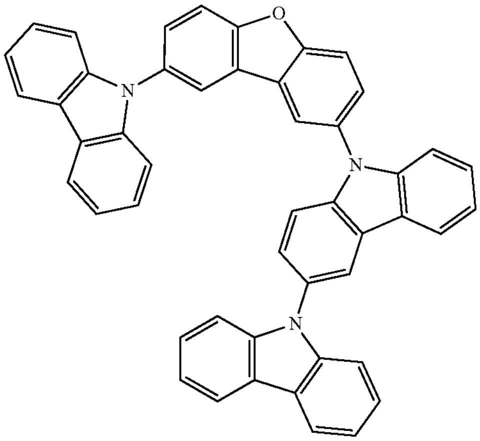
[Formula 37]
4-75
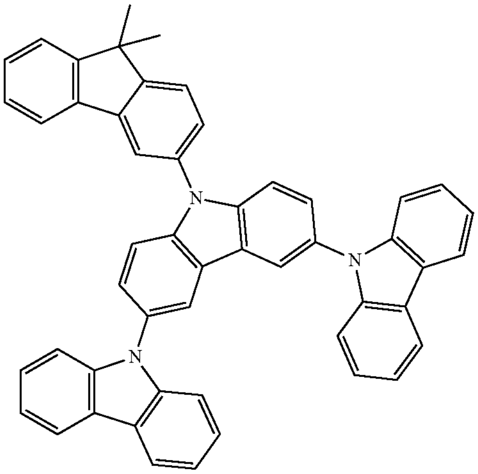
-continued
4-76
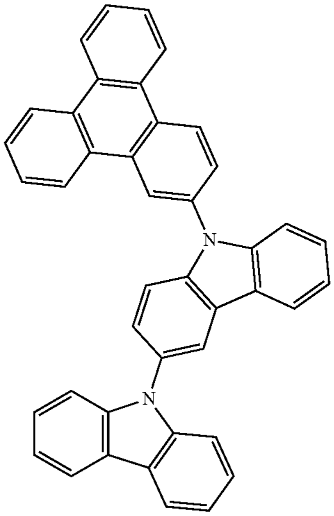
4-77
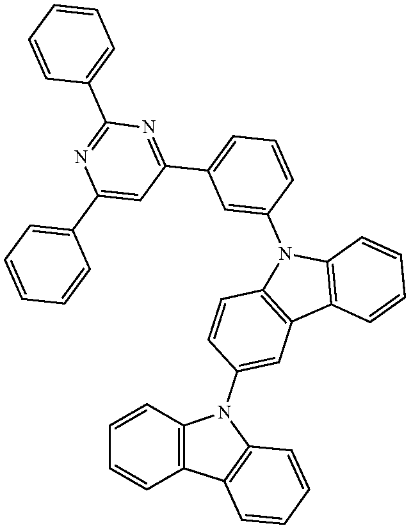

-continued
4-78
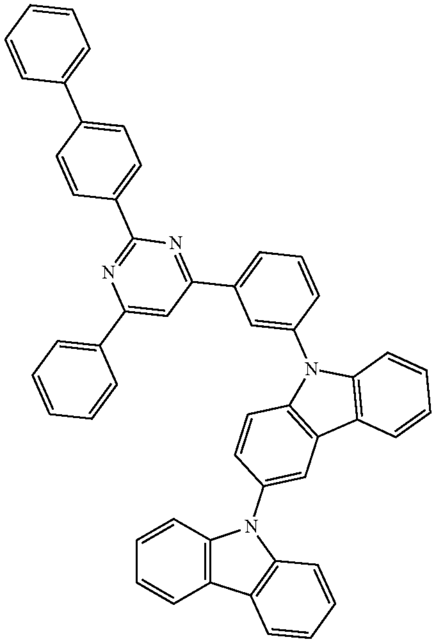
4-79
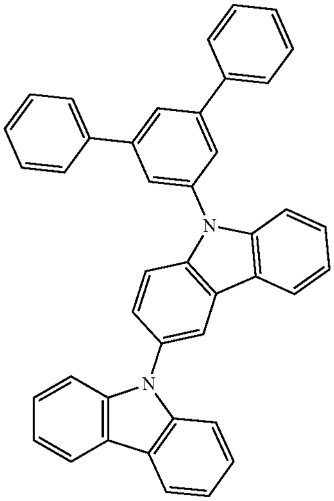
4-80
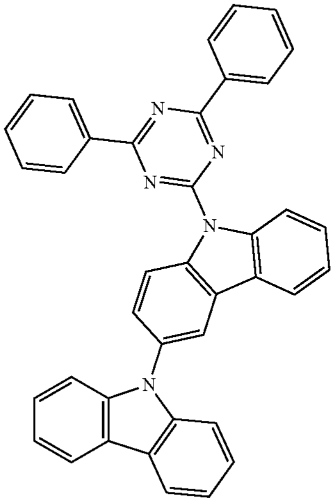
-continued
4-81
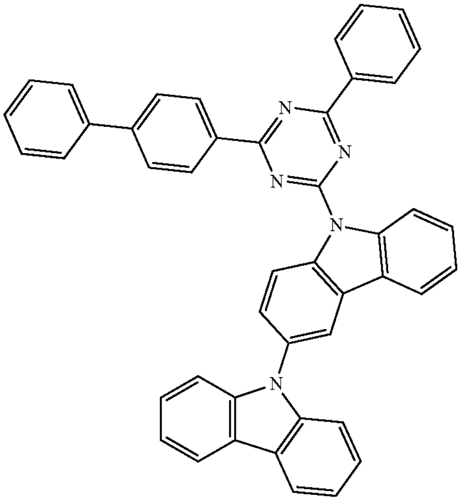
4-82
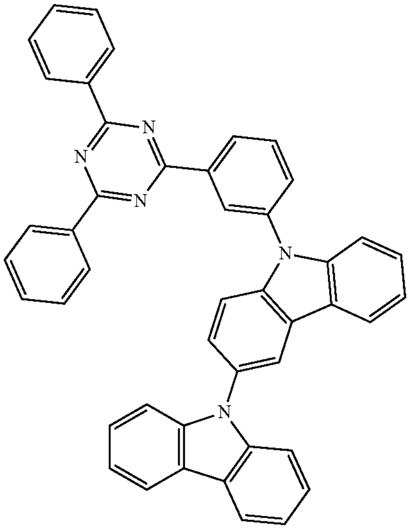
4-83
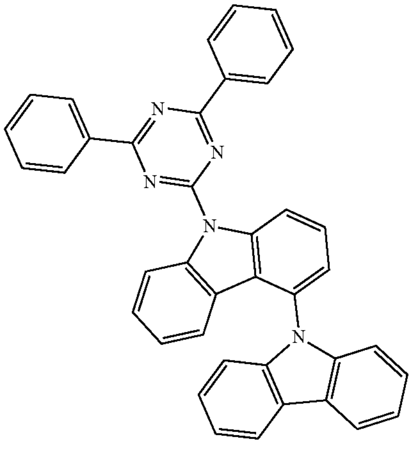

-continued 4-84

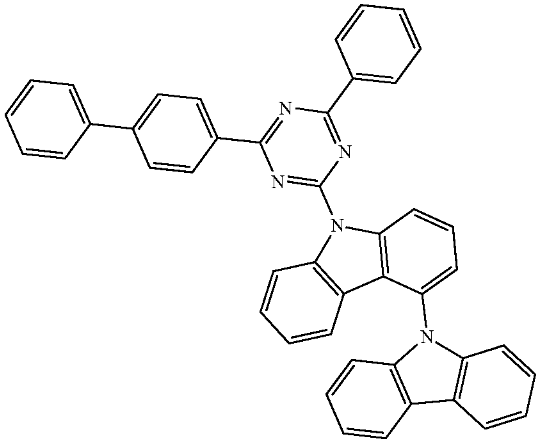

4-85

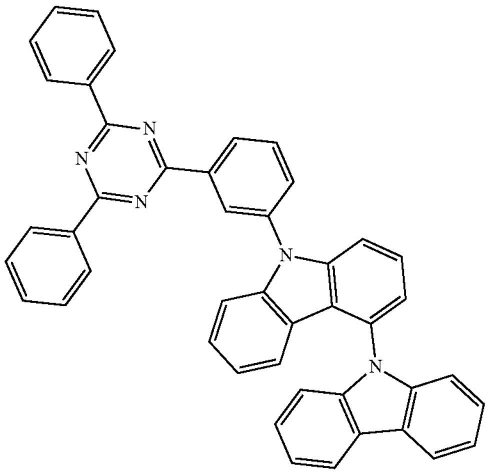

4-86

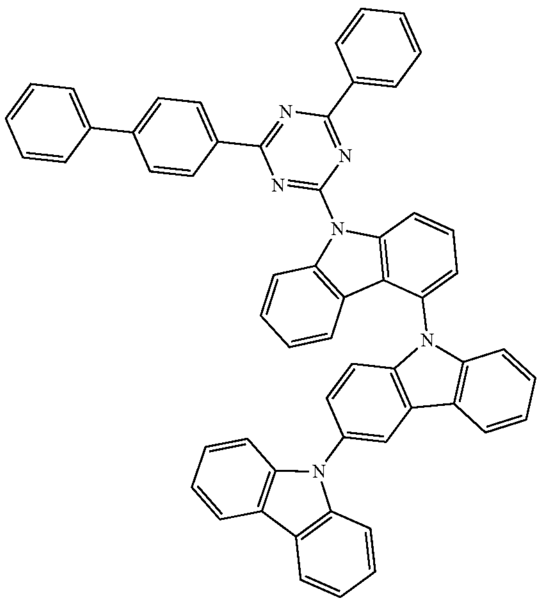

Use of the first host selected from the compounds represented by the general formula (1); and the second host selected from the compounds represented by the general formula (2), (3) or (4) as host materials for a light-emitting layer can provide an excellent organic electroluminescent device.

The first host and the second host which are, for example, vapor deposited from different individual vapor deposition sources can be used; however, it is preferable to premix them as a composition (also referred to as "premixture".) for an organic electroluminescent device before vapor deposition and to vapor-deposit the premixture simultaneously from one vapor deposition source to thereby form a light-emitting layer. In this case, the premixture may be mixed with a light-emitting dopant material necessary for formation of a light-emitting layer, or another host to be used as necessary. However, when there is a large difference in temperatures to provide desired vapor pressure, vapor deposition may be performed from another vapor deposition source.

The premixing method is desirably a method that can allow for mixing as uniformly as possible, and examples thereof include pulverization and mixing, a heating and melting method under reduced pressure or under an atmosphere of an inert gas such as nitrogen, and sublimation, but not limited thereto.

In addition, regarding the mixing ratio (weight ratio) between the first host and the second host, the proportion of the first host is 20 to 60%, preferably more than 20% and less than 55%, and more preferably 40 to 50% based on the first host and the second host in total.

The difference between the absolute values of electron affinities (EA) of the first host and the second host is preferably more than 0.1 eV and less than 0.6 eV. The value of EA can be calculated by using the value of ionization potential (IP) in a thin film of a host material, obtained according to photoelectron spectroscopy, and the value of energy gap determined from an absorption end in an absorption spectrum measured.

Next, the structure of the organic electroluminescent device of the present invention will be described by referring to the drawing, but the structure of the organic electroluminescent device of the present invention is not limited thereto.

FIG. 1 is a cross-sectional view showing a structure example of an organic electroluminescent device generally used for the present invention, in which there are indicated a substrate 1, an anode 2, a hole injection layer 3, a hole transport layer 4, a light-emitting layer 5, an electron transport layer 6, and a cathode 7. The organic electroluminescent device of the present invention may have an exciton blocking layer adjacent to the light-emitting layer and may have an electron blocking layer between the light-emitting layer and the hole injection layer. The exciton blocking layer can be inserted into either of the anode side and the cathode side of the light-emitting layer and inserted into both sides at the same time. The organic electroluminescent device of the present invention has the anode, the light-emitting layer, and the cathode as essential layers, and preferably has a hole injection transport layer and an electron injection transport layer in addition to the essential layers, and further preferably has a hole blocking layer between the light-emitting layer and the electron injection transport layer. Note that the hole injection transport layer refers to either or both of a hole injection layer and a hole transport layer, and the electron injection transport layer refers to either or both of an electron injection layer and an electron transport layer.

A structure reverse to that of FIG. 1 is applicable, in which a cathode 7, an electron transport layer 6, a light-emitting layer 5, a hole transport layer 4, and an anode 2 are stacked on a substrate 1 in this order. In this case, layers may be added or omitted as necessary.

—Substrate—

The organic electroluminescent device of the present invention is preferably supported on a substrate. The substrate is not particularly limited, and those conventionally used in organic electroluminescent devices may be used, and substrates made of, for example, glass, a transparent plastic, or quartz may be used.

—Anode—

Regarding an anode material for an organic electroluminescent device, it is preferable to use a material selected from a metal, an alloy, an electrically conductive compound or a mixture thereof having a large work function (4 eV or more).

Specific examples of such an electrode material include a metal such as Au, and a conductive transparent material such as CuI, indium tin oxide (ITO), $SnO_2$, and ZnO. In addition, an amorphous material such as IDIXO ($In_2O_3$—ZnO), which is capable of forming a transparent conductive film, may be used. Regarding the anode, such an electrode material is used to form a thin film by, for example, a vapor-deposition or sputtering method, and a desired shape pattern may be formed by a photolithographic method; or if the pattern accuracy is not particularly required (about 100 μm or more), a pattern may be formed via a desired shape mask when the electrode material is vapor deposited or sputtered. Alternatively, when a coatable substance such as an organic conductive compound is used, a wet film formation method such as a printing method or a coating method may be used. For taking emitted light from the anode, it is desired to have a transmittance of more than 10%, and the sheet resistance for the anode is preferably several hundreds Ω/□ or less. The film thickness is selected usually within 10 to 1000 nm, preferably within 10 to 200 nm though depending on the material.

—Cathode—

Meanwhile, regarding a cathode material, preferable to a material selected from a metal (an electron injection metal), an alloy, an electrically conductive compound, or a mixture thereof having a small work function (4 eV or less) are used. Specific examples of such an electrode material include sodium, a sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture, and a rare earth metal. Among these, from the viewpoint of the electron injectability and the durability against oxidation and the like, a mixture of an electron injection metal and a second metal which is a stable metal having a larger work function value is suitable, and examples thereof include a magnesium/silver mixture, a magnesium/aluminum mixture, a magnesium/indium mixture, an aluminum/aluminum oxide mixture, a lithium/aluminum mixture and aluminum. The cathode can be produced by forming a thin film by a method such as vapor-depositing or sputtering of such a cathode material. In addition, the sheet resistance of cathode is preferably several hundreds Ω/□ or less. The film thickness is selected usually within 10 nm to 5 μm, preferably within 50 to 200 nm. Note that for transmission of emitted light, if either one of the anode and cathode of the organic electroluminescent device is transparent or translucent, emission luminance is improved, which is convenient.

In addition, formation of a film of the above metal with a thickness of 1 to 20 nm on the cathode, followed by formation of a conductive transparent material described in the description on the anode thereon, enables production of a transparent or translucent cathode, and application of this enables production of a device wherein an anode and a cathode both have transmittance.

—Light-Emitting Layer—

The light-emitting layer is a layer that emits light after excitons are generated when holes and electrons injected from the anode and the cathode, respectively, are recombined. The light-emitting layer contains an organic light-emitting dopant material and a host.

As a host, the first host and the second host are used.

Regarding the compound represented by the general formula (1) as the first host, one kind thereof may be used, or two or more kinds thereof may be used. Likewise, regarding the carbazole compound or indolocarbazole compound represented by the general formulas (2) to (4) as the second host, one kind thereof may be used, or two or more kinds thereof may be used.

If necessary, one, or two or more known host materials may be used in combination; however, it is preferable that an amount thereof to be used be 50 wt % or less, preferably 25 wt % or less based on the host materials in total.

Other material may be used as the host.

The first host and the second host may be vapor-deposited from different vapor deposition sources, or alternatively, may be premixed before vapor deposition to prepare a premixture and thus the first host and the second host may be vapor-deposited from one vapor deposition source at the same time.

In the case of use of a plurality of kinds of hosts, such respective hosts can be vapor-deposited from different vapor deposition sources, or can be simultaneously vapor-deposited from one vapor deposition source by premixing for premixture formation before vapor deposition.

When the first host and the second host are premixed and used, it is desirable that a difference in 50% weight reduction temperature ($T_{50}$) be small in order to produce an organic electroluminescent device having favorable characteristics with high reproducibility. The 50% weight reduction temperature is a temperature at which the weight is reduced by 50% when the temperature is raised to 550° C. from room temperature at a rate of 10° C./min in TG-DTA measurement under a nitrogen stream reduced pressure (1 Pa). It is considered that vaporization due to evaporation or sublimation the most vigorously occurs around this temperature.

The difference in 50% weight reduction temperatures of the first host and the second host is preferably within 20° C. and more preferably within 15° C. Regarding a premixing method, a known method such as pulverization and mixing can be used, and it is desirable to mix them as uniformly as possible.

When a phosphorescent dopant is used as a light-emitting dopant material, preferred is a phosphorescent dopant including an organic metal complex containing at least one metal selected from ruthenium, rhodium, palladium, silver, rhenium, osmium, iridium, platinum and gold. Specifically, iridium complexes described in J. Am. Chem. Soc. 2001, 123, 4304 and JP2013-530515A are preferably used, but the phosphorescent dopant is not limited thereto.

Regarding the phosphorescent dopant material, only one kind thereof may be contained in the light-emitting layer, or two or more kinds thereof may be contained. A content of the phosphorescent dopant material is preferably 0.1 to 30 wt % and more preferably 1 to 20 wt % with respect to the host material.

The phosphorescent dopant material is not particularly limited, and specific examples thereof include the following.

[Formula 38]
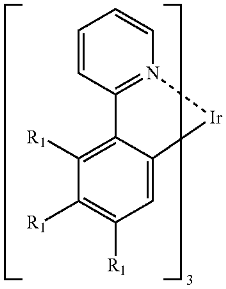
$R_1$: H, $CH_3$, $CF_3$, F
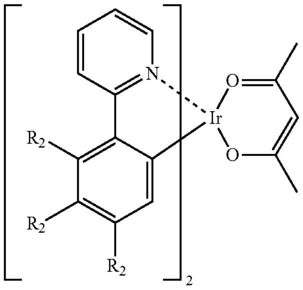
$R_2$: H, F
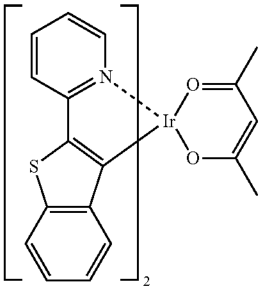
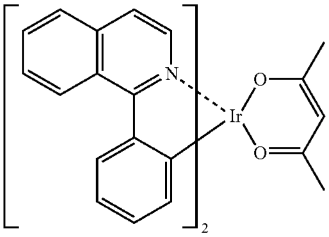
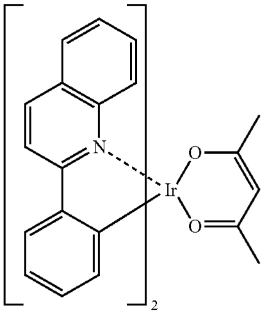
-continued
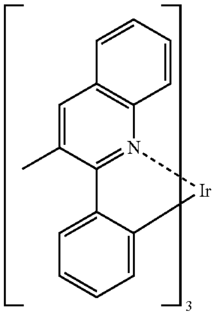
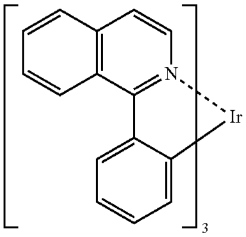
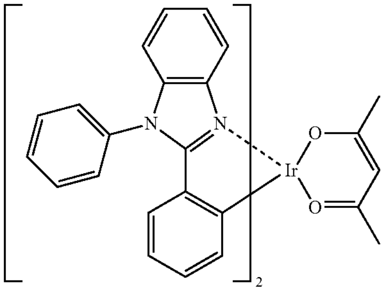
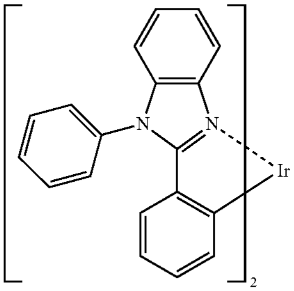
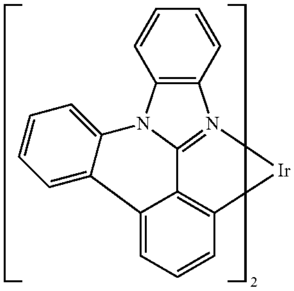
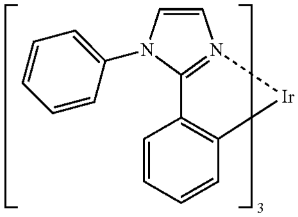

-continued
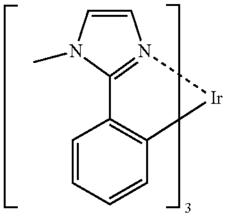
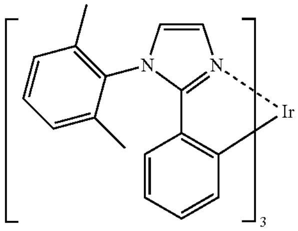
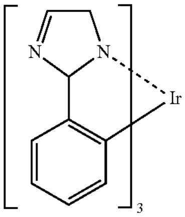
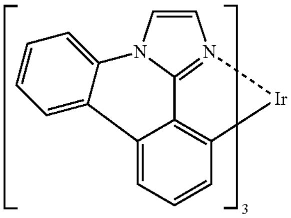
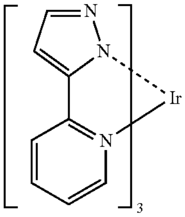
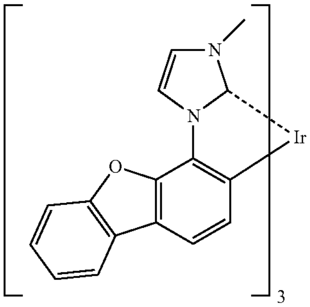
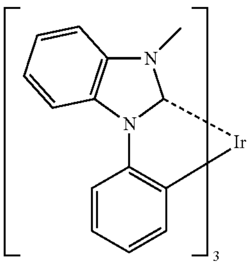
-continued
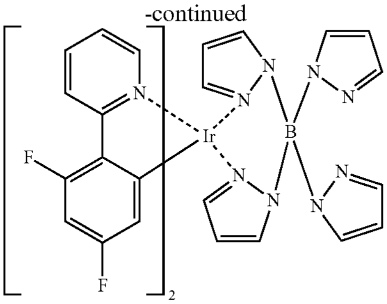
[Formula 39]
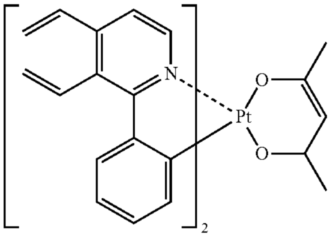
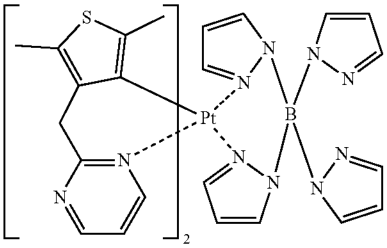
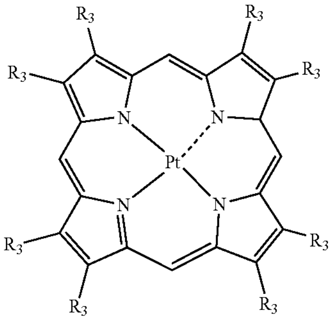
$R_3$: $CH_3$, $CH_2CH_2$
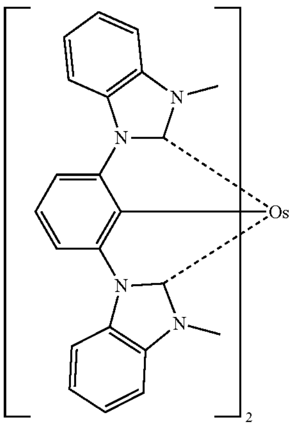

-continued

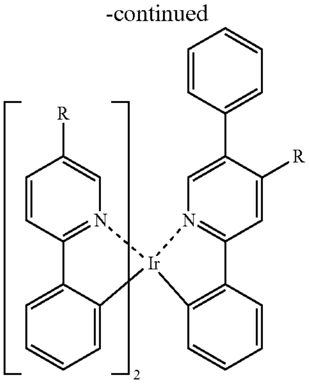

R: H, $CH_3$, $CD_3$

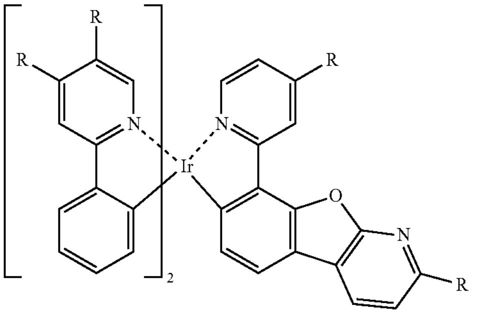

R: H, $CH_3$, $CD_3$

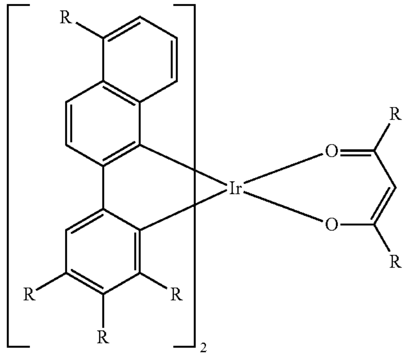

R:$H_3$, $CH_3$, $C_4H_9$, $CD_3$

When a fluorescence-emitting dopant is used as the light-emitting dopant material, the fluorescence-emitting dopant is not particularly limited. Examples thereof include benzoxazole derivatives, benzothiazole derivatives, benzimidazole derivatives, styrylbenzene derivatives, polyphenyl derivatives, diphenylbutadiene derivatives, tetraphenyl butadiene derivatives, naphthalimido derivatives, coumarin derivatives, fused aromatic compounds, perinone derivatives, oxadiazole derivatives, oxazine derivatives, aldazine derivatives, pyrrolidine derivatives, cyclopentadiene derivatives, bisstyryl anthracene derivatives, quinacridone derivatives, pyrrolopyridine derivatives, thiadiazolopyridine derivatives, styrylamine derivatives, diketopyrrolopyrrole derivatives, aromatic dimethylidine compounds, metal complexes of 8-quinolinol derivatives or metal complexes of pyromethene derivatives, rare earth complexes, various metal complexes represented by transition metal complexes, polymer compounds such as polythiophene, polyphenylene, and polyphenylene vinylene, and organosilane derivatives. Preferred examples thereof include fused aromatic derivatives, styryl derivatives, diketopyrrolopyrrole derivatives, oxazine derivatives, pyromethene metal complexes, transition metal complexes, and lanthanoid complexes. More preferable examples thereof include naphthalene, pyrene, chrysene, triphenylene, benzo[c]phenanthrene, benzo[a]anthracene, pentacene, perylene, fluoranthene, acenaphthofluoranthene, dibenzo[a,j]anthracene, dibenzo[a,h]anthracene, benzo[a]naphthalene, hexacene, naphtho[2,1-f]isoquinoline, α-naphthaphenanthridine, phenanthrooxazole, quinolino[6,5-f]quinoline, and benzothiophanthrene. These may have an alkyl group, an aryl group, an aromatic heterocyclic group, or a diarylamino group as a substituent.

Regarding the fluorescence-emitting dopant material, only one kind thereof may be contained in the light-emitting layer, or two or more kinds thereof may be contained. A content of the fluorescence-emitting dopant material is preferably 0.1 wt % to 20 wt % and more preferably 1 wt % to 10 wt % with respect to the host material.

When a thermally activated delayed fluorescence-emitting dopant is used as the light-emitting dopant material, the thermally activated delayed fluorescence-emitting dopant is not particularly limited. Examples thereof include: metal complexes such as a tin complex and a copper complex; indolocarbazole derivatives described in WO2011/070963A; cyanobenzene derivatives and carbazole derivatives described in Nature 2012, 492, 234; and phenazine derivatives, oxadiazole derivatives, triazole derivatives, sulfone derivatives, phenoxazine derivatives, and acridine derivatives described in Nature Photonics 2014, 8,326.

The thermally activated delayed fluorescence-emitting dopant material is not particularly limited, and specific examples thereof include the following.

[Formula 40]

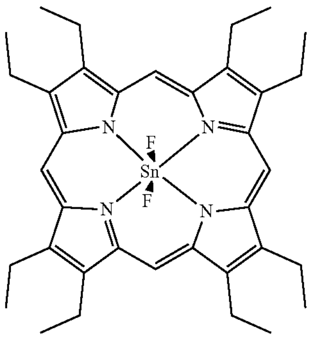

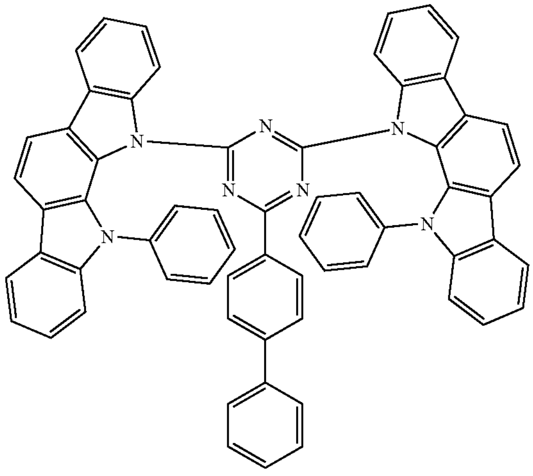

-continued

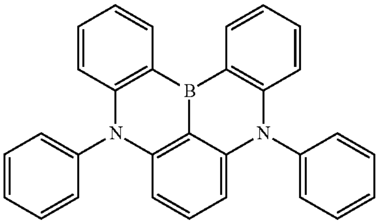

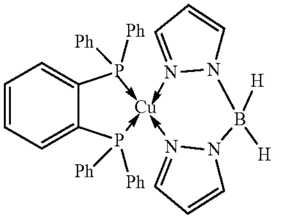

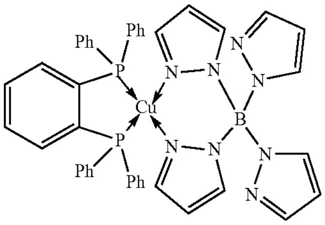

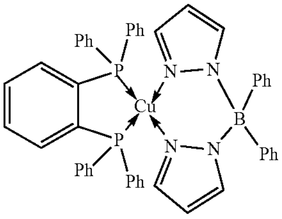

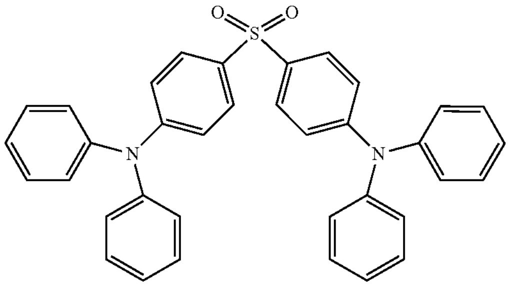

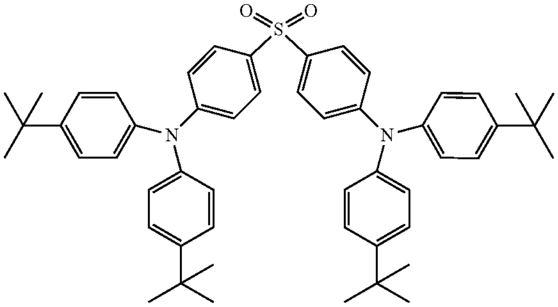

-continued

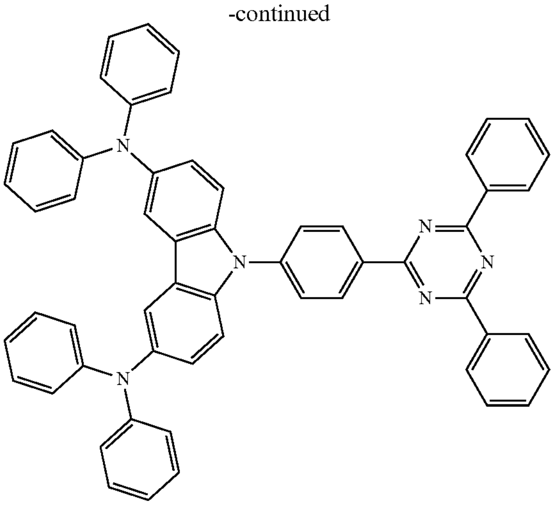

Regarding the thermally activated delayed fluorescence-emitting dopant material, only one kind thereof may be contained in the light-emitting layer, or two or more kinds thereof may be contained. In addition, the thermally activated delayed fluorescence-emitting dopant may be used by mixing with a phosphorescent dopant and a fluorescence-emitting dopant. A content of the thermally activated delayed fluorescence-emitting dopant material is preferably 0.1% to 50% and more preferably 1% to 30% with respect to the host material.

—Injection Layer—

The injection layer is a layer that is provided between an electrode and an organic layer in order to lower a driving voltage and improve emission luminance, and includes a hole injection layer and an electron injection layer, and may be present between the anode and the light-emitting layer or the hole transport layer, and between the cathode and the light-emitting layer or the electron transport layer. The injection layer can be provided as necessary.

—Hole Blocking Layer—

The hole blocking layer has a function of the electron transport layer in a broad sense, and is made of a hole blocking material having a function of transporting electrons and a significantly low ability to transport holes, and can block holes while transporting electrons, thereby improving a probability of recombining electrons and holes in the light-emitting layer.

For the hole blocking layer, a known hole blocking layer material can be used, but it is preferred for the layer to contain the compound represented by the general formula (1).

—Electron Blocking Layer—

The electron blocking layer has a function of a hole transport layer in a broad sense and blocks electrons while transporting holes, thereby enabling a probability of recombining electrons and holes in the light-emitting layer to be improved.

Regarding the material of the electron blocking layer, a known electron blocking layer material can be used and a material of the hole transport layer to be described below can be used as necessary. A film thickness of the electron blocking layer is preferably 3 to 100 nm, and more preferably 5 to 30 nm.

—Exciton Blocking Layer—

The exciton blocking layer is a layer for preventing excitons generated by recombination of holes and electrons in the light-emitting layer from being diffused in a charge transport layer, and insertion of this layer allows excitons to be efficiently confined in the light-emitting layer, enabling the luminous efficiency of the device to be improved. The exciton blocking layer can be inserted, in a device having two or more light-emitting layers adjacent to each other, between two adjacent light-emitting layers.

Regarding the material of the exciton blocking layer, a known exciton blocking layer material can be used. Examples thereof include 1,3-dicarbazolyl benzene (mCP) and bis(2-methyl-8-quinolinolato)-4-phenylphenolato aluminum (III) (BAlq).

—Hole Transport Layer—

The hole transport layer is made of a hole transport material having a function of transporting holes, and the hole transport layer can be provided as a single layer or a plurality of layers.

The hole transport material has either hole injection, transport properties or electron barrier properties, and may be an organic material or an inorganic material. For the hole transport layer, any one selected from conventionally known compounds can be used. Examples of such a hole transport material include porphyrin derivatives, arylamine derivatives, triazole derivatives, oxadiazole derivatives, imidazole derivatives, polyarylalkane derivatives, pyrazoline derivatives and pyrazolone derivatives, phenylenediamine derivatives, arylamine derivatives, amino-substituted chalcone derivatives, oxazole derivatives, styryl anthracene derivatives, fluorenone derivatives, hydrazone derivatives, stilbene derivatives, silazane derivatives, an aniline copolymer, and a conductive polymer oligomer, and particularly a thiophene oligomer. Use of porphyrin derivatives, arylamine derivatives, or styrylamine derivatives preferred. Use of arylamine compounds is more preferred.

—Electron Transport Layer—

The electron transport layer is made of a material having a function of transporting electrons, and the electron transport layer can be provided as a single layer or a plurality of layers.

The electron transport material (which may also serve as a hole blocking material) may have a function of transferring electrons injected from the cathode to the light-emitting layer. For the electron transport layer, any one selected from conventionally known compounds can be used, and examples thereof include polycyclic aromatic derivatives such as naphthalene, anthracene, and phenanthroline, tris(8-quinolinolato)aluminum(III) derivatives, phosphine oxide derivatives, nitro-substituted fluorene derivatives, diphenylquinone derivatives, thiopyrandioxide derivatives, carbodiimide, (fluorenylidene)methane derivatives, anthraquinodimethane and anthrone derivatives, bipyridine derivatives, quinoline derivatives, oxadiazole derivatives, benzimidazole derivatives, benzothiazole derivatives, and indolocarbazole derivatives. In addition, a polymer material in which the above material is introduced into a polymer chain or the above material is used for a main chain of a polymer can be used. The difference in electron affinities (EA) of the electron transport material (which may also serve as a hole blocking material) and the organic light-emitting dopant material or host is preferably 0.3 eV.

EXAMPLES

Hereafter, the present invention will be described in detail by referring to Examples, but the present invention is not limited these Examples and can be implemented in various forms without departing from the gist thereof.

Example 1

On a glass substrate on which an anode made of ITO with a film thickness of 110 nm was formed, respective thin films were stacked by a vacuum evaporation method at a degree of vacuum of $4.0\times10^{-5}$ Pa. First, HAT-CN was formed with a thickness of 25 nm as a hole injection layer on ITO, and next, NPD was formed with a thickness of 30 nm as a hole transport layer. Next, HT-1 was formed with a thickness of 10 nm as an electron blocking layer. Then, compound 1-6 as a first host, compound 2-2 as a second host and $Ir(ppy)_3$ as a light-emitting dopant were co-vapor-deposited from different vapor deposition sources, respectively, to form a light-emitting layer with a thickness of 40 nm. In this case, co-vapor deposition was performed under vapor deposition conditions such that the concentration of $Ir(ppy)_3$ was 10 wt % and the weight ratio between the first host and the second host was 30:70. Next, ET-1 was formed with a thickness of 20 nm as an electron transport layer. Further, LiF was formed with a thickness of 1 nm as an electron injection layer on the electron transport layer. Finally, Al was formed with a thickness of 70 nm as a cathode on the electron injection layer to produce an organic electroluminescent device.

Examples 1 to 82

Organic electroluminescent devices were produced in the same manner as in Example 1 except that compounds shown in Tables 1 and 2 were used as the first host and the second host instead of those of Example 1.

Example 83 to 87

The first host and the second host were mixed in advance to prepare a premixture, and the premixture was co-vapor deposited from one vapor deposition source.

Organic electroluminescent devices were produced in the same manner as in Example 1 except for use of a premixture obtained by weighing a first host (0.30 g) and a second host (0.70 g) and mixing them while grinding in a mortar.

Examples 88 to 92

The first host and the second host were mixed in advance to prepare a premixture, and the premixture was co-vapor deposited from one vapor deposition source.

Organic electroluminescent devices were produced in the same manner as in Example 1 except for use of a premixture obtained by weighing the first host (0.40 g) and the second host (0.60 g) and mixing them while grinding in a mortar in Example 1.

Evaluation results of the produced organic electroluminescent devices are shown in Tables 1 to 3.

In the tables, the luminance, driving voltage, and luminous efficiency are values at the time when the driving current was 20 mA/cm$^2$, and they exhibit initial characteristics. LT70 is a time period needed for the initial luminance to be reduced to 70% thereof, and it represents lifetime characteristics.

TABLE 1

| Example | 1st host material | 2nd host material | Luminance (cd/m2) | Voltage (V) | Power efficiency (lm/W) | LT70 (h) |
|---|---|---|---|---|---|---|
| 1 | 1-6 | 2-2 | 11800 | 3.6 | 51.5 | 3900 |
| 2 | 1-6 | 2-3 | 11800 | 3.5 | 53.0 | 3500 |
| 3 | 1-6 | 2-5 | 11200 | 3.4 | 51.7 | 3000 |
| 4 | 1-6 | 2-43 | 11300 | 3.4 | 52.2 | 4000 |
| 5 | 1-6 | 2-44 | 12000 | 3.6 | 52.4 | 2900 |
| 6 | 1-6 | 3-21 | 11100 | 3.4 | 51.3 | 2900 |
| 7 | 1-6 | 3-33 | 11200 | 3.4 | 51.7 | 2900 |
| 8 | 1-6 | 3-45 | 12100 | 3.7 | 51.4 | 2800 |
| 9 | 1-6 | 3-79 | 12100 | 3.7 | 51.4 | 3000 |
| 10 | 1-6 | 3-80 | 12200 | 3.7 | 51.8 | 3000 |
| 11 | 1-6 | 3-83 | 12000 | 3.7 | 50.9 | 2900 |
| 12 | 1-6 | 3-101 | 12000 | 3.7 | 50.9 | 2900 |
| 15 | 1-6 | 3-102 | 12000 | 3.6 | 52.4 | 3000 |
| 16 | 1-6 | 3-103 | 12000 | 3.7 | 50.9 | 2900 |
| 17 | 1-6 | 3-104 | 12000 | 3.6 | 52.4 | 3000 |
| 18 | 1-6 | 4-3 | 12000 | 3.7 | 50.9 | 2900 |
| 19 | 1-6 | 4-4 | 12000 | 3.7 | 50.9 | 2900 |
| 20 | 1-6 | 4-67 | 12000 | 3.6 | 52.4 | 3000 |
| 21 | 1-6 | 4-69 | 12000 | 3.6 | 52.4 | 3000 |
| 22 | 1-7 | 2-2 | 11200 | 3.7 | 48.2 | 4000 |
| 23 | 1-7 | 2-3 | 11200 | 3.6 | 49.6 | 3600 |
| 24 | 1-7 | 2-5 | 11000 | 3.5 | 50.1 | 3100 |
| 25 | 1-7 | 2-43 | 11000 | 3.5 | 50.1 | 4100 |
| 26 | 1-7 | 2-44 | 11400 | 3.7 | 49.1 | 3000 |
| 27 | 1-7 | 3-21 | 10600 | 3.5 | 48.3 | 3000 |
| 28 | 1-7 | 3-33 | 10600 | 3.5 | 48.3 | 3000 |
| 29 | 1-7 | 3-45 | 11500 | 3.8 | 48.2 | 2900 |
| 30 | 1-7 | 3-79 | 11500 | 3.8 | 48.2 | 3100 |
| 31 | 1-7 | 3-80 | 11600 | 3.8 | 48.6 | 3100 |

TABLE 2

| Example | 1st host material | 2nd host material | Luminance (cd/m2) | Voltage (V) | Power efficiency (lm/W) | LT70 (h) |
|---|---|---|---|---|---|---|
| 32 | 1-7 | 3-83 | 11500 | 3.8 | 48.2 | 3000 |
| 33 | 1-7 | 3-101 | 11500 | 3.8 | 48.2 | 3000 |
| 34 | 1-7 | 3-102 | 11400 | 3.7 | 49.1 | 3100 |
| 35 | 1-7 | 3-103 | 12000 | 3.8 | 50.3 | 3000 |
| 36 | 1-7 | 3-104 | 11400 | 3.7 | 49.1 | 3100 |
| 37 | 1-7 | 4-3 | 11400 | 3.8 | 47.8 | 3000 |
| 38 | 1-7 | 4-4 | 11400 | 3.8 | 47.8 | 3000 |
| 39 | 1-7 | 4-67 | 11400 | 3.7 | 49.1 | 3100 |
| 40 | 1-7 | 4-69 | 11400 | 3.7 | 49.1 | 3100 |
| 41 | 1-16 | 2-2 | 11800 | 3.7 | 50.1 | 4000 |
| 42 | 1-16 | 2-3 | 11800 | 3.6 | 51.5 | 3600 |
| 43 | 1-16 | 2-5 | 11200 | 3.5 | 50.3 | 3100 |
| 44 | 1-16 | 2-43 | 11300 | 3.5 | 50.7 | 4000 |
| 45 | 1-16 | 3-21 | 11100 | 3.5 | 49.8 | 3000 |
| 46 | 1-16 | 3-102 | 12000 | 3.7 | 50.9 | 3100 |
| 47 | 1-16 | 4-4 | 12000 | 3.8 | 49.6 | 3000 |
| 48 | 1-137 | 2-2 | 11200 | 3.6 | 48.9 | 4000 |
| 49 | 1-137 | 2-3 | 11200 | 3.5 | 50.3 | 3600 |
| 50 | 1-137 | 2-5 | 11000 | 3.4 | 50.8 | 3100 |
| 51 | 1-137 | 2-43 | 11000 | 3.4 | 50.8 | 4000 |
| 52 | 1-137 | 3-21 | 10600 | 3.4 | 49.0 | 3000 |
| 53 | 1-137 | 3-102 | 11000 | 3.5 | 49.4 | 3100 |
| 54 | 1-137 | 4-4 | 11400 | 3.6 | 49.7 | 3000 |
| 55 | 1-198 | 2-2 | 11800 | 3.6 | 51.5 | 3900 |
| 56 | 1-198 | 2-3 | 11500 | 3.5 | 51.6 | 3500 |
| 57 | 1-198 | 2-5 | 11200 | 3.4 | 51.7 | 3100 |
| 58 | 1-198 | 2-43 | 11100 | 3.4 | 51.3 | 3900 |
| 59 | 1-198 | 3-21 | 11100 | 3.4 | 51.3 | 3000 |
| 60 | 1-198 | 3-102 | 11500 | 3.6 | 50.2 | 3100 |
| 61 | 1-198 | 4-4 | 12000 | 3.7 | 50.9 | 3000 |

TABLE 3

| Example | 1st host material | 2d host material | Luminance (cd/m2) | Voltage (V) | Power efficiency (lm/W) | LT70 (h) |
|---|---|---|---|---|---|---|
| 62 | 1-222 | 2-2 | 12000 | 3.8 | 49.6 | 3700 |
| 63 | 1-222 | 2-3 | 11700 | 3.7 | 49.7 | 3600 |
| 64 | 1-222 | 2-5 | 11400 | 3.6 | 49.7 | 3100 |
| 65 | 1-222 | 2-43 | 11300 | 3.6 | 49.3 | 3700 |
| 66 | 1-222 | 3-21 | 11400 | 3.6 | 49.7 | 3000 |
| 67 | 1-222 | 3-102 | 11900 | 3.8 | 49.2 | 3100 |
| 68 | 1-222 | 4-4 | 12500 | 4.0 | 49.1 | 3000 |
| 69 | 1-223 | 2-2 | 13000 | 4.1 | 49.8 | 3600 |
| 70 | 1-223 | 2-3 | 12600 | 4.0 | 49.5 | 3600 |
| 71 | 1-223 | 2-5 | 12400 | 3.9 | 49.9 | 3100 |
| 72 | 1-223 | 2-43 | 12300 | 3.9 | 49.5 | 3600 |
| 73 | 1-223 | 3-21 | 12200 | 3.9 | 49.1 | 3000 |
| 74 | 1-223 | 3-102 | 13000 | 4.1 | 49.8 | 3100 |
| 75 | 1-223 | 4-4 | 13500 | 4.3 | 49.3 | 3000 |
| 76 | 1-234 | 2-2 | 13500 | 4.3 | 49.3 | 3600 |
| 77 | 1-234 | 2-3 | 13100 | 4.2 | 49.0 | 3600 |
| 78 | 1-234 | 2-5 | 13000 | 4.1 | 49.8 | 3100 |
| 79 | 1-234 | 2-43 | 13100 | 4.1 | 50.2 | 3600 |
| 80 | 1-234 | 3-21 | 13000 | 4.1 | 49.8 | 3000 |
| 81 | 1-234 | 3-102 | 13500 | 4.2 | 50.5 | 3100 |
| 82 | 1-234 | 4-4 | 13400 | 4.2 | 50.1 | 3000 |
| 83 | 1-6 | 2-3 | 11800 | 3.5 | 53.0 | 4200 |
| 84 | 1-6 | 2-43 | 11300 | 3.4 | 52.2 | 4300 |
| 85 | 1-7 | 2-3 | 11500 | 3.6 | 50.2 | 4200 |
| 86 | 1-7 | 2-43 | 12500 | 3.9 | 50.3 | 4300 |
| 87 | 1-16 | 2-43 | 11300 | 3.5 | 50.7 | 4200 |
| 88 | 1-6 | 2-3 | 12000 | 3.4 | 55.4 | 3800 |
| 89 | 1-6 | 2-43 | 11500 | 3.3 | 54.7 | 4000 |
| 90 | 1-7 | 2-3 | 12000 | 3.5 | 53.9 | 3900 |
| 91 | 1-7 | 2-43 | 12300 | 3.8 | 50.8 | 4100 |
| 92 | 1-16 | 2-43 | 11500 | 3.4 | 53.1 | 3900 |

Comparative Example 1

An organic electroluminescent device was produced in the same manner as in Example 1 except that compound 2-2 was used alone as the host instead of the hosts of Example 1. The thickness of the light-emitting layer and the concentration of the light-emitting dopant were the same as those in Example 1.

Comparative Examples 2 to 4

Organic electroluminescent devices were produced in the same manner as Comparative Example 1 except that each of compounds shown in Table 2 was used alone instead of the host of Comparative Example 1.

Comparative Examples 5 to 11

Organic electroluminescent devices were produced in the same manner as in Example 1 except that compound A was used as the first host and compound 2-5, compound 2-3, compound 2-5, compound 2-43, compound 3-21, compound 3-102, or compound 4-4 was used as the second host instead of those of Example 1.

Comparative Examples 12 to 18

Organic electroluminescent devices were produced in the same manner as in Comparative Examples 5 to 11 except that compound B was used as the first host instead of those of Comparative Examples 5 to 11.

Comparative Example 19

The first host and the second host were mixed in advance to prepare a premixture, and the premixture was co-vapor deposited from one vapor deposition source.

An organic electroluminescent device was produced in the same manner as in Comparative Example 1 except for use of a premixture obtained by weighing compound C (0.30 g) and compound 2-2 (0.70 g) and mixing them while grinding in a mortar in Comparative Example 1.

Evaluation results of the produced organic electroluminescent devices are shown in Table 4.

TABLE 4

| Comparative Example | 1st host material | 2nd host material | Luminance (cd/m2) | Voltage (V) | Power efficiency (lm/W) | LT70 (h) |
|---|---|---|---|---|---|---|
| 1 | — | 2-2 | 9000 | 5.1 | 27.7 | 500 |
| 2 | — | 3-21 | 9000 | 5.0 | 28.3 | 550 |
| 3 | — | 3-102 | 8000 | 5.2 | 24.2 | 500 |
| 4 | — | 4-3 | 7000 | 5.0 | 22.0 | 500 |
| 5 | A | 2-2 | 12100 | 4.7 | 40.4 | 2000 |
| 6 | A | 2-3 | 12200 | 4.7 | 40.8 | 2000 |
| 7 | A | 2-5 | 12000 | 4.7 | 40.1 | 2000 |
| 8 | A | 2-43 | 12000 | 4.7 | 40.1 | 2000 |
| 9 | A | 3-21 | 12500 | 4.7 | 41.8 | 2000 |
| 10 | A | 3-102 | 12500 | 4.6 | 42.7 | 2000 |
| 11 | A | 4-4 | 12500 | 4.7 | 41.8 | 2000 |
| 12 | B | 2-2 | 12200 | 4.5 | 42.6 | 2000 |
| 13 | B | 2-3 | 12200 | 4.5 | 42.6 | 2000 |
| 14 | B | 2-5 | 12000 | 4.4 | 42.8 | 1000 |
| 15 | B | 2-43 | 12000 | 4.4 | 42.8 | 1000 |
| 16 | B | 3-21 | 11500 | 4.3 | 42.0 | 1000 |
| 17 | B | 3-102 | 11500 | 4.4 | 41.1 | 1000 |
| 18 | B | 4-4 | 10000 | 4.3 | 36.5 | 1000 |
| 19 | C | 2-2 | 11400 | 4.2 | 42.6 | 4300 |

From Tables 1 to 3, it is understood that Examples 1 to 92 improved the power efficiency, and exhibited good characteristics.

Example 93

On a glass substrate on which an anode made of ITO with a film thickness of 110 nm was formed, respective thin films were stacked by a vacuum evaporation method at a degree of vacuum of $4.0\times10^{-5}$ Pa. First, HAT-CN was formed with a thickness of 25 nm as a hole injection layer on ITO, and next, NPD was formed with a thickness of 45 nm as a hole transport layer. Next, HT-1 was formed with a thickness of 10 nm as an electron blocking layer. Then, compound 1-6 as a first host, compound 2-4 as a second host and $Ir(piq)_2acac$ as a light-emitting dopant were co-vapor deposited from different vapor deposition sources, respectively, to form a light-emitting layer with a thickness of 40 nm. In this case, co-vapor deposition was performed under a vapor deposition condition such that the concentration of $Ir(piq)_2acac$ was 7.0 wt %. Next, ET-1 was formed with a thickness of 37.5 nm as an electron transport layer. Then, LiF was formed with a thickness of 1 nm as an electron injection layer on the electron transport layer. Finally, Al was formed with a thickness of 70 nm as a cathode on the electron injection layer to produce an organic electroluminescent device.

Examples 94 to 172

Organic electroluminescent devices were produced in the same manner as in Example 93 except that compounds shown in Tables 5 to 7 were used as the first host and the second host instead of those of Example 93.

Examples 173 to 177

The first host and the second host were mixed in advance to prepare a premixture, and the premixture was co-vapor deposited from one vapor deposition source.

Organic electroluminescent devices were produced in the same manner as in Example 93 except that for use of a premixture obtained by weighing the first host (0.30 g) and the second host (0.70 g) and mixing them while grinding in a mortar in Example 93.

Examples 178 to 182

The first host and the second host were mixed in advance to prepare a premixture, and the premixture was co-vapor deposited from one vapor deposition source.

Organic electroluminescent devices were produced in the same manner as in Example 93 except that for use of a premixture obtained by weighing the first host (0.40 g) and the second host (0.60 g) and mixing them while grinding in a mortar in Example 93.

Evaluation results of the produced organic electroluminescent devices are shown in Tables 5 to 7. LT95 used therein is a time period needed for the initial luminance to be reduced to 95% thereof, and it represents lifetime characteristics.

TABLE 5

| Example | 1st host material | 2nd host material | Luminance (cd/m2) | Voltage (V) | Power efficiency (lm/W) | LT95 (h) |
|---|---|---|---|---|---|---|
| 93 | 1-6 | 2-2 | 3100 | 3.4 | 14.3 | 550 |
| 94 | 1-6 | 2-3 | 3100 | 3.3 | 14.8 | 500 |
| 95 | 1-6 | 2-5 | 3000 | 3.3 | 14.3 | 500 |
| 96 | 1-6 | 2-43 | 3000 | 3.3 | 14.3 | 550 |
| 97 | 1-6 | 2-44 | 3300 | 3.6 | 14.4 | 450 |
| 98 | 1-6 | 3-21 | 3000 | 3.4 | 13.9 | 500 |
| 99 | 1-6 | 3-33 | 3000 | 3.4 | 13.9 | 500 |
| 100 | 1-6 | 3-45 | 3000 | 3.4 | 13.9 | 450 |
| 101 | 1-6 | 3-79 | 2900 | 3.3 | 13.8 | 500 |
| 102 | 1-6 | 3-80 | 3000 | 3.3 | 14.3 | 500 |
| 103 | 1-6 | 3-83 | 3300 | 3.7 | 14.0 | 440 |
| 104 | 1-6 | 3-101 | 3300 | 3.7 | 14.0 | 440 |
| 105 | 1-6 | 3-102 | 3300 | 3.6 | 14.4 | 500 |
| 106 | 1-6 | 3-103 | 3300 | 3.7 | 14.0 | 500 |
| 107 | 1-6 | 3-104 | 3300 | 3.6 | 14.4 | 500 |
| 108 | 1-6 | 4-3 | 3300 | 3.7 | 14.0 | 500 |
| 109 | 1-6 | 4-4 | 3300 | 3.7 | 14.0 | 500 |
| 110 | 1-6 | 4-67 | 3300 | 3.6 | 14.4 | 550 |
| 111 | 1-6 | 4-69 | 3300 | 3.6 | 14.4 | 500 |
| 112 | 1-7 | 2-2 | 3100 | 3.5 | 14.1 | 560 |
| 113 | 1-7 | 2-3 | 3100 | 3.4 | 14.5 | 500 |
| 114 | 1-7 | 2-5 | 3000 | 3.4 | 14.1 | 560 |
| 115 | 1-7 | 2-43 | 3000 | 3.4 | 14.1 | 560 |
| 116 | 1-7 | 2-44 | 3300 | 3.7 | 14.2 | 450 |
| 117 | 1-7 | 3-21 | 3000 | 3.5 | 13.7 | 500 |
| 118 | 1-7 | 3-33 | 3000 | 3.5 | 13.7 | 500 |
| 119 | 1-7 | 3-45 | 3000 | 3.5 | 13.7 | 440 |
| 120 | 1-7 | 3-79 | 3000 | 3.4 | 14.1 | 500 |
| 121 | 1-7 | 3-80 | 3000 | 3.4 | 14.1 | 500 |
| 122 | 1-7 | 3-83 | 3300 | 3.8 | 13.8 | 440 |

TABLE 6

| Example | 1st host material | 2nd host material | Luminance (cd/m2) | Voltage (V) | Power efficiency (lm/W) | LT95 (h) |
|---|---|---|---|---|---|---|
| 123 | 1-7 | 3-101 | 3300 | 3.8 | 13.8 | 440 |
| 124 | 1-7 | 3-102 | 3300 | 3.7 | 14.2 | 500 |
| 125 | 1-7 | 3-103 | 3300 | 3.8 | 13.8 | 510 |
| 126 | 1-7 | 3-104 | 3300 | 3.7 | 14.2 | 500 |
| 127 | 1-7 | 4-3 | 3300 | 3.8 | 13.8 | 510 |
| 128 | 1-7 | 4-4 | 3300 | 3.8 | 13.8 | 510 |
| 129 | 1-7 | 4-67 | 3300 | 3.7 | 14.2 | 540 |
| 130 | 1-7 | 4-69 | 3300 | 3.7 | 14.2 | 510 |
| 131 | 1-16 | 2-2 | 3100 | 3.5 | 13.9 | 560 |

TABLE 6-continued

| Example | 1st host material | 2nd host material | Luminance (cd/m2) | Voltage (V) | Power efficiency (lm/W) | LT95 (h) |
|---|---|---|---|---|---|---|
| 132 | 1-16 | 2-3 | 3100 | 3.4 | 14.3 | 510 |
| 133 | 1-16 | 2-5 | 3000 | 3.4 | 13.9 | 510 |
| 134 | 1-16 | 2-43 | 3000 | 3.4 | 13.9 | 560 |
| 135 | 1-16 | 3-21 | 3000 | 3.5 | 13.5 | 510 |
| 136 | 1-16 | 3-102 | 3300 | 3.7 | 14.0 | 510 |
| 137 | 1-16 | 4-4 | 3300 | 3.7 | 14.0 | 510 |
| 138 | 1-137 | 2-2 | 3100 | 3.5 | 13.9 | 540 |
| 139 | 1-137 | 2-3 | 3100 | 3.4 | 14.3 | 500 |
| 140 | 1-137 | 2-5 | 3000 | 3.4 | 13.9 | 540 |
| 141 | 1-137 | 2-43 | 3000 | 3.8 | 12.4 | 540 |
| 142 | 1-137 | 3-21 | 3000 | 3.8 | 12.4 | 480 |
| 143 | 1-137 | 3-102 | 3300 | 3.7 | 14.0 | 480 |
| 144 | 1-137 | 4-4 | 3300 | 3.8 | 13.6 | 500 |
| 145 | 1-198 | 2-2 | 3100 | 3.4 | 14.3 | 550 |
| 146 | 1-198 | 2-3 | 3100 | 3.4 | 14.3 | 510 |
| 147 | 1-198 | 2-5 | 3000 | 3.4 | 13.9 | 510 |
| 148 | 1-198 | 2-43 | 3000 | 3.4 | 13.9 | 550 |
| 149 | 1-198 | 3-21 | 3000 | 3.4 | 13.9 | 510 |
| 150 | 1-198 | 3-102 | 3100 | 3.5 | 13.9 | 510 |
| 151 | 1-198 | 4-4 | 3200 | 3.6 | 14.0 | 510 |
| 152 | 1-222 | 2-2 | 3300 | 3.6 | 14.4 | 530 |

TABLE 7

| Example | 1st host material | 2ond host material | Luminance (cd/m2) | Voltage (V) | Power efficiency (lm/W) | LT95 (h) |
|---|---|---|---|---|---|---|
| 153 | 1-222 | 2-3 | 3300 | 3.6 | 14.4 | 500 |
| 154 | 1-222 | 2-5 | 3200 | 3.6 | 14.0 | 530 |
| 155 | 1-222 | 2-43 | 3200 | 3.6 | 14.0 | 530 |
| 156 | 1-222 | 3-21 | 3300 | 3.6 | 14.4 | 480 |
| 157 | 1-222 | 3-102 | 3300 | 3.7 | 14.0 | 480 |
| 158 | 1-222 | 4-4 | 3500 | 3.7 | 14.9 | 500 |
| 159 | 1-223 | 2-2 | 3300 | 3.7 | 14.0 | 520 |
| 160 | 1-223 | 2-3 | 3300 | 3.7 | 14.0 | 500 |
| 161 | 1-223 | 2-5 | 3300 | 3.7 | 14.0 | 520 |
| 162 | 1-223 | 2-43 | 3300 | 3.7 | 14.0 | 520 |
| 163 | 1-223 | 3-21 | 3300 | 3.7 | 14.0 | 480 |
| 164 | 1-223 | 3-102 | 3400 | 3.8 | 14.1 | 480 |
| 165 | 1-223 | 4-4 | 3500 | 3.8 | 14.5 | 500 |
| 166 | 1-234 | 2-2 | 3300 | 3.5 | 14.8 | 520 |
| 167 | 1-234 | 2-3 | 3300 | 3.5 | 14.8 | 510 |
| 168 | 1-234 | 2-5 | 3200 | 3.5 | 14.4 | 520 |
| 169 | 1-234 | 2-43 | 3200 | 3.5 | 14.4 | 520 |
| 170 | 1-234 | 3-21 | 3300 | 3.5 | 14.8 | 480 |
| 171 | 1-234 | 3-102 | 3300 | 3.6 | 14.4 | 480 |
| 172 | 1-234 | 4-4 | 3500 | 3.7 | 14.9 | 500 |
| 173 | 1-6 | 2-3 | 3100 | 3.3 | 14.8 | 550 |
| 174 | 1-6 | 2-43 | 3000 | 3.3 | 14.3 | 550 |
| 175 | 1-7 | 2-3 | 3100 | 3.4 | 14.3 | 550 |
| 176 | 1-7 | 2-43 | 3000 | 3.3 | 14.3 | 570 |
| 177 | 1-16 | 2-43 | 3000 | 3.4 | 13.9 | 570 |
| 178 | 1-6 | 2-3 | 3200 | 3.4 | 14.8 | 530 |
| 179 | 1-6 | 2-43 | 3100 | 3.3 | 14.8 | 530 |
| 180 | 1-7 | 2-3 | 3200 | 3.3 | 15.2 | 530 |
| 181 | 1-7 | 2-43 | 3100 | 3.3 | 14.8 | 540 |
| 182 | 1-16 | 2-43 | 3100 | 3.3 | 14.8 | 540 |

Comparative Example 20

Organic electroluminescent devices were produced in the same manner as in Example 97 except that compound 1-6 was used alone as the host instead of the hosts of Example 93. The thickness of the light-emitting layer and the concentration of the light-emitting dopant were the same as those in Example 97.

Comparative Example 21 to 23

Organic electroluminescent devices were produced in the same manner as in Comparative Example 20 except that each of compounds shown in Table 8 was used alone instead of the host of Comparative Example 20.

Comparative Examples 24 to 30

Organic electroluminescent devices were produced in the same manner as in Example 93 except that compound A was used as the first host and compound 2-5, compound 2-3, compound 2-5, compound 2-43, compound 3-21, compound 3-102, or compound 4-4 was used as the second host instead of those of Example 93.

Comparative Examples 31 to 37

Organic electroluminescent devices were produced in the same manner as in Comparative Examples 24 to 30 except that compound B was used as the first host instead of that of Comparative Examples 24 to 30.

Comparative Example 38

The first host and the second host were mixed in advance to prepare a premixture, and the premixture was co-vapor deposited from one vapor deposition source.

An organic electroluminescent device was produced in the same manner as in Comparative Example 1 except for use of a premixture obtained by weighing compound C (0.30 g) and compound 2-2 (0.70 g) and mixing them while grinding in a mortar in Comparative Example 1.

Evaluation results of the produced organic electroluminescent devices are shown in Table 8.

TABLE 8

| Comparative Example | 1st host material | 2nd host material | Luminance (cd/m2) | Voltage (V) | Power efficiency (lm/W) | LT95 (h) |
|---|---|---|---|---|---|---|
| 20 | — | 2-2 | 2000 | 4.8 | 6.5 | 110 |
| 21 | — | 3-21 | 2000 | 4.8 | 6.5 | 110 |
| 22 | — | 3-102 | 2000 | 4.9 | 6.4 | 100 |
| 23 | — | 4-3 | 2000 | 5.0 | 6.3 | 100 |
| 24 | A | 2-2 | 2500 | 4.7 | 8.4 | 220 |
| 25 | A | 2-3 | 2500 | 4.7 | 8.4 | 170 |
| 26 | A | 2-5 | 2500 | 4.7 | 8.4 | 170 |
| 27 | A | 2-43 | 2500 | 4.7 | 8.4 | 110 |
| 28 | A | 3-21 | 2500 | 4.7 | 8.4 | 110 |
| 29 | A | 3-102 | 2500 | 4.6 | 8.5 | 110 |
| 30 | A | 4-4 | 2500 | 4.7 | 8.4 | 110 |
| 31 | B | 2-2 | 2500 | 4.5 | 8.7 | 200 |
| 32 | B | 2-3 | 2500 | 4.5 | 8.7 | 170 |
| 33 | B | 2-5 | 2500 | 4.4 | 8.9 | 150 |
| 34 | B | 2-43 | 2500 | 4.4 | 8.9 | 100 |
| 35 | B | 3-21 | 2500 | 4.3 | 9.1 | 100 |
| 36 | B | 3-102 | 2500 | 4.4 | 8.9 | 100 |
| 37 | B | 4-4 | 2500 | 4.3 | 9.1 | 100 |
| 38 | C | 2-2 | 2600 | 4.2 | 9.7 | 300 |

From Tables 5 to 8, it is understood that Examples 93 to 182 improved the power efficiency, and exhibited good characteristics.

Compounds used in Examples are shown below.
[Formula 34]
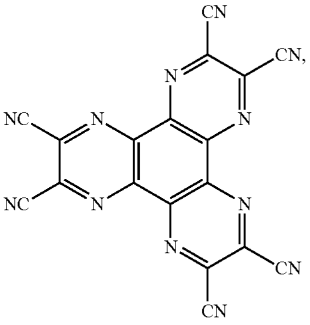
HAT-CN
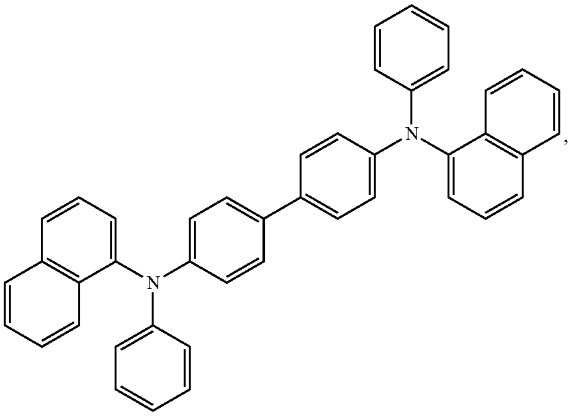
NPD
HT-1
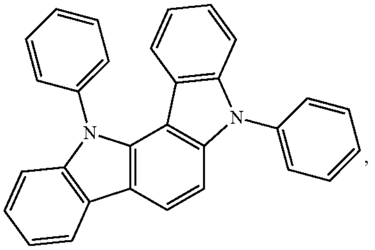
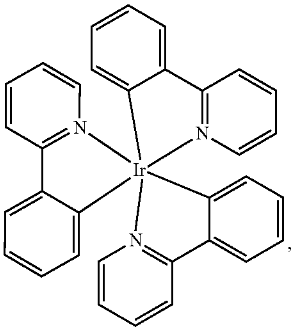
Ir(ppy)3
-continued
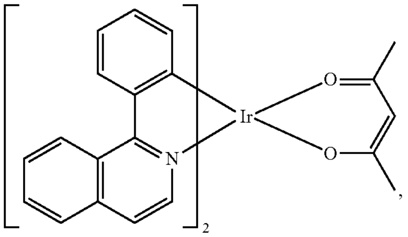
Ir(piq)2acaa
ET-1
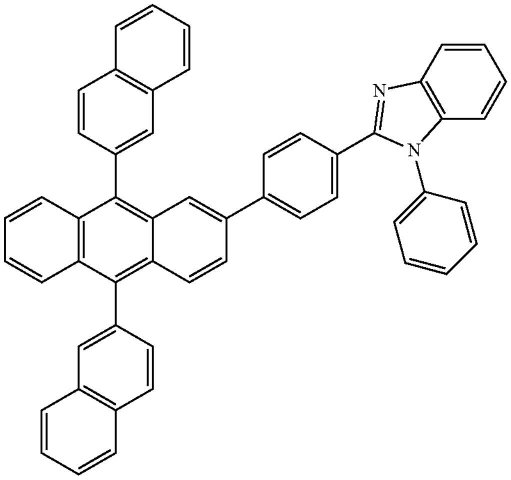
A
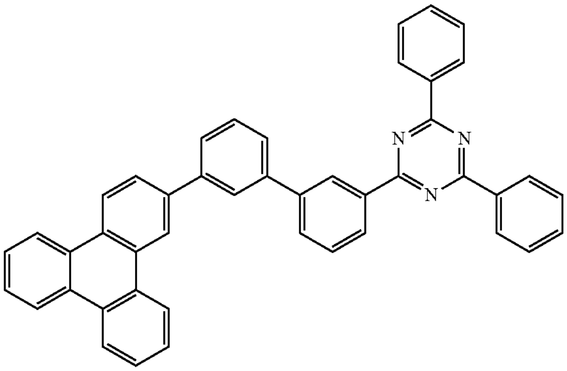
B
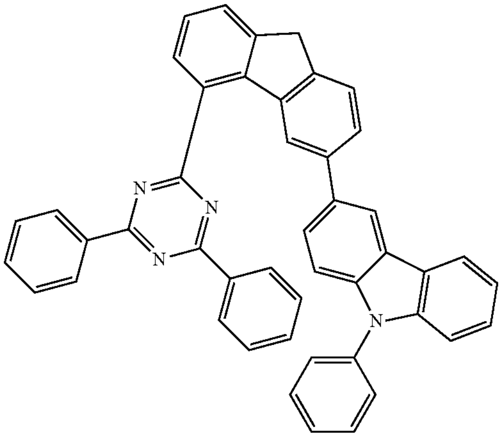

-continued

C

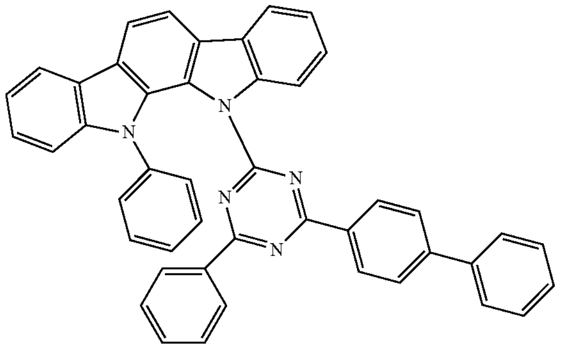

The 50% weight reduction temperatures ($T_{50}$) of compounds 1-6, 1-7, 1-16, 1-137, 2-3, and 2-43 are described in Table 9.

TABLE 9

| Compound | $T_{50}$ [° C.] |
| --- | --- |
| 1-6 | 306 |
| 1-7 | 312 |
| 1-16 | 328 |
| 1-137 | 345 |
| 2-3 | 319 |
| 2-43 | 317 |
| Compound C | 270 |

The invention claimed is:

1. An organic electroluminescent device comprising an anode, an organic layer and a cathode stacked on a substrate, wherein at least one layer of the organic layer is a light-emitting layer containing a first host, a second host, and a light-emitting dopant material, the first host is selected from a compound represented by the following general formula (5) or general formula (6), and the second host is selected from a compound represented by the following general formula (2), general formula (3), or general formula (4):

(5)

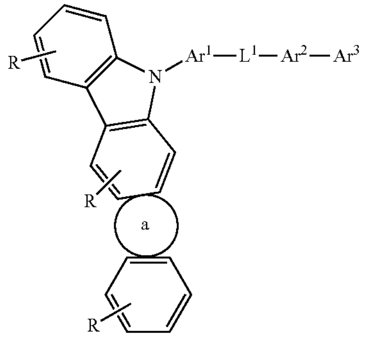

(5a)

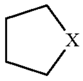

-continued (1a)

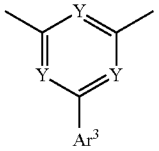

wherein R independently represents hydrogen, deuterium, an aliphatic hydrocarbon group having 1 to 10 carbon atoms, a substituted or unsubstituted aromatic hydrocarbon group having 6 to 30 carbon atoms, a substituted or unsubstituted aromatic heterocyclic group having 3 to 16 carbon atoms, or a substituted or unsubstituted linked aromatic group in which two to three of these aromatic groups are linked to each other;

$Ar^1$ and $Ar^2$ are independently an aromatic heterocyclic group represented by formula (Ia);

Y independently represents N or $CR^{14}$, and at least one Y represents N;

$R^{14}$ represents hydrogen, deuterium, an aliphatic hydrocarbon group having 1 to 10 carbon atoms, a substituted or unsubstituted aromatic hydrocarbon group having 6 to 30 carbon atoms, a substituted or unsubstituted aromatic heterocyclic group having 3 to 16 carbon atoms, or a substituted or unsubstituted linked aromatic group in which two to five of these aromatic rings are linked to each other;

$Ar^3$ independently represents hydrogen, a substituted or unsubstituted aromatic hydrocarbon group having 6 to 30 carbon atoms, or a substituted or unsubstituted aromatic heterocyclic group having 3 to 16 carbon atoms, or a substituted or unsubstituted linked aromatic group in which two to five of these aromatic rings are linked to each other;

$L^1$ independently represents a substituted or unsubstituted aromatic hydrocarbon group having 6 to 30 carbon atoms;

ring a is represented by formula (5a) and the ring a is fused to an adjacent ring at any position; and X represents $NR^{11}$, S, or O, and $R^{11}$ represents an aliphatic hydrocarbon group having 1 to 10 carbon atoms, a substituted or unsubstituted aromatic hydrocarbon group having 6 to 30 carbon atoms, a substituted or unsubstituted aromatic heterocyclic group having 3 to 16 carbon atoms, or a linked aromatic group in which two to five of these groups are linked to each other;

(6)

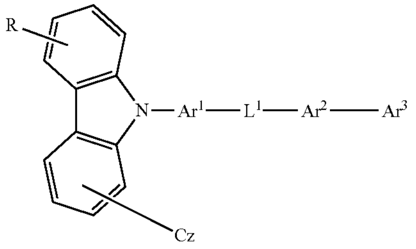

(6a)

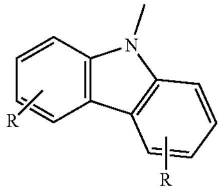

-continued (6b)

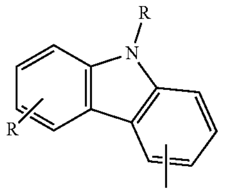

wherein R, $Ar^1$, $Ar^2$, $Ar^3$, and $L^1$ have the same meaning as in general formula (5); and Cz presents a carbazole group represented by formula (6a) or formula (6b);

(2)

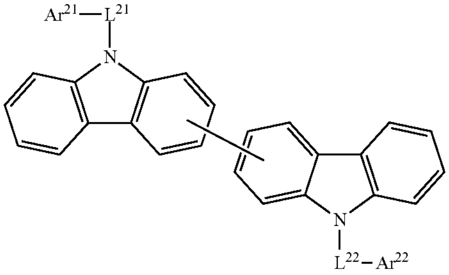

wherein $Ar^{21}$ and $Ar^{22}$ independently represent hydrogen, a substituted or unsubstituted aromatic hydrocarbon group having 6 to 14 carbon atoms, or a substituted or unsubstituted linked aromatic group in which two of the aromatic hydrocarbon groups are linked to each other; and $L^{21}$ and $L^{22}$ independently represent a phenylene group;

(3)

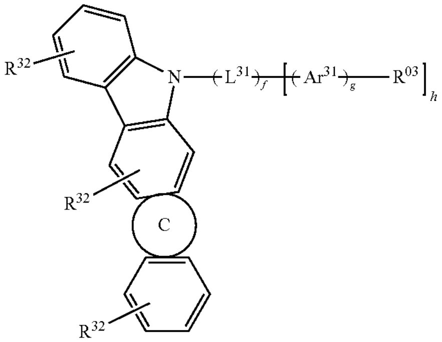

(3a)

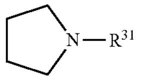

wherein ring c is a heterocycle represented by formula (3a) and the ring c is fused to an adjacent ring at any position;

$R^{03}$ and $R^{32}$ independently represent hydrogen, deuterium, an aliphatic hydrocarbon group having 1 to 10 carbon atoms, a substituted or unsubstituted aromatic hydrocarbon group having 6 to 30 carbon atoms, or a substituted or unsubstituted aromatic heterocyclic group having 3 to 16 carbon atoms;

$R^{31}$ represents a substituted or unsubstituted aromatic hydrocarbon group having 6 to 10 carbon atoms, a carbazolyl group, or a substituted or unsubstituted linked aromatic group in which two to five of these aromatic rings are linked to each other;

$L^{31}$ independently represents a substituted or unsubstituted aromatic hydrocarbon group having 6 to 30 carbon atoms, or a substituted or unsubstituted aromatic heterocyclic group having 3 to 16 carbon atoms;

$Ar^{31}$ independently represents a substituted or unsubstituted aromatic hydrocarbon group having 6 to 10 carbon atoms; and f is the number of repetitions and represents an integer of 1 to 3, g is the number of repetitions and independently represents an integer of 0 to 3, and h is the number of substitutions and represents an integer of 1 to 7;

(4)

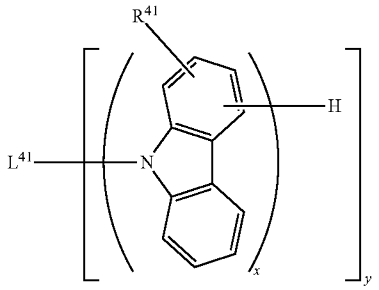

wherein $L^{41}$ represents a substituted or unsubstituted aromatic hydrocarbon group having 6 to 30 carbon atoms, a substituted or unsubstituted aromatic heterocyclic group having 3 to 12 carbon atoms, or a linked aromatic group in which two to five of these aromatic rings are linked;

$R^{41}$ each independently represents hydrogen, deuterium, an aliphatic hydrocarbon group having 1 to 10 carbon atoms, a substituted or unsubstituted aromatic hydrocarbon group having 6 to 30 carbon atoms, or a substituted or unsubstituted aromatic heterocyclic group having 3 to 16 carbon atoms, provided that $R^{41}$ is not a carbazole group;

x is the number of repetitions and independently represents an integer of 1 to 4, provided that at least one x is an integer of 2 to 4;

y is the number of substitutions and represents an integer of 1 to 4; and when x and y are each 2 or more, a plurality of carbazolyl groups in the formula may be the same or different.

2. The organic electroluminescent device according to claim 1, wherein the compound represented by the general formula (1) (5) is a compound represented by any of formulas (7) to (12):

(7)

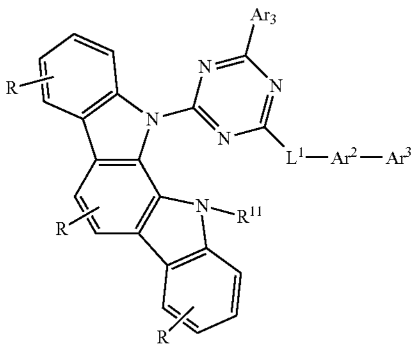

-continued (8)

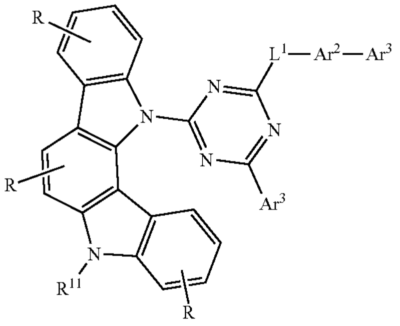

(9)

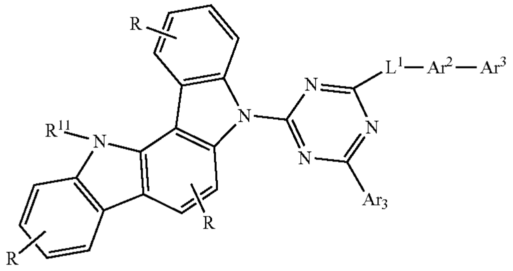

(10)

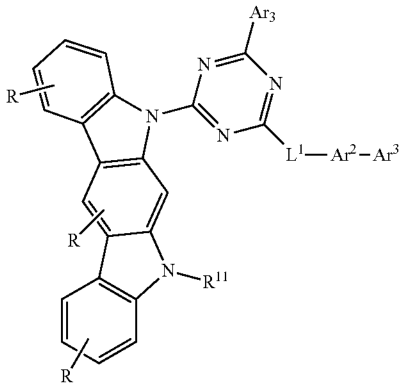

(11)

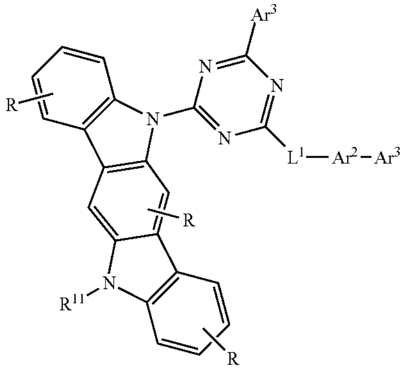

-continued (12)

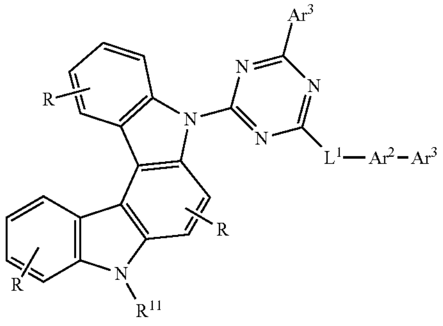

wherein $L^1$, $Ar^2$, $Ar^3$, R, and $R^{11}$ have the same meanings as in the general formula (5).

3. The organic electroluminescent device according to claim 1, wherein the compound represented by the general formula (2) is used as the second host.

4. The organic electroluminescent device according to claim 3, wherein the compound represented by the general formula (2) is a compound represented by the following formula (13):

(13)

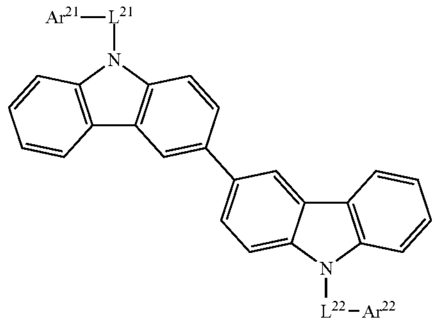

wherein $Ar^{21}$, $Ar^{22}$, $L^{21}$, and $L^{22}$ have the same meanings as in the general formula (2).

5. The organic electroluminescent device according to claim 1, wherein the compound represented by the general formula (3) is used as the second host.

6. The organic electroluminescent device according to claim 5, wherein $L^{31}$ in the general formula (3) represents a compound represented by a substituted or unsubstituted aromatic hydrocarbon group having 6 to 15 carbon atoms, a substituted or unsubstituted carbazole group, a substituted or unsubstituted dibenzothiophene group, or a substituted or unsubstituted dibenzofuran group.

7. The organic electroluminescent device according to claim 5, wherein $L^{31}$ in the general formula (3) represents a substituted or unsubstituted phenyl group, a substituted or unsubstituted naphthyl group, a substituted or unsubstituted biphenyl group, a substituted or unsubstituted 9,9'-dimethylfluorene group, or a substituted or unsubstituted carbazole group.

8. The organic electroluminescent device according to claim 5, wherein the compound represented by the general formula (3) is a compound represented by the following formula (14) or formula (15):

(14)

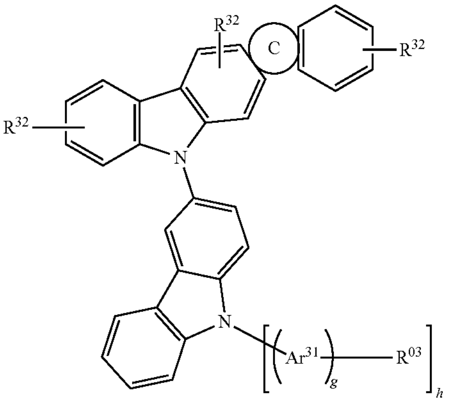

(15)

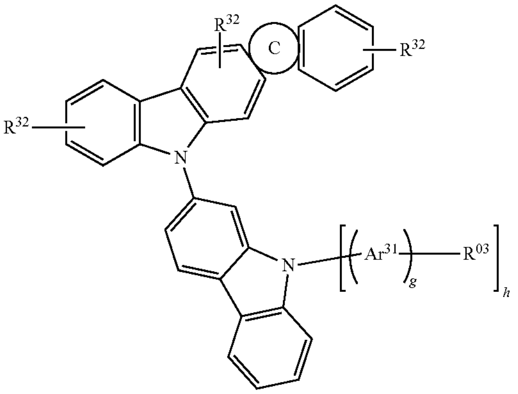

wherein a ring c, $R^{03}$, $R^{32}$, $Ar^{31}$, g and h have the same meanings as in the general formula (3).

9. The organic electroluminescent device according to claim 1, wherein the compound represented by the general formula (4) is used as the second host.

10. The organic electroluminescent device according to claim 9, wherein the general formula (4) has at least one binding structure represented by formula (4a), or at least one binding structure represented by formula (4b):

(4a)

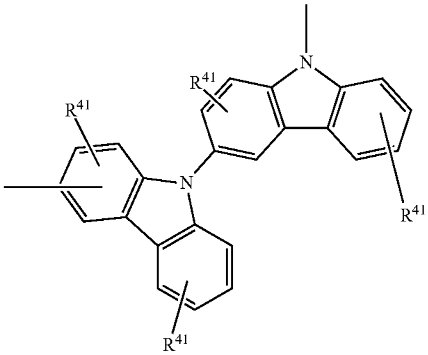

-continued (4b)

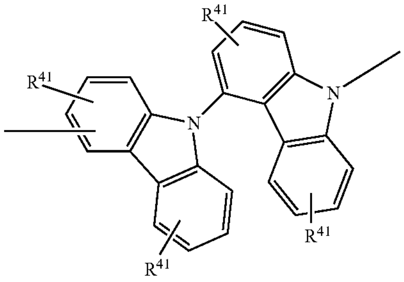

wherein $R^{41}$ has the same meaning as in the general formula (4).

11. The organic electroluminescent device according to claim 1, wherein a proportion of the first host is more than 20 wt % and less than 55 wt % based on the first host and the second host in total.

12. The organic electroluminescent device according to claim 1, wherein the light-emitting dopant material is an organic metal complex containing at least one metal selected from the group consisting of ruthenium, rhodium, palladium, silver, rhenium, osmium, iridium, platinum and gold.

13. The organic electroluminescent device according to claim 1, wherein the light-emitting dopant material is a fluorescent dopant material comprising a thermally activated delayed fluorescence-emitting dopant.

14. The organic electroluminescent device according to claim 1, wherein a difference in electron affinities (EA) of the first host and the second host is more than 0.1 eV and less than 0.6 eV.

15. The organic electroluminescent device according to claim 1, wherein a hole blocking layer is provided adjacent to the light-emitting layer, and the hole blocking layer comprises the compound represented by the general formula (5) or general formula (6).

16. A composition for the organic electroluminescent device according to claim 1 comprising a first host and a second host, wherein the composition comprises the compound represented by the general formula (5) or general formula (6) as the first host and the compound represented by the general formula (2), general formula (3), or general formula (4) as the second host.

17. The composition for the organic electroluminescent device according to claim 16, comprising the compound represented by the following formula (13) as the second host:

(13)

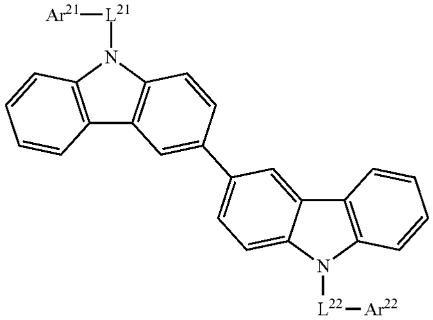

wherein $Ar^{21}$ and $Ar^{22}$ independently represent hydrogen, a substituted or unsubstituted aromatic hydrocarbon group having 6 to 14 carbon atoms, or a substituted or unsubstituted linked aromatic group in which two of the aromatic hydrocarbon groups are linked to each other; and $L^{21}$ and $L^{22}$ independently represent a phenylene group.

18. The composition for the organic electroluminescent device according to claim 16, wherein a difference in 50% weight reduction temperatures of the first host and the second host is within 20° C.

19. A method for producing an organic electroluminescent device including an anode, an organic layer and a cathode stacked on a substrate, the method comprising producing a light-emitting layer by using the composition for the organic electroluminescent device according to claim 16, and a light-emitting dopant material.

20. The organic electroluminescent device according to claim 1, wherein, in the compound represented by the general formula (6), either $Ar^1$ or $Ar^2$ has a structure in which all three Y in the formula (1a) are N.

21. An organic electroluminescent device comprising an anode, an organic layer and a cathode stacked on a substrate, wherein at least one layer of the organic layer is a light-emitting layer containing a first host, a second host and a light-emitting dopant material, the first host is selected from compound 1-222 or 1-223, and the second host is selected from a compound represented by the following general formula (2), general formula (3), or general formula (4):

1-222

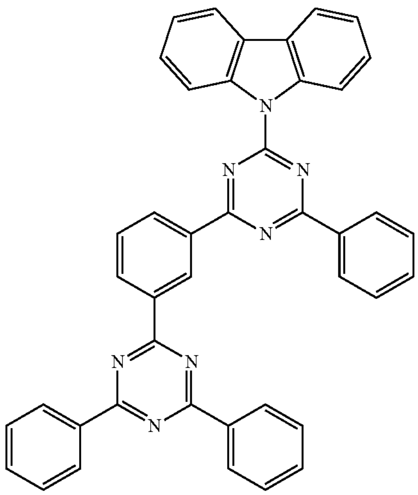

-continued 1-223

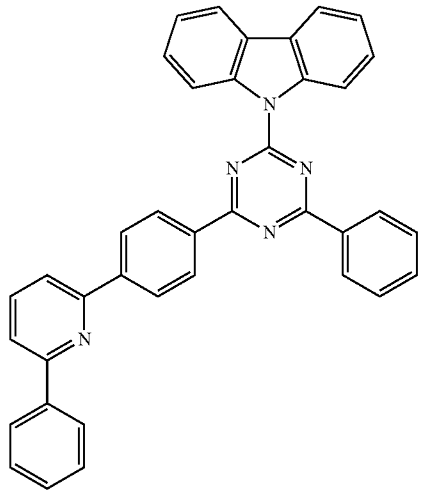

(2)

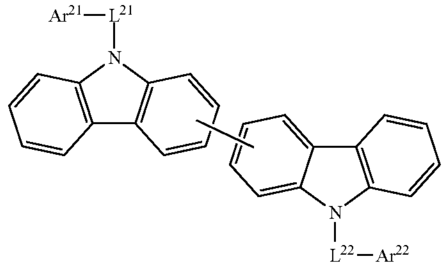

wherein $Ar^{21}$ and $Ar^{22}$ independently represent hydrogen, a substituted or unsubstituted aromatic hydrocarbon group having 6 to 14 carbon atoms, or a substituted or unsubstituted linked aromatic group in which two of the aromatic hydrocarbon groups are linked to each other; and $L^{21}$ and $L^{22}$ independently represent a phenylene group;

(3)

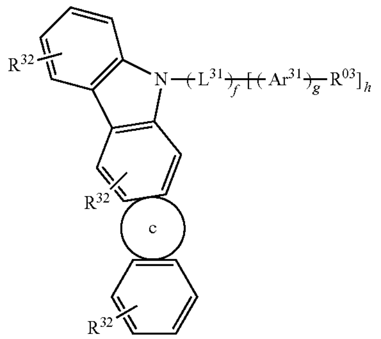

(3a)

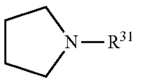

wherein ring c is a heterocycle represented by formula (3a) and the ring c is fused to an adjacent ring at any position;

$R^{03}$ and $R^{32}$ independently represent hydrogen, deuterium, an aliphatic hydrocarbon group having 1 to 10 carbon atoms, a substituted or unsubstituted aromatic hydrocarbon group having 6 to 30 carbon atoms, or a substituted or unsubstituted aromatic heterocyclic group having 3 to 16 carbon atoms;

$R^{31}$ represents a substituted or unsubstituted aromatic hydrocarbon group having 6 to 10 carbon atoms, a carbazolyl group, or a substituted or unsubstituted linked aromatic group in which two to five of these aromatic rings are linked to each other;

$L^{31}$ independently represents a substituted or unsubstituted aromatic hydrocarbon group having 6 to 30 carbon atoms, or a substituted or unsubstituted aromatic heterocyclic group having 3 to 16 carbon atoms;

$Ar^{31}$ independently represents a substituted or unsubstituted aromatic hydrocarbon group having 6 to 10 carbon atoms;

f is the number of repetitions and represents an integer of 1 to 3;

g is the number of repetitions and independently represents an integer of 0 to 3; and h is the number of substitutions and represents an integer of 1 to 7;

(4)

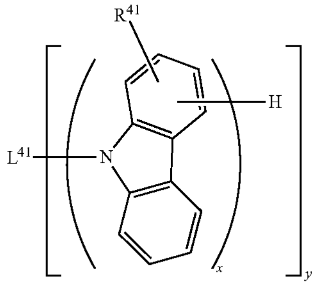

wherein $L^{41}$ represents a substituted or unsubstituted aromatic hydrocarbon group having 6 to 30 carbon atoms, a substituted or unsubstituted aromatic heterocyclic group having 3 to 12 carbon atoms, or a linked aromatic group in which two to five of these aromatic rings are linked;

$R^{41}$ each independently represents hydrogen, deuterium, an aliphatic hydrocarbon group having 1 to 10 carbon atoms, a substituted or unsubstituted aromatic hydrocarbon group having 6 to 30 carbon atoms, or a substituted or unsubstituted aromatic heterocyclic group having 3 to 16 carbon atoms, provided that $R^{41}$ is not a carbazole group;

x is the number of repetitions and independently represents an integer of 1 to 4, provided that at least one x is an integer of 2 to 4;

y is the number of substitutions and represents an integer of 1 to 4; and when x and y are each 2 or more, a plurality of carbazolyl groups in the formula may be the same or different.

* * * * *